US012588317B2

(12) United States Patent
Zhu et al.

(10) Patent No.: US 12,588,317 B2
(45) Date of Patent: Mar. 24, 2026

(54) LED DISPLAY DEVICE, METHOD OF CONTROLLING THE SAME, AND METHOD OF MANUFACTURING AN LED DISPLAY DEVICE

(71) Applicant: PORO TECHNOLOGIES LTD, Cambridge (GB)

(72) Inventors: Tongtong Zhu, Cambridge (GB); Alex Yudin, Cambridge (GB); Simon Hammersley, Cambridge (GB)

(73) Assignee: PORO TECHNOLOGIES LTD, Cambridge (GB)

( * ) Notice: Subject to any disclaimer, the term of this patent is extended or adjusted under 35 U.S.C. 154(b) by 0 days.

(21) Appl. No.: 18/292,695

(22) PCT Filed: Jul. 28, 2022

(86) PCT No.: PCT/GB2022/052001
§ 371 (c)(1),
(2) Date: Jan. 26, 2024

(87) PCT Pub. No.: WO2023/007178
PCT Pub. Date: Feb. 2, 2023

(65) Prior Publication Data
US 2025/0160098 A1      May 15, 2025

(30) Foreign Application Priority Data

Jul. 28, 2021      (GB) ....................................... 2110884
Jul. 29, 2021      (GB) ....................................... 2110976
(Continued)

(51) Int. Cl.
*G09G 3/32*            (2016.01)
*H10H 20/01*           (2025.01)
(Continued)

(52) U.S. Cl.
CPC ............. *H10H 20/812* (2025.01); *G09G 3/32* (2013.01); *H10H 20/01335* (2025.01);
(Continued)

(58) Field of Classification Search
CPC .... H10H 20/812; H10H 20/821; H10H 29/49; H10H 29/345; H10H 20/825;
(Continued)

(56) References Cited

U.S. PATENT DOCUMENTS 7,995,014 B2      8/2011  Lin et al.
8,098,265 B2      1/2012  El-Ghoroury et al.
(Continued)

FOREIGN PATENT DOCUMENTS

EP            1887636 B1      8/2007
EP            2398076 A2      12/2011
(Continued)

OTHER PUBLICATIONS

Yuya Inatomi et al., "Theoretical study of the composition pulling effect in InGaN metalorganic vapor-phase epitaxy growth", Japanese Journal of Applied Physics 56, 078003 (2017).
(Continued)

*Primary Examiner* — Michael A Faragalla
(74) *Attorney, Agent, or Firm* — Merchant & Gould P.C.

(57)              ABSTRACT

A display device comprises a light emitting diode (LED) which includes a porous semiconductor material, wherein the device comprises a pixel comprising a plurality of subpixels each having a light-emitting layer. A first subpixel has a first light-emitting layer having a first area A1, and a second subpixel has a second light-emitting layer having a second area A2 different from the first area A1. The first subpixel is configured to emit at a first peak wavelength, and the second subpixel is configured to emit at a second peak wavelength different from the first peak wavelength. A (Continued)

method of controlling this display device and a method of manufacturing said display device are also provided.

13 Claims, 63 Drawing Sheets

(30) Foreign Application Priority Data

| | | |
|---|---|---|
| Jan. 28, 2022 | (GB) | 2201161 |
| Jan. 28, 2022 | (GB) | 2201163 |
| Feb. 4, 2022 | (GB) | 2201493 |
| Mar. 10, 2022 | (GB) | 2203367 |
| Apr. 7, 2022 | (GB) | 2205122 |
| Apr. 14, 2022 | (GB) | 2205604 |
| May 4, 2022 | (GB) | 2206521 |
| Jun. 20, 2022 | (GB) | 2209054 |

(51) Int. Cl.

| | |
|---|---|
| *H10H 20/812* | (2025.01) |
| *H10H 20/815* | (2025.01) |
| *H10H 20/817* | (2025.01) |
| *H10H 20/821* | (2025.01) |
| *H10H 20/825* | (2025.01) |
| *H10H 29/01* | (2025.01) |
| *H10H 29/34* | (2025.01) |
| *H10H 29/49* | (2025.01) |
| *H10H 20/813* | (2025.01) |
| *H10H 29/30* | (2025.01) |

(52) U.S. Cl.
CPC ........ *H10H 20/815* (2025.01); *H10H 20/817* (2025.01); *H10H 20/821* (2025.01); *H10H 20/825* (2025.01); *H10H 29/012* (2025.01); *H10H 29/345* (2025.01); *H10H 29/49* (2025.01); *G09G 2300/0452* (2013.01); *G09G 2320/0233* (2013.01); *G09G 2320/0626* (2013.01); *G09G 2320/0666* (2013.01); *G09G 2330/02* (2013.01); *G09G 2330/021* (2013.01); *H10H 20/8131* (2025.01); *H10H 29/362* (2025.01)

(58) Field of Classification Search
CPC ........... H10H 29/012; H10H 20/01335; H10H 20/817; H10H 20/815; H10H 20/8131; G09G 3/32; G09G 2300/0452; G09G 2320/0233; G09G 2320/0626; G09G 2320/0666; G09G 2330/02
See application file for complete search history.

(56) References Cited

U.S. PATENT DOCUMENTS

| | | | |
|---|---|---|---|
| 9,484,504 | B2 | 11/2016 | Bibl et al. |
| 11,062,638 | B2 | 7/2021 | Bogdanowicz et al. |
| 11,164,512 | B2 | 11/2021 | Chaji |
| 2005/0280375 | A1 | 12/2005 | Chikugawa et al. |
| 2014/0267456 | A1 | 9/2014 | Ando et al. |
| 2016/0359299 | A1 | 12/2016 | El-Ghoroury et al. |
| 2016/0372514 | A1 | 12/2016 | Chang et al. |
| 2018/0144715 | A1 | 5/2018 | Shigeta et al. |
| 2018/0331161 | A1 | 11/2018 | Liao et al. |
| 2019/0333455 | A1 | 10/2019 | El-Ghoroury |
| 2020/0152841 | A1* | 5/2020 | Han ................... H01L 25/0753 |
| 2020/0212347 | A1* | 7/2020 | Park ................... H10K 50/856 |
| 2020/0274025 | A1 | 8/2020 | Wang et al. |
| 2020/0312216 | A1 | 10/2020 | Kim et al. |
| 2021/0091268 | A1 | 3/2021 | Dierolf et al. |

FOREIGN PATENT DOCUMENTS

| | | | |
|---|---|---|---|
| FR | 3019380 | A1 | 10/2015 |
| TW | 347595 | | 12/1998 |
| TW | 201735390 | | 10/2017 |
| TW | I601267 | B | 10/2017 |
| TW | 202001860 | | 1/2020 |
| TW | 202127690 | | 7/2021 |
| WO | 2016/204166 | | 12/2016 |
| WO | 2019/063957 | A1 | 4/2019 |
| WO | 2019/145728 | A1 | 8/2019 |
| WO | 2021/050731 | A1 | 3/2021 |
| WO | 2021/133530 | A1 | 7/2021 |
| WO | 2021/148808 | A1 | 7/2021 |
| WO | 2022/029434 | A1 | 2/2022 |

OTHER PUBLICATIONS

Shengjun Zhou et al., "The effect of nanometre-scale V-pits on electronic and optical properties and efficiency droop of GaN-based green light-emitting diodes", Scientific Reports, 8:11053 (2018).

K. Hiramatsu, Y. Kawaguchi et al., "The Composition Pulling Effect in MOVPE Grown InGaN on GaN and AlGaN and its TEM Characterization", MRS Internet Journal of Nitride Semiconductor Research, vol. 2, Article 6 (1997).

International Search Report and Written Opinion for PCT/GB2022/052001 (Oct. 31, 2022).

Hangleiter A. et al: "Suppression of Nonradiative Recombination by V-Shaped Pits in GaInN/GaN Quantum Wells Produces a Large Increase in the Light Emission Efficiency", Physical Review Letters, vol. 95, No. 12, Sep. 16, 2005.

Pasayat Shubhra S. et al: "Demonstration of ultra-small (<10 [mu]n) 632 nm red InGaN micro-LEDs with useful on- wafer external quantum efficiency (>0.2%) for mini-displays", Applied Physics Express, vol. 14, No. 1, pp. 011004-1 to 011004-4, Dec. 16, 2020.

* cited by examiner

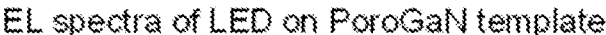
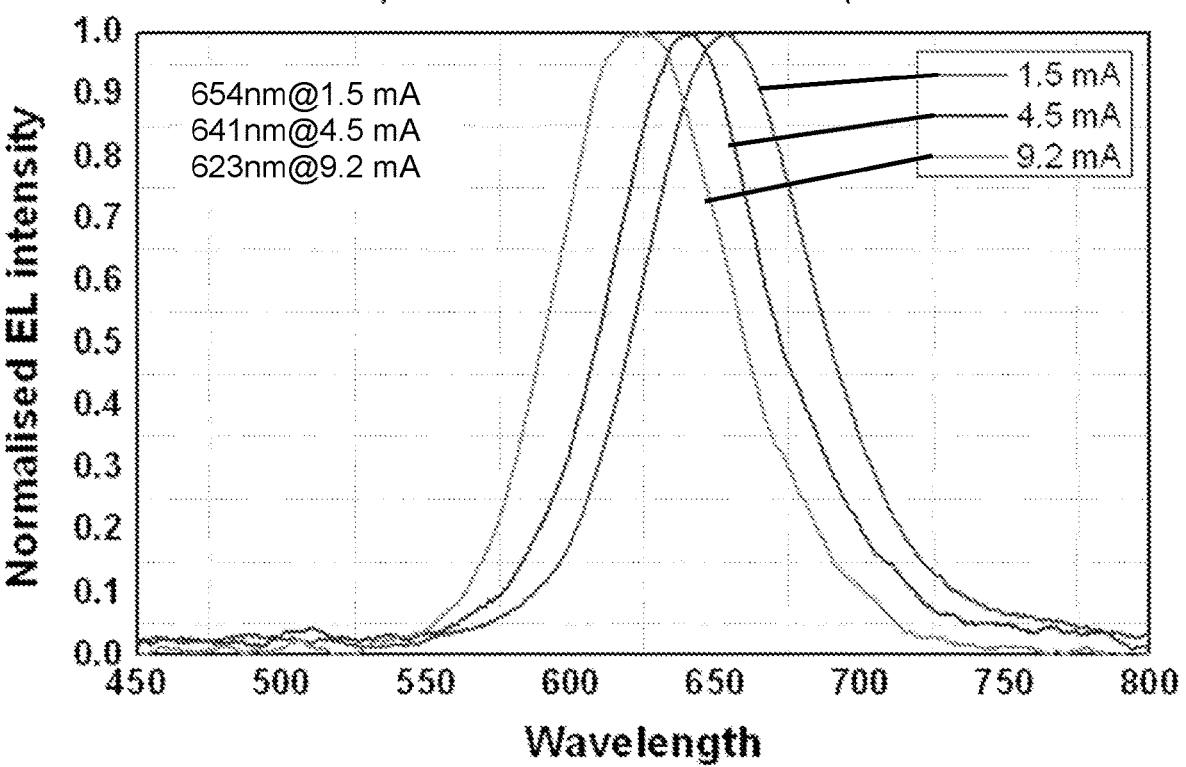
Figure 21
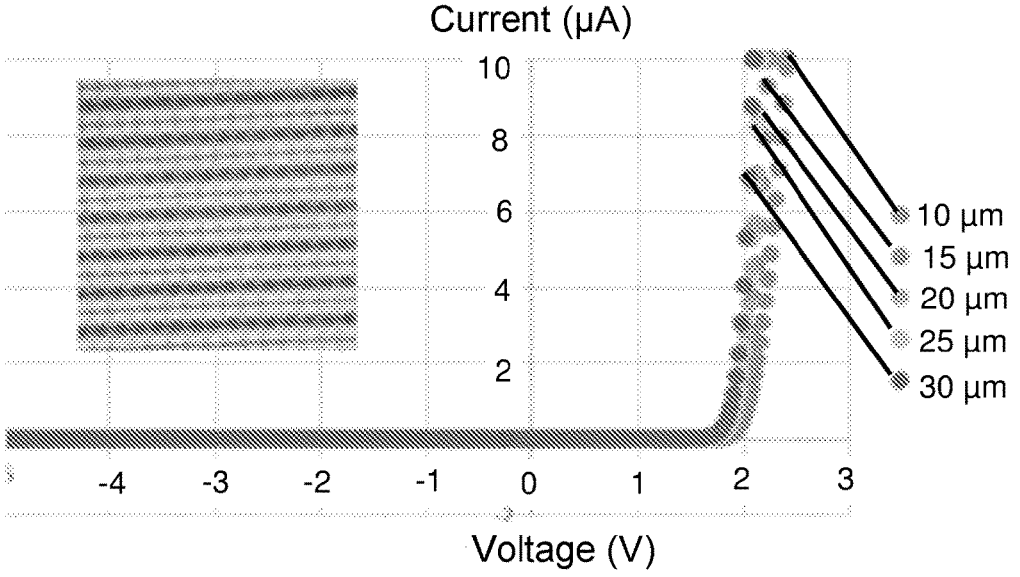
Figure 22

| 50 μA | 100 μA | 1 mA | 10 mA | 20 mA |

| Layer 5 – p-(Al,In)GaN |
| Layer 4 – Active region MQW |
| Layer 3 – pre-strain layer |
| Layer 2 – n(Al,In)GaN |
| Layer 1 – connecting layer (Al,In)GaN |
| Porous region |
| Substrate |

312

311

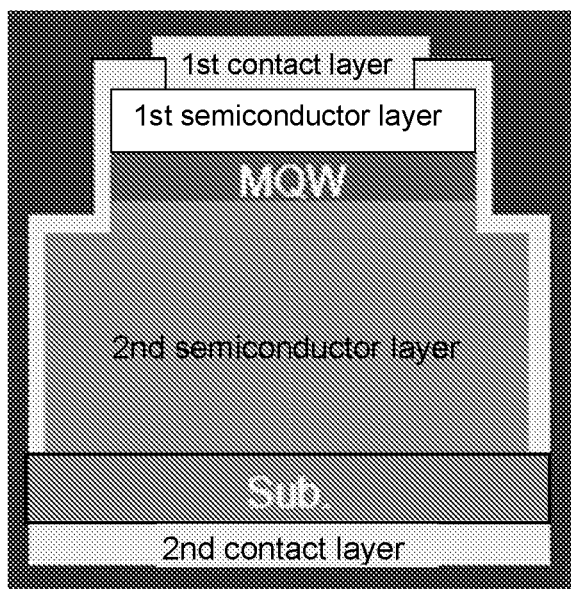
Figure 40
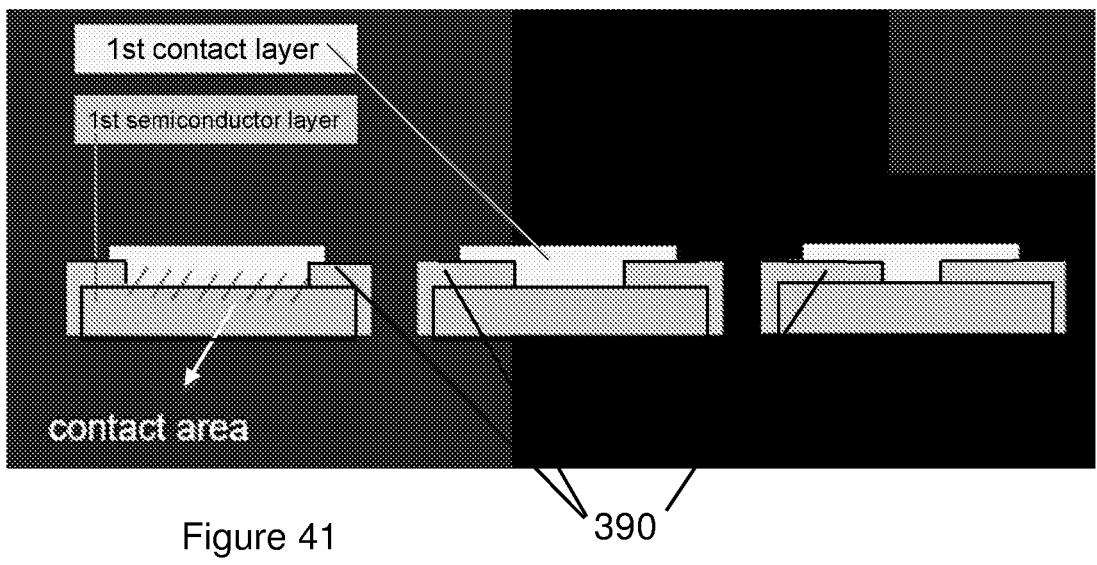
Figure 41
Figure 42
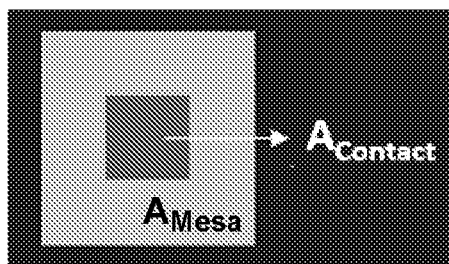

390

Figure 44
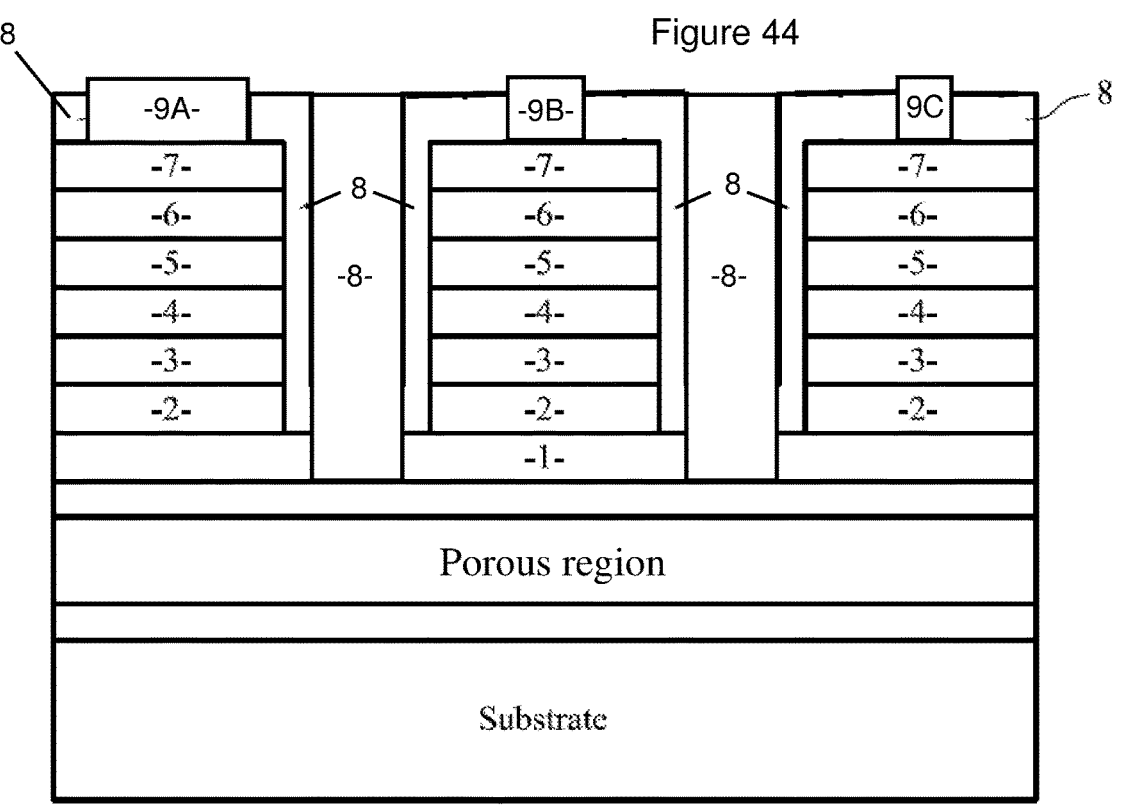
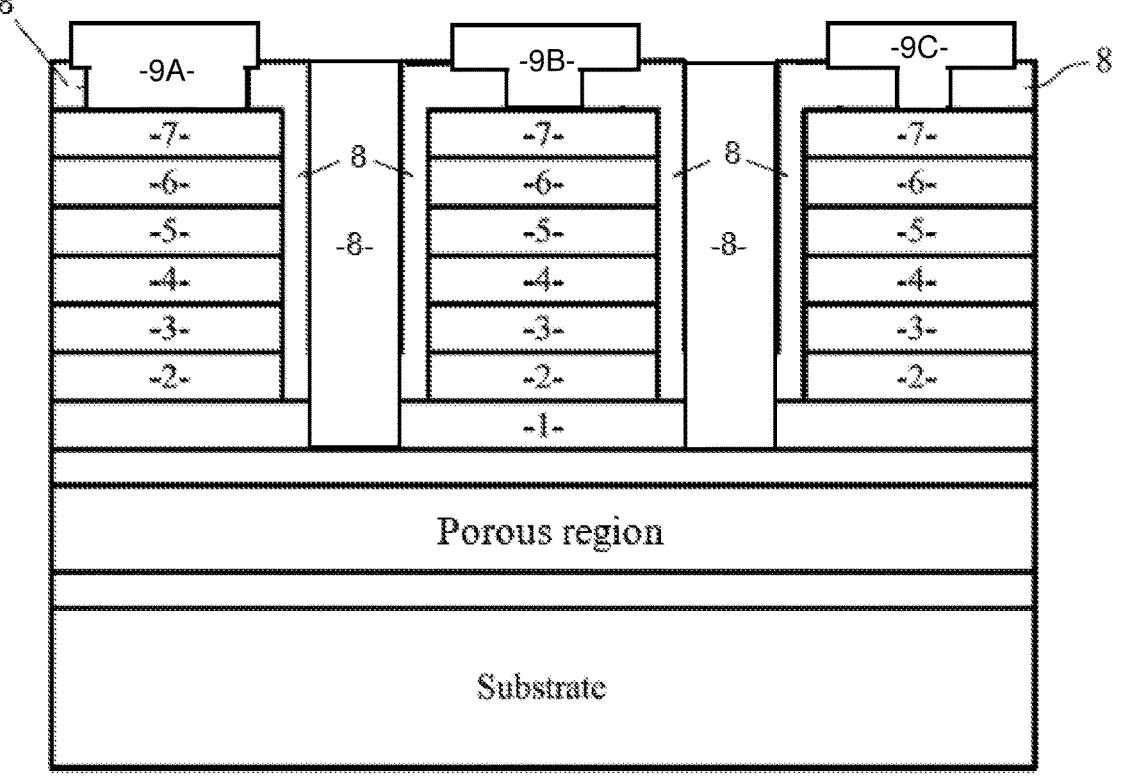
Figure 45

1. Continuous MQWs                    2. V-pits
Figure 46B
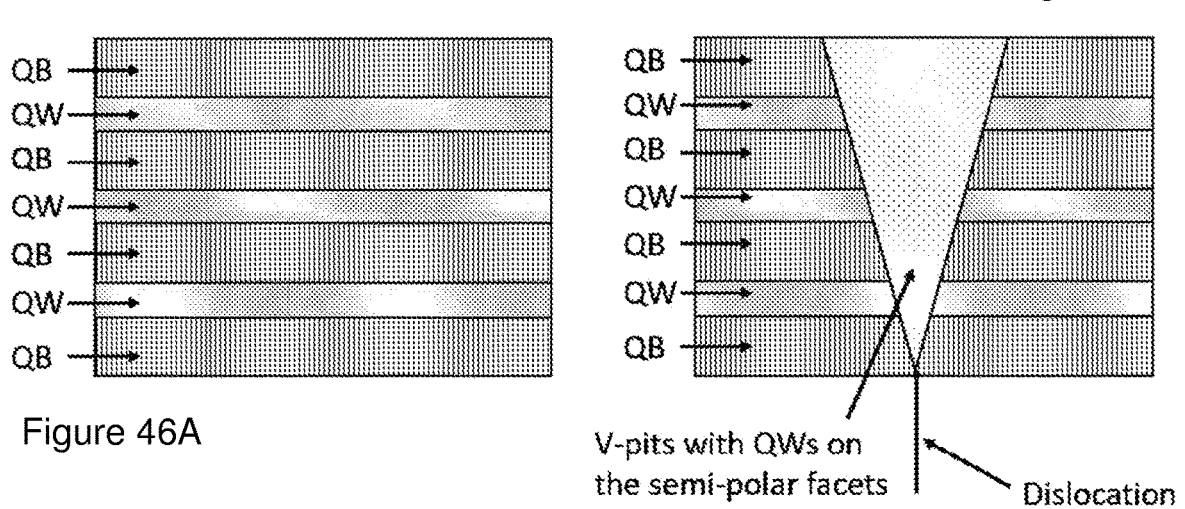
Figure 46A
V-pits with QWs on
the semi-polar facets
Dislocation
3. Non-uniform MQWs
Gappy QWs or QWs with gaps
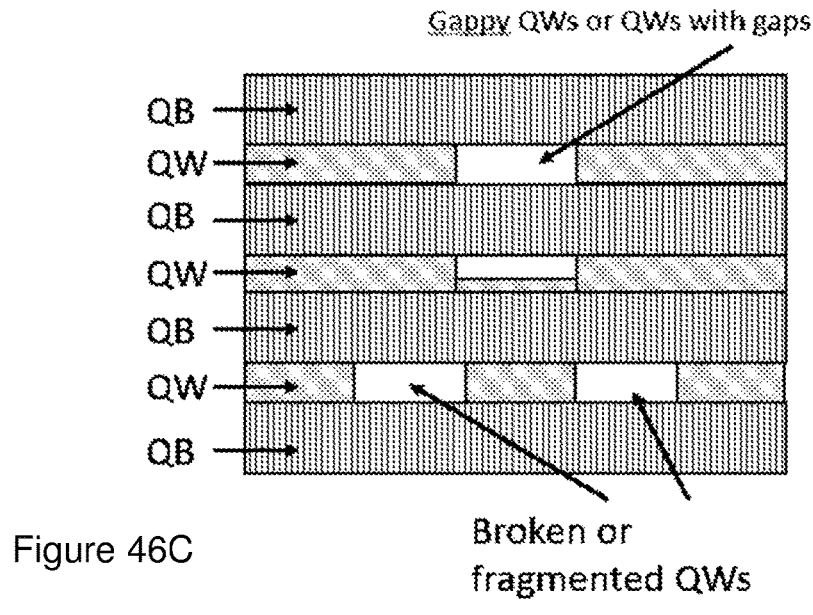
Figure 46C
Broken or
fragmented QWs

4. Quantum dots or quantum nanostructures

QDs on QB or QDs on top of QW or broken/gappy QWs

5. Well-width fluctuation

QWs have different width within the same QWs and across different QWs

6. Alloy composition

QB3
QW3
QB2
QW2
QB1
QW1
QB0

7. Different combinations of MQWs and underlayers

QB3
QW3
QB2
QW2
QB1
QW1
QB0

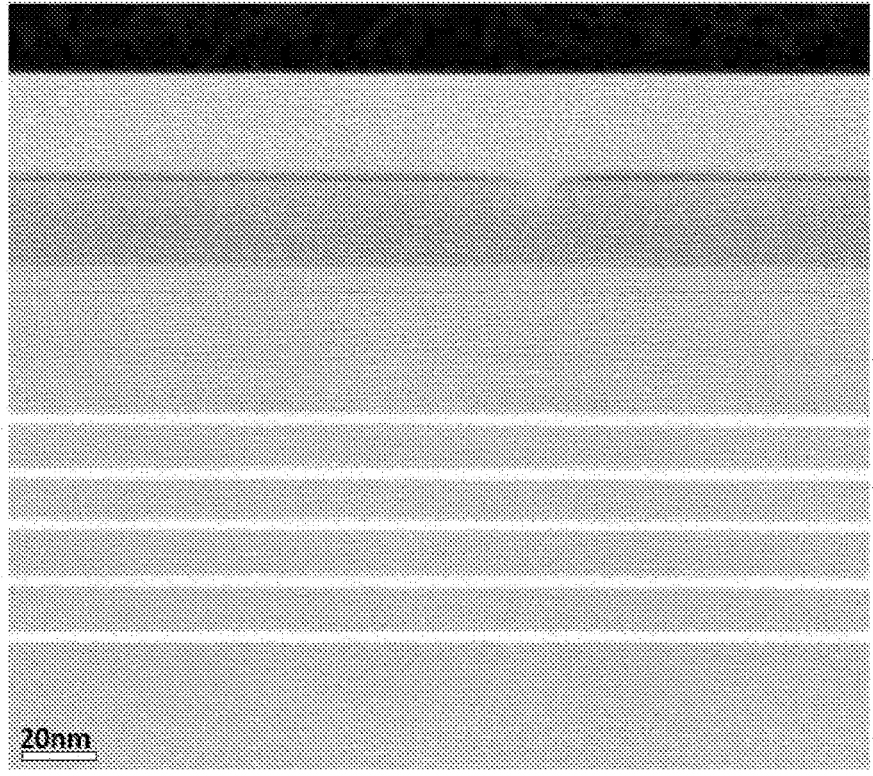
Non-variable wavelength LED      Figure 47A
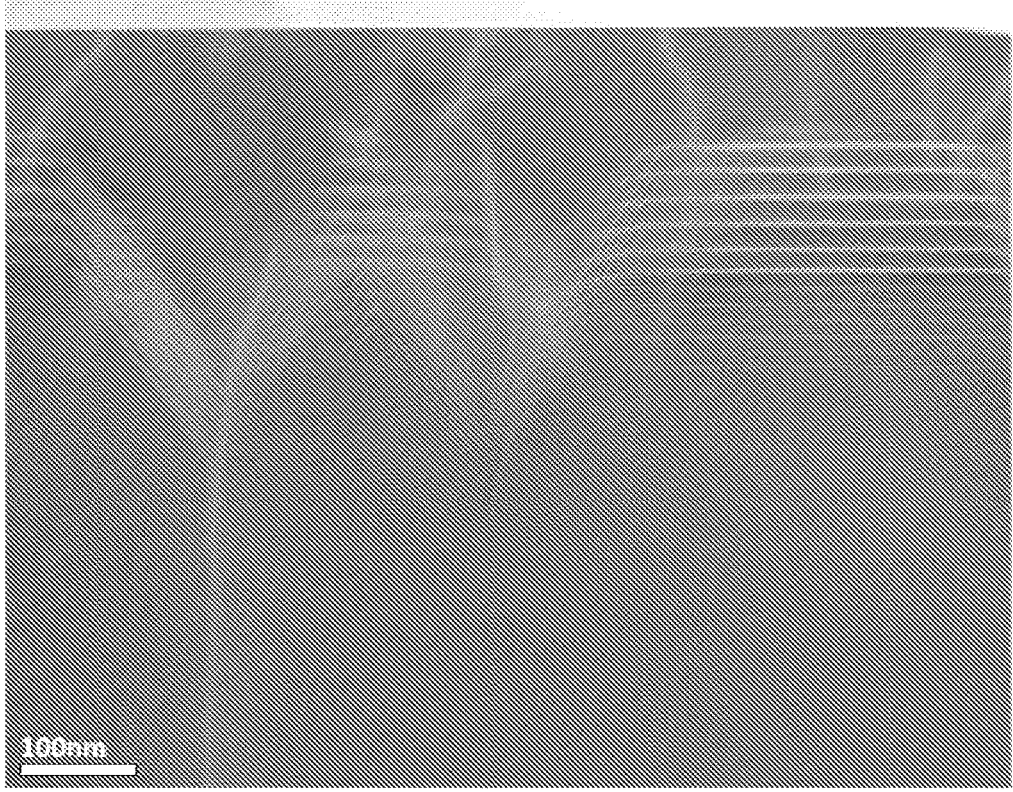
Variable wavelength LED      Figure 47B Porous
region Non-variable wavelength LED Variable wavelength LED

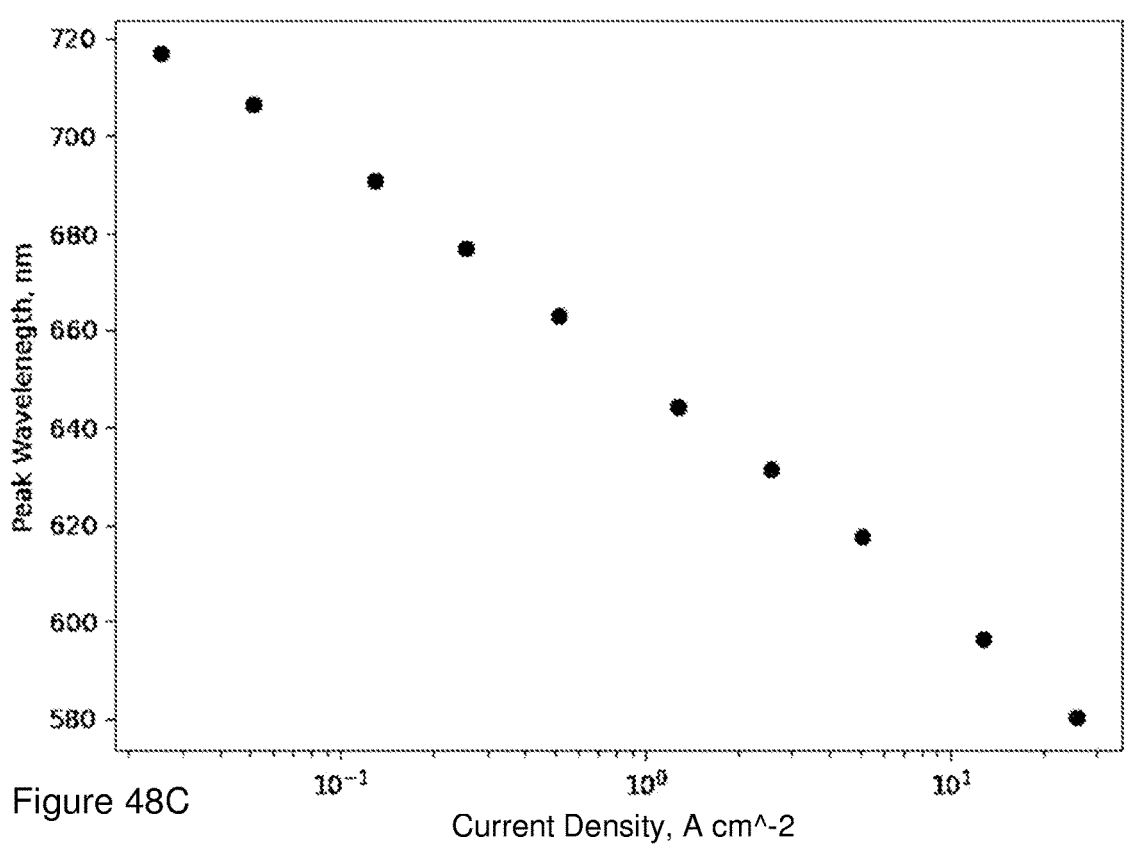
Figure 48C
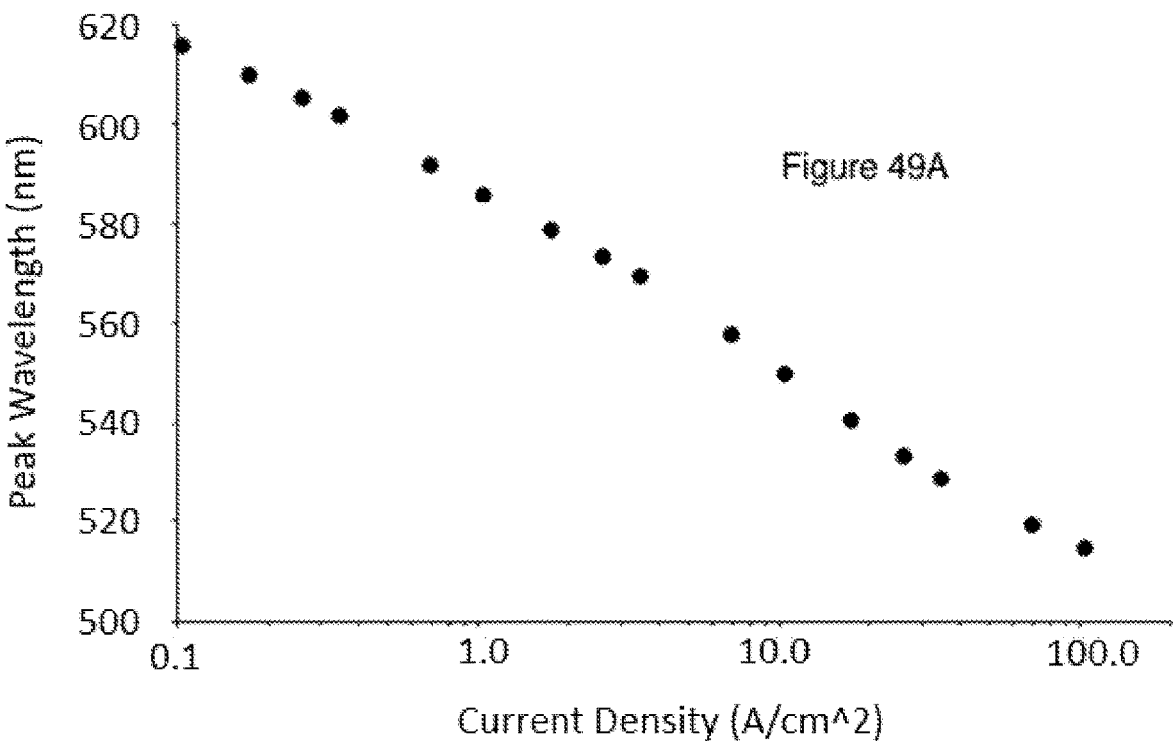

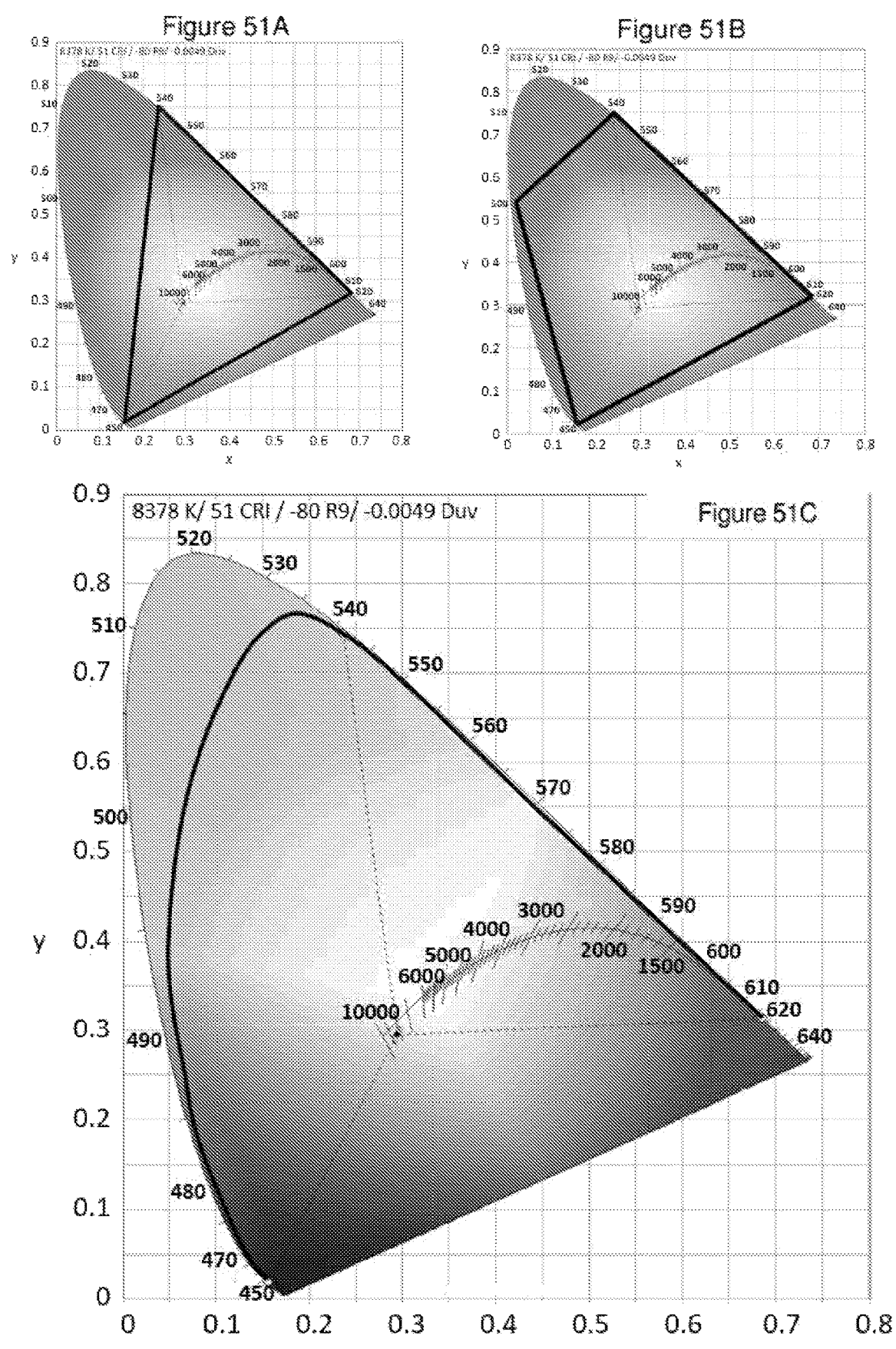

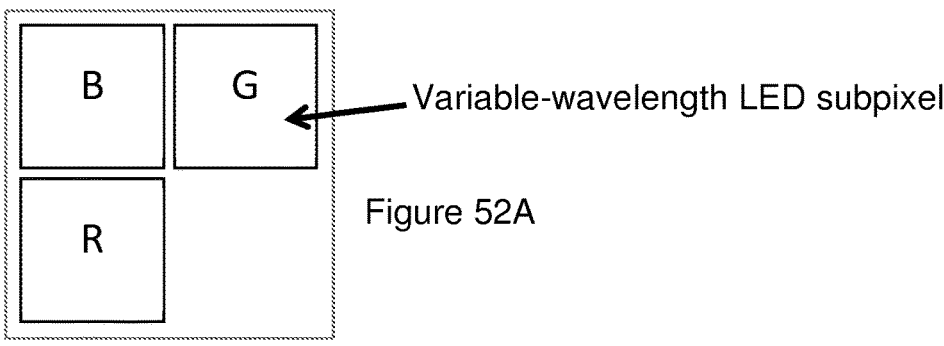
Variable-wavelength LED subpixel
Figure 52A
Figure 52B
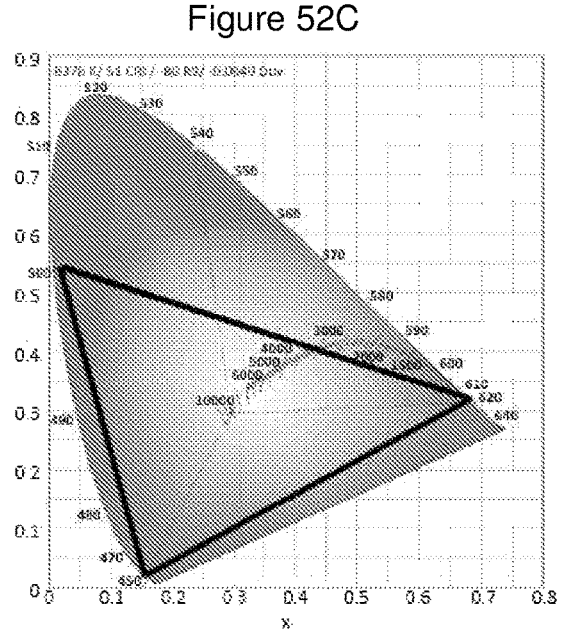
Gamut for G subpixel in mode 1          Gamut for G subpixel in mode 2
Figure 52C
Figure 52D
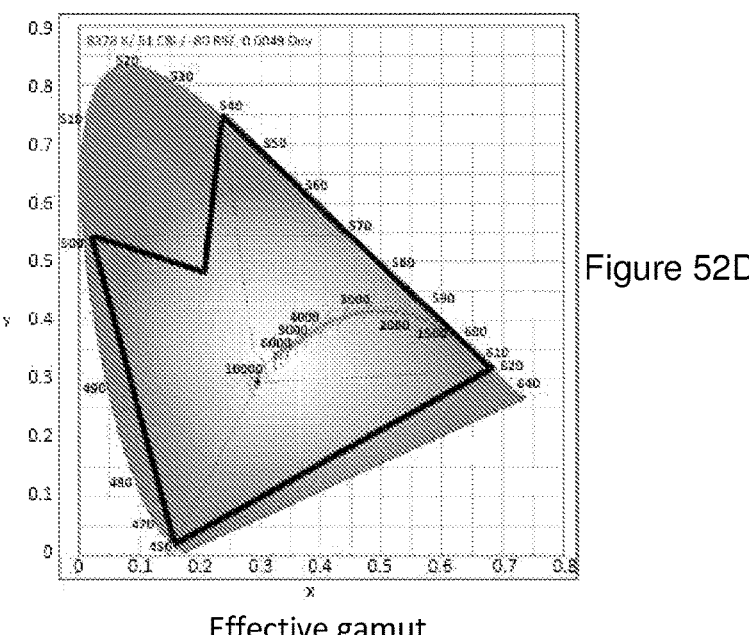
Effective gamut

| B | G |
|---|---|
| R |   |

Time unit 1

| R | G |
|---|---|
| B |   |

Time unit 2

| B | G |
|---|---|
| R |   |

Time unit 3

| R | G |
|---|---|
| B |   |

Time unit 4

Variable-wavelength LED subpixel

| B | G1 |
|---|----|
| R | G2 |

Effective gamut

| RGB | RGB |
|-----|-----|

Observed pixel chromaticity is spatial and temporal combination

Variable-wavelength LED subpixel

Variable-wavelength
LED subpixel (blue-
green)

Variable-wavelength LED subpixel (red-green-blue)

Single variable wavelength subpixel (can display colours from blue to red)

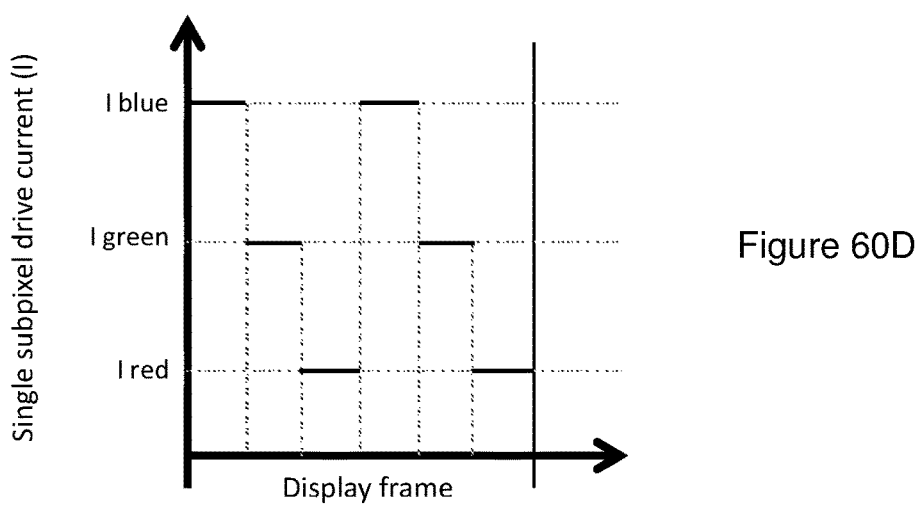
Figure 60D
Figure 61A
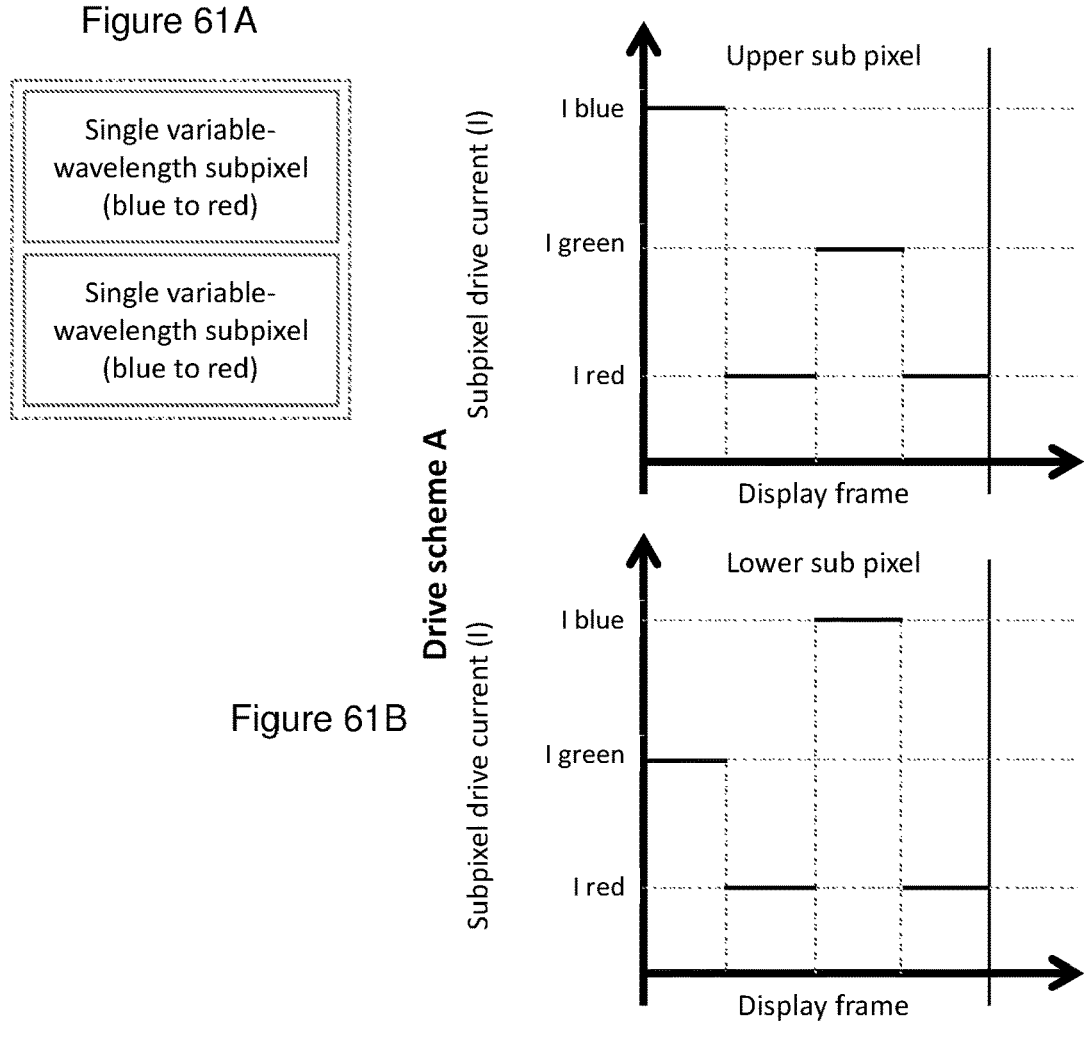
Figure 61B

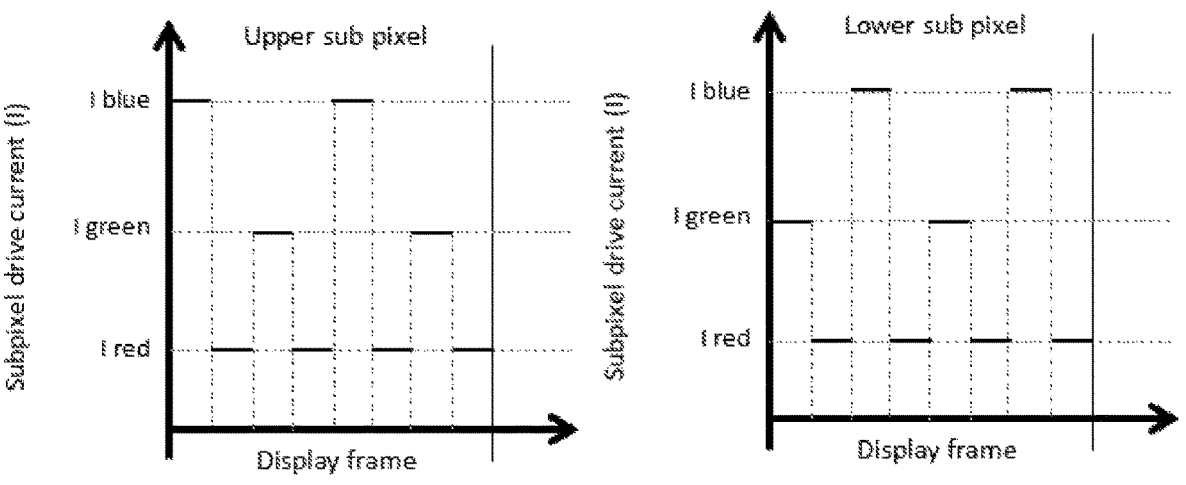
Drive scheme B
Figure 61C
Figure 62
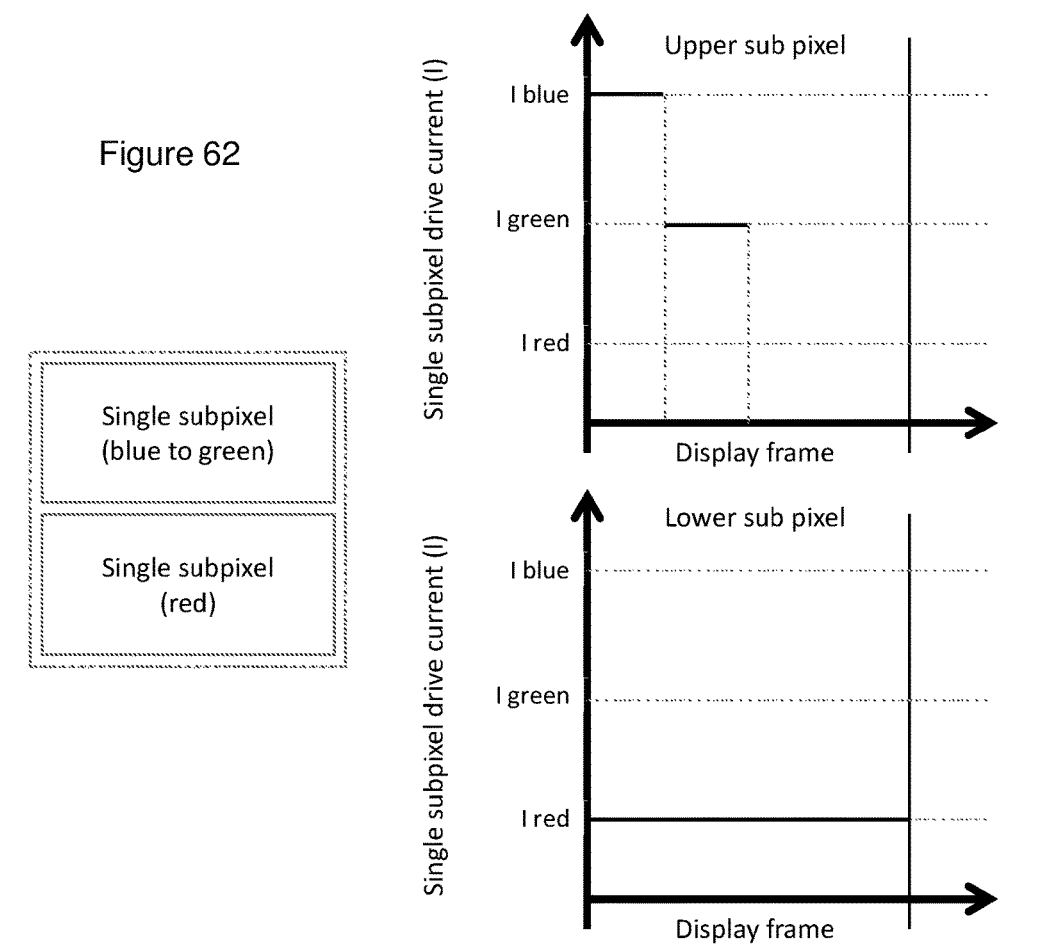

Figure 63
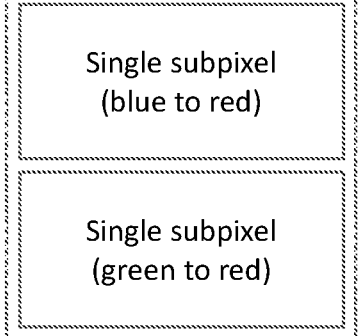
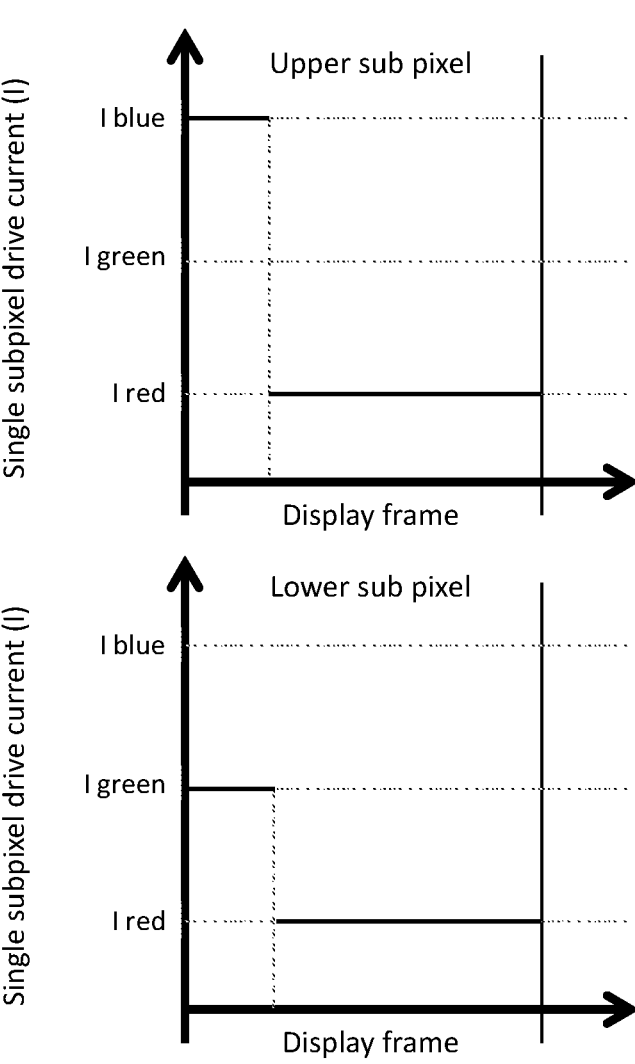

Single variable-
wavelength subpixel (can display colours
from blue to red)

Pixel color is
temporal
combination

Embodiment 11:

Single pixel can be one subpixel or more, and each subpixel can change colors by the image information (this subpixel can display colors from blue to red)

Each pixel can determine its own color by modulating the signal and produce image information Pixel color and brightness are a combination of signal pulse duty cycle and amplitude Embodiment 12:
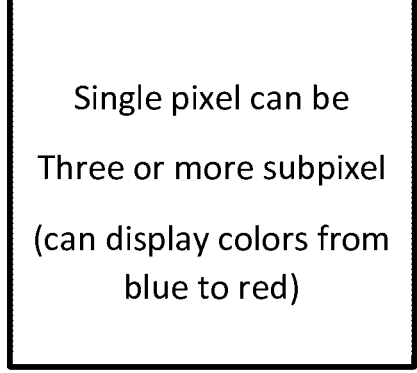
Single pixel can be
Three or more subpixel
(can display colors from blue to red)
Figure 66
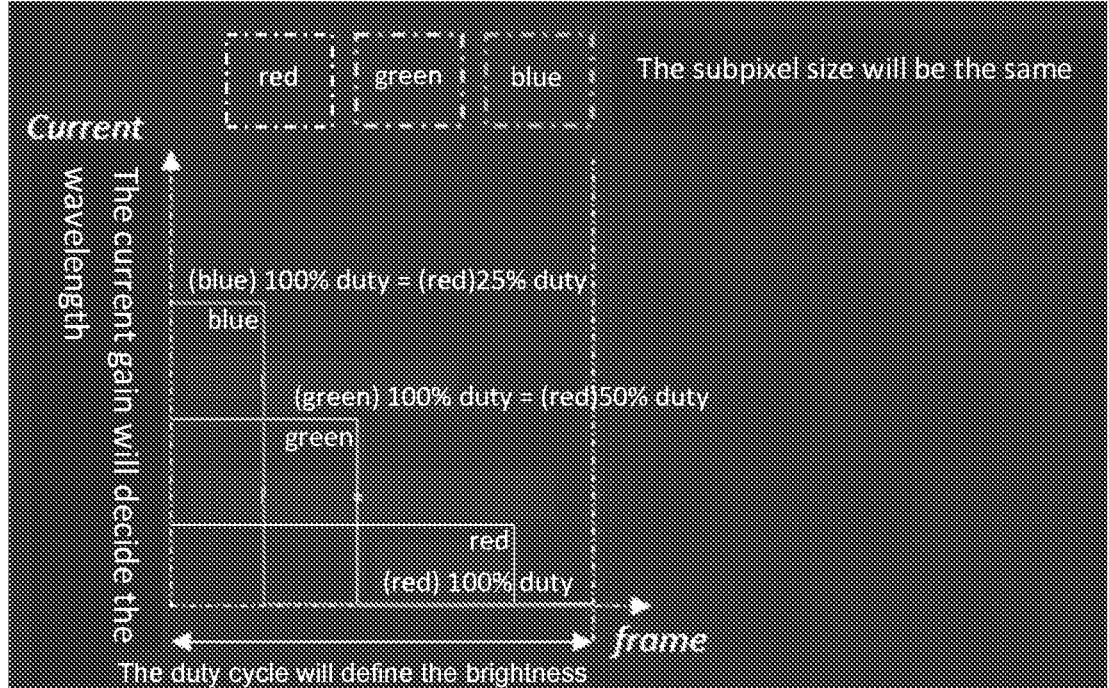
Each subpixel can determine its own color by modulating the signal, and Image information for each pixel can be determined by combining multiple sub-pixels
Pixel color and brightness are a combination of signal pulse duty cycle and amplitude Embodiment 13:
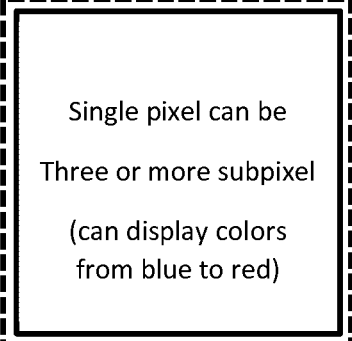
Figure 67
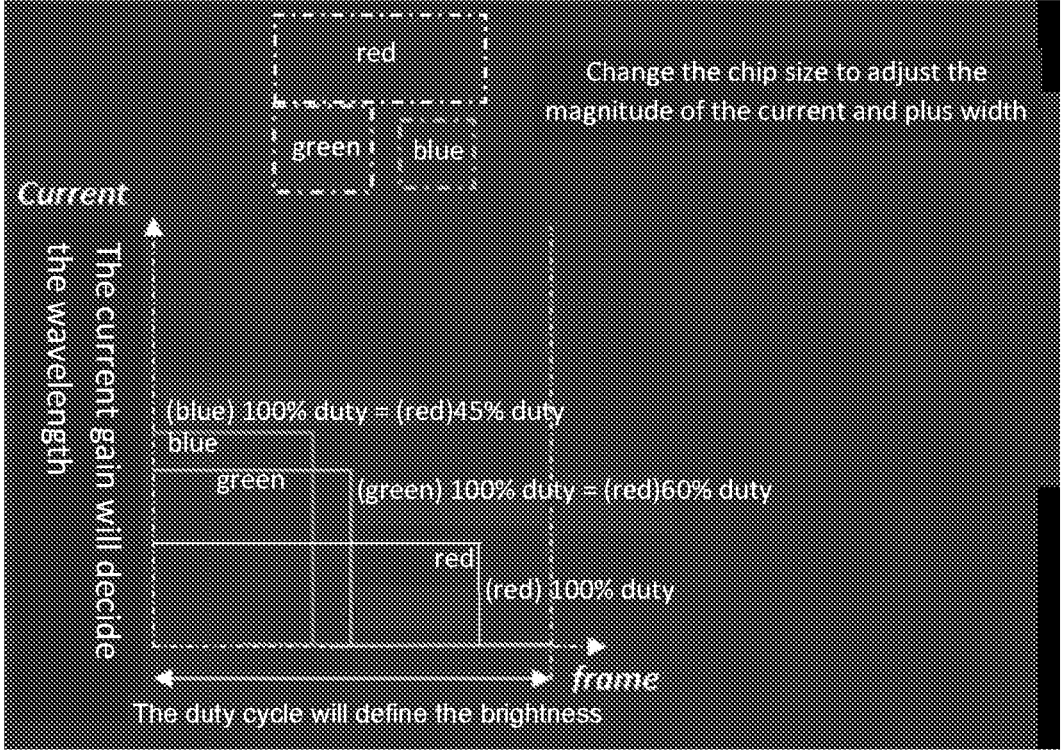
Each subpixel can determine its own color by modulating the signal, and Image information for each pixel can be determined by combining multiple sub-pixels
Pixel color and brightness are a combination of signal pulse duty cycle and amplitude Embodiment 14:
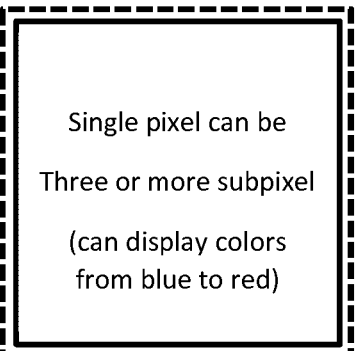
Single pixel can be
Three or more subpixel
(can display colors
from blue to red)
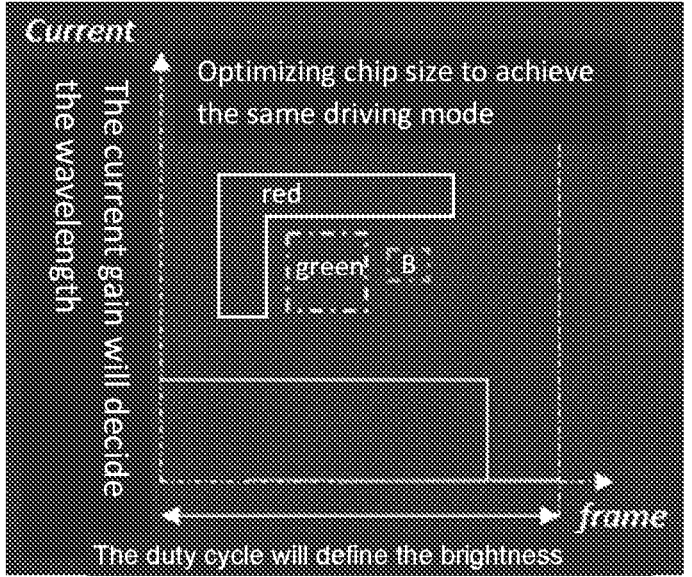
Figure 68
Each subpixel can determine its own color by modulating the signal, and Image information for each pixel can be determined by combining multiple sub-pixels
Pixel color and brightness are a combination of signal pulse duty cycle and amplitude Embodiment 15:

Some sub-pixels can focus on producing specific colors through signal modulation, while others can change colors as needed by the image information (can display colors from blue to red)

Figure 69

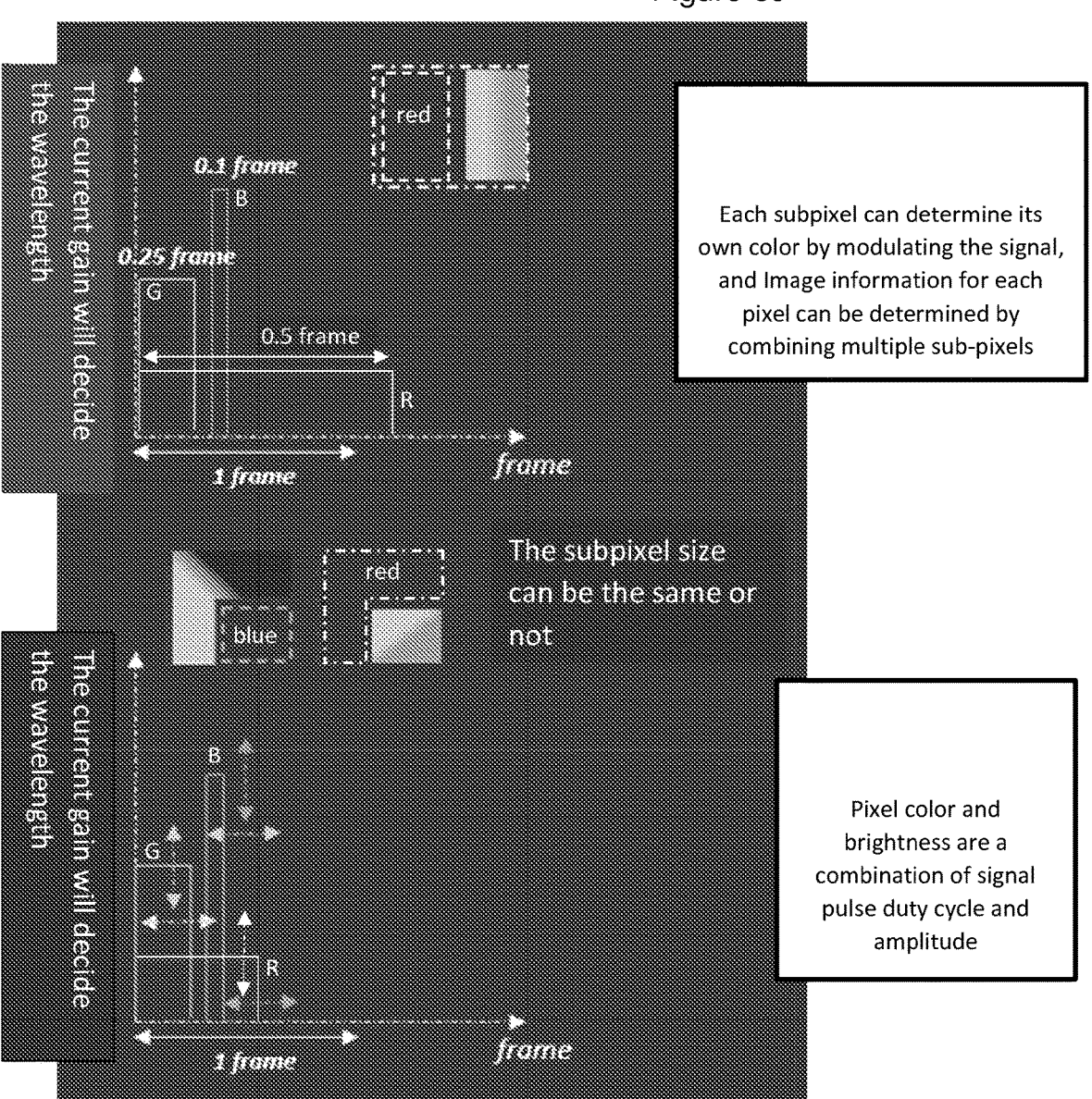

Each subpixel can determine its own color by modulating the signal, and Image information for each pixel can be determined by combining multiple sub-pixels The subpixel size can be the same or not Pixel color and brightness are a combination of signal pulse duty cycle and amplitude LED peak wavelength vs drive current Sequence of current pulses Spectra of emission resulting from current pulses and
total perceived output by an observer Embodiment A Embodiment B
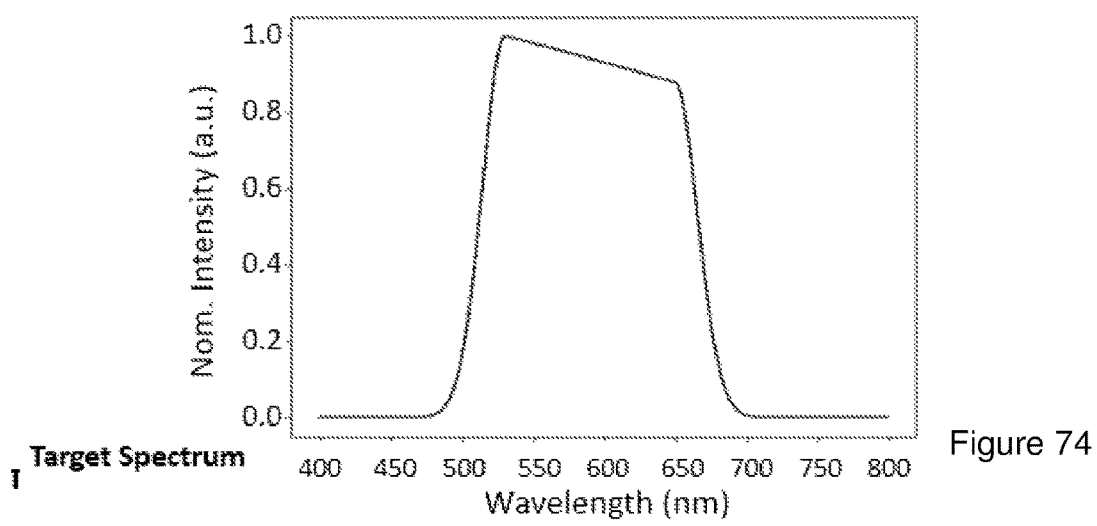
Target Spectrum
Figure 74
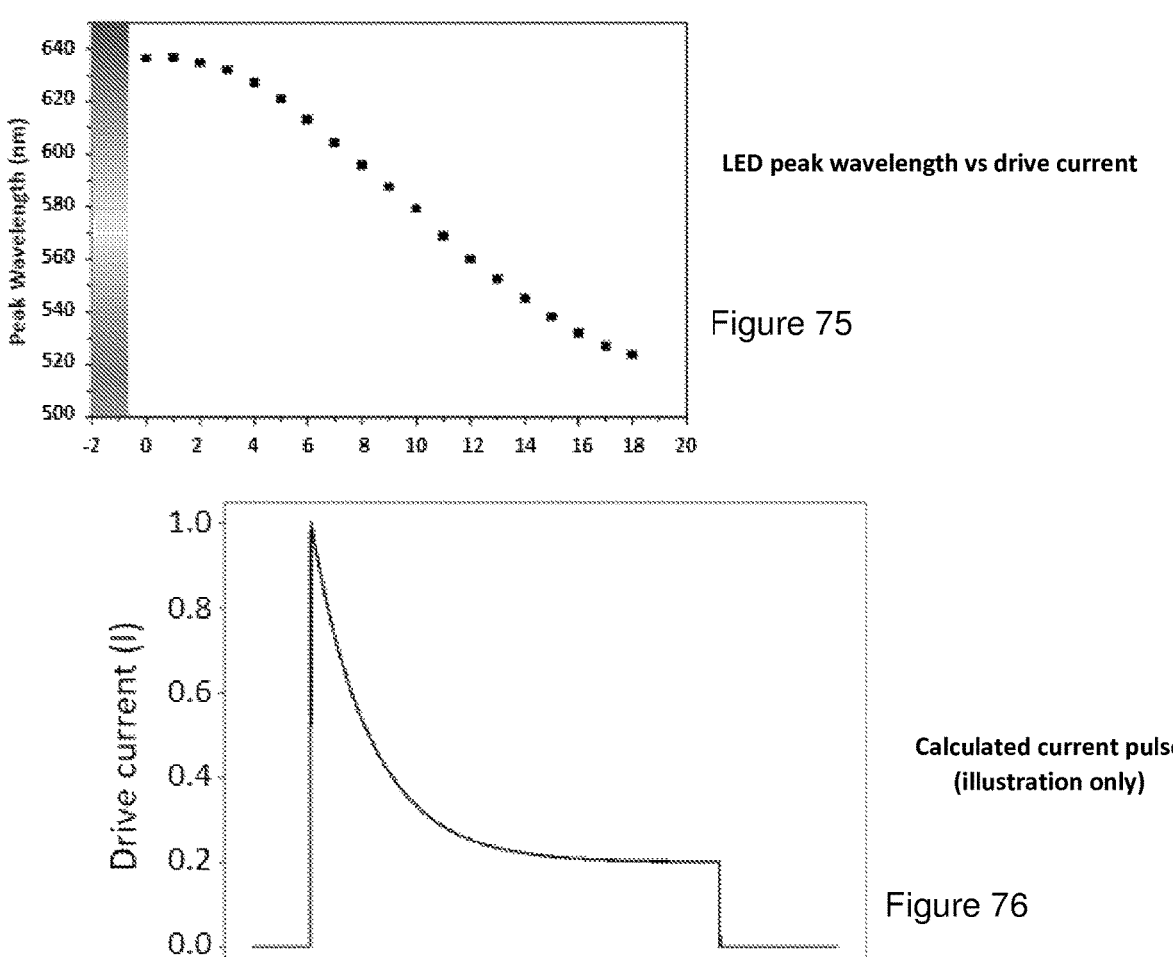
LED peak wavelength vs drive current
Figure 75
Calculated current pulse
(illustration only)
Figure 76

Output Spectrum

Embodiment C

Embodiment D

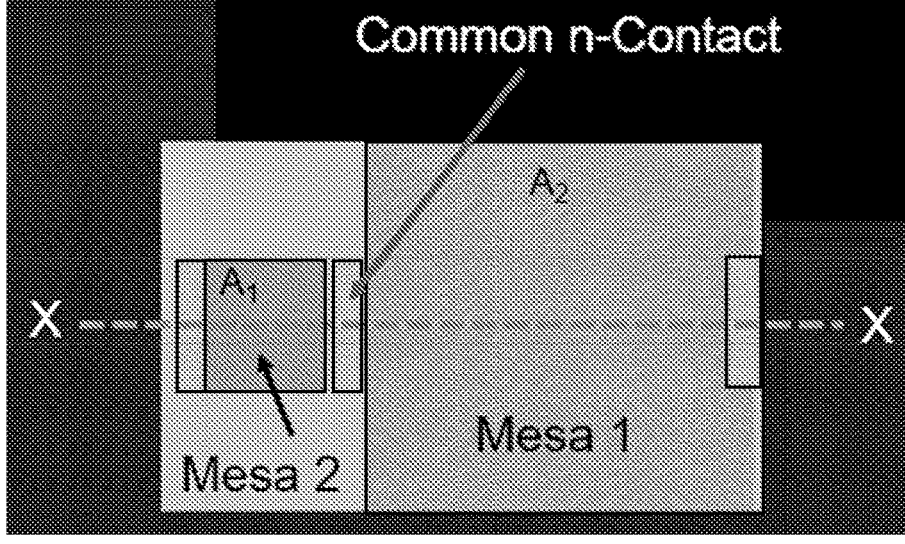
Figure 82A
Figure 82B
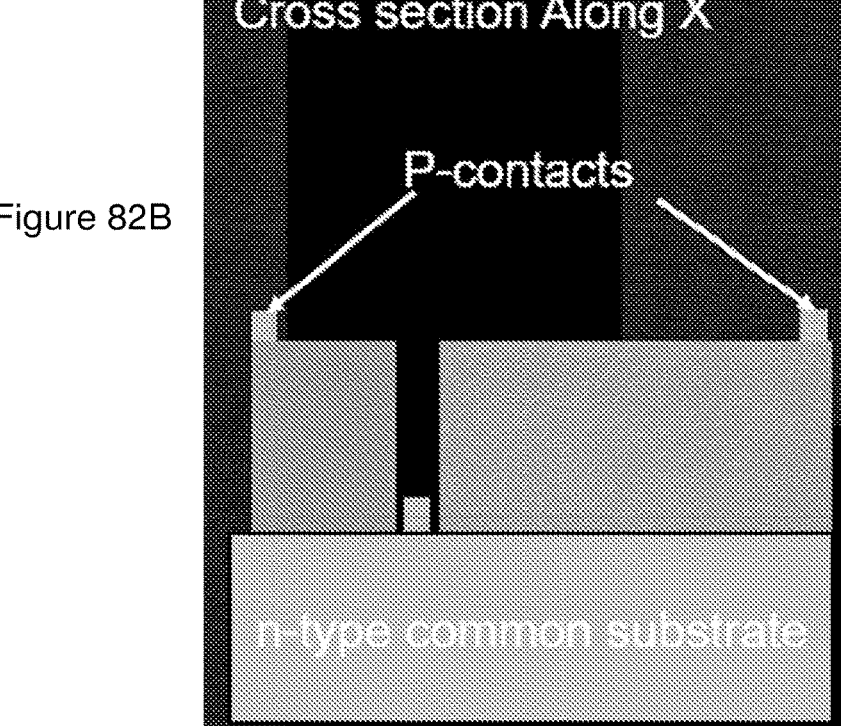

LED DISPLAY DEVICE, METHOD OF CONTROLLING THE SAME, AND METHOD OF MANUFACTURING AN LED DISPLAY DEVICE

This application is a National Stage Application of PCT/GB2022/052001, filed Jul. 28, 2022, which claims benefit of priority to British Patent Application Nos. 2110884.0, filed Jul. 28, 2021; 2110976.4, filed Jul. 29, 2021; 2201161.3, filed Jan. 28, 2022; 2201163.9, filed Jan. 28, 2022; 2201493.0, filed Feb. 4, 2022; 2203367.4, filed Mar. 10, 2022; 2205122.1, filed Apr. 7, 2022; 2205604.8, filed Apr. 14, 2022; 2206521.3, filed May 4, 2022; and 2209054.2, filed Jun. 20, 2022, and which applications are incorporated herein by reference. To the extent appropriate, a claim of priority is made to each of the above disclosed applications.

The invention relates to a display device comprising a variable-wavelength light emitting diode (LED), a method of controlling a display device, and a method of manufacturing a display device.

BACKGROUND

III-V semiconductor materials are of particular interest for semiconductor device design, in particular the family of III-nitride semiconductor materials.

"III-V" semiconductors include binary, ternary and quaternary alloys of Group III elements, such as Ga, Al and In, with Group V elements, such as N, P, As and Sb), and are of great interest for a number of applications, including optoelectronics.

Of particular interest is the class of semiconductor materials known as "III-nitride" materials, which includes gallium nitride (GaN), indium nitride (InN) and aluminium nitride (AlN), along with their ternary and quaternary alloys. (Al,In) GaN is a term encompassing AlGaN, InGaN and GaN. III-nitride materials have not only achieved commercial success in solid-state lighting and power electronics, but also exhibit particular advantages for quantum light sources and light-matter interaction.

Doping of In into GaN semiconductor material is of interest for optoelectronic semiconductor devices, as varying the In content of the semiconductor alters the electronic bandgap of the material, and therefore the wavelength at which the semiconductor emits light. However, varying the In content of the material also affects the in-plane lattice constant of the semiconductor. For example, the in-plane lattice constant of InN is roughly 11% larger than that of GaN, with the lattice dimensions of intermediate compositions varying depending on the indium content. This creates a problem in device design where it is desirable to deposit an active semiconductor layer on top of a substrate layer that has different lattice dimensions. The reason for this is that the lattice mismatch at the layer boundary introduces strain into the lattice which leads to the formation of defects in the material which act as non-radiative recombination centres. This significantly harms device performance.

There is a huge demand for LEDs emitting at all visible wavelengths, particularly at longer wavelengths towards green, yellow and red, but manufacturers have historically encountered more problems manufacturing LEDs emitting at longer wavelengths.

One of the big challenges facing the growth of longer wavelength LEDs such as green, yellow and red LEDs on GaN-based platforms, for example, is the requirement to use high indium (In) contents to reduce the bandgap in the active region to an appropriate level for long-wavelength emission.

The required InGaN active regions have a larger lattice parameter than the underlying GaN and the resulting strain leads to the formation of defects in the material which act as non-radiative recombination centres deteriorating device performance.

High quality InGaN (with high Indium content>20%) is therefore difficult to achieve, due to the large lattice mismatch between InN and GaN. The misfit strain also results in a reduced indium composition through the composition pulling effect.

Shorter-wavelength LEDs are easier to manufacture, as they can be made using InGaN light-emitting regions containing a lower proportion of Indium than is needed for longer-wavelength light emission.

SUMMARY OF INVENTION

The present application relates to a display device comprising a variable-wavelength light emitting diode (LED), a method of controlling a display device, and a method of manufacturing a display device.

The invention is defined in the independent claims, to which reference should now be made. Preferred or advantageous features of the invention are defined in the appended sub-claims.

The light-emitting diodes, or LEDs, described in the present application are preferably formed from III-V semiconductor material, particularly preferably from III-nitride semiconductor material.

"III-V" semiconductors include binary, ternary and quaternary alloys of Group III elements, such as Ga, Al and In, with Group V elements, such as N, P, As and Sb), and are of great interest for a number of applications, including optoelectronics.

Of particular interest is the class of semiconductor materials known as "III-nitride" materials, which includes gallium nitride (GaN), indium nitride (InN) and aluminium nitride (AlN), along with their ternary and quaternary alloys (Al,In) GaN. Different crystal orientations may be used in the present invention, such as polar c-plane, non-polar and semi-polar orientations. There are two primary non-polar orientations, a-plane (11-20) and m-plane (1-100). For semi-polar, there are (11-22), {2021} which is a family of crystal planes. III-nitride materials have not only achieved commercial success in solid-state lighting and power electronics, but also exhibit particular advantages for quantum light sources and light-matter interaction.

While a variety of III-nitride materials are commercially interesting, Gallium nitride (GaN) is widely regarded as one of the most important new semiconductor materials, and is of particular interest for a number of applications.

It is known that the introduction of pores into bulk III-nitrides, such as GaN can profoundly affect its material properties (optical, mechanical, electrical, and thermal, etc.). The possibility of tuning a wide range of material properties of GaN and III-nitrides semiconductors by altering its porosity therefore makes porous GaN of great interest for optoelectronic applications.

The present invention will be described primarily by reference to GaN and InGaN, but may advantageously be applicable to alternative III-nitride material combinations.

In the following description, a substrate or template for overgrowth is a semiconductor structure, on which further semiconductor layers are grown in order to result in a LED semiconductor device. An exemplary substrate template for overgrowth in the present invention may be a GaN semi-
conductor structure, comprising multiple layers of doped
and undoped GaN.

Regions or layers of the semiconductor structure may be
porosified by electrochemical etching as set out in interna-
tional patent applications PCT/GB2017/052895 (published
as WO2019/063957) and PCT/GB2019/050213 (published
as WO2019/145728).

Problem to be Solved

In traditional multicolour (RGB) LED displays each sub-
pixel originates from a separate LED wafer, and must
therefore be combined through mass transfer.

Red and blue-green LEDs must typically be made from
different semiconductor materials. In order to provide an
RGB LED display, LEDs which emit at three colours need
to be grown separately, transferred to a common substrate
and re-pitched individually to form a multi-colour display
device.

The current mass transfer process have the following
items to overcome:

Complex COT process: Stamp pick and place;

Unstable yield: Fluidic assembly;

Higher cost: Laser transfer

This becomes especially difficult when the size of the
individual sub pixels gets smaller, as the resolution require-
ment of the mass transfer system increases.

This also becomes problematic for high resolution dis-
plays, as the reliability of the mass transfer system needs to
be extremely high, placing millions of individual devices, in
order to produce a single working display.

The complexity of the mass transfer process is also
significantly complicated when combining sub pixels pro-
duced using multiple material systems.

The majority of LED display technologies require the use
of multiple material systems in order to produce red, green
and blue emitting sub pixels, such as InGaN for blue and
green emitting sub pixels, and InAlGaP for the red emitting
sub pixels.

To achieve mass production and commercialization of
multi-wavelength LED microdisplays, the present invention
uses a variable-wavelength LED with a chip-on-wafer
(COW) design based on InGaN materials. It uses a variable-
wavelength LED to achieve multiple emission wavelengths
from one diode structure, which can simplify the process of
manufacturing a multi-colour display device, improve pro-
duction efficiency and reduce costs.

Variable-Wavelength LED

In a first aspect of the present invention there is provided
a light emitting diode (LED), comprising:

an n-doped portion;

a p-doped portion;

a light-emitting region located between the n-doped por-
tion and a p-doped portion, the light-emitting region
comprising a light-emitting layer which emits light at a
peak emission wavelength under electrical bias there-
across;

wherein the LED is configured to receive a power supply,
in which the peak emission wavelength of the LED is
continuously controllable over an emission wavelength
range by varying, or controlling, the power supply. The
peak emission wavelength of the variable-wavelength
LED is preferably continuously controllable, or con-
tinuously variable, over an emission wavelength range
of at least 40 nm by varying, or controlling, the power
supply.

As the peak emission wavelength of the variable-wave-
length LED is preferably continuously controllable, or con-
tinuously variable, over an emission wavelength range the
LED can be described as a variable-wavelength LED.

The variable-wavelength LED is configured to receive a
supply of power, or a drive current, from a power supply or
LED driver. The term "power supply" is used herein to refer
to the power, or current, supplied to drive an LED during
use.

The peak emission wavelength of the LED may prefer-
ably be continuously controllable, or continuously variable,
over an emission wavelength range by varying, or control-
ling, the magnitude of a drive current provided to the
variable-wavelength LED.

In traditional LED devices, changes to the driving current
provided to the LED produces a very small shift in emission
wavelengths, but the present inventors have found that the
wavelength shift can be broadened and controlled to a
greater extent than traditional LED materials. Rather than
the few nm emission range of prior art devices, the LED of
the present invention is controllable to emit over a far
broader emission range, for example a range of at least 40
nm. As the present LED is tunable to emit over a broad
wavelength range, it may be referred to as a variable-
wavelength LED.

The LED may be a dynamic colour-tunable LED, in
which the peak emission wavelength of the LED is tunable
by varying the driving conditions provided to the LED by
the power supply.

The LED is preferably driveable to emit at a single peak
emission wavelength in response to a stable power supply,
but to emit at different peak emission wavelengths in
response to variations in the power supply. Thus the LED
may be used to emit a particular colour for a prolonged
period, or alternatively the LED may be driven to emit a
variety of different wavelengths by providing varying driv-
ing conditions.

Preferably, the n-doped portion, the p-doped portion and
the light-emitting region all comprise or consist of III-nitride
material, preferably GaN, InGaN, AlGaN or AlInGaN The variable-wavelength LED preferably contains a
single epitaxially-grown diode structure containing the
n-doped portion, the p-doped portion and the light-emitting
region. Thus the variable peak emission wavelengths of the
LED are all emitted by the same LED diode structure and
composition.

The LED preferably comprises a porous region of III-
nitride material. The light-emitting region of the LED is
preferably formed over a porous region of III-nitride mate-
rial. In some embodiments, one of the n-doped portion or the
p-doped portion may contain the porous region of III-nitride
material. In other embodiments, the n-doped portion; the
p-doped portion; and the light-emitting region are provided
on a substrate which comprises the porous region of III-
nitride material. During epitaxial growth of the LED, the
light-emitting region is preferably overgrown after the
porous region has been formed.

The present inventors have found that a porous region of
III-nitride material enables the same LED to emit at a range
of peak emission wavelengths, rather than at one specific
wavelength. The peak emission wavelength of the LED may
be varied across an emission wavelength range by varying
the power supply provided to the LED. The present inven-
tion therefore provides a variable-wavelength LED, which
may be controlled to emit at any wavelength across a
continuous emission wavelength range. By varying the
driving conditions provided to the LED by the power supply, the LED is capable of emitting at any wavelength within the emission wavelength range of said LED, and not simply at discrete peak emission wavelengths.

The present inventors have found that the ability of the LED to emit at tuneable wavelengths across a broad emission range may be imparted by either incorporating a porous region of III-nitride semiconductor material into the LED structure, or forming the LED diode structure over a porous region of III-nitride semiconductor material. Benefits provided to the LED by the porous region include strain relaxation, lattice parameter enlargement, wafer bow reduction, and beneficial mechanical and thermal influences during the growth of the light-emitting region at high temperatures.

The light-emitting region of the LED is preferably formed over a porous region of III-nitride material during manufacture, so that the porous region influences the structure and mechanical properties of layers of semiconductor that are epitaxially deposited over the porous region. Layers of semiconductor material that are deposited over the porous region during growth experience benefits such as strain reduction, lattice parameter enlargement, and wafer bow reduction, which are imparted to the LED light-emitting region and affect its structure and its light-emitting behaviour.

Once the LED light-emitting (active) region has been epitaxially grown over the porous region, and the quality of the active region has been enhanced by the influence of the porous region, the beneficial effects of the porous region on the emission properties are permanently imparted to the LED active region. Thus the LED diode structure may be retained on the porous region, in which case the variable-wavelength LED comprises a porous region of III-nitride material, or alternatively, during the processing of LEDs into devices after epitaxial growth, the porous region may be removed from the LED structure.

The width of the emission wavelength range may vary depending on the structure and composition of the LED structure (the n-doped portion, light-emitting region and p-doped portion), and on the structure and porosity of the porous region. The width of the emission wavelength range may also vary depending on the size and shape of the LED (the pixel size and shape).

The present invention is not limited to a particular LED structure, as the variable-wavelength behaviour of the LED may be achieved using a variety of conventional LED structures, preferably provided over a porous template. A large variety of LED structures are known in the art, and by providing different conventional LED structures over templates comprising a porous region, LEDs with different emission wavelength ranges may be obtained.

In preferred embodiments, the peak emission wavelength is controllable over an emission wavelength range of at least 40 nm, or at least 50 nm, or at least 60 nm, or at least 70 nm, or at least 80 nm by varying the power supply. Preferably the peak emission wavelength is controllable over an emission wavelength range of up to 100 nm, or 110 nm, or 120 nm, or 130 nm, or 140 nm, or 150 nm, or 160 nm, or 170 nm, or 180 nm, or 190 nm, or 200 nm, or 400 nm, or 450 nm. The size of the emission wavelength range obtainable by the present LED is thus far greater than the emission ranges achievable with LEDs of the prior art.

The LED is advantageously controllable to emit at any peak emission wavelength within its emission wavelength range. By varying the characteristics of the power supply and LED pixel size and shape, the LED may therefore be controlled to emit light at any selected peak emission wavelength within this range.

The emission wavelength of the variable-wavelength LED is preferably continuously variable across its emission wavelength range in response to driving conditions provided by a power source being varied continuously across a range of driving conditions.

The position of the emission wavelength range in the electromagnetic spectrum may also vary depending on the design of the LED structure (the n-doped portion, light-emitting region and p-doped portion). For example the wavelengths contained in the emission wavelength range may depend on the number and composition of light emitting layers in the LED. A large variety of LED active regions are known in the art for emitting at different wavelengths in the visible spectrum, so by light-emitting region forming the LEDs of the present invention with different light-emitting regions, emission wavelength ranges covering different portions of the spectrum may be obtained.

The LED emission wavelength range may be between 400 nm and 850 nm, or between 400 nm and 800 nm, or between 400 nm and 690 nm, or between 400 nm and 675 nm. The emission wavelength range may be a sub-range within the range of 400 nm to 750 nm. The emission wavelength range may be tuned to cover any part of this range by selecting different LED active regions and controlling the size and shape of the LED pixels.

Preferably the emission wavelength range of the LED extends from a lower end below 410 nm, or 430 nm, or 450 nm, or 470 nm, or 500 nm, or 520 nm, or 540 nm, or 560 nm, to an upper end above 570 nm, or 580 nm, or 600 nm, or 610 nm, or 630 nm, or 650 nm, or 675 nm. The first and second ends of the emission wavelength range may be tuned depending on the selection of LED structure and LED shape and size, as described above.

For example in preferred embodiments the lower end of the emission wavelength may be between 400 nm and 450 nm (violet) or between 450 nm and 500 nm (blue) or between 500 nm and 570 nm (green), and the upper end of the emission wavelength may be between 570 nm and 590 nm (yellow), or between 590 nm and 610 nm (orange), or between 610 and 700 nm (red).

In a preferred embodiment, the LED emission wavelength range may extend from a lower end that is below 500 nm to a higher end that is above 610 nm, so that the peak emission wavelength of the LED may be varied to emit at any wavelength from blue (below 500 nm) to red (above 610 nm) by varying the power supply. Providing a single LED design that can be controlled to emit at blue wavelengths (450-500 nm), green (500-570 nm) and also at yellow (570-590 nm), orange (590-610 nm) and red (610-760 nm) is highly advantageous, and could provide significant advantages for LED displays.

In other preferred embodiments, the LED emission wavelength range may extend between 520 nm and 660 nm, or between 550 nm and 650 nm, by varying the power supply to the LED.

In a particularly preferred embodiment, the peak emission wavelength is controllable between 540 nm and 680 nm, or between 560 nm and 675 nm, by varying the power supply. Thus, the same LED may be controllable to emit at a peak emission wavelength anywhere between 540 nm in the green and 680 nm in the red. Green and red LEDs have historically been more difficult to manufacture than shorter wavelength blue LEDs due to issues such as the difficulty of incorporating the required indium content into the light-emitting region. Providing a single LED design that can be controlled to emit at green wavelengths (500-570 nm) and also at yellow (570-590 nm), orange (590-610 nm) and red (610-760 nm) is therefore highly advantageous, and could provide significant advantages for LED displays.

In another preferred embodiment, the peak emission wavelength is controllable between 520 nm and 675 nm, or between 550 nm and 650 nm, by varying the power supply.

Although the variable-wavelength LED can emit across a continuous emission wavelength range, in some embodiments it may be desirable to control the LED to function in a plurality of discrete emission modes, for example in response to a power supply having a plurality of driving modes. For example by driving the LED in a plurality of different modes corresponding to discrete emission colours, a simplified colour display may be provided, in which discrete emission colours are mixed in known methods to give a desired visual effect.

The LED is preferably controllable to emit at least two discrete peak emission wavelengths by varying the driving conditions provided by the power supply between two discrete driving conditions (such as two discrete magnitudes of drive current). The LED may be controllable to emit at a first peak emission wavelength in response to a first driving condition provided by the power supply (which may be a drive current having a first magnitude), at a second peak emission wavelength in response to a second driving condition provided by the power supply (which may be a drive current having a second magnitude different from the first magnitude).

The LED is preferably controllable to emit at least three discrete peak emission wavelengths by varying the driving conditions provided by the power supply. The peak emission wavelength of the variable-wavelength LED may thus be variable over at least three "colours" in the EM spectrum.

The LED may be controllable to emit at a first peak emission wavelength in response to a first driving condition provided by the power supply, at a second peak emission wavelength in response to a second driving condition provided by the power supply, and at a third peak emission wavelength in response to a third driving condition provided by the power supply.

The LED may preferably be controllable to emit a blue peak emission wavelength in response to a first driving condition provided by the power supply, to emit a green peak emission wavelength in response to a second driving condition provided by the power supply, and to emit a red peak emission wavelength in response to a third driving condition provided by the power supply.

The LED may be controllable to emit a first peak emission wavelength in the range 400-500 nm in response to a first driving condition provided by the power supply, to emit a second peak emission wavelength in the range 500-550 nm in response to a second driving condition provided by the power supply, and to emit a third peak emission wavelength greater than 600 nm in response to a third driving condition provided by the power supply.

Preferably, the LED is controllable to emit a first peak emission wavelength in the range 430-460 nm in response to a first driving condition provided by the power supply, to emit a second peak emission wavelength in the range 510-560 nm in response to a second driving condition provided by the power supply, and to emit a third peak emission wavelength in the range 600-660 nm in response to a third driving condition provided by the power supply.

The first, second and third driving conditions may be first, second and third current densities, or the first, second and third driving conditions may be first, second and third power densities.

In preferred embodiments of the present invention, the variable-wavelength emission behaviour of the LED structure is enabled by the fact that the LED structure (the n-doped portion, the light-emitting region and the p-doped portion) are grown over a template containing a porous region. The present inventors have found that the presence of a porous region of III-nitride material in the template structure prior to overgrowth of the LED structure leads to higher quality crystal growth and thus significant benefits including the possibility of varying the emission wavelength of the LED light-emitting region. The mechanism by which the porous region enables the variable wavelength emission of the LED is the subject of ongoing study. Benefits provided to the LED by the porous region include strain relaxation, lattice parameter enlargement, wafer bow reduction, and mechanical and thermal influence during the light-emitting region being grown at high temperatures.

The present inventors have realised that electrochemical porosification of III-nitride materials advantageously leads to a reduction in the strain in the III-nitride lattice, and the overall wafer bow or curvature. Without wishing to be bound by theory, it is thought that the process of porosifying the porous region of III-nitride material also etches away structural defects, such as threading dislocations which were formed during growth of that layer on top of a substrate.

The removal of dislocations from the semiconductor material of the porous region during porosification greatly reduces the strain in the porous region, which occurs particularly if the lattice dimension of the porous region does not match the lattice dimension of an underlying substrate material. Thus, during epitaxial growth of the LED structure when layers of III-nitride material are deposited above the porous region, the porous material is more compliant to matching the lattice of the overlying non-porous layers. This results in the layers above the porous region experiencing significantly lower strain than would be the case without the porous region. As the light-emitting region is formed over the porous region, the light-emitting region of the LED is formed with reduced strain in the semiconductor lattice, and the porous region imparts unusual properties to the structure and light-emitting characteristics of the light-emitting region.

As layers of non-porous semiconductor material that are formed over the porous region experience lower strain, there are also fewer structural defects in these layers to act as non-radiative recombination centres to harm device performance.

Composition pulling effect: Kawaguchi et al. reported a so-called InGaN composition pulling effect in which the indium fraction is smaller during the initial stages of growth but increases with increasing growth thickness. This observation was to a first extent independent of the underlying layer, GaN or AlGaN. The authors suggested that this effect is caused by strain caused by the lattice mismatch at the interface. They found that a larger lattice mismatch between InGaN and the bottom epitaxial layers was accompanied by a larger change in the In content.

In *Theoretical study of the composition pulling effect in InGaN metalorganic vapor-phase epitaxy growth* by Inatomi et al (Japanese Journal of Applied Physics, Volume 56, Number 7) it was found that compressive strain suppresses the incorporation of InN. On the other hand, tensile strain promotes the incorporation of InN compared to the relaxed bulk growth case.

The inventors have found that the presence of a porous region in the semiconductor structure during epitaxial growth leads to "strain relaxation" which reduces strain in the layers of a semiconductor structure, and that this can lead to an improvement with respect to the composition pulling effect. Porosification reduces the strain in the III-nitride layers and the semiconductor structure is made less strained, and thus the conditions for higher incorporation of In are made available. The present invention can therefore aid in higher Indium incorporation into layers of the LED grown on top of the porous region, which is highly desirable for emission at longer wavelengths.

The n-doped region, the light-emitting region, and the p-doped region are preferably formed over the porous region during manufacture of the LED. The porous region may then be permanently retained in the LED and incorporated into a device, or alternatively the porous region may be removed after the LED diode structure has been formed. Even if the porous region is removed by cleaving the as-grown structure, the mechanical and structural benefits of the porous region on the growth of the light-emitting region are retained in the light-emitting region.

The n-doped region, the light-emitting region, and the p-doped region are preferably provided above the porous region. In other words, the porous region may be positioned under the n-doped region, the light-emitting region, and the p-doped region in the LED structure.

The light-emitting layer may preferably be an indium gallium nitride (InGaN) layer.

By providing a porous region of III-nitride material, the n-doped region, the light-emitting region, and the p-doped region may therefore be grown over the porous region (possibly with intervening layers of III-nitride material between the porous region and the LED structure) with a lower strain than would be possible without the porous region. This reduced level of strain in the layered semiconductor structure can therefore aid in higher Indium incorporation into the light emitting layer(s) of the LED, so that high quality InGaN light emitting layers can be grown with a high Indium content.

As mentioned in the background section above, although there is a huge demand for LEDs that emit light between 400 and 750 nm, particularly between 500 and 750 nm, the technical difficulties of incorporating enough indium into the light emitting layer(s) has meant longer wavelength LEDs have been hard to achieve.

The inventors have found that growing an LED structure over a porous region of III-nitride material causes a significant shift in emission wavelength towards longer wavelengths, compared to an identical LED structure grown on a non-porous substrate.

The inventors have demonstrated this by growing a conventional green/yellow (emission between 500-570 nm, or 570 nm-590 nm) InGaN LED structure on a non-porous GaN wafer, and demonstrating that the LED emits green/yellow light as expected. The same "green/yellow" InGaN LED structure was then grown on a template containing a porous region, and when an electrical bias was applied across the LED the LED emitted light in the red range of between 600 and 750 nm.

The present invention advantageously allows conventional, easily-manufacturable LED structures to be shifted to longer wavelength emission, and to emit at a range of different peak emission wavelengths by controlling the power supply to the LED. While a variety of different emission ranges are achievable, in a particularly preferred embodiment known LED structures previously known as yellow or green LEDs can be made into variable-wavelength green-red LEDs.

The LED light-emitting region may be an LED light-emitting region for emitting at a peak wavelength of 500-600 nm, or 500 nm-550 nm, or 550 nm-600 nm, or 510 to 570 nm, or 530 nm to 560 nm or 540 nm-600 nm. The LED light-emitting region may be an LED light-emitting region which emits at a peak wavelength of 500-600 nm, or 510 to 570 nm, or 530 nm to 560 nm or 540 nm-600 nm, or 590 nm-640 nm when not overgrown on a porous Ill-nitride layer. Growth of the LED light-emitting region over the porous region of III-nitride material may however shift the emission wavelength of the light-emitting region to longer wavelengths (for example between 600 and 750 nm) and also enable the LEDs to emit across a continuous range of different emission wavelengths.

Conventionally, in order to grow InGaN quantum wells incorporating higher quantities of indium which are required for longer-wavelength emission, lower growth temperatures have been required during epitaxial deposition of InGaN material. Varying growth pressures and growth rates have also been tried as ways of increasing indium incorporation. Downsides of lower growth temperatures include the presence of more defects in the crystal structure, and lower NH3 cracking efficiencies.

In the present invention, however, the presence of the porous region in the LED template during growth reduces the strain in the crystal structure, enlarges lattice parameters, and enables a higher incorporation of In into the active region than has previously been possible at a given growth temperature. By incorporating a porous region into the structure, there is therefore no longer the same need to lower the growth temperature of the InGaN to increase In incorporation, as larger quantities of In are incorporated at higher temperatures. This allows higher InGaN growth temperatures to be used for the LED, leading to higher crystal quality, fewer defects, and improved performance and LED characteristics than LEDs in the prior art.

The improved crystal quality of the LED structure overgrown over the porous region also enables the LED to emit light over a far wider emission wavelength range than has ever been possible in the prior art.

In some previous attempts to introduce porous material into LEDs, the porous material was found to lead to a high degree of spectral broadening, so that the full width half max (FWHM) of the spectral emission peak became undesirably broad. This is undesirable for most LED applications, where a narrow emission peak is preferred so that the light emitted by the LED is at or close to the desired wavelength.

Advantageously, in the present invention the LED preferably emits light with a FWHM of 50 nm or less, or 40 nm or less or 30 nm or less, preferably in which the LED has a FWHM of <20 nm. Thus although the peak emission wavelength of the variable-wavelength LED can be varied by varying the driving conditions supplied to the LED, at any given drive conditions the LED preferably emits light with a FWHM of 50 nm or less, or 40 nm or less or 30 nm or less, or 20 nm or less.

In preferred embodiments, the light emitting layer is a light-emitting indium gallium nitride layer. The LED preferably also comprises a region of GaN material. Due to the lattice mismatch between GaN and InGaN, the stress relaxation effect created by the porous region is particularly advantageous.

The light emitting diode may comprise at least one feature selected from:

(a) the light-emitting region comprises one or two or three or four or five or six or seven or eight quantum wells (or at least one quantum well); or (b) the III-nitride layer comprises an aluminium gallium nitride layer which has a composition $Al_yGa_{(1-y)}N$, where y is in a range from 0.1 to 1.0; or (c) a UV or blue emitting InGaN/GaN or InGaN/InGaN superlattice or InGaN layer is located between the n-doped portion and the light-emitting region.

The n-doped portion, the p-doped portion and the light-emitting region are preferably designed according to conventional LED designs known in the art. For example the thickness, composition and number of such layers may be selected according to conventional principles of LED design. The LED may contain other layers which are conventional in the art of LED design, and which are well understood by the skilled person. For example, the LED may comprise a III-nitride layer located on the light-emitting layer, and a III-nitride barrier layer located on the III-nitride layer. Such structural features are well-known, and may be used in the LED of the present invention.

Control of Power Supply

The peak emission wavelength of the variable-wavelength LED is controlled by controlling the power supply to the LED.

The power supply may be controlled in a variety of ways in order to achieve the variable-wavelength properties of the present invention. For example, either voltage or current driving schemes may be used, in either continuous wave (CW) or pulsed mode.

In preferred embodiments, the power supply may be a pulsed power supply. Alternatively, the power supply may be a continuous wave (CW) or quasi-continuous-wave power supply.

The power supply may be a constant-voltage power supply, or alternatively a constant-current power supply.

The parameter that is varied in order to control the power supply may vary depending on the driving scheme being used to drive the LED. For example, the LED may be controlled by varying the power, power density, current, current density, or voltage of the power supply to the LED. As power, current and voltage are related by P=IV, control of these parameters is well understood by those skilled in the art.

The peak emission wavelength emitted by a variable-wavelength LED during use is determined by the current density (which may alternatively be described in terms of power density) passing through the LED diode structure during use. The current density (in $A/cm^2$) experienced by the variable-wavelength LED is determined by both the magnitude of the current (in Amperes) supplied by the power supply and the cross-sectional area (in $cm^2$) of the LED diode structure through which the current is passing. Once the variable-wavelength LED has been manufactured, the cross-sectional area (in $cm^2$) of the LED diode structure through which the current is passing is fixed, so the current density through the LED is varied by varying the magnitude of the current provided to the LED in use.

For a given LED of fixed size, it is possible to discuss the driving conditions in terms of drive current magnitude. As LEDs may be manufactured in a huge variety of shapes and sizes, however, it may be more appropriate to define general driving conditions in terms of current density, or power density.

The emission wavelength range is a continuous wavelength range, so the LED can advantageously emit at any wavelength within that range by varying the power supply.

The power supply may be variable over a power supply range, corresponding to the emission wavelength range of the LED. For example the power supply range may be a range of power (in Watts) or power density (in $W/cm^2$), the range being defined by a lower power at which the LED emits at the longer-wavelength limit of the emission wavelength range, and a higher power at which the LED emits at the shorter-wavelength limit of the emission wavelength range. Alternatively the power supply range may be defined by upper and lower current (in Amperes) or current density (in $A/cm^2$) limits, or upper and lower voltage limits.

The power supply to the LED is preferably regulated or controlled by an LED driver. The light emitting diode may be configured to connect to, or connected to, an LED driver that is configured to provide the power supply to the LED. The LED driver is preferably configured to supply a variable supply of power to the LED. For example the LED driver is preferably capable of varying the magnitude of the drive current supplied to the LED, either by varying the magnitude of the drive current continuously across a range, or by providing a plurality of discrete drive current modes having different fixed magnitudes.

A variety of conventional LED drivers may be used to regulate the power supply to the LED. The LED driver may be an integrated circuit (IC), for example the LED driver may be a CMOS driver or a TFT driver. The driver may be a discrete component, such as a backplane IC driver, or an on-chip IC driver made from the same GaN epiwafer.

The duty cycle of each driving condition can be at least 0.001%, 0.01%, 0.1%, 1%, 5%, 10%, 20%, 30%, 40%, 50%, 60%, 70%, 80%, 90%, or 100%.

Power Control

The peak emission wavelength of the LED may advantageously be controllable by varying the power, or the power density, provided to the LED.

The peak emission wavelength may decrease in response to an increase in the power provided to the LED by the power supply, and the peak emission wavelength may increase in response to a decrease in the power provided by the power supply.

For example, the LED may emit at a first peak emission wavelength when the power supply supplies a first power to the LED, and the LED may emit at a second peak emission wavelength longer than the first emission wavelength when the power supply supplies a second power lower than the first power.

In a particularly preferred embodiment, the first peak emission wavelength is below 570 nm and the second peak emission wavelength is above 610 nm, such that the LED emits green light in response to the first power and red light in response to the second power. Thus the LED may be controlled to emit at any wavelength between green and red by controlling the power supplied to the LED.

The LED preferably emits at a third peak emission wavelength when the power supply provides a third power density different from the first and second powers.

The peak emission wavelength of the LED of the present invention advantageously varies with the power, or power density, of the power supply in a consistent way that can be calibrated into a display device containing the LED. In preferred embodiments the peak emission wavelength of the LED of the present invention may vary in a calibratable relationship with the logarithm of the power, or power density, of the power supply. This is highly advantageous for device design, as the predictable relationship between the power supply and the peak emission wavelength enables the LED emission to be precisely controlled. The power supply can easily be calibrated so that when a specific emission wavelength is desired, it is straightforward to calculate and supply the precise power required to result in that emission wavelength.

Current Control

The peak emission wavelength of the LED may advantageously be controllable by varying the current, or the current density, of the power supply provided to the LED.

The drive current density dependent shift in peak emission wavelength of the variable-wavelength LED may preferably be greater than 10 nm/decade, or greater than 20 nm/decade.

The peak emission wavelength may decrease in response to an increase in the current density provided to the LED by the power supply, and the peak emission wavelength may increase in response to a decrease in the current density provided by the power supply.

For example, the LED may emit at a first peak emission wavelength when the power supply supplies a first current density to the LED, and the LED may emit at a second peak emission wavelength longer than the first emission wavelength when the power supply supplies a second current density lower than the first current density.

The LED preferably emits at a third peak emission wavelength when the power supply has a third current density different from the first and second current densities.

In a particularly preferred embodiment, the first peak emission wavelength is below 570 nm and the second peak emission wavelength is above 610 nm, such that the LED emits green light in response to the first current density and red light in response to the second current density. Thus the LED may be controlled to emit at any wavelength between green and red by controlling the current density supplied to the LED.

The peak emission wavelength of the LED of the present invention advantageously varies with the current, or current density, of the power supply in a consistent way that can be calibrated into the display device. In preferred embodiments the peak emission wavelength of the LED of the present invention may have a calibratable correlation with the logarithm of the current, or current density, of the power supply. This is highly advantageous for device design, as the predictable relationship between the power supply characteristics and the peak emission wavelength enables the LED emission to be precisely controlled. The power supply can easily be calibrated so that when a specific emission wavelength is desired, it is straightforward to calculate and supply the precise current density required to result in that emission wavelength.

The LED may be driveable by current densities of 0.001 A/cm$^2$ to 1000 A/cm$^2$, or 0.01 A/cm$^2$ to 500 A/cm$^2$, or 0.1 A/cm$^2$ to 250 A/cm$^2$.

In a preferred embodiment of the invention, the LED emits green light at a wavelength of 570 nm or lower in response to a current density of greater than 5 A/cm$^2$, or greater than 7 A/cm$^2$, or greater than 9 A/cm$^2$, or greater than 10 A/cm$^2$, or greater than 11 A/cm$^2$. The same LED emits red light at a wavelength of greater than 610 nm in response to a current density of less than 4 A/cm$^2$, or less than 3 A/cm$^2$, or less than 2 A/cm$^2$.

In preferred embodiments the LED emits light at a wavelength of between 430 nm and 500 nm in response to a current density of greater than 19 A/cm$^2$, or greater than 20 A/cm$^2$, or greater than 21 A/cm$^2$.

Porous Template

The n-type region, the light-emitting region and the p-type region (which may be called the LED structure, or LED diode structure) are preferably grown over a semiconductor template which contains the porous region. The semiconductor template may also contain a number of layers of semiconductor material arranged to provide a suitable substrate for the overgrowth of the LED structure. Once the n-type region, the light-emitting region and the p-type region have been grown on the template, however, the LED structure and the template both form part of the LED.

The porous region and the template may optionally be removed from the LED structure during subsequent chip processing.

The porous region may have a thickness of at least 1 nm, preferably at least 10 nm, particularly preferably at least 50 nm. For example, the porous region may have a thickness between 1 nm and 10000 nm.

The porous region may have a porosity between 1% and 99% porosity, or between 10% and 80% porosity, or between 20% and 70% porosity, or between 30% and 60% porosity. The porosity of the porous region may be measured as the volume of all pores relative to the volume of the whole porous region.

The degree of porosity has been found to have an effect on the magnitude of the wavelength shift caused by the porous region. In general, the higher the % porosity, the larger the wavelength shift of the LED compared to the same LED structure on a non-porous template.

The porous region is preferably formed from one of GaN, InGaN, AlGaN, AlInGaN or AlN.

The porous region may be under or below the n-type region, the light-emitting region and the p-type region of the LED. Preferably the n-type region, the light-emitting region and the p-type region (the LED structure) is positioned on or over the porous region, as defined by the order of growth of the layers in the LED. The LED structure is preferably overgrown over the porous region, so that the LED structure benefits from the strain relaxation in the porous III-nitride layer.

LED Layers

The LED may comprise a connecting layer of III-nitride material positioned between the n-doped portion and the porous region. Preferably the thickness of the connecting layer is at least 100 nm, though lesser or greater thicknesses could also be employed. The connecting layer may preferably be one of GaN, InGaN, AlGaN, AlInGaN or AlN.

The LED preferably comprises a non-porous intermediate layer of III-nitride material porous region between the porous region and the light-emitting region. As the porous region is preferably formed by electrochemical porosification through a non-porous layer of III-nitride material, using the method of PCT/GB2017/052895 (published as WO2019/063957) and PCT/GB2019/050213 (published as WO2019/145728), the non-porous layer of III-nitride material typically forms a non-porous intermediate layer which remains on top of the porous region. The non-porous intermediate layer advantageously provides a smooth surface for overgrowth of further layers during manufacture.

Preferably the LED comprises a non-porous intermediate layer of III-nitride material positioned between the porous region and the connecting layer. This may preferably be a non-porous layer through which electrochemical etching of the porous region takes place.

The non-porous intermediate layer may preferably be one of GaN, InGaN, AlGaN, AlInGaN or AlN.

The porous region may be a porous layer, such that the light emitting diode comprises a porous layer of III-nitride material. Preferably the porous region may be a porous layer that is continuously porous, for example formed from a continuous layer of porous III-nitride material.

The porous region may comprise a plurality of porous layers, and optionally a plurality of non-porous layers. In preferred embodiments of the invention, the porous region is a stack of alternating porous and non-porous layers, with the top surface of the stack defining the top of the porous region, and the bottom surface of the stack defining the bottom of the porous region. The light-emitting region may be formed over a porous region comprising a stack of porous layers of III-nitride material.

In some embodiments, the light-emitting region is positioned over a stack of multiple porous layers of III-nitride material. Thus, rather than being a single porous layer of III-nitride material, the porous region may be a stack of layers of III-nitride material in which at least some layers are porous. The stack of porous layers may preferably be a stack of alternating porous and non-porous layers.

Alternatively the porous region may be a layer of III-nitride material that contains one or more porous regions, for example one or more porous regions in an otherwise non-porous layer of III-nitride material. In other words, the porous region need not be a continuous layer of porous material.

In preferred embodiments, the porous region, or porous layer, may have a lateral dimension (width or length) equivalent to that of the substrate on which the porous layer or region is grown. For example, conventional substrate wafer sizes may have a variety of sizes, such as 1 cm$^2$, or 2 inch, 4 inch, 6 inch, 8 inch, 12 inch, or 16 inch diameter. By patterning one or more layers and/or depositing regions of different charge carrier concentrations in the same layer, however, smaller porous regions can be formed that do not span the entire substrate. The lateral dimensions of the porous layer or region may therefore vary from around $\frac{1}{10}$ of a pixel (for example 0.1 μm), up to the lateral dimensions of the substrate itself.

The n-doped portion preferably comprises an n-doped III-nitride layer.

Preferably the n-doped portion and/or the n-doped layer comprises n-GaN, or n-InGaN, or a stack of alternating layers of n-GaN/n-InGaN, or a stack of alternating layers of n-InGaN/n-InGaN containing different concentrations of indium.

The n-doped portion may comprise a single-crystalline n-doped III-nitride portion, preferably in which the n-doped portion comprises a single-crystalline n-doped III-nitride layer having a planar top surface.

The porous region and each layer between the porous region and the single-crystalline n-doped III-nitride layer may be planar layers having a respective top surface and a respective bottom surface that are parallel to the planar top surface of the single-crystalline n-doped III-nitride layer.

The light-emitting layer preferably comprises one or more InGaN quantum wells, preferably between 1 and 10 quantum wells.

The light emitting layer may be a nanostructured layer of InGaN comprising quantum structures such as quantum dots, fragmented quantum well, or discontinuous quantum well.

The light-emitting layer and/or the quantum wells preferably have the composition In$_x$Ga$_{1-x}$N, in which 0.07≤x≤0.40, preferably 0.12≤x≤0.30 or 0.22≤x≤0.30 or 0.30≤x≤0.40, particularly preferably 0.22≤x≤0.27 and 0.27≤x≤0.40.

The LED preferably comprises a III-nitride layer located on the light-emitting layer; and a III-nitride barrier layer located on the III-nitride layer.

The III-nitride layer on the light-emitting layer may be termed a "cap layer". This cap layer is used to 1) increase the quantum confined stark effect for band bending, hence the red shift and achieving longer-wavelength emission, and 2) to protect the high In % in InGaN to ensure sufficient In % is incorporated for achieving long wavelengths, as well as providing a larger barrier.

The LED preferably comprises a cap layer of III-nitride material between the quantum wells and the p-doped region. The cap layer could be GaN, InGaN, AlGaN, or AlN.

The LED preferably comprises a barrier layer of III-nitride material between the quantum wells and the p-doped region. The barrier layer could be GaN, InGaN, AlGaN, or AlN.

The p-doped region may comprise a p-doped III-nitride layer and a p-doped aluminium gallium nitride layer positioned between the p-doped III-nitride layer and the light-emitting region. The p-doped aluminium nitride layer is preferably an electron-blocking-layer (EBL) positioned between the cap layer and the p-type layer, in which the electron-blocking-layer contains 5-25 at % aluminium, preferably in which the electron-blocking-layer has a thickness of between 10-50 nm.

In a preferred embodiment, the porous region is not part of a distributed Bragg reflector (DBR). In other embodiments however, the porous region may form and act as an optical reflector or mirror or filter with a distinct reflectivity/transmission band over a range of wavelengths.

The morphology of quantum wells (QWs) in the active light-emitting region may be varied. For example the light-emitting region may contain uniform QWs with well-defined interfaces or fragmented QWs with less well-defined interfaces, fragmentation, or QW well width/composition fluctuation or quantum dots like localisation centres. This control of QW morphology can determine the range of the variable emission wavelength to be controlled and manipulated.

The light-emitting region preferably comprises a plurality of quantum wells (QWs). The quantum wells may be continuous. The quantum wells may be fragmented, or discontinuous.

Current Constraining Layer

The LED may comprise a current constraining layer, or a current limiting layer, which is a dielectric layer configured to confine the lateral area of the LED through which current is conducted. The use of a current constraining layer may advantageously allow further control of the current density, in order to better control the peak emission wavelength of the LED.

The current constraining layer may advantageously enable the manipulation of the power density provided to the variable-wavelength LED, in order to control the peak emission wavelength.

The current constraining layer is preferably a layer of dielectric material. For example, the current constraining layer may be any dielectric, for example SiO$_2$, SiN or SiNx.

The current constraining layer may be positioned in a variety of positions in the LED, as long as it confines the lateral area of the LED through which current is conducted. The current constraining layer may be positioned in the LED between an electrical n-contact and an electrical p-contact.

The current constraining layer may be positioned adjacent to either the n-doped portion or the p-doped portion of the LED. For example the current constraining layer may be positioned between the n-doped portion and the light-emitting region. Alternatively the current constraining layer may be positioned between the light-emitting region and the p-doped portion. The current constraining layer may be positioned between an electrical contact and the LED structure (n-doped portion, p-doped portion and light-emitting region).

The current constraining layer preferably comprises an aperture extending through the current constraining layer, or one or more apertures extending through the current constraining layer. The aperture may preferably be positioned in the centre of the current constraining layer. For example the current constraining layer may comprise a circular opening in the centre of the LED structure.

The LED may be configured so that an electrical contact is in contact with the LED structure via the aperture in the current constraining layer, so that the area of the aperture defines a contact area over which the contact and the LED structure are touching.

The lateral dimensions of the or each aperture is preferably much smaller than the lateral dimensions of the LED. By providing an aperture through the dielectric current constraining layer, high local current density may be achieved, which may advantageously enable improved control of the power through the LED.

For example the lateral width (or diameter) of the aperture may be equal to or less than 50% of the lateral width of the LED structure (the LED mesa). The width of the aperture may be equal to or less than 45%, or 40%, or 35%, or 30%, or 25%, or 20% of the width of the LED structure.

The relative area of the aperture compared to the overall area of the current constraining layer (the blocked region) may be varied to modify the local current density.

Pixel Sizes

The light-emitting region, and/or the LED, may have lateral dimensions (width and length when viewed from above) of greater than 50 nm, 100 nm, 200 nm, 300 nm, 500 nm, 600 nm, 700 nm, 800 nm, 900 nm, 1 μm, 2 μm, 3 μm, 4 μm, 5 μm, or 10 μm, 20 μm, 30 μm, 40 μm, 50 μm, 60 μm, 70 μm, 80 μm, 90 μm, or greater than 100 μm or 200 μm, 300 μm, and less than 1000 μm The light-emitting region, and/or the LED, may have lateral dimensions (width and length) of greater than 100 μm and less than 300 μm. In this case, the LED may be termed a "mini-LED". In preferred embodiments, the mini-LED may be square or circular or square with circular corners and have dimensions such as 300 μm×300 μm, 200 μm×200 μm, 100 μm×100 μm.

The light-emitting region, and/or the LED, may alternatively have lateral dimensions (width and length) of less than 100 μm. In this case, the LED may be termed a "micro-LED". The micro-LED may preferably have lateral dimensions of less than 80 μm, or 70 μm, or 60 μm, or 50 μm or 30 μm, or 25 μm, or 20 μm, or 15 μm or 10 μm, or 5 μm or 3 μm or 1 μm or 500 nm, or 200 nm, or 100 nm, or 50 nm.

In preferred embodiments, the micro-LED may be square or circular or square with circular corners and have dimensions such as 75 μm×75 μm, 50 μm×50 μm, 40 μm×40 μm, 30 μm×30 μm, 25 μm×25 μm, 20 μm×20 μm or 10 μm×10 μm, or 5 μm×5 μm, or 2 μm×2 μm, or 1 μm×1 μm, or 500 nm×500 nm or smaller.

The LEDs may circular, triangle, rectangular, square, oval, diamond, hexagonal, pentagonal, and any combination of these shapes. In the case of irregular-shapes of pixel design, at least one dimension should fall within the dimensions defined above in order for the LEDs to be classed as mini- or micro-LEDs. For example the width or diameter of the LEDs are preferably less than 100 μm so that the LEDs are classed as micro-LEDs.

Light-Emitting Region

The light emitting region preferably comprises a multiple quantum well (MQW) containing a plurality of quantum wells (QWs), or quantum dots, quantum wires, or other quantum nanostructures.

In some embodiments, the light-emitting region comprises a plurality of quantum wells (QWs), and the quantum wells are continuous.

The present inventors have found that non-uniformities in the light-emitting region have a significant effect in broadening the emission wavelength range across which a light-emitting region can emit light in response to variations in the power supplied to the LED. In the prior art, non-uniformities in the light-emitting region are typically considered problematic flaws, which are unwanted and should be avoided in any way possible because the goal is typically a high-quality, low-flaw semiconductor wafer. The present inventors have eschewed this prejudice in the art, and found that intentionally creating non-uniformities in the light emitting region may advantageously broaden the emission wavelength range and result in a variable-wavelength LED which can emit over a far broader wavelength range than has ever been possible in the prior art.

In alternative embodiments of the present invention, the light-emitting region is non-uniform, fragmented, or discontinuous. The light-emitting region may be deliberately introduced to achieve the effect of carrier localisation centres in InGaN quantum wells, such as multiple types of QW region with different Indium composition and well width and quantum barriers, non-uniform, or fragmented, or broken, or gappy, or discontinuous quantum wells which would result in fluctuation in the well width, InGaN quantum dots or nanostructures, quantum wells formed on polar, semi-polar or non-polar facets.

In a preferred embodiment, the light-emitting region comprises a plurality of quantum wells (QWs), and the quantum wells are non-uniform, fragmented, or discontinuous.

The plurality of QWs may comprise fluctuations in well-width. For example the well width of the QWs may fluctuate by at least 2%, 5%, 10%, 20%, 25%, or 50%, or 75%. The well width fluctuations can be variations between quantum wells (vertical direction) as well as within one quantum well (lateral direction).

The plurality of QWs may comprise fluctuations in alloy composition. For example the indium composition of the QWs may vary by at least 2%, 5%, 10%, 20%, 25% or 50% or 75% across the light-emitting region.

The inventors have found that fluctuations in well-width and/or alloy composition may induce carrier localisation centres, either in the upper interface or lower interface of the QWs. Any carrier localisation centres would induce the variable wavelength in the variable-wavelength LED of the present invention. The larger the density of those carrier localisation centres, the larger the variable wavelength range can be achieved.

The LED may comprise a v-shaped pit which extends, or propagates, through the light emitting active region. Preferably the LED comprises a plurality of v-shaped pits which extend through the light-emitting region.

Preferably the LED may comprise a density of v-shaped pits (measured looking down onto the LED structure from above) of at least $1\times10^7/cm^2$, for example at least $5\times10^7/cm^2$ or at least $1\times10^8/cm^2$, for example a density of v-shaped pits of $1\times10^7/cm^2$ to $5\times10^9/cm^2$.

The LED may comprise a density of v-shaped pits of less than $5\times10^9/cm^2$, for example a density of v-shaped pits of less than $1\times10^9/cm^2$ or less than $5\times10^8/cm^2$.

V-shaped pits are a phenomenon known in the art of epitaxial semiconductor growth, and methods of growing v-shaped pits in semiconductor structures are known in the art. For example, v-shaped pits and their growth are described in the prior art in *The effect of nanometre-scale V-pits on electronic and optical properties and efficiency droop of GaN-based green light-emitting Diodes*; Zhou et al; Scientific Reports|(2018) 8:11053|DOI: 10.1038/s41598-018-29440-4.

These v-shaped pits are v-shaped when viewed in cross-section, but in reality form as conical or funnel-shaped voids in semiconductor structures that are grown from the bottom up using conventional epitaxial growth methods. While the cross-section of the pits is v-shaped, the pits are typically hexagonal when viewed from above. The point of the v-shaped pits are always directed downwards towards earlier-deposited layers of semiconductor structure, as the pits widen as subsequent layers of epitaxial growth are deposited on top of the structure.

Although v-shaped pits are known in the art, they are typically considered a problematic flaw in semiconductor structures, which are unwanted because the goal is typically a high-quality, low-flaw semiconductor wafer.

In the unusual situations where v-shaped pits have been incorporated into semiconductor structures in the past, the v-shaped pits have been used as a screening mechanism to create higher band gap regions which prevent current carriers going down threading dislocations as a leakage path.

In preferred embodiments of the present invention, however, v-shaped pits are intentionally incorporated into the LED structure. The v-shaped pits extend far enough down into the semiconductor structure that they terminate in a layer below the active light-emitting region. This means that the v-shaped pits must extend through the thickness of the active light-emitting region.

The present inventors have found that v-shaped pits extending through the light-emitting region of the LED structure may advantageously broaden the emission wavelength range over which a variable-wavelength LED can emit.

As the v-shaped pits extend through the active region of the LED, during epitaxial growth from the bottom up, quantum well (QW) layers that are planar across the rest of the structure are grown on the sloping side walls of the v-shaped pits. The QWs deposited on the pit sidewalls are distorted and stretched around the sides of the pits, so end up being of different thickness and composition compared to the planar QWs across the bulk of the structure.

Around the v-shaped pits, QW layers of semiconductor material are grown as flat planar layers. The active light-emitting region is thus planar around the v-shaped pit. In the location of the v-shaped pits, however, the active layers are distorted and stretched downwards along the sidewalls into the v-shaped pit. This stretching effect changes the thickness of the QWs on the sidewalls of the pit, so that they are different in thickness compared to the planar QW layers formed over the rest of the LED structure.

The inventors have found that v-shaped pits can create local strain relaxation, and MQWs deposited on the sidewall of these v-pits will have different thickness and composition compared to the rest of the MQW, hence the MQW in the region of the v-shaped pits will produce a different emission wavelength.

The quantum wells grown on the side walls of the v-shaped pit are thinner than the bulk planar QWs elsewhere in the structure, which may affect the QW bandgap and allow the QWs in this region to emit at wavelengths different from those emitted by the planar QWs elsewhere in the structure. In addition to this, the QWs on the pit sidewalls may end up having a higher indium (In) content than the surrounding planar QWs, because the sidewalls expose a semipolar facet of the QWs—this facet incorporates more indium during epitaxial growth, so the QWs in the region of the v-shaped pits may be higher in indium than the planar QWs around the pits. Higher indium incorporation typically leads to longer peak emission wavelengths. Both the QW thickness and the indium content affect the emission wavelengths produced by the light-emitting region. The presence of v-shaped pits in the LED structure may thus advantageously modify the composition and thickness of QWs in the light-emitting region in a way that expands the emission wavelength range over which the LED can be driven to emit light.

V-shaped pits typically grow from threading dislocations in the semiconductor structure. The threading dislocations are perpetuated upwards through the structure as additional layers are grown over layers containing a threading dislocation, and at a certain point the dislocation widens into a v-shaped pit. Typically the skilled person aims to keep threading dislocation concentrations low in order to produce a "high quality" low-flaw wafer.

V-shaped pits can alternatively be grown using 3-dimensional epitaxial growth modes. 3D epitaxial deposition techniques are known in the art and are typically used to grow "islands" or "pyramids" of semiconductor material on a template. By controlling deposition of the LED structure using 3D epitaxial deposition techniques, v-shaped pits can be artificially grown in desired locations, with no need for a threading dislocation to be present to "seed" the formation of the v-shaped pit. By using this deposition control, the bottom (nadir) of the pit may be created at a desired location in the structure-both a desired lateral position and a desired height in the structure, for example in a particular layer of the semiconductor structure below the active light-emitting region.

The bottom of the v-shaped pit may be located in the connecting layer of the semiconductor structure. The connecting layer may be positioned between the porous region and the n-doped portion.

The bottom of the v-shaped pit may be located in a pre-strain layer of the semiconductor structure. The pre-strain layer may be positioned above the n-doped portion and below the light-emitting region.

Preferably the LED comprises a plurality of v-shaped pits which extend through the active light-emitting region.

Preferably the LED comprises a density of v-shaped pits (measured looking down onto the LED structure from above) of at least $1\times10^7/cm^2$, for example at least $5\times10^7/cm^2$ or at least $1\times10^8/cm^2$. The LED may comprise a density of v-shaped pits of less than $5\times10^9/cm^2$, for example a density of v-shaped pits of less than $1\times10^9/cm^2$ or less than $5\times10^8/cm^2$.

for example a density of v-shaped pits of $1\times10^7/cm^2$ to $5\times10^9/cm^2$, or $5\times10^7/cm^2$ to $5\times10^9/cm^2$, or $1\times10^8/cm^2$ to $5\times10^8/cm^2$.

The LED may comprise more than 0.1 v-shaped pit per square micrometre, or more than 1 v-shaped pits per square micrometre, or more than 2 v-shaped pits per square micrometre.

The concentration of v-shaped pits in the LED is preferably controlled, as too many v-shaped pits may negatively affect the light emission of the LED by disrupting radiative recombination. For example the LED may comprise fewer than 10 v-shaped pits per square micrometre, or fewer than 8 v-shaped pits per square micrometre, or fewer than 6 v-shaped pits per square micrometre.

In a preferred embodiment the LED structure may comprise no greater than 10^9 threading dislocations per square centimetre. Preferably the semiconductor structure below the active light-emitting region (typically a substrate, the porous region and a connecting layer) comprise no more than 10^9 threading dislocations per square centimetre. The threading dislocation density is preferably limited to this level so that further epitaxial growth does not create too many v-shaped pits in the light-emitting region.

Both the density and size (the depth) of the v-shaped pits may be controlled. The size of the V-pits can be controlled by the position and the growth conditions of the pre-strain layer and the low-temperature nGaN layer where the pits started.

The morphology of quantum wells (QWs) in the active light-emitting region may be varied. For example the light-emitting region may contain uniform QWs with well-defined interfaces or fragmented QWs with less well-defined interfaces, fragmentation, or QW well width/composition fluctuation or quantum dot like localisation centres. This control of QW morphology can determine the range of the variable emission wavelength to be controlled and manipulated.

The light-emitting region preferably comprises a plurality of quantum wells (QWs). The quantum wells may be continuous. The quantum wells may be fragmented, or discontinuous.

If QWs are continuous and very uniform in thickness and composition, recombination of charge carriers can only happen in regular well defined ways. On the other hand, if QWs are fragmented or discontinuous, this creates lots of nanostructures, which in turn creates different band gaps that result in emission of different colours.

Method of Controlling a Variable-Wavelength LED

In another aspect of the present invention there is provided a method of controlling a variable-wavelength LED, the method comprising the steps of:

providing a power supply to a variable-wavelength LED according to the first aspect of the invention; and controlling the power supply to vary the peak emission wavelength of the variable-wavelength LED over the emission wavelength range. The method may comprise the step of varying the power supply to vary the peak emission wavelength of the variable-wavelength LED within the emission wavelength range.

The method may comprise dynamically tuning the power supply to the LED during a single display frame.

A power supply, or a supply of power, may be provided to the variable-wavelength LED from a power source, optionally via an LED driver.

The method may comprise the steps of providing a driving current to the variable-wavelength LED, and varying the magnitude of the driving current to vary the peak emission wavelength of the variable-wavelength LED within the emission wavelength range.

Preferably the peak emission wavelength of the variable-wavelength LED is varied by changing the drive current provided to that LED during operation.

The LED may be controlled to emit light at a plurality of discrete peak emission wavelengths by changing the drive current provided to that subpixel between a plurality of discrete non-zero values. This may advantageously provide a tunable monocolour display.

The LED may be controlled to emit light at a plurality of discrete peak emission wavelengths by changing the drive current provided to that subpixel between a plurality of discrete non-zero values during one display frame. This may advantageously enable dynamic pixel tuning, in which the colours emitted by individual LEDs are tunable during a display frame.

The power supply may be controlled to vary the peak emission wavelength over an emission wavelength range of at least 40 nm, or at least 50 nm, or at least 60 nm, or at least 70 nm, or at least 80 nm, preferably over a range of up to 100 nm or 110 nm or 120 nm or 140 nm, or 160 nm, or 180 nm, or 200 nm.

In a particularly preferred embodiment, the power supply may be controlled to vary the peak emission wavelength between 400 nm and 680 nm, 430 nm and 670 nm, 450 nm and 650 nm, 500 nm and 680 nm, or between 520 nm and 675 nm.

The power supply may be a pulsed power supply, or the power supply may be a continuous wave (CW) or quasi-continuous-wave power supply.

The control of the power supply may be current control, or voltage control.

The power supply may be a constant-voltage power supply, or a constant-current power supply. AC or DC power supplies are also usable.

The power supply may be operated in a pulse width modulation (PWM) mode, or a pulse amplitude modulation (PAM mode), or both.

The magnitude or amplitude of the power supply may be changed between at least two non-zero values during one display frame.

The magnitude or amplitude of the power supply may be changed between a plurality of discrete non-zero values during one display frame, for example between three non-zero values during one display frame.

The power supply may be controlled to provide a current density of between 0.001 A/cm$^2$ and 1000 A/cm$^2$ to the LED, or between 0.01 A/cm$^2$ and 500 A/cm$^2$, or between 0.1 A/cm$^2$ and 250 A/cm$^2$.

The power supply may be controlled to provide a driving current to the LED for a duty cycle of at least 0.001%, 0.01%, 0.1%, 1%, 5%, 10%, 20%, 30%, 40%, 50%, 60%, 70%, 80%, 90%, or 100%.

The method may comprise the step of providing a first drive current so that the LED emits at a first peak emission wavelength, and providing a second drive current having a magnitude or amplitude different from the first drive current so that the LED emits at a second peak emission wavelength.

The first drive current may be provided to the LED for a first duty cycle, and the second drive current may be provided to the LED for a second duty cycle. The method may comprise the step of controlling the duration of the first duty cycle and/or the second duty cycle in order to control an observed brightness and/or chromaticity produced by the display device.

The method may comprise the step of providing a third drive current having a magnitude or amplitude different from the first drive current and the second drive current, so that the LED emits at a third peak emission wavelength.

The method may comprise the step of providing the third drive current to the LED for a third duty cycle, and preferably controlling the duration of the third duty cycle, in order to control an observed brightness and/or chromaticity produced by the display device.

The drive current provided to the LED may be changed between the first drive current, the second drive current and/or the third drive current, in order to control an observed chromaticity produced by the display device.

The or each LED may be operated in a plurality of modes in response to a plurality of different drive current magnitudes or amplitudes, the LED being configured to emit at a discrete peak emission wavelength in each of the plurality of modes. In each mode the subpixel is driven at a different amplitude of current density, causing the subpixel to emit at different peak wavelengths in different amplitude modes. The amplitude of the drive current provided to the variable-wavelength LED may be varied during operation of the display device, preferably within a single display frame.

Power Control

The power supply may be controlled to vary the peak emission wavelength of the LED by varying the power (in Watts) or the power density (in Watts/cm$^2$) provided to the LED.

The power provided by the power supply may be increased in order to decrease the peak emission wavelength, or the power provided by the power supply may be decreased in order to increase the peak emission wavelength.

The power supply may be controlled to supply a first power at which the LED emits at a first peak emission wavelength, and the power supply may be controlled to supply a second power lower than the first power, so that the LED emits at a second peak emission wavelength longer than the first emission wavelength.

In a particularly preferred embodiment of a green-red LED, the first peak emission wavelength may be below 570 nm and the second peak emission wavelength may be above 610 nm, such that the LED emits green light in response to the first power and red light in response to the second power. The LED may also emit light at a continuous spectrum of wavelengths between the first and second peak emission wavelengths, by varying the power between the first power and the second power.

Current Control

The power supply may be controlled to vary the peak emission wavelength of the LED by varying the current (in Amperes) or the current density (in A/cm$^2$) provided to the LED.

Similarly to power, the current density provided by the power supply may be increased in order to decrease the peak emission wavelength, or decreased in order to increase the peak emission wavelength.

The power supply may be controlled to supply a first current density at which the LED emits at a first peak emission wavelength, and to supply a second current density lower than the first current density, at which the LED emits at a second peak emission wavelength longer than the first emission wavelength.

In a particularly preferred embodiment of a green-red LED, the first peak emission wavelength may be below 570 nm and the second peak emission wavelength may be above 610 nm, such that the LED emits green light in response to the first current density and red light in response to the second current density.

Voltage Control

The power supply may be controlled to vary the peak emission wavelength of the LED by varying the voltage provided to the LED.

The voltage provided by the power supply may be increased in order to decrease the peak emission wavelength, or the voltage provided by the power supply may be decreased in order to increase the peak emission wavelength.

The power supply may be controlled to supply a first voltage at which the LED emits at a first peak emission wavelength, and the power supply may be controlled to supply a second voltage lower than the first voltage, so that the LED emits at a second peak emission wavelength longer than the first emission wavelength.

In a particularly preferred embodiment of a green-red LED, the first peak emission wavelength may be below 570 nm and the second peak emission wavelength may be above 610 nm, such that the LED emits green light in response to the first voltage and red light in response to the second voltage. The LED may also emit light at a continuous spectrum of wavelengths between the first and second peak emission wavelengths, by varying the voltage between the first voltage and the second voltage.

Method of Manufacture of Variable-Wavelength LED

In a further aspect there is provided a method of manufacturing a variable-wavelength LED, comprising the step of growing:

an n-doped portion;

a p-doped portion; and a light-emitting region located between the n-doped portion and a p-doped portion, the light-emitting region comprising a light-emitting layer which emits light at a peak emission wavelength under electrical bias thereacross.

The method may comprise the step of overgrowing the n-doped portion, the p-doped portion and the light-emitting region over a porous region of III-nitride material.

The method may comprise the step of forming a porous region of III-nitride material in at least one of the n-doped portion or the p-doped portion, and forming the light-emitting region over a porous region of III-nitride material.

The method may optionally comprise the step of removing the porous region from the LED structure (the n-doped portion, the p-doped portion and the light-emitting region) after the n-doped portion, the p-doped portion and the light-emitting region have been formed.

The light-emitting layer may emit light at a peak emission wavelength between 400 and 800 nm, or between 450-800 nm, or between 500 and 800 nm, or between 550 and 800 nm, or between 610 and 800 nm under electrical bias thereacross.

The method may comprise the step of connecting the LED to a variable power supply.

The method may comprise the step of connecting the LED to an LED driver configured to provide a variable power supply to the LED. The LED driver may be configured to control the power or the current or the voltage of the power supply to the LED. The LED driver may be configured to provide a pulsed, or CW, or quasi-CW power supply to the LED.

The LED structure, including the n-doped portion, the p-doped portion, and the light-emitting region, may be an LED structure for emitting at a wavelength lower than the peak emission wavelength of the LED, so that the porous region of III-nitride material red-shifts the emission wavelength of the light-emitting region to the peak emission wavelength.

The n-doped portion, the p-doped portion and the light-emitting region are preferably formed from III-nitride semi-conductor material.

In a preferred embodiment, the light-emitting region may comprise a light-emitting indium gallium nitride layer for emitting at a peak wavelength of 500 nm-550 nm or 550 nm-600 nm, wherein overgrowth on the porous region of III-nitride material shifts the emission wavelength of the light-emitting region to a peak wavelength between 600 and 750 nm under electrical bias.

The light-emitting region may comprise a light-emitting indium gallium nitride layer for emitting at a peak wave-length of 500-550 nm, or 500-580 nm, or 510 to 570 nm, or 530 nm to 560 nm, or 550 nm to 600 nm. The light-emitting indium gallium nitride layer may be one or more layers known to emit at these wavelengths when grown in con-ventional LEDs, for example on non-porous GaN substrates. However, the inventors have found that growing conven-tional yellow or green LED structures over a porous III-nitride layer leads to an LED that emits at a peak wavelength between 600 and 750 nm under electrical bias.

The method may comprise the step of growing a yellow or green LED structure over a porous region of III-nitride material.

In preferred embodiments, the light emitting layer is a light-emitting indium gallium nitride layer. The LED pref-erably also comprises a region of GaN material. Due to the lattice mismatch between GaN and InGaN, the stress relax-ation effect created by the porous region is particularly advantageous.

The method may comprise the step of forming the light emitting active region with carrier localisation centres in the quantum wells (which are preferably InGaN QWs). such as multiple types of QW region with different Indium compo-sition and well width and quantum barriers, non-uniform, or fragmented, or broken, or gappy, or discontinuous quantum wells which would result in fluctuation in the well width, InGaN quantum dots or nanostructures, quantum wells formed on polar, semi-polar or non-polar facets.

The method may comprise the step of forming a plurality of quantum wells (QWs), in which the quantum wells are non-uniform, fragmented, or discontinuous.

The plurality of QWs may comprise fluctuations in indium composition, and/or well width fluctuations.

The method may comprise the step of forming one or more v-shaped pits in the LED structure, so that the v-shaped pit extends through the thickness of the light-emitting region. Preferably the method comprises the step of forming at least 0.1 v-shaped pits per square micrometre, or at least 1 v-shaped pits per square micrometre, or at least 2 v-shaped pits per square micrometre. Preferably the method comprises the step of forming a density of v-shaped pits in the light-emitting region of at least $1\times10^7/cm^2$, for example at least $5\times10^7/cm^2$ or at least $1\times10^8/cm^2$, for example a density of v-shaped pits of $1\times10^7/cm^2$ to $5\times10^9/cm^2$. Pref-erably the method comprises the step of forming a density of v-shaped pits in the light-emitting region of less than $5\times10^9/cm^2$, for example a density of v-shaped pits of less than $1\times10^9/cm^2$ or less than $5\times10^8/cm^2$.

V-shaped pits are a phenomenon known in the art of epitaxial semiconductor growth, and methods of growing v-shaped pits in semiconductor structures are known in the art. For example, v-shaped pits and their growth are described in the prior art in *The effect of nanometre-scale V-pits on electronic and optical properties and efficiency*

*droop of GaN-based green light-emitting Diodes*; Zhou et al; Scientific Reports|(2018) 8:11053|DOI: 10.1038/s41598-018-29440-4.

V-shaped pits may be grown in the semiconductor struc-ture so that they terminate in a layer below the active light-emitting region. This means that the v-shaped pits must extend through the thickness of the active light-emitting region.

V-shaped pits may be grown from threading dislocations in the semiconductor structure by controlling the growth conditions during epitaxial deposition of layers above a layer containing a threading dislocation. The threading dis-locations are perpetuated upwards through the structure as additional layers are grown over layers containing a thread-ing dislocation, and by controlling growth conditions the dislocation is widened into a v-shaped pit.

V-shaped pits can alternatively be grown using 3-dimen-sional epitaxial growth modes. 3D epitaxial deposition tech-niques are known in the art and are typically used to grow "islands" or "pyramids" of semiconductor material on a template. By controlling deposition of the LED structure using 3D epitaxial deposition techniques, v-shaped pits can be artificially grown in desired locations, with no need for a threading dislocation to be present to "seed" the formation of the v-shaped pit. By using this deposition control, the bottom (nadir) of the pit may be created at a desired location in the structure—both a desired lateral position and a desired height in the structure, for example in a particular layer of the semiconductor structure below the active light-emitting region.

The bottom of the v-shaped pit may be located in the connecting layer of the semiconductor structure. The con-necting layer may be positioned between the porous region and the n-doped portion.

The bottom of the v-shaped pit may be located in a pre-strain layer of the semiconductor structure. The pre-strain layer may be positioned above the n-doped portion and below the light-emitting region.

Preferably the LED comprises a plurality of v-shaped pits which extend through the active light-emitting region.

Both the density and size (the depth) of the v-shaped pits may be controlled. The size of the V-pits can be controlled by the position and the growth conditions of the pre-strain layer and the low-temperature nGaN layer where the pits started.

Quantum wells (QWs) in the active light-emitting region may be deposited so that the quantum wells are continuous and/or of uniform thickness. Alternatively quantum wells (QWs) in the active light-emitting region may be deposited so that the quantum wells are fragmented, or discontinuous.

Manufacturing Steps

The n-type region, the light-emitting region and the p-type region (which may be called the LED structure) are preferably grown over a semiconductor template which contains the porous region. The semiconductor template may also contain a number of layers of semiconductor material arranged to provide a suitable substrate for the overgrowth of the LED structure.

The method may comprise the first step of electrochemi-cally porosifying a layer of III-nitride material, to form the porous region of III-nitride material. This may be achieved using a wafer scale porosification process as set out in international patent applications PCT/GB2017/052895 (published as WO2019/063957) and PCT/GB2019/050213 (published as WO2019/145728).

The method may preferably comprise the step of forming the porous region of III-nitride material by electrochemical porosification through a non-porous layer of III-nitride material, such that the non-porous layer of III-nitride material forms a non-porous intermediate layer. The non-porous intermediate layer may advantageously provide a smooth surface for overgrowth of further layers, such as one or more connecting layers of III-nitride material.

The porous region may be formed by porosifying one or more layers or regions of III-nitride material on a substrate. The substrate may be Silicon, Sapphire, SiC, β-Ga2O3. The crystal orientation of the substrates can be polar, semi-polar or non-polar orientation. The substrate thickness may typically vary between 100 μm and 1500 μm.

The porous region may be a porous layer, such that the method comprises the step of overgrowing, over a porous layer of III-nitride material: an n-doped portion; a p-doped portion; and an LED light-emitting region. Preferably the porous region may be a porous layer that is continuously porous, for example formed from a continuous layer of porous III-nitride material.

The porous region may comprise a plurality of porous layers, and optionally a plurality of non-porous layers. In preferred embodiments of the invention, the porous region is a stack of alternating porous and non-porous layers, with the top surface of the stack defining the top of the porous region, and the bottom surface of the stack defining the bottom of the porous region.

Alternatively the porous region may be a layer of III-nitride material that contains one or more porous regions, for example one or more porous regions in an otherwise non-porous layer of III-nitride material.

In preferred embodiments, the porous region, or porous layer, may have a lateral dimension (width or length) equivalent to that of the substrate on which the porous layer or region is grown. For example, conventional substrate wafer sizes may have a variety of sizes, such as 1 cm$^2$, or 2 inch, 4 inch, 6 inch, 8 inch, 12 inch, or 16 inch diameter. By patterning one or more layers and/or depositing regions of different charge carrier concentrations in the same layer, however, smaller porous regions can be formed that do not span the entire substrate. The lateral dimensions of the porous layer or region may therefore vary from around $\frac{1}{10}$ of a pixel (for example 0.1 μm), up to the lateral dimensions of the substrate itself.

Prior to the porosification step, a doped region of n-doped III-nitride semiconductor material, preferably containing a layer, or stack of layers, may be deposited on a substrate. The III-nitride layer(s) may contain one or a combination of these elements: Al, Ga, In (ternary of quaternary layer). The thickness of the III-nitride stack is preferably between 10-4000 nm. The III-nitride region may have a doping concentration between $1 \times 10^{17}$ cm$^{-3}$-$5 \times 10^{20}$ cm$^{-3}$.

Preferably an intermediate layer of undoped III-nitride material is deposited over the doped material before it is porosified. The intermediate layer preferably has a thickness of between 1 nm and 3000 nm, preferably between 5 nm and 2000 nm. As the intermediate layer is undoped, it remains non-porous after the porosification step, which advantageously provides a good surface for epitaxial overgrowth of further layers of semiconductor.

In preferred embodiments, the doped region consists of an alternating stack of doped and undoped layers. In preferred embodiments the stack contains between 5-50 pairs of layers. The thickness of each highly doped layer may vary between 10 nm-200 nm and low-doped or undoped layers may have a thickness of between 5-180 nm.

As is known in the art, electrochemical porosification removes material from n-type doped regions of III-nitride materials, and creates empty pores in the semiconductor material.

In preferred embodiments, the LED structure is formed over a stack of multiple porous layers of III-nitride material. Thus, rather than being a single porous layer of III-nitride material, the porous region may be a stack of layers of III-nitride material in which at least some layers are porous. The stack of porous layers may preferably be a stack of alternating porous and non-porous layers.

The method may preferably comprise the step of depositing one or more connecting layers of III-nitride material on the surface of the intermediate layer of III-nitride material prior to overgrowing the n-doped region, the LED light-emitting region and the p-doped region on the connecting layer.

Alternatively, where there is no non-porous intermediate layer over the porous region, the method may comprise the step of depositing a connecting layer of III-nitride material onto the surface of the porous region of III-nitride material.

The method may comprise the further step of overgrowing the n-doped region, the LED light-emitting region and the p-doped region on the connecting layer.

The LED produced by the method of manufacture is preferably a variable-wavelength LED according to the first aspect of the invention.

Display Devices

The first aspect of the invention provides a variable-wavelength LED, the peak emission wavelength of which depends on the driving current density, or driving power density, supplied to the LED during use.

This variable-wavelength LED can be incorporated into a display device in a variety of ways to give a range of desirable device characteristics.

According to a second aspect of the invention there may be provided a display device comprising a variable-wavelength LED according to the first aspect of the invention, the LED being configured to receive a power supply.

The display device may comprise a variable-wavelength light emitting diode (LED), the variable-wavelength LED comprising:

an n-doped portion;

a p-doped portion;

a light emitting region located between the n-doped portion and a p-doped portion, the light emitting region comprising a light-emitting layer which emits light at a peak emission wavelength under electrical bias thereacross;

wherein the LED is configured to receive a power supply, in which the peak emission wavelength of the LED is continuously controllable over an emission wavelength range of at least 40 nm by varying the power supply.

The display device preferably comprises a plurality of variable-wavelength LEDs according to the first aspect of the invention, each variable-wavelength LED being configured to receive its own power supply, in which each of the plurality of variable-wavelength LEDs are controllable so that the peak emission wavelength of each variable-wavelength LED is controllable by varying the power supply to that LED.

The display device preferably comprises a plurality of LED pixels. Each pixel may comprise a single variable-wavelength LED, or multiple LED subpixels. Of those subpixels, some or all may be variable-wavelength LEDs as described above.

A variety of embodiments of display device are described and illustrated in relation to the Figures.

In display devices according to the present invention, the display device preferably comprises a plurality of LED pixels, and preferably each device pixel comprises at least one variable-wavelength LED according to the first aspect of the invention. Preferably at least one subpixel of each pixel is a variable-wavelength LED according to the first aspect of the invention. The display device may comprises a plurality of LED pixels, and each device pixel may comprise one, two, three or four variable-wavelength LEDs according to the first aspect of the invention.

In preferred embodiments of the present invention, some or all of the variable-wavelength LEDs are preferably configured to receive a variable-magnitude supply of driving current from a power source, so that the magnitude of the driving current to each variable-wavelength LED is variable. By varying the magnitude of the driving current to a variable-wavelength LED, the peak emission wavelength of that LED can be varied as the display device is used. The driving current provided to each variable-wavelength LED may be individually controllable, so that the peak emission wavelength of each variable-wavelength LED in the display may be controlled and varied individually. Alternatively, the device may be configured so that the same driving conditions are provided to a group of variable-wavelength LEDs simultaneously, so that all of the variable-wavelength LEDs in that group emit light at the same peak emission wavelength when the driving current is on, and the peak emission wavelength of the entire group can be varied by varying the magnitude of the driving current.

In alternative embodiments, some or all of the variable-wavelength LEDs in the display device may be configured to receive a fixed-magnitude (i.e. non-variable) driving current which is either on or off. When the fixed driving current is on, those variable-wavelength LEDs will behave as conventional LEDs, and emit at a single peak emission wavelength determined by the driving conditions provided to the LEDs. Thus variable-wavelength LEDs which are configured to receive a fixed-magnitude driving current may be used as fixed-emission-wavelength LEDs in the display device.

Preferably at least one subpixel of each pixel is a variable-wavelength LED according to the first aspect of the invention. Other subpixels may also be incorporated into the display device. For example, each pixel in the display device may comprise one or more fixed-emission-wavelength LED subpixels. Fixed-emission-wavelength LED subpixels are preferably configured to receive a fixed-magnitude driving current.

The device may be configured to separately control the driving current provided to each of the plurality of LEDs, so that each of the plurality of LEDs is individually driveable. The device may be configured to provide a plurality of different driving currents to the plurality of LEDs, so that separate LEDs are driveable to emit at different peak emission wavelengths in response to the different driving currents.

Alternatively, the device may be configured to separately control a groups of two or more LEDs, so that each LED in a group emits at the same peak emission wavelength. The display device may be configured to provide different driving currents to different groups of LEDs, so that separate groups of LEDs are driveable to emit at different peak emission wavelengths in response to the different driving currents.

The display device preferably comprises a power supply configured to provide a driving current to the plurality of LEDs. The display device may comprise a power source, or may be connectable to a power source.

The power supply may be a pulsed power supply. The power supply may configured to be operated in a pulse width modulation (PWM) mode, or in a pulse amplitude modulation (PAM mode). Preferably the power supply is configured to be operated in a pulse amplitude modulation (PAM mode) and a pulse width modulation (PWM) mode.

The power supply may be a continuous wave (CW) or quasi-continuous-wave power supply. The power supply may be a constant-voltage power supply or a constant-current power supply.

Each light emitting diode is preferably connected to an LED driver configured to provide the power supply to the LED.

The power supply to the LED is preferably regulated or controlled by an LED driver. The LED driver is preferably configured to supply a variable-magnitude supply of power to the variable-wavelength LED(s) in the display device. For example the LED driver is preferably capable of varying the magnitude of the drive current supplied to each variable-wavelength LED, either by varying the magnitude of the drive current continuously across a range, or by providing a plurality of discrete drive current modes having different fixed magnitudes.

A variety of conventional LED drivers may be used to regulate the power supply to the LED. The LED driver may be an integrated circuit (IC), for example the LED driver may be a CMOS driver or a TFT driver. The driver may be a discrete component, such as a backplane IC driver, or an on-chip IC driver made from the same GaN epiwafer.

The LED driver is connectable to a power source, for example either an external power source (mains electricity) or a battery.

The display device may comprise a controller configured to control the power supply to the LEDs in the device. The controller may be programmed to control the power supply, or the drive current, provided to the LEDs by the LED driver. For example the controller may be programmed, or programmable, to control the magnitude, duration and phase of the power supply provided to each LED in the display.

The controller may be programmable to control the device in different control modes. For example the controller may be responsive to a user input, so that in response to a user input the controller controls the LEDs in the device to operate in a selected mode.

The controller may be programmable to control an LED in the display device in fixed-wavelength emission mode, by providing a fixed-magnitude driving current to the LED, the magnitude of the fixed driving current corresponding to the wavelength to be emitted. And/or the controller may be programmable to control an LED in the display device in dynamic variable-wavelength emission mode, by providing a variable-magnitude driving current to the LED, the magnitude of the fixed driving current varying corresponding to the wavelength to be emitted at a given time.

The display device may comprise an array of LED pixels, in which each pixel comprises two or more subpixels, and in which at least one of the subpixels of each pixel is a variable-wavelength LED.

The display device may comprise an array of LEDs, in which each LED has the same diode structure, and in which each LED is tunable to emit at peak wavelengths across the same emission wavelength range.

The display device may be an augmented reality (AR), mixed reality (MR), or virtual reality (VR) device, or the device may be a smart wearable device, a smart display, or a direct-view display.

The LED or at least one of the plurality of LEDs is preferably a dynamic colour-tunable LED.

The display device preferably comprises a porous region of semiconductor material, preferably a porous region of III-nitride semiconductor material. The first and/or second subpixels are preferably formed over the porous region, as described above in relation to the first aspect.

The term "display device" may be substituted for "LED device" throughout this document.

In the prior art, arrays of red, green and blue (RGB) LED pixels have been provided close together, so that operating these pixels alone or in combination gives the effect of emitting a range of secondary colours to the viewer. The present invention, however, provides a superior alternative by providing a single LED pixel which may be controlled to emit at a continuous range of different wavelengths. The LED may thus be controlled to emit "true" colours of a variety of different wavelengths, without the need to overlay the different emission wavelengths of discrete LEDs (such as RGB pixels) to arrive at a composite emission wavelength.

The display device may be a monolithic full colour display.

A display device comprising an array containing a plurality of identical variable-wavelength LEDs according to the invention may be provided, in which each LED in the array may be controlled to emit at the same wavelength, or at different wavelengths within the emission wavelength range. The array may also be controlled to turn individual pixels on or off in order to control the intensity of the emitted light.

The display device of the present invention may comprise both variable-wavelength LEDs as described herein and further LEDs: either further variable-wavelength LEDs having different emission wavelength ranges; or further conventional single-wavelength LEDs. In a preferred embodiment, the variable-wavelength LEDs of the present invention may be provided in an array with further LEDs configured to emit at further peak emission wavelengths outside the emission wavelength range of the variable-wavelength LEDs. If the further peak emission wavelengths are outside the emission wavelength range, these wavelengths are not obtainable using the variable-wavelength LEDs. Similarly to a conventional RGB array, the variable-wavelength LEDs and the further LEDs may therefore be used in combination to provide an even wider range of possible emission wavelengths.

The display device of the present invention may comprise an LED array, comprising a plurality of LED subpixels according to any preceding aspect of the invention. Depending on the size of the LED pixels, the array may be an array of mini-LEDs or micro-LEDs.

In another aspect there may be provided an LED display device, comprising a plurality of variable-wavelength LEDs (or mini-LEDs or micro-LEDs) acting as subpixels as described above. In the LED display, each of the plurality of LEDs is preferably separately controllable so that the peak emission wavelength of each LED is controllable by varying the power supply to each LED individually. By controlling the emission wavelength of each LED separately, a colour display may be provided. As each variable-wavelength LED can emit over a range of wavelengths rather than the standard single wavelength, however, a large range of possible colours may be provided using fewer LEDs than are required for conventional RGB multi-colour displays in the prior art.

In the LED display, groups of multiple variable-wavelength LEDs may be configured to receive the same driving conditions from a power source, so that the peak emission wavelength of all of the variable-wavelength LEDs in the group are simultaneously controllable by varying the power supply to that group.

The LED display may comprise a first variable-wavelength LED which has a peak emission wavelength controllable over a first emission wavelength range, and a second variable-wavelength LED which has a peak emission wavelength controllable either over the first emission wavelength range, or over a second emission wavelength range. The second emission wavelength range may be a separate wavelength range, or it may partially overlap the first emission wavelength range. The first and second variable-wavelength LEDs may thus be controlled to emit at separate peak emission wavelengths. For example a pixel of the LED display device may comprise a first variable-wavelength LED subpixel which has a peak emission wavelength controllable over a first emission wavelength range, and a second variable-wavelength LED subpixel which has a peak emission wavelength controllable either over the first emission wavelength range, or over a second emission wavelength range.

In another preferred embodiment, the LED display may comprise a plurality of variable-wavelength LEDs which are controllable over a first emission wavelength range, and at least one further LED configured to emit at a peak emission wavelength outside the first emission wavelength range. For example, the further LED may be configured to emit at a wavelength outside the wavelength range of the variable-wavelength LEDs in order to increase the colour range obtainable from the display. For example a pixel of the LED display device may comprise a plurality of variable-wavelength LED subpixels which are controllable over a first emission wavelength range, and at least one further LED subpixel which is configured to emit at a peak emission wavelength outside the first emission wavelength range.

The plurality of variable-wavelength LEDs are preferably operable at different peak emission wavelengths within the first emission wavelength range. For example one of the plurality of variable-wavelength LEDs may emit at a first wavelength within the range, while another of the plurality of variable-wavelength LEDs emits at a second wavelength within the first emission wavelength range. A wide variety of secondary and complementary colours may thus be achieved.

In a preferred embodiment, some or all of the plurality of variable-wavelength LEDs are operable at the same peak emission wavelength in order to provide a desired emission intensity at that wavelength. As longer wavelengths are achieved by decreasing the magnitude of the power supplied to the LED, the intensity of the LED emission at longer wavelengths is lower than the emission intensity at shorter wavelengths. Providing a plurality of variable-wavelength LEDs may advantageously enable the display to compensate for this intensity difference by controlling the number of LEDs emitting at the desired wavelength. For example, two or more LEDs may be controlled to emit red wavelengths in order to increase the brightness of the emitted red light to a level appropriate for the display.

In a preferred embodiment, the LED display comprises a plurality of variable-wavelength LEDs which are controllable to emit at peak emission wavelengths between 500 nm and 680 nm, or between 520 nm and 675 nm, and the LED comprises at least one further LED configured to emit at a peak emission wavelength below 560 nm, preferably below 500 nm. Thus the variable-wavelength LEDs are controllable to emit light at colours ranging from green, through yellow and orange, to red, while the further LED is configured to emit blue light. These LEDs therefore give the display the ability to emit a wide range of wavelengths across the spectrum between blue and red.

In a particularly preferred embodiment, the LED display comprises a plurality of variable-wavelength LEDs which are controllable to emit at peak emission wavelengths between 560 nm and 680 nm, or between 570 nm and 675 nm, and the LED comprises at least one further LED configured to emit at a peak emission wavelength below 560 nm, preferably below 500 nm. Thus the variable-wavelength LEDs are controllable to emit light at colours ranging from green, through yellow and orange, to red, while the further LED is configured to emit blue light.

In another preferred embodiment, the LED display comprises a plurality of variable-wavelength LEDs which are controllable to emit at peak emission wavelengths between 400 nm and 680 nm, or between 450 nm and 630 nm, or between 470 and 610 nm. Thus the variable-wavelength LEDs are controllable to emit light at colours ranging from violet or blue, through to green, yellow and orange, to red.

In a further aspect there may be provided a display device comprising a variable-wavelength LED which is configured to receive a drive current and to emit light in response to the drive current, wherein the peak emission wavelength of the variable-wavelength LED is dependent on an amplitude of the drive current supplied to the variable-wavelength LED; and wherein the amplitude of the drive current for the variable-wavelength LED is changeable between at least two non-zero values during one display frame.

The variable-wavelength LED is preferably a variable-wavelength LED according to the first aspect of the invention described above, the LED being configured to receive a power supply. Any features of the variable-wavelength LED described above are therefore applicable to the present display device.

The variable-wavelength LED is preferably a pixel of the display device, and the peak emission wavelength of the pixel is preferably variable by changing the drive current provided to that pixel during operation.

The variable-wavelength LED is preferably controllable to emit a desired spectral output in response to an analogue drive current pulse, in which the amplitude of the analogue drive current pulse varies between non-zero values within a single display frame.

The variable-wavelength LED is preferably controllable to emit light at a plurality of discrete peak emission wavelengths by changing the drive current provided to that variable-wavelength LED between a plurality of discrete non-zero values during one display frame. For example the variable-wavelength LED may be controllable to emit light at a plurality of discrete peak emission wavelengths by changing the drive current provided to the variable-wavelength LED between at least 3, or at least 4, or at least 5, or at least 6, or at least 7 discrete non-zero values during one display frame. Each discrete drive current applied to the variable-wavelength LED causes the LED to emit light at a corresponding discrete peak emission wavelength. By applying three drive current pulses at discrete current magnitudes, the variable-wavelength LED will thus emit light at three discrete peak emission wavelengths, each emission wavelength corresponding to a different input drive current.

The variable-wavelength LED is controllable to emit a desired spectral output in response to a drive current comprising a sequence of discrete current pulses within a single display frame, the discrete current pulses having a plurality of different amplitudes. The sequence of discrete current pulses preferably comprises at least 3, or at least 5, or at least 7 current pulses with different amplitudes.

The amplitude of the drive current for the variable-wavelength LED is preferably changeable between at least three, or at least four, or at least five, or at least six, or at least seven non-zero values during one display frame.

The perceived spectral output of the variable-wavelength LED in the display frame is the temporal combination of two or more peak emission wavelengths emitted by the variable-wavelength LEDs in response to the two or more non-zero drive currents provided to the LED during the display frame.

The duration of each drive current pulse in the sequence will determine the brightness of the peak emission wavelength corresponding to that drive current, and thus the summation of the emitted wavelengths which make up the emission spectrum perceived by a detector, for example by the eyes of a human viewing the display device.

By selecting which of the available discrete drive currents to provide to the variable-wavelength LED during the display frame, the temporally-averaged emitted spectrum which is perceived by a viewer may be varied across a wide colour gamut.

The duration of a display frame may be 50 ms or less, or 45 ms or less, or 40 ms or less. The duration of the display frame is preferably less than or equal to the response time of a detector. The duration of the display frame is preferably less than or equal to the response time of ~50 ms for the human eye as a detector.

Each variable-wavelength LED in a multiple-LED display device is preferably controllable to reproduce a predetermined spectral output corresponding to the temporal combination of a plurality of peak emission wavelengths emitted during the display frame.

The display device may comprise an array of variable-wavelength LEDs, in which each variable-wavelength LED is controllable to reproduce a predetermined spectral output corresponding to the temporal combination of a plurality of peak emission wavelengths emitted during the display frame.

Preferably a plurality of variable-wavelength LED sub-pixels are individually tuneable across a display area of the display device.

The display device may be a large area luminaire for reproducing a programmed illumination spectrum or sequence of illumination spectra.

The display device may be configured to produce an emission spectrum, in which the shape of the emission spectrum is controllable by applying a plurality of fixed driving currents.

The display device may be configured to produce an emission spectrum in which the shape of the emission spectrum is controllable by applying a continuum of driving currents. In other words, rather than driving the variable-wavelength LED by applying one of a plurality of available discrete drive current levels, the driving current may be provided in the form of a continuous pulse, for example an analogue-style signal of drive currents which vary in magnitude during the display frame.

The display device may comprise a pulse current source configured to generate a drive current pulse which varies between a plurality of non-zero values during one display frame. For example the pulse current source may be configured to generate a drive current pulse which varies between at least two, or at least three, or at least four, or at least five, or at least six, or at least seven non-zero values during one display frame.

The display device may comprise a pulse current source configured to generate an analogue drive current pulse which varies in amplitude during one display frame.

The display device may comprise a multiplexer configured to provide separate drive currents to a plurality of LEDs.

The device may be an illumination device, such as a hyperspectral light source.

A plurality of variable-wavelength LEDs ("tuneable" LEDs) may be provided in an array to form a display device. Each variable-wavelength LED is preferably arranged to form a pixel (or a subpixel) of the display device. The pixels of the display device may each be configured to receive their own driving current from a pulse current source which is configured to generate current pulses (either a series of digital pulses having discrete amplitudes, or analogue pulses which vary in amplitude). The driving current provided to each pixel is preferably controllable independently from that applied to the other pixels. The pulse current source may be configured to provide pulses of driving current to a multiplexer which is connected to the individual pixels in the display device.

The current pulses can be designed for two main applications:

To accurately represent the spectrum of the image being recreated by the display device; or.

To correct for non-uniformity in LED performance which results from the manufacturing process, by adjusting the current pulse for each LED pixel or sub pixel such that they all emit identical emission wavelength and intensity across the entire display. The tuned display would then be driven with the adjusted current pulses with the emission from two or more sub pixels combining to produce the perceived colour for each pixel.

An aspect of the invention may provide a display device formed of a light emitting diode which preferably includes a porous semiconductor material, wherein each pixel is comprised of a number of sub-pixels; wherein the peak emission wavelength of each sub-pixel is dependent on drive current density; and where the peak emission wavelength of at least one sub-pixel is intentionally not fixed during operation.

The peak emission wavelength of the at least one subpixel which has a peak emission not fixed during operation is preferably controllable by varying the drive current density provided to that subpixel during operation.

There may be provided a display device formed of a light emitting diode which includes a porous semiconductor material, wherein each pixel is comprised of a number of sub-pixels; wherein each subpixel has the same diode structure; and wherein the display device is configured to provide a drive current density separately to each subpixel; and in which the peak emission wavelength of each subpixel is controllable independently by varying the drive current density provided to the subpixels.

Each subpixel may consist of an LED formed over a porous region of semiconductor material.

Each LED subpixel is configured to receive a power supply, and at least one sub pixel is a variable-wavelength subpixel, the peak emission wavelength of which is controllable over an emission wavelength range by varying the power supply.

The peak emission wavelength of the variable-wavelength subpixel is preferably controllable over an emission wavelength range by varying the current density of the power supply, or by varying the power density of the power supply.

The peak emission wavelength of the variable-wavelength subpixel is preferably controllable over an emission wavelength range of at least 40 nm, or at least 50 nm, or at least 60 nm, or at least 70 nm, or at least 80 nm by varying the power supply, preferably over a range of up to 100 nm or 110 nm or 120 nm or 140 nm, or 160 nm, or 180 nm, or 200 nm.

In a preferred embodiment, each subpixel preferably has the same diode structure, and only the drive current density is used to control the peak wavelength of emission from each subpixel.

Preferably at least one of the subpixels is operable in a plurality of modes, the subpixel being configured to emit at a discrete peak emission wavelength in each of the plurality of modes. Preferably in each mode the subpixel is driven at a different current density, causing the subpixel to emit at different peak wavelengths in different modes.

The mode of the subpixel is preferably dynamically variable during operation of the display device.

Each of the subpixels in the display device is preferably a variable-wavelength subpixel.

The display device may be configured to alter the emission peak wavelengths of the or each variable-wavelength subpixels at regular time intervals. For example the display device may be configured to rotate, or to swap, the emission wavelengths of the subpixels at regular time intervals, in order to distribute heating of sub-pixels caused by high current-density emission wavelengths. The time interval may be a display frame or shorter.

The display device may be configured to alter the emission wavelengths of the subpixels by altering the driving current applied to the subpixels at regular intervals.

The display device may comprise a plurality of sub-pixels configured to emit at a peak wavelength within the same colour, in which the plurality of subpixels are configured to emit at different peak wavelengths within that colour. In a preferred embodiment, the device may comprise four subpixels, two of which are pixels configured to emit at a peak wavelength within the same colour. The plurality of sub-pixels configured to emit at a peak wavelength within the same colour preferably have identical diode structures, and the device is configured to drive them at different current densities to produce different peak emission wavelengths.

The display device may comprise a plurality of variable-wavelength subpixels configured to emit at different peak emission wavelengths in response to different applied current densities.

Preferably at least one subpixel is controllable to emit at peak wavelengths over the range of 450 nm to 530 nm. Preferably the peak emission wavelength of the variable-wavelength subpixel is controllable in the range 450 nm to 630 nm or wider.

Optionally at least one subpixel is configured to be driven at a single current density, and thus to emit at a single peak wavelength. This subpixel may preferably be configured to emit red light at a single peak wavelength.

The display device preferably comprises a plurality of variable-wavelength subpixels configured to emit at different peak emission wavelengths in response to different applied current densities, in which each of the plurality of variable-wavelength subpixels is controllable to emit at peak wavelengths across a wavelength range.

Each variable-wavelength subpixel may preferably have a peak emission wavelength controllable in the range 450 nm to 630 nm or wider. The display device may be configured to vary the current density provided to each of the variable-wavelength subpixels so that varying the current density across a continuous range of current densities varies the peak emission wavelengths across a continuous wavelength range of 450 nm to 630 nm or wider.

Each of the variable-wavelength subpixels may be configured to emit across a wavelength range above or below a central wavelength of the subpixel, preferably a wavelength range of 20 nm or more lower or higher than the central wavelength. Each variable-wavelength subpixel in a pixel of the display device may optionally have a different central wavelength.

The display device may comprise a first subpixel configured to emit at peak emission wavelengths from 430 nm to 480 nm; and/or a second subpixel configured to emit at peak emission wavelengths from 500 nm to 540 nm; and/or a third subpixel configured to emit at peak emission wavelengths from 580 nm to 620 nm.

By incorporating variable-wavelength LEDs into a display device, the effective colour gamut of the display may advantageously be greater than that which could be achieved by operating each sub-pixel with a fixed peak emission wavelength.

The number of sub-pixels in a pixel of the display device may be less than three, and preferably less than two. One or more sub-pixels may have a fixed peak emission wavelength.

The drive current density dependent shift in peak emission wavelength of the variable-wavelength subpixel is preferably greater than 20 nm/decade.

The peak emission wavelengths used to display a particular chromaticity point may be chosen as those giving the most efficient overall operation of the display.

Preferably each subpixel has the same diode structure, and the peak emission wavelengths of the subpixels are controlled by supplying different current densities to the different subpixels.

Contact Pad Ratio

The variable-wavelength LED of the first aspect enables the same LED diode structure to emit at a range of different peak emission wavelengths under different current densities. While a key advantage of this is that a single variable-wavelength LED may be controlled to emit at a variety of different emission wavelengths, the inventors have realised that this invention may also be harnessed to provide a variety of fixed-emission-wavelength LEDs using the same semiconductor materials and diode structures. Thus instead of varying the current density provided to the LEDs by varying the drive current during use, the current density experienced by a given LED may instead be set by fixing the magnitude of the drive current to that LED, and controlling the area of that LED which experiences the drive current.

Some or all of the variable-wavelength LEDs in the display device may thus be configured to receive a fixed-magnitude (i.e. non-variable) driving current which is either on or off. When the fixed driving current is on, those variable-wavelength LEDs will behave as conventional LEDs, and emit at a single peak emission wavelength determined by current density resulting from the fixed driving current and the area of the LED experiencing the drive current. Thus variable-wavelength LEDs may be used as fixed-emission-wavelength LEDs in the display device. The drive current provided to some or all subpixels may be the same, with only differences in LED area and electrical contact area creating the difference in the driving current densities experienced by different subpixels. By providing separate LEDs which experience different current densities, multiple LEDs having the same diode structure can be used to emit at different peak emission wavelengths. This may advantageously eliminate the need to combine separate semiconductor materials systems to achieve different emission colours, significantly simplifying the process of display device fabrication.

The display device may comprise a plurality of variable-wavelength LED subpixels configured to emit at different peak emission wavelengths. The device may comprise a first subpixel comprising a first light-emitting layer having a first light-emitting area $A_1$, and a first electrical contact which contacts the first subpixel over a first contact area, the first electrical contact being configured to apply a driving current to the first subpixel. The first subpixel may have a first contact ratio defined by the ratio of the first contact area:first light-emitting area $A_1$. The device may further comprise a second subpixel comprising a second light-emitting layer having a second light-emitting area $A_2$, and a second electrical contact which contacts the second subpixel over a second contact area, the second electrical contact being configured to apply a driving current to the second subpixel. The second subpixel may have a second contact ratio defined by the ratio of the second contact area:second light-emitting area $A_2$. The first contact ratio is preferably different from the second contact ratio, so that the two subpixels are configured to emit at different peak wavelengths in response to the same driving current.

Each of the variable-wavelength LEDs is a variable-wavelength LED as described above in relation to the first aspect of the invention.

The display device preferably comprises a porous region of semiconductor material, preferably a porous region of III-nitride semiconductor material. The first and/or second subpixels are preferably formed over the porous region.

The display device may comprise a plurality of pixels, with each pixel of the display device comprising a first subpixel and a second subpixel as defined above.

Preferred embodiments may provide a display device comprising at least two LED subpixels, each subpixel having a light-emitting layer with a light-emitting area, and an electrical contact in contact with the subpixel over a contact area, in which each subpixel has a contact ratio determined by the ratio of the contact area to the light-emitting area for that subpixel, and in which at least two subpixels do not have the same contact ratio.

The at least two subpixels having different contact ratios are preferably configured to emit at different peak emission wavelengths under the same driving current.

The light-emitting area $A_i$ of the subpixels is the active light emitting area of the subpixel if viewed from above. This may be referred to as the mesa area of a subpixel, as LED subpixels are typically formed as mesas with vertical sidewalls, as is known in the art. The light-emitting area is the area of the light emitting layer that is electrically activated when a driving current is applied to the subpixels.

In traditional LED devices the shift in emission wavelengths produced by an LED device as a function of changes to the drive current is minimal, but by providing LEDs over a porous III-nitride template the present inventors have found that the wavelength shift can be broadened and controlled to a greater extent than traditional LED materials. This is discussed in greater detail in relation to the first aspect of the invention.

This will allow multiple subpixels to be combined together on the same wafer, reducing the number of mass transfer operations required in order to produce a display. In particular, multiple subpixels may be formed by etching a single LED diode structure into discrete subpixel mesas. When this is done, the discrete mesas each have the same diode structure. By processing the LED subpixel mesas into a display device using the present invention, however, these subpixel mesas may be made to emit at different peak emission wavelengths despite being formed from the same semiconductor materials and the same diode structure.

As the drive current density experienced by a given LED, or LED subpixel, is determined by both the absolute drive current (the magnitude of the drive current) and the area of the LED through which the current passes, the present inventors have found that drive current density experienced by the LED can be manipulated by controlling the contact area over which an electrical contact provides driving current to the diode structure of an LED.

In particular, the present inventors have found that by controlling the "contact ratio"—the ratio of the contact area to the light-emitting area of a given subpixel—the peak emission wavelength of a subpixel in response to any given driving current may be altered.

By varying the contact ratio, separate LED subpixels having different areas but otherwise identical diode structures (identical layered LED structures of n-type layer(s), active layers and p-type layers, formed from identical materials) will thus emit different peak emission wavelengths in response to the same absolute drive current.

The contact ratio of each subpixel determines the peak emission wavelength emitted in response to the driving current. Thus when the first and second subpixels have different contact ratios, this means that the first and second subpixels are configured to emit at different peak emission wavelengths in response to the same driving current.

The first subpixel may be configured to emit at a first peak emission wavelength in response to a driving current having a first magnitude, and the second subpixel may be configured to emit at a second peak emission wavelength different from the first peak emission wavelength in response to a driving current having the first magnitude. The difference in emission wavelengths may be entirely down to the difference between the first and second contact ratios.

The first LED subpixel has a diode structure, and preferably the second LED subpixel has the same diode structure.

The light-emitting area $A_i$ is the area of the light-emitting region when viewed from above. The light-emitting area is preferably arranged to extend over, or span, the entire subpixel diode structure, so that the light-emitting area is the same as the subpixel area when viewed from above.

The first subpixel and the second subpixel are preferably formed from identical semiconductor materials. Particularly preferably the first and second subpixels are formed from the same LED structure, for example by etching the LED structure to form first and second subpixel mesas. In such a case, the layer structure and materials of the different subpixels are identical, so that any differences in emission wavelength are governed solely by driving currents and/or differences in contact ratios between the electrical contacts and respective subpixels.

Both subpixels preferably comprise light-emitting regions comprising InGaN semiconductor material.

The first and second contact areas are the surface areas over which the first and second contacts are in contact with the first and second subpixels, respectively.

In some preferred embodiments, the first light-emitting area $A_1$ is the same size as the second light-emitting area $A_2$. In order for the first and second subpixels to have differing contact ratios, the first contact area is different from the second contact area.

In alternative embodiments, the first light-emitting area $A_1$ is a different size to the second light-emitting area $A_2$. The first contact area may be the same size as the second contact area, or alternatively the contact areas may be different. As long as the first and second contact ratios are not the same, the two subpixels will emit at different peak wavelengths in response to the same driving current.

The different first and second contact areas are configured to convert driving currents having the same magnitude into different current densities at the first and second subpixels.

The first subpixel may receive a first current density through the first contact area in response to a driving current having a first magnitude, while the second subpixel receives a second current density through the second contact area in response to a driving current having the first magnitude. If the first and second contact areas are different, the second current density will be different from the first current density.

The contact ratio is defined by the ratio of contact area:light-emitting area (contact area/light-emitting area).

The lower the contact ratio (the smaller the contact area relative to the light-emitting area), the shorter the peak emission wavelength of that subpixel in response to a given driving current.

The higher the contact ratio (the larger the contact area relative to the light-emitting area), the longer the peak emission wavelength of that subpixel in response to a given driving current.

In some embodiments, the first contact area is smaller than the second contact area, such that a driving current having a first magnitude applied to the first subpixel via the first electrical contact is driven through a smaller contact area than the same driving current applied to the second subpixel via the second electrical contact, such that the first subpixel receives a first current density higher than a second current density received by the second subpixel.

The first subpixel may be configured to emit at a first peak emission wavelength shorter than a second peak emission wavelength emitted by the second subpixel in response to a driving current having the first magnitude. Thus the same absolute driving current may be applied to both subpixels, but the different contact ratios of the two subpixels will cause the two subpixels to emit at different peak wavelengths.

The contact areas of the electrical contacts on the subpixels may be controlled by varying the size of the electrical contacts. Alternatively, masking (passivation) layers may be provided over the subpixels, the masking layers comprising apertures through which the electrical contacts contact the subpixels. The size of the aperture in the masking layer may thus determine the contact area between the electrical contact and its subpixel. The masking layers advantageously function as current constraining layers which constrain current density.

The first subpixel may comprise a first masking layer, the first masking layer comprising a first aperture through which the first electrical contact is in contact with the first subpixel, such that the first aperture defines the first contact area.

The second subpixel may comprise a second masking layer, the second masking layer comprising a second aperture through which the second electrical contact is in contact with the second subpixel, such that the second aperture defines the second contact area.

The first and/or second electrical contact may be a p-type electrical contact, or an n-type electrical contact.

In some embodiments, the first electrical contact may be in contact with the p-doped portion of the first subpixel diode structure, and the second electrical contact may be in contact with the p-doped portion of the second subpixel diode structure.

In other embodiments, the first electrical contact may be in contact with the n-doped portion of the first subpixel diode structure, and the second electrical contact may be in contact with the n-doped portion of the second subpixel diode structure.

The present invention is not limited to only two subpixels. The display device may comprise a plurality of subpixels each having different contact ratios.

The display device may comprise a plurality of subpixels having the first contact ratio, a plurality of subpixels having the second contact ratio, and optionally a plurality of subpixels having a third contact ratio. In response to a standard driving current having a set magnitude, the different contact ratios of the subpixels may thus cause the subpixels to emit at different wavelengths corresponding to their contact ratio.

The display device may comprise a third subpixel comprising a third light-emitting layer having a third light-emitting area $A_1$;

a third electrical contact which contacts the third subpixel over a third contact area, the third electrical contact being configured to apply a driving current to the third subpixel;

in which the third subpixel has a third contact ratio defined by the ratio of the third contact area:third light-emitting area $A_1$. The third contact ratio is preferably different from the first and second contact ratios.

In response to the same driving current, the third subpixel may thus emit light at a third peak emission wavelength different from the first and second peak wavelengths, in response to a driving current having the first magnitude.

In a particularly preferred embodiment, the first, second and third subpixels are configured to emit at red, green and blue wavelengths in response to the same driving current. The display device may thus be a red-green-blue (RGB) display device.

The display device may comprise a plurality of pixels. Each pixel may comprise two or more subpixels, preferably three or more subpixels.

The first subpixel and the second subpixel may be positioned on a shared n-type conductive layer of semiconductor material.

The display device according may comprise driver circuitry configured to control the drive current provided to each subpixel in the display device.

The first light-emitting area and the second light-emitting area are preferably footprints of the first and second light-emitting layers over the porous region. In preferred embodiments, the first and second subpixels may be formed entirely over the porous region of the display device.

The first and/or second and/or third electrical contacts may comprise titanium, platinum, chromium, aluminum, nickel, gold, or indium tin oxide (ITO), or any other material known in the art to provide suitable electrical contacts on semiconductor devices.

Contact Ratio Between Different Subpixel Colours

Depending on the size (area) of the subpixels compared to the contact areas, the inventors have found that the distance which the current spreads outwards from an electrical contact is much more reliant on contact area than on the total LED mesa area. For LEDs in which the contact area is much smaller than the area of the LED, for example, current spreading may be limited to a relatively small area around the electrical contact regardless of the overall size of the LED mesa, so increasing the mesa area further would not affect the peak emission wavelength. The inventors have thus appreciated that the differences in applied current densities may more appropriately be defined by reference to the ratio of contact areas between different LEDs, or different LED subpixels.

In an aspect of the present invention, there may be provided a display device comprising a plurality of LED subpixels configured to emit at different peak emission wavelengths. The device may comprise:

a first subpixel, and a first electrical contact which contacts the first subpixel over a first contact area $AC_1$, the first electrical contact being configured to apply a driving current to the first subpixel;

a second subpixel, and a second electrical contact which contacts the second subpixel over a second contact area $AC_2$, the second electrical contact being configured to apply a driving current to the second subpixel.

The LED subpixels configured to emit at different peak emission wavelengths are preferably variable-wavelength LEDs according to the first aspect described above.

The first contact area $AC_1$ may be different in size to the second contact area $AC_2$. The device may have a colour contact ratio defined by the ratio of the first contact area $AC_1$ to the second contact area $AC_2$.

When the same driving current I is provided to both subpixels, the colour contact ratio determines the relationship between the different current densities J experienced by the two subpixels. The subpixel with the smaller contact area will experience a higher current density J from the same driving current I, than the subpixel with the larger contact area.

Current density experienced by a subpixel is defined by:
$J=I/AC$ (contact area)

So if a fixed driving current I is provided to two subpixels through two electrical contacts having different contact areas $AC_1$ and $AC_2$, the difference in contact areas is $\Delta AC=AC_1-AC_2$, and the difference in current densities experienced by the two subpixels is $\Delta J=1/\Delta AC$.

The current density required for a subpixel to emit at a desired peak emission wavelength is known, or can be easily found by conventional calibration techniques.

In order to provide two subpixels emitting at two desired peak emission wavelengths, the two required current densities J are thus known, and the $\Delta J$ can be calculated. From this, the $\Delta AC$ between the first and second contact areas can be found.

The ratio of contact areas required to result in different colours is also fixed.

In a preferred embodiment, the display device comprises a first subpixel and a first electrical contact which contacts the first subpixel over a first contact area $AC_1$, the first electrical contact being configured to apply a driving current to the first subpixel; and a second subpixel, and a second electrical contact which contacts the second subpixel over a second contact area $AC_2$, the second electrical contact being configured to apply a driving current to the second subpixel. The first contact area $AC_1$ is a different size to the second contact area $AC_2$. The size of the first contact area $AC_1$ is selected so that the first subpixel emits red light when a driving current I is applied through the first contact. The size of the second contact area $AC_2$ is selected so that the second subpixel emits green light when a driving current I is applied through the second contact.

The ratio of the two contact areas may be expressed as $R_{red/green}=AC_1$ (red)/$AC_2$ (green).

As current density and contact area are inversely related by J=I/AC, the ratio $R_{red/green}=AC_1$ (red)/$AC_2$ (green)=$J_2$ (green)/$J_1$ (red).

When I is fixed, Peak wavelength $W_{peak}\sim J\sim 1/AC$

Because J has a specific range over which desired visible wavelengths are emitted by the subpixels, the range of contact areas AC is also limited.

|   | R | Y | G |
|---|---|---|---|
| J | 1~2 | 3~7 | >20 |

However, since the I cannot be limited, the emitted wavelengths are not determined by AC only.

In order to control J within a specific range, AC will change proportionally with the driving current I.

To reduce the I fraction, the ratio of contact area between different colors under the same I may be used to fix the colour relationship between separate subpixels. R=red. Y=yellow. G=green.

| Colour contact ratio - Ratio of contact area between different colour subpixels | |
|---|---|
| $R_{R/R}$ | 1 (as base line) |
| $R_{R/Y}$ | 1.5~7 |
| $R_{R/G}$ | >10 |

In a preferred embodiment, there is provided a display device comprising a plurality of LED subpixels configured to emit at different peak emission wavelengths. The device may comprise:

a first subpixel, and a first electrical contact which contacts the first subpixel over a first contact area $AC_1$, the first electrical contact being configured to apply a driving current to the first subpixel;

a second subpixel, and a second electrical contact which contacts the second subpixel over a second contact area $AC_2$, the second electrical contact being configured to apply a driving current to the second subpixel; and a third subpixel, and a third electrical contact which contacts the third subpixel over a third contact area $AC_3$, the third electrical contact being configured to apply a driving current to the third subpixel.

The first contact area $AC_1$ may be different in size to the second contact area $AC_2$ and the third contact area $AC_3$. The second contact area $AC_2$ may be different in size to the first contact area $AC_1$ and the third contact area $AC_3$. The device may have colour contact ratios defined by the ratio of the first contact area $AC_1$ to the second contact area $AC_2$, and the ratio of the first contact area $AC_1$ to the third contact area $AC_3$.

The first subpixel is preferably a red subpixel. The second subpixel is preferably a green subpixel. The third subpixel is preferably a blue subpixel. The device may have a red/green colour ratio defined by the ratio of the first contact area $AC_1$ to the second contact area $AC_2$, and a red/blue colour ratio defined by the ratio of the first contact area $AC_1$ to the third contact area $AC_3$.

Alternatively the first subpixel may be a red subpixel, the second subpixel may be a yellow subpixel, and the third subpixel may be a green subpixel. The device may have a red/yellow colour ratio defined by the ratio of the first contact area $AC_1$ to the second contact area $AC_2$, and a red/green colour ratio defined by the ratio of the first contact area $AC_1$ to the third contact area $AC_3$. The red/yellow colour ratio is preferably between 1.5:1 and 7:1. The red/green colour ratio is preferably at least 10:1.

$$// J = I / AC \rightarrow R_{1/2} = AC_1 / AC_2 = J2 / J1 \text{ (under same current injection)}$$

In use, the display device is preferably controlled by supplying a fixed drive current I to all of the subpixels in the display device. As all subpixels receive the same magnitude of drive current, the drive current density experienced by the different subpixels will differ primarily based on the respective contact areas. When the same driving current I is provided to both subpixels, the colour contact ratio determines the relationship between the different current densities J experienced by the two subpixels.

A method of manufacturing this display may comprise the steps of: forming, on a first subpixel, a first electrical contact which contacts the first subpixel over a first contact area $AC_1$; and forming, on a second subpixel, a second electrical contact which contacts the second subpixel over a second contact area $AC_2$. The first contact area $AC_1$ is preferably different in size to the second contact area $AC_2$.

The method may comprise the step of forming first and second variable-wavelength LED subpixels according to the first aspect described above.

The ratio of the first contact area $AC_1$ to the second contact area $AC_2$ defines a colour contact ratio of the device.

The current density required for a subpixel to emit at a desired peak emission wavelength is known, or can be easily found by conventional calibration techniques.

In order to provide two subpixels emitting at two desired peak emission wavelengths, the two required current densities J are thus known, and the required $\Delta J$ between the two subpixels can be calculated. From this, the $\Delta$ AC between the first and second contact areas can be found.

The ratio of contact areas required to result in different colours is also fixed, to fix the colour relationship between separate subpixels. R=red. Y=yellow. G=green.

As discussed above, the contact area for a red pixel is formed to be at least 10 times larger than the contact area for a green pixel. The contact area for a red pixel is formed to be around 1.5-7 times larger than the contact area for a yellow pixel.

In a preferred embodiment, The first contact area $AC_1$ is formed to be a different size to the second contact area $AC_2$. The size of the first contact area $AC_1$ is selected so that the first subpixel emits red light when a driving current I is applied through the first contact. The size of the second contact area $AC_2$ is selected so that the second subpixel emits green light when a driving current I is applied through the second contact. In this embodiment, $AC_1$ is formed to be at least 10 times the area of $AC_2$.

The ratio of the two contact areas may be expressed as $R_{red/green}=AC_1$ (red)/$AC_2$ (green).

In a preferred embodiment, the method of manufacturing a display device comprises the steps of forming:

a first subpixel, and a first electrical contact which contacts the first subpixel over a first contact area $AC_1$, the first electrical contact being configured to apply a driving current to the first subpixel;

a second subpixel, and a second electrical contact which contacts the second subpixel over a second contact area $AC_2$, the second electrical contact being configured to apply a driving current to the second subpixel; and a third subpixel, and a third electrical contact which contacts the third subpixel over a third contact area $AC_3$, the third electrical contact being configured to apply a driving current to the third subpixel.

All of the subpixels in the device are preferably formed with the same LED diode structure.

The first contact area $AC_1$ is preferably different in size to the second contact area $AC_2$ and the third contact area $AC_3$. The second contact area $AC_2$ is preferably different in size to the first contact area $AC_1$ and the third contact area $AC_3$. The device may have colour contact ratios defined by the ratio of the first contact area $AC_1$ to the second contact area $AC_2$, and the ratio of the first contact area $AC_1$ to the third contact area $AC_3$. If the three contact areas are different in size and the subpixels have the same variable-wavelength LED diode structure, then the three subpixels will emit different peak wavelengths in response to the same magnitude of driving current.

The first subpixel is preferably a red subpixel. The second subpixel is preferably a green subpixel. The third subpixel is preferably a blue subpixel. The device may have a red/green colour ratio defined by the ratio of the first contact area $AC_1$ to the second contact area $AC_2$, and a red/blue colour ratio defined by the ratio of the first contact area $AC_1$ to the third contact area $AC_3$.

Alternatively the first subpixel may be a red subpixel, the second subpixel may be a yellow subpixel, and the third subpixel may be a green subpixel. The device may have a red/yellow colour ratio defined by the ratio of the first contact area $AC_1$ to the second contact area $AC_2$, and a red/green colour ratio defined by the ratio of the first contact area $AC_1$ to the third contact area $AC_3$. The red/yellow colour ratio is preferably between 1.5:1 and 7:1. The red/green colour ratio is preferably at least 10:1.

Pixel Size and Geometry

In an aspect of the invention there is provided a display device comprising a light emitting diode (LED) which preferably includes a porous semiconductor material. The device may comprise a pixel comprising a plurality of subpixels each having a light-emitting layer. A first subpixel has a first light-emitting layer having a first area $A_1$, and a second subpixel has a second light-emitting layer having a second area $A_2$ different from the first area $A_1$. The first subpixel is configured to emit at a first peak wavelength, and the second subpixel is configured to emit at a second peak wavelength different from the first peak wavelength.

The term "display device" may be substituted for "LED device" throughout this document.

The area A of the subpixels is the area is the active light emitting area of the subpixel if viewed from above. This be referred to as the mesa area of a subpixel, as LED subpixels are formed as mesas with vertical sidewalls, as is known in the art. This area is the area of the light emitting layer that is electrically activated when a driving current is applied to the subpixels.

In the present invention, a display device may thus comprise a plurality of LED subpixels having different relative areas, which emit at different emission wavelengths in response to the same driving current.

The present invention may relate to a display in which the emission colour of a subpixel is controlled by the total area of the subpixel.

In traditional LED devices the shift in emission wavelengths produced by an LED device as a function of changes to the drive current is minimal, but by providing LEDs over a porous III-nitride template the present inventors have found that the wavelength shift can be broadened and controlled to a greater extent than traditional LED materials.

This will allow multiple sub pixels to be combined together, reducing the number of mass transfer operations required in order to produce a display.

Geometry of the LEDs can be chosen to achieve multiple different outcomes such as specified Peak wavelengths of multiple LEDs at a given Current, specified emission Intensities at a given Wavelength, specified luminosity at a given wavelength.

By providing LEDs over a porous template of III-nitride material, variable-wavelength LEDs having a continuous correlation between peak emission wavelength and drive current may be provided, as described above.

As the drive current density experienced by a given LED, or LED subpixel, is determined by both the absolute drive current and the area of the LED through which the current passes, the drive current density experienced by the LED can be manipulated by controlling the area, or size, of the LEDs.

Separate LEDs having different areas but otherwise identical diode structures (identical layered LED structures of n-type layer(s), active layers and p-type layers) will thus emit different peak emission wavelengths in response to the same magnitude of drive current.

In the present display device, at least one subpixel may be a variable-wavelength subpixel, and the display device may be configured to provide a variable drive current to the variable-wavelength subpixel, such that the variable-wavelength subpixel emits at different peak emission wavelengths in response to different drive currents.

In a preferred embodiment, the first subpixel is a variable-wavelength subpixel configured to emit at the first peak emission wavelength in response to a first drive current applied to the first subpixel, and to emit at a third peak emission wavelength in response to a third drive current applied to the first subpixel.

Likewise, the second subpixel may be a variable-wavelength subpixel configured to emit at the second peak emission wavelength in response to a second drive current applied to the second subpixel, and to emit at a fourth peak emission wavelength in response to a fourth drive current applied to the second subpixel.

The present inventors have found that growing the n-doped portion, light emitting region and p-doped portion of an LED over a porous region of III-nitride material advantageously enables the same LED to emit at a range of peak emission wavelengths, rather than at one specific wavelength. The peak emission wavelength of the LED may be varied across an emission wavelength range by varying the power supply provided to the LED. The present invention may therefore comprise a variable-wavelength LED, which may be controlled to emit at any wavelength across a continuous emission wavelength range.

Individual variable-wavelength LED subpixels may be provided as part of a pixel containing multiple subpixels. LED subpixels are equivalent to standalone LED devices, as each subpixel may be controlled separately.

The structure and properties of the variable-wavelength LED subpixels are described above in relation to the first aspect.

The display device may be configured to provide the same fixed drive current I to both the first and second subpixels.

The display device may be configured to provide a first drive current $I_1$ to the first subpixel, and to provide a second drive current $I_2$ to the second subpixel, the second drive current having a different magnitude to the first drive current.

The first subpixel may have a first geometry or shape, and the second subpixel may have a second geometry or shape. The first geometry or shape may be different from the second geometry or shape, or alternatively the first and second geometries or shapes may be the same.

In one preferred embodiment, the first subpixel is circular in shape, and the second subpixel is formed as a ring arranged concentrically around the circular first subpixel.

Preferably the first subpixel and the second subpixel have the same diode structure. The emission characteristics of the subpixels may thus vary as a result not of the diode layer structure, but as a result of differences in subpixel shapes and sizes, and differences in drive currents applied to the subpixels.

The display device may comprise a plurality of pixels. Each pixel may comprise two or more subpixels, preferably three or more subpixels.

The first subpixel and the second subpixel may be positioned on a shared n-type conductive layer of semiconductor material.

The display device according may comprise driver circuitry configured to control the drive current provided to each subpixel in the display device.

The first subpixel may be configured to emit at a first emission intensity at the first peak wavelength in response to a first drive current applied to the first subpixel, and/or the second subpixel may be configured to emit at a second emission intensity at the second peak wavelength in response to a second drive current applied to the second subpixel.

The first subpixel may be configured to emit at a first luminosity at the first peak wavelength in response to a first drive current applied to the first subpixel, and/or the second subpixel may be configured to emit at a second luminosity at the second peak wavelength in response to a second drive current applied to the second subpixel.

The first area $A_1$ of the first light-emitting layer may be larger than the second area $A_2$ of the second light-emitting area, or the first area $A_1$ of the first light-emitting layer may be smaller than the second area $A_2$ of the second light-emitting area.

The first area $A_1$ of the first light-emitting layer may have a different shape than the second area $A_2$ of the second light-emitting area.

The first area and the second area are preferably footprints of the first and second light-emitting layers over the porous region. In preferred embodiments, the first and second subpixels may be formed entirely over a porous region of the display device.

Method of Controlling an LED Display Device

In a further aspect there is provided a method of controlling an LED display device.

The method may comprise the steps of separately controlling the power supply to each of the plurality of LEDs (which may be LED subpixels) in the LED display, so that the peak emission wavelength of each LED is controlled to emit at a desired peak emission wavelength within its emission wavelength range.

Each LED, or LED subpixel, in the display may preferably be controlled as described above in relation to the preceding aspects.

The method may comprise the step of providing a first driving condition to a first group of LEDs, so that the first group of LEDs all emit light at a first wavelength, and providing a second driving condition to a second group of LEDs, so that the second group of LEDs all emits at a second wavelength.

The method may comprise the steps of controlling the power supply to a first variable-wavelength LED (for example an LED subpixel) so that the first variable-wavelength LED emits at a first peak emission wavelength within a first emission wavelength range, and controlling the power supply to a second variable-wavelength LED so that the second variable-wavelength LED emits at a second peak emission wavelength. The second peak emission wavelength may be a wavelength within the first emission wavelength range, or within a second emission wavelength range.

The method may comprise the steps of controlling the power supply to a first plurality of variable-wavelength LEDs in the LED display so that the first plurality of LEDs emit at a peak emission wavelength within a first emission wavelength range, and controlling the power supply to at least one further LED to emit at a peak emission wavelength outside the first emission wavelength range. For example the plurality of variable-wavelength LEDs may be green-red LEDs capable of emitting at wavelengths between green and red, while the further LED may be a blue LED for emitting blue light that is not achievable by the variable-wavelength LEDs alone.

The method may comprise the step of providing different power supplies to the plurality of variable-wavelength LEDs, so that the plurality of variable-wavelength LEDs emit at different peak emission wavelengths within the first emission wavelength range.

The method may comprise the step of providing power to some or all of the first plurality of variable-wavelength LEDs to emit at a first peak emission wavelength in order to provide a desired emission intensity at the first peak emission wavelength. As the intensity of the emitted light depends on the power supplied to the LED, longer-wavelengths will be emitted at lower intensities than shorter wavelengths. By operating some or all of the plurality of LEDs at the same wavelength, the overall intensity of the emitted light may be controlled.

In a particularly preferred embodiment, the method may comprise the step of providing power to the plurality of variable-wavelength LEDs so that they emit at peak emission wavelengths between 560 nm and 680 nm, or between 570 nm and 675 nm, and providing power to at least one further LED so that it emits at a peak emission wavelength below 560 nm, preferably below 500 nm.

The method may comprise altering the emission wavelengths of the LEDs by altering the driving current applied to the LEDs at regular intervals.

The method may comprise the step of rotating, or swapping, the emission wavelengths of the LEDs or LED subpixels at regular time intervals, in order to distribute heating of sub-pixels caused by high current-density emission wavelengths.

In a further aspect of the present invention there is provided a method of controlling a display device comprising a variable-wavelength LED, the method comprising the steps of: providing a drive current to the variable-wavelength LED; and varying the amplitude of the drive current between a plurality of non-zero values during a single display frame so that the variable-wavelength LED produces a plurality of peak emission wavelengths within a single display frame.

Varying the amplitude of the drive current between a plurality of non-zero values during a single display frame produces a plurality of peak emission wavelengths from the variable-wavelength LED within the duration of the display frame, such that a temporal combination of the plurality of peak emission wavelengths reproduces the light spectrum.

This may advantageously allow a viewer to perceive that a particular light spectrum is being emitted by an LED, or by a plurality of LEDs, where that light spectrum would not usually be emittable by an LED. For example the temporal combination of the plurality of peak emission wavelength may produce a particular colour of light which does not correspond to an emission bandgap of a known semiconductor material. Using this method, the range of colours that LEDs can be perceived to emit is therefore greatly expanded.

The duration of a display frame may be 50 ms or less, or 45 ms or less, or 40 ms or less. The duration of the display frame is preferably less than or equal to the response time of a detector. The duration of the display frame is preferably less than or equal to the response time of ~50 ms for the human eye as a detector.

The method may comprise providing a first drive current to the variable-wavelength LED; and varying the amplitude of the first drive current between a plurality of non-zero values during a single display frame so that the variable-wavelength LED produces a plurality of peak emission wavelengths within a single display frame, and providing a second drive current to a second variable-wavelength LED; and varying the amplitude of the second drive current between a plurality of non-zero values during a single display frame so that the second variable-wavelength LED produces a plurality of peak emission wavelengths within a single display frame.

A display device may comprise a plurality of variable-wavelength LEDs, and the method may preferably comprise providing separate drive currents to each LED. The magnitudes and durations of drive currents provided to separate LEDs may differ, so that separate LEDs emit separate emission spectra during the same display frame.

Each variable-wavelength LED in a multiple-LED display device is preferably controllable to reproduce a predetermined spectral output corresponding to the temporal combination of a plurality of peak emission wavelengths emitted during the display frame.

The variable-wavelength LED is preferably a variable-wavelength LED as described above according to a preceding aspect of the invention.

The method may comprise the step of varying the amplitude of the drive current during a single display frame by providing a sequence of discrete drive current pulses at discrete amplitudes. The method may comprise the step of varying the drive current between at least two, or at least three, or at least four, or at least five, or at least six, or at least seven non-zero amplitudes during the display frame. The method may comprise the step of the step controlling the brightness of each emitted peak emission wavelength by controlling the duration of each drive current pulse. The method may comprise the step of repeating the sequence of drive current pulses in subsequent display frames.

The method may comprise the step of generating a sequence of drive current pulses having discrete magnitudes and durations, and providing that sequence of drive current pulses to the variable-wavelength LED(s) in the display device.

Alternatively the method may comprise the step of varying the amplitude of the drive current over a continuum of amplitudes during a single display frame.

The method may comprise the step of generating an analogue drive current pulse having a magnitude which varies within the duration of a display frame, and providing that drive current pulse to the variable-wavelength LED(s) in the display device.

The method may comprise controlling a plurality of variable-wavelength LEDs in a display device in order to reproduce a light spectrum.

According to a further aspect of the present invention there is provided a method of controlling a display device comprising first and second variable-wavelength LED subpixels configured to emit at different peak emission wavelengths. As described above, the device may comprise a first subpixel comprising a first light-emitting layer having a first light-emitting area $A_1$, and a first electrical contact which contacts the first subpixel over a first contact area, the first electrical contact being configured to apply a driving current to the first subpixel. The first subpixel may have a first contact ratio defined by the ratio of the first contact area:first light-emitting area $A_1$. The device may further comprise a second subpixel comprising a second light-emitting layer having a second light-emitting area $A_2$, and a second electrical contact which contacts the second subpixel over a second contact area, the second electrical contact being configured to apply a driving current to the second subpixel. The second subpixel may have a second contact ratio defined by the ratio of the second contact area:second light-emitting area $A_2$. The first contact ratio is preferably different from the second contact ratio, so that the two subpixels are configured to emit at different peak wavelengths in response to the same driving current.

The method of controlling such a display device comprises the steps of:

providing a first drive current $I_1$ to the first subpixel, and providing a second drive current $I_2$ to the second subpixel.

The magnitude of the first drive current $I_1$ may be the same as the magnitude of the second drive current $I_2$. The different first and second contact ratios may in this case provide different current densities to the first and second subpixels. $J=I/\Delta \ AC$.

The method may comprise the step of providing a third drive current $I_3$ to a third subpixel having a third contact ratio different from the first and second contact ratios. The magnitude of the third drive current $I_3$ may be the same as the magnitude of the first and second drive currents. The different first, second and third contact ratios may thus provide different current densities to the first, second and third subpixels.

The device may be controlled using variable current injection. Current density J may be controlled as follows:

$$J = \Delta I / A$$

$$J = I / \Delta \ A$$

$$J = \Delta I / \Delta \ A$$

Thus no specific contact areas are required.

According to a further aspect of the present invention there is provided a method of controlling a display device comprising a pixel comprising a plurality of subpixels each having a light-emitting layer, a first subpixel which has a first light-emitting layer having a first area $A_1$, and a second subpixel which has a second light-emitting layer having a second area $A_2$ different from the first area $A_1$. The first subpixel is configured to emit at a first peak wavelength, and the second subpixel is configured to emit at a second peak wavelength different from the first peak wavelength.

The method may comprise the steps of:

providing a first drive current $I_1$ to the first subpixel, and providing a second drive current $I_2$ to the second subpixel.

The magnitude of the first drive current $I_1$ may be the same as the magnitude of the second drive current $I_2$. Alternatively the magnitude of the first drive current $I_1$ may be different from the magnitude of the second drive current $I_2$.

Preferably the first and second drive currents are fixed (i.e. non-varying) in magnitude during use of the display device. The peak emission wavelength of the first and second subpixels will then also be fixed during use. The peak emission wavelengths emitted by the first and second subpixels will be determined by the current densities experienced by the subpixels as a result of the magnitudes of their respective driving currents and the sizes of the subpixel mesas and/or the electrical contacts through which current is supplied to the subpixels.

All of the steps of controlling an LED, or a display device comprising one or more LEDs, may be carried out by a controller which is configured to control the power supply to the LEDs in the device.

The controller may control the power supply to the LEDs in the device in response to a user input. In response to a user input the controller may control the LEDs in the device to operate in a selected mode. For example the controller may control one or more LEDs in the display device to operate in fixed-wavelength emission mode, by providing a fixed-magnitude driving current to the LED, the magnitude of the fixed driving current corresponding to the wavelength to be emitted. And/or the controller may control one or more LEDs in the display device to operate in dynamic variable-wavelength emission mode, by providing a variable-magnitude driving current to the LED, the magnitude of the fixed driving current varying corresponding to the wavelength to be emitted at a given time.

Method of Manufacturing a Display Device

In a further aspect of the present disclosure there is provided a method of manufacturing a display device, comprising the steps of:

forming an LED diode structure into a plurality of discrete LED mesas;

and connecting the LED mesas to a power supply configured to provide a variable power supply to at least some of the plurality of discrete LED mesas.

Preferably the LED diode structure is a variable-wavelength LED manufactured according to the method of the preceding aspect described above.

A variable-wavelength LED diode structure may be manufactured at wafer-scale, for example, and then divided into a plurality of discrete LED mesas. The discrete LED mesas may then form individual LED subpixels of a display device.

This allows multiple subpixels to be combined together on the same wafer, reducing the number of mass transfer operations required in order to produce a display. In particular, multiple subpixels may be formed by etching a single LED diode structure into discrete subpixel mesas. When this is done, the discrete mesas each have the same diode structure. By processing the LED subpixel mesas into a display device using the present invention, however, these subpixel mesas may be made to emit at different peak emission wavelengths despite being formed from the same semiconductor materials and the same diode structure.

The method may comprise forming separate LED mesas having different surface areas.

The method may be a method of manufacturing a display device comprising a plurality of LED subpixels configured to emit at different peak emission wavelengths. The method may comprise the step of depositing a first electrical contact on a first LED subpixel comprising a first light-emitting layer having a first light-emitting area $A_1$, the first electrical contact being in contact with the first subpixel over a first contact area, so that the first subpixel has a first contact ratio defined by the ratio of the first contact area:first light-emitting area $A_1$. The method comprises the further step of depositing a second electrical contact on a second LED subpixel comprising a second light-emitting layer having a second light-emitting area $A_2$, the second electrical contact being in contact with the second subpixel over a second contact area, so that the second subpixel has a second contact ratio defined by the ratio of the second contact area:second light-emitting area $A_2$. The first contact ratio may be different from the second contact ratio.

The method may comprise the step of depositing a first masking layer over the first subpixel before depositing the first electrical contact, forming a first aperture in the first masking layer, and depositing the first electrical contact so that it contacts the first subpixel through the first aperture, and/or depositing a second masking layer over the second subpixel before depositing the second electrical contact, forming a second aperture in the second masking layer, and depositing the second electrical contact so that it contacts the second subpixel through the second aperture. In this embodiment, the area of the first aperture is the first contact area, and/or the area of the second aperture is the second contact area.

The method may comprise the step, prior to depositing the electrical contacts, of etching an LED structure having a diode structure comprising a light-emitting layer, to form a first subpixel mesa having a first light-emitting layer with a first area $A_1$ and a second subpixel mesa having a second light-emitting layer with a second area $A_2$, the first subpixel and the second subpixel having the diode structure of the LED structure. The first and second subpixels may thus be provided with identical diode structures and compositions, as both are formed from the same starting LED structure.

The LED structure may comprise an n-type conductive layer and a porous region below the diode structure, and the etching step preferably does not etch through the n-type conductive layer.

In some embodiments, the first subpixel mesa has the same area as the second subpixel mesa. In other embodiments, the first subpixel mesa does not have the same area as the second subpixel mesa.

In a further aspect there is provided a method of manufacturing an LED display device comprising:

etching an LED structure having a diode structure comprising a light-emitting layer, to form a first subpixel mesa having a first light-emitting layer with a first area $A_1$ and a second subpixel mesa having a second light-emitting layer with a second area $A_2$, the first subpixel and the second subpixel having the diode structure of the LED structure. As the first and second subpixels are etched from the same LED structure, both resulting subpixels will have the same diode structure, and the same compositions.

The LED structure preferably comprises an n-type conductive layer and a porous region below the diode structure. The etching step preferably does not etch through the n-type conductive layer.

The first area is preferably selected to produce a first current density at the first light-emitting layer when a first drive current $I_1$ is applied to the first subpixel, and the second area is preferably selected to produce a second current density at the second light-emitting layer when a second drive current $I_2$ is applied to the second subpixel.

The first area may be selected so that the first subpixel emits at a first emission intensity when a first drive current $I_1$ is applied to the first subpixel. The second area may be selected so that the second subpixel emits at a second emission intensity when a second drive current $I_2$ is applied to the second subpixel.

The first area may be selected so that the first subpixel emits at a first luminosity when a first drive current $I_1$ is applied to the first subpixel. The second area may be selected so that the second subpixel emits at a second luminosity when a second drive current $I_2$ is applied to the second subpixel.

The method may comprise the step of bonding the first and second subpixels to driver circuitry configured to control the drive current provided to each subpixel in the display device.

The method may comprise the additional step of applying a first electrical contact to the first subpixel, the first electrical contact being in contact with the first subpixel over a first contact area. The method may comprise the additional step of applying a second electrical contact to the second subpixel, the second electrical contact being in contact with the second subpixel over a second contact area. As described above, masking layers may be used to control the sizes of the first and/or second contact areas.

Method of Reproducing a Light Spectrum

In many applications it is desirable to be able to reproduce a particular spectrum of light.

In the prior art, this is achieved by:

Modulating the intensity of one or more illumination sources with fixed broad band emission spectra. This is inherently inefficient due to the subtractive nature.

Combining the emission from multiple narrow band emission sources. This provides limited tunability due to the fixed number of emission sources.

Using filters to modify the light from a high power broad spectrum source. This suffers from inherent inefficiency, and limited tunability due to fixed number of tuning elements.

In a further aspect of the present invention there is provided a method of reproducing a light spectrum with a variable-wavelength LED, the method comprising the steps of providing a drive current to the variable-wavelength LED; and varying the amplitude of the drive current between a plurality of non-zero values during a single display frame, in which varying the amplitude of the drive current between a plurality of non-zero values during a single display frame produces a plurality of peak emission wavelengths, such that a temporal combination of the plurality of peak emission wavelengths reproduces the light spectrum.

This may advantageously allow a viewer to perceive that a particular light spectrum is being emitted by an LED, or by a plurality of LEDs, where that light spectrum would not usually be emittable by an LED. For example the temporal combination of the plurality of peak emission wavelength may produce a particular colour of light which does not correspond to an emission bandgap of a known semiconductor material. Using this method, the range of colours that LEDs can be perceived to emit is therefore greatly expanded.

The duration of a display frame may be 50 ms or less, or 45 ms or less, or 40 ms or less. The duration of the display frame is preferably less than or equal to the response time of a detector. The duration of the display frame is preferably less than or equal to the response time of ~50 ms for the human eye as a detector.

Each variable-wavelength LED in a multiple-LED display device is preferably controllable to reproduce a predetermined spectral output corresponding to the temporal combination of a plurality of peak emission wavelengths emitted during the display frame.

The variable-wavelength LED is preferably a variable-wavelength LED as described above according to a preceding aspect of the invention.

The method may comprise the step of varying the amplitude of the drive current during a single display frame by providing a sequence of discrete drive current pulses at discrete amplitudes. The method may comprise the step of varying the drive current between at least two, or at least three, or at least four, or at least five, or at least six, or at least seven non-zero amplitudes during the display frame. The method may comprise the step of the step controlling the brightness of each emitted peak emission wavelength by controlling the duration of each drive current pulse. The method may comprise the step of repeating the sequence of drive current pulses in subsequent display frames.

The method may comprise the step of generating a sequence of drive current pulses having discrete magnitudes and durations, and providing that sequence of drive current pulses to the variable-wavelength LED(s).

Alternatively the method may comprise the step of varying the amplitude of the drive current over a continuum of amplitudes during a single display frame.

The method may comprise the step of generating an analogue drive current pulse having a magnitude which varies within the duration of a display frame, and providing that drive current pulse to the variable-wavelength LED(s).

The method may comprise controlling a plurality of variable-wavelength LEDs in a display device in order to reproduce a light spectrum.

Features described herein in relation to one aspect of the invention are equally applicable to all of the other aspects of the invention.

BRIEF DESCRIPTION OF THE DRAWINGS

Embodiments of the invention will now be described with reference to the figures, in which:

FIG. 21 is a graph of normalised electroluminescence (EL) intensity vs wavelength at different current injections, for the same InGaN LED as FIG. 20 grown over a porous region;

FIG. 22 is an I-V curve measured for InGaN micro-LEDs of different pixel sizes on a non-porous substrate, with the inset image showing yellow emission;

FIG. 40 is a schematic side-on cross-section of a variable-wavelength LED structure according to another preferred embodiment of the present invention;

FIG. 41 is a schematic illustrations of the contact area between a contact layer and a semiconductor layer in an LED diode;

FIG. 42 is a schematic plan view of an electrical contact positioned over an LED subpixel mesa;

FIG. 44 is a schematic side-on cross-section of three subpixels on a shared semiconductor template, having different contact areas and thus different contact ratios;

FIG. 45 is a schematic side-on cross-section of three subpixels on a shared semiconductor template, having different contact areas and thus different contact ratios.

FIGS. 46A-G illustrate alternative embodiments of non-uniform, fragmented or discontinuous light-emitting regions of variable-wavelength LEDs according to the present invention;

FIG. 47A is a TEM image of a cross-section of a conventional non-variable-wavelength LED;

FIG. 47B is a TEM image of the light-emitting region of a variable-wavelength LED comprising v-shaped pits, according to an embodiment of the present invention;

FIG. 48C is a graph of peak emission wavelength vs driving current density for a variable-wavelength LED according to another embodiment of the present invention;

FIG. 49A is a graph of peak emission wavelength vs driving current density for another variable-wavelength LED according to the present invention;

FIG. 51A-C illustrate colour gamuts obtainable with prior art displays and the devices of the present invention;

FIGS. 52A-D illustrate a display pixel according to an embodiment of the present invention and the colour gamuts obtainable with that pixel;

FIG. 58 illustrates a display pixel according to another embodiment of the present invention and the colour gamut obtainable with that pixel;

FIG. 59A illustrates a variable-wavelength display pixel according to an embodiment of the present invention, and FIGS. 59B-60D illustrate driving schemes for controlling the pixel of FIG. 59A;

FIG. 61A illustrates a display pixel according to an embodiment of the present invention, and FIGS. 61B-61C illustrate driving schemes for controlling the pixel of FIG. 61A;

FIG. 62 illustrates a display pixel according to an embodiment of the present invention, and driving schemes for controlling the pixel;

FIG. 63 illustrates a display pixel according to an embodiment of the present invention, and driving schemes for controlling the pixel;

FIG. 66 is a schematic illustration of driving current conditions for a variable-wavelength LED according to Embodiment 2 of the present invention;

FIG. 67 is a schematic illustration of driving current conditions for a variable-wavelength LED according to Embodiment 3 of the present invention;

FIG. 68 is a schematic illustration of driving current conditions for a variable-wavelength LED according to Embodiment 4 of the present invention;

FIG. 69 is a schematic illustration of driving current conditions for a variable-wavelength LED according to Embodiment 5 of the present invention;

FIG. 74 illustrates an exemplary target emission spectrum;

FIG. 75 illustrates the peak emission wavelength emitted by a variable-wavelength LED according to the present invention in response to different drive currents;

FIG. 76 illustrates an exemplary analogue driving current pulse usable in Embodiment B of the present invention;

FIGS. 82A and 82B illustrate an exemplary device pixel comprising two subpixels with the same diode structure but different areas;

The porous template comprises a porous region of III-nitride material on a substrate, with a non-porous layer of III-nitride material arranged over the top surface of the porous region. Optionally there may be further layers of III-nitride material between the substrate and the porous region.

As described in more detail below, the porous region may be provided by epitaxially growing an n-doped region of III-nitride material and then an undoped layer of III-nitride material, and porosifying the n-doped region using the porosification process as set out in international patent applications PCT/GB2017/052895 (published as WO2019/063957) and PCT/GB2019/050213 (published as WO2019/145728).

As described above, this porosification leads to strain relaxation in the crystal lattice, which means that subsequent overgrowth of further semiconductor layers benefit from reduced compressive strain in their lattices.

The porous region may comprise one or more layers one or more III-nitride materials, and may have a range of thicknesses, all while still providing the strain relaxation benefit that shifts the wavelength of InGaN light emitting layers overgrown above the porous region. In preferred embodiments, the porous region may for example comprise GaN and/or InGaN.

Figure 1:
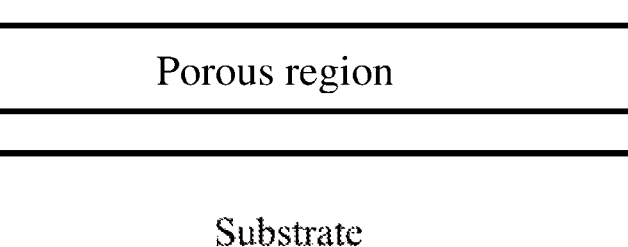
FIG. 1 illustrates a porous template suitable for an LED according to the present invention.

A variety of LED structures may be overgrown over the template illustrated in FIG. 1.

In particular, LED structures containing InGaN light emitting layers, which are known in the art for the manufacture of yellow or green LEDs, may be overgrown on the porous template using standard LED manufacturing steps. When grown on the porous template, however, a LED structure which normally emits at a first wavelength, will emit at a red-shifted longer wavelength.

In this way, the use of a porous region of III-nitride material as a template or pseudo-substrate for overgrowth of known InGaN LED structures allows longer-wavelength LEDs to be manufactured in a straightforward manner.

In a preferred embodiment, a LED according to the present invention comprises the following layers, and may be manufactured using the step by step process described below.

The following description of the LED structure relates to a Top emission architecture being described from the bottom up, but the invention is equally applicable to a bottom emission architecture.

Figure 2:
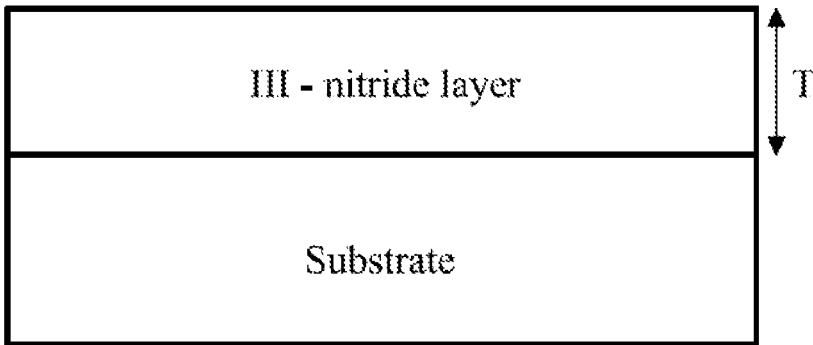
FIGS. 2-18 illustrate the steps of manufacturing an LED according to a preferred embodiment of the present invention.

FIG. 2—Substrate & III-Nitride Layer for Porosification

A compatible substrate is used as a starting surface for epitaxy growth. The substrate may be Silicon, Sapphire, SiC, β-Ga2O3, GaN, glass or metal. The crystal orientation of the substrates can be polar, semi-polar or non-polar orientation. The substrate size may vary from 1 cm$^2$, 2 inch, 4 inch, 6 inch, 8 inch, 12 inch, 16 inch diameters and beyond, and the substrate may have a thickness of greater than 1 μm, for example between 1 μm and 15000 μm.

A layer or stack of layers of III-nitride material is epitaxially grown on the substrate. The III-nitride layer may contain one or a combination of these elements: Al, Ga, In (binary, ternary or quaternary layer).

The thickness T of the III-nitride stack is preferably at least 10 nm, or at least 50 nm, or at least 100 nm, for example between 10-10000 nm.

The III-nitride layer comprises a doped region having an n-type doping concentration between $1 \times 10^{17}$ cm$^{-3}$-$5 \times 10^{20}$ cm$^{-3}$. The III-nitride layer may also comprise an undoped "cap" layer of III-nitride material over the doped region.

The doped region may terminate at the exposed upper surface of the III-nitride layer, in which case the surface of the layer will be porosified during electrochemical etching.

Alternatively, the doped region of the III-nitride material may be covered by an undoped "cap" layer of III-nitride material, so that the doped region is sub-surface in the semiconductor structure. The sub-surface starting depth (d) of the doped region may be between 1-2000 nm for example.

Figure 3:
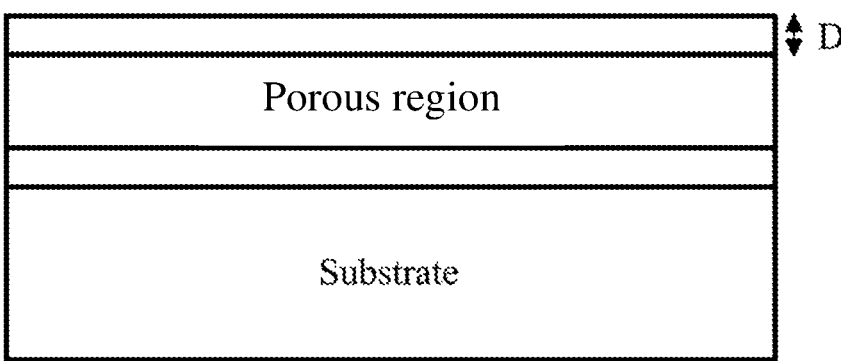

FIG. 3—Porosification to Porous Region

After it is deposited on the substrate, the III-nitride layer (or stack of layers) is porosified with a wafer scale porosification process as set out in international patent applications PCT/GB2017/052895 (published as WO2019/063957) and PCT/GB2019/050213 (published as WO2019/145728). During this process, the doped region of the III-nitride material becomes porous, while any undoped region of III-nitride material does not become porous.

Following the porosification step, the structure therefore contains a porous region which remains where there was previously n-doped III-nitride material, and optionally a non-porous intermediate layer overlying the porous region.

The degree of porosity of the porous region is controlled by the electrochemical etching process and may be between 1%-99% porosity, preferably between 20% to 90% porosity or between 30%-80%, though lesser or greater porosities could also be employed.

The thickness of the porous region following porosification is preferably greater than 1 nm, more preferably greater than 10 nm, particularly preferably at least 40 nm or 50 nm or 100 nm. However, the thickness of material required to obtain the strain relaxation benefit provided by the porous region may vary depending on the type of III-nitride material from which the porous region is made.

The porous region created by the porosification process may be a bulk layer of a III-nitride material having a uniform composition and a uniform porosity throughout the layer. Alternatively the porous region may comprise multiple layers of porous material of different compositions and/or porosities, forming a porous stack of III-nitride material. For example the porous region may be a continuous layer of porous GaN, or a continuous layer of porous InGaN, or a stack comprising one or more layers of porous GaN and/or one or more layers of porous InGaN. The inventors have found that the strain relaxation benefit of the porous region for overgrowth is obtainable across a wide range of porous regions having different thicknesses, compositions, and layered stacks.

In the embodiment illustrated in the Figures, the porous region is a single porous layer.

Where there is an undoped cap layer of III-nitride material over the doped region, the undoped region remains non-porous following through-surface porosification of the doped region below. The thickness D of this non-porous cap layer may preferably be at least 2 nm, or at least 5 nm, or at least 10 nm, preferably 5-3000 nm. Providing an undoped cap layer over the doped region advantageously leads to a non-porous layer of III-nitride material covering the porous region following porosification. This non-porous cap layer may advantageously allow better overgrowth of further material above the porous region.

As the porosification method of PCT/GB2017/052895 (published as WO2019/063957) and PCT/GB2019/050213 (published as WO2019/145728) can be carried out on entire semiconductor wafers, no processing/patterning/treatment is needed to prepare the template for porosification.

Figure 4:
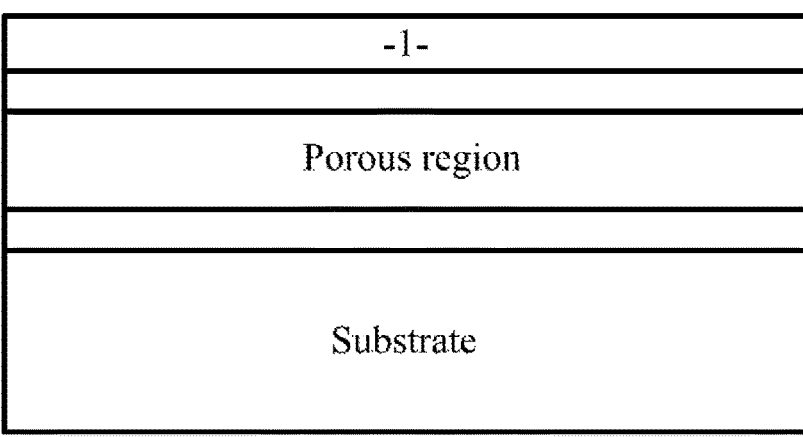

FIG. 4—Connecting Layer

After formation of the porous layer, a III-nitride LED epitaxy structure can be grown onto the porous template/pseudo-substrate provided by the porous layer and the non-porous cap layer.

The first layer for growth of the LED structure onto the template may be termed a connecting layer 1.

Although it is possible for an LED epitaxial structure to be grown directly onto the non-porous cap layer, it is preferable that a connecting layer 1 is provided over the cap layer before overgrowth of the LED structure. The inventors have found that the use of a III-nitride connecting layer 1 between the porous region and the LED epitaxy structure may advantageously ensure a good epitaxial relationship between the LED and the porous template/substrate. The growth of this layer makes sure that subsequent overgrowth on top of the connecting layer is smooth and epitaxial and suitably high quality.

The connecting layer 1 is formed of III-nitride material and may contain one or a combination of these elements: Al, Ga, In (binary, ternary or quaternary layer).

The connecting layer can be a doped or un-doped layer. The connecting layer can optionally be doped with suitable n-type dopant materials, e.g Si, Ge, C, O. The III-nitride layer may have a doping concentration between $1 \times 10^{17}$ cm$^{-3}$-$5 \times 10^{20}$ cm$^{-3}$.

The thickness of this connecting layer is preferably at least 100 nm, and can be for example between 100-10000 nm.

Figure 5:
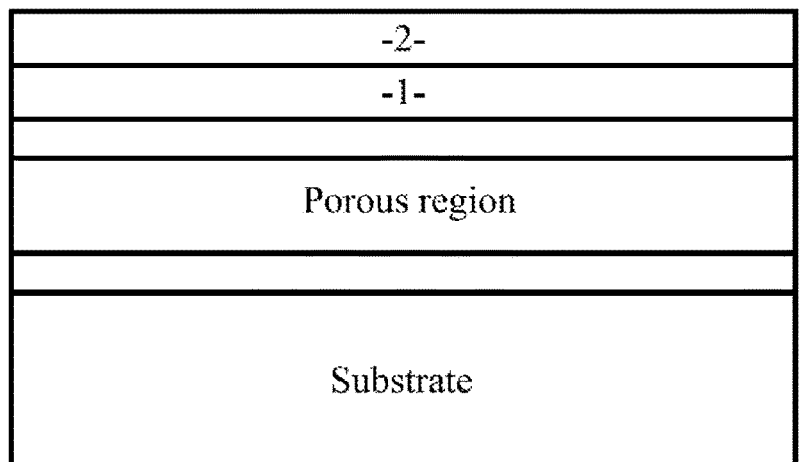

FIG. 5—N-Doped Region

After the growth of the connecting layer, a bulk n-doped III-nitride region 2 is grown.

The n-doped region 2 may comprise or consist of a III-nitride layer containing Indium, or a stack of thin III-nitride layers with or without indium, or a bulk layer or stack of III-nitride layers with a variation in atomic percentage of indium across the layer or stack is grown. For example, the n-doped region may be a layer of n-GaN, or a layer of n-InGaN, or alternatively the n-doped region may be a stack of n-GaN/n-InGaN alternating layers, or a stack of n-InGaN/n-InGaN alternating layers having different quantities of indium in alternating layers.

Preferably the n-doped region 2 comprises indium, so that the crystalline lattice of the n-doped region has similar lattice parameters to the lattice of the InGaN light emitting layer in the LED. The Indium atomic percentage in the n-doped region may vary between 0.1-25% for example.

In preferred embodiments, the indium content of the n-doped region is within 20 at %, or within 15 at %, or within 10 at %, or within 5 at % of the indium content of the InGaN light emitting layer. This may advantageously ensure that the lattice parameters of the n-doped region are sufficiently similar to those of the InGaN light emitting layer to avoid excessive strain between these layers.

The total thickness of the n-doped region may be at least 2 nm, or at least 5 nm, or at least 10 nm, or at least 20 nm. The thickness of the n-doped region may vary between 2 nm-5000 nm, or even thicker, for example. If the n-doped region comprises a stack of layers, the thickness of each individual layer in the stack is preferably between 1-40 nm.

The n-doped region preferably has an n-type doping concentration between $1 \times 10^{17}$ cm$^{-3}$-$5 \times 10^{20}$ cm$^{-3}$, preferably between $1 \times 10^{18}$ cm$^{-3}$-$5 \times 10^{20}$ cm$^{-3}$, particularly preferably greater than $1 \times 10^{18}$ cm$^{-3}$.

Figure 6:
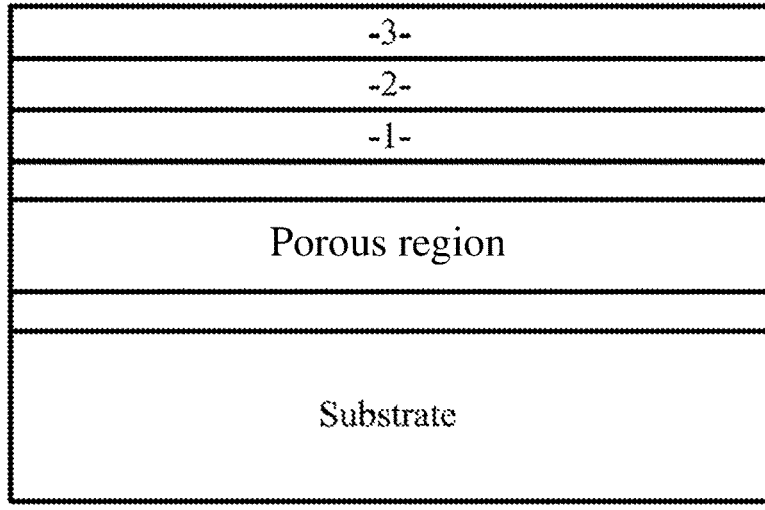
Figure 7:
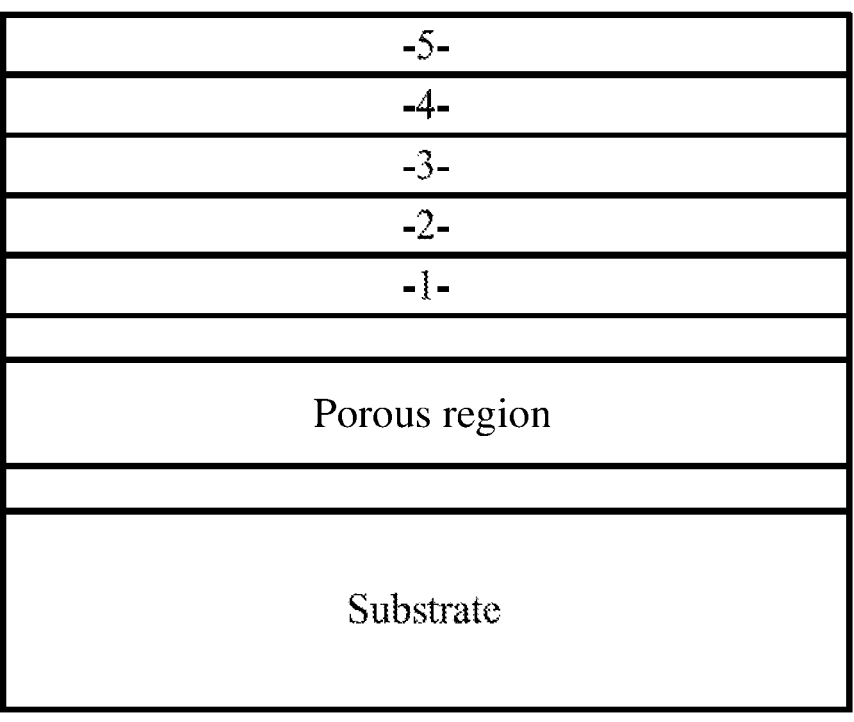

FIG. 6—Light-Emitting Region

After growth of the n-doped region 2, an underlay or pre-layer or pre-well (not labelled in FIG. 6) may be grown, in order to release the strain in the light emitting layer(s). The underlay can be a single layer or stack/multi-layers of GaN, InGaN, or GaN/InGaN, or InGaN/InGaN. Alternatively, the underlay may have a structure similar to InGaN QW/GaN quantum barrier but with a lower proportion of indium. For example, before depositing the light emitting layer having a relatively high proportion of indium, an underlay consisting of a layer of bulk InGaN having a lower proportion of indium than the light emitting layer may be grown. Alternatively, the underlay may take the form of an InGaN "dummy" QW with a lower proportion of indium than the light emitting layer, and one or more GaN quantum barriers.

After growth of the n-doped region 2 and optionally the underlay, a light-emitting region 3 containing an InGaN light emitting layer is grown.

The light-emitting region 3 may contain at least one InGaN light emitting layer. Each InGaN light emitting layer may be an InGaN quantum well (QW). Preferably the light-emitting region may comprise between 1-7 quantum wells. Adjacent quantum wells are separated by barrier layers of III-nitride material having a different composition to the quantum wells.

The light emitting layer(s) may be referred to as "quantum wells" throughout the present document, but may take a variety of forms. For example, the light emitting layers may be continuous layers of InGaN, or the layers may be continuous, fragmented, broken layers, contain gaps, or nanostructured so that the quantum well effectively contains a plurality of 3D nanostructures behaving as quantum dots.

The quantum wells and barriers are grown in a temperature range of 600-800° C.

Each quantum wells consists of an InGaN layer with atomic indium percentage between 15-40%. Preferably the light-emitting indium gallium nitride layer(s) and/or the quantum wells have the composition In$_x$Ga$_{1-x}$N, in which $0.05 \leq x \leq 0.40$, preferably $0.12 \leq x \leq 0.35$ or $0.22 \leq x \leq 0.30$, particularly preferably $0.22 \leq x \leq 0.27$.

The thickness of each quantum well layer may be between 1.5-8 nm, preferably between 1.5 nm and 6 nm, or between 1.5 nm and 4 nm. The quantum wells may be capped with a thin (0.5-3 nm) III-nitride QW capping layer, which may contain one or a combination of these elements: Al, Ga, In (ternary of quaternary layer)

The QW capping layer, which is the layer added immediately after QW growth, can be AlN, AlGaN of any Al % 0.01-99.9%, GaN, InGaN of any In % 0.01-30%.

The III-nitride QW barriers separating the light emitting layers (quantum wells) may contain one or a combination of these elements: Al, Ga, In (ternary of quaternary layer). The QW barrier can be AlN, AlGaN of any Al % 0.01-99.9%, GaN and InGaN of any In % 0.01-15%. Preferably the QW barrier layers contain AlN and/or AlGaN.

The QW capping layer(s) and QW barriers are not indicated with individual reference numerals in the Figures, as these layers form part of the light-emitting region 3.

The QW capping layers may be grown after each QW but before the barrier growth. For example, if an LED contains 3 QWs then each of these QWs may be overgrown with a QW capping layer and then a QW barrier layer, so that the light-emitting region contains 3 such QW capping layers and three such QW barrier layers.

1. One can grow the cap at the same conditions as the QW.
2. One can ramp without growth to higher temperature, and grow this cap (effectively this is an annealing step) and here the ramp can be carried out in a different gas mixture.
3. One can ramp and grow during the temperature ramp.

The design of the light-emitting region may be varied according to parameters that are well understood in the art and conventional in LED design. For example, depending on the target EL emission wavelength of the LED, the composition, thickness and number of light-emitting layers and barrier layers may be varied. As described earlier in the application, the indium content of InGaN light-emitting layers may be increased when longer-wavelength emission is desired.

As described above, the present invention may be provided by growing a known LED structure, known to emit at a first wavelength under electrical bias, over a template containing a porous region. The strain relaxation caused by the porous region beneath the LED structure enables incorporation of more indium into the light-emitting layer(s) under the same growth conditions, so the wavelength of the resulting LED is red-shifted when compared to the same LED structure grown under the same conditions over a non-porous substrate. A greater variety of emission wavelengths may therefore be achieved using the present invention than has been possible in the prior art, and in particular, longer wavelengths can be achieved at higher InGaN growth temperatures. This leads to superior quality crystal structures in the LED, and thus higher performance LEDs.

For the manufacture of longer-wavelength LEDs the large amount of Indium in the light emitting layer(s) makes the capping layer even more important, as previous attempts to manufacture longer wavelength yellow, orange or red LEDs have failed due to not enough Indium being incorporated. So capping is very important to make sure that there is sufficient Indium trapped within the light-emitting region.

FIG. 7—Cap Layer

After growth of the light emitting layer(s) a non-doped cap layer 4 is grown. Non-doped cap layer 4 may be termed a light-emitting-region cap layer, as this layer is formed after growth of the complete light-emitting region, for example after the growth of the stack of QWs, QW capping layers and QW barrier layers.

The cap layer (light-emitting-region cap layer) 4 is a standard layer which is very well known in the growth schemes for III-nitride LEDs.

The thickness of the cap layer can be between 5-30 nm, preferably between 5-25 nm or 5-20 nm.

The purpose of the light-emitting-region cap layer 4, is to protect the indium in the light-emitting region (QW stack) and prevent it from desorbing/evaporating during subsequent processing. Because the InGaN QW is normally grown at lower temperature, that is not favourable for GaN/AlGaN, there is typically a temperature ramp step needed before further layers can be overgrown above the light-emitting region. The cap layer is used to ensure that the InGaN light emitting layer(s) are properly capped and protected, so that there is a chance and time window to change the p-doped layer growth conditions for better material quality. The light-emitting-region cap layer 4 also ensures that no Mg dopant is entering the QW region during the growth of p-type layers.

Electron Blocking Layer (EBL)

After the growth of quantum wells, capping and barrier layers, an electron blocking III-nitride layer (EBL) 5 containing Aluminium is grown. The Al % can be between 5-25% for example, though higher Al content is possible.

The EBL is doped with a suitable p-type doping material. The p-type doping concentration of the EBL is preferably between $5\times10^{18}$ cm$^{-3}$-$8\times10^{20}$ cm$^{-3}$ The thickness of the EBL can be between 10-50 nm, preferably 20 nm.

Figure 8:
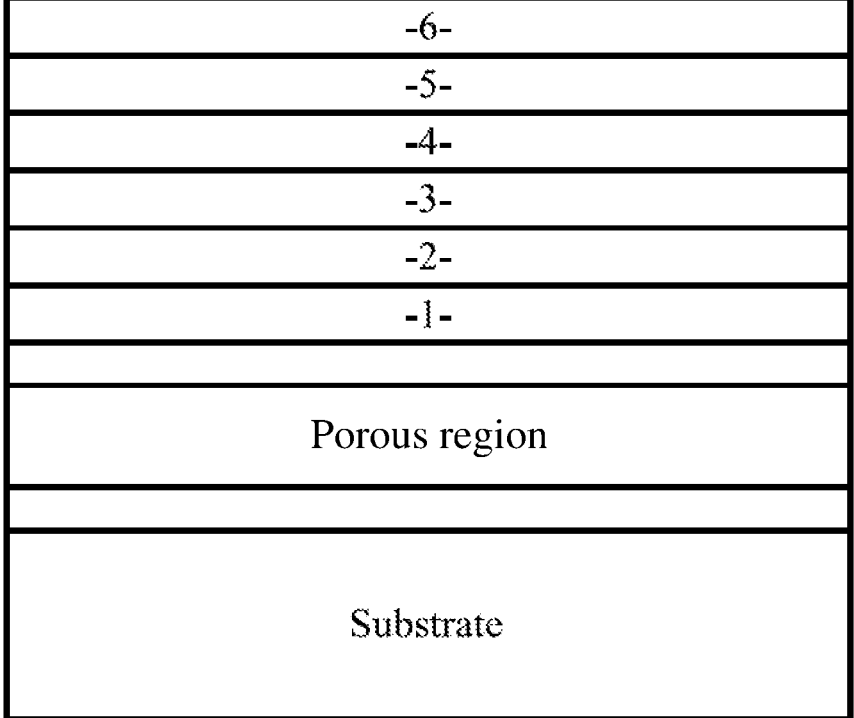

FIG. 8—P-Doped Layer

A p-doped layer 6 is grown above the electron blocking layer (EBL) 5.

The p-type region is preferably doped with Mg, and the p-type doping concentration of the p-type layer is preferably between $5\times10^{18}$ cm$^{-3}$-$8\times10^{20}$ cm$^{-3}$.

The p-doped III-nitride layer may contain In and Ga.

The doping layer is preferably between 20-200 nm thick, particularly preferably between 50-100 nm thick. The doping concentration may vary across the p-type layer and can have a spike in doping levels in the last 10-30 nm of the layer towards the LED surface, in order to allow better p-contact.

For activation of Mg acceptors in the p-doped layer, the structure may be annealed inside of MOCVD reactor or in an annealing oven. The annealing temperature may be in the range of 700-850° C. in N$_2$ or in N$_2$/O$_2$ ambient.

As both the EBL and the p-doped layer are p-type doped, these layers may be referred to as the p-doped region.

Figure 9:
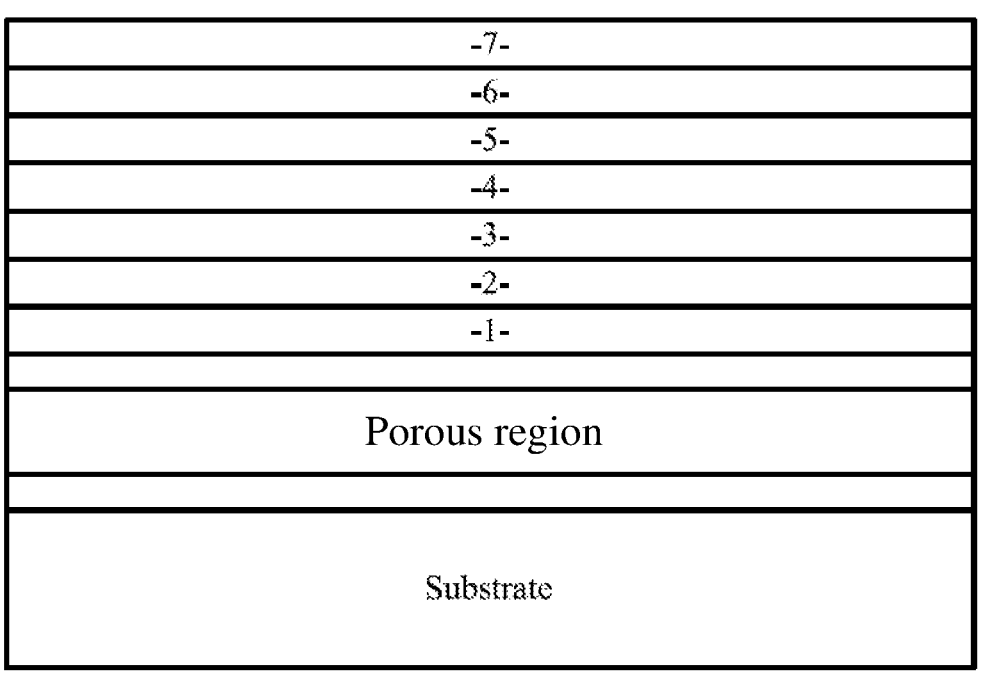

FIG. 9—Transparent Conducting Layer

The stack of active semiconductor layers is covered with a transparent conducting layer 7. The transparent conducting layer can be made of Ni/Au, indium tin oxide, indium zinc oxide, graphene, Pd, Rh, silver, ZnO etc., or a combination of these materials.

The thickness of the transparent conducting layer can be between 10-250 nm.

Transparent conducting layers are well known in the art, and any suitable material and thickness may be used.

An annealing step may be required for making the p-contact ohmic.

FIG. 10

Depending on the LED structure being manufactured, the semiconductor structure may be processed into LED, mini-LED or micro-LED devices.

Normal LEDs are typically larger than 200 μm (referring to the lateral dimensions of width and length of the LED structure. Mini-LEDs are typically 100-200 μm in lateral size, while Micro-LEDs are typically less than 100 μm in size.

Figure 10:
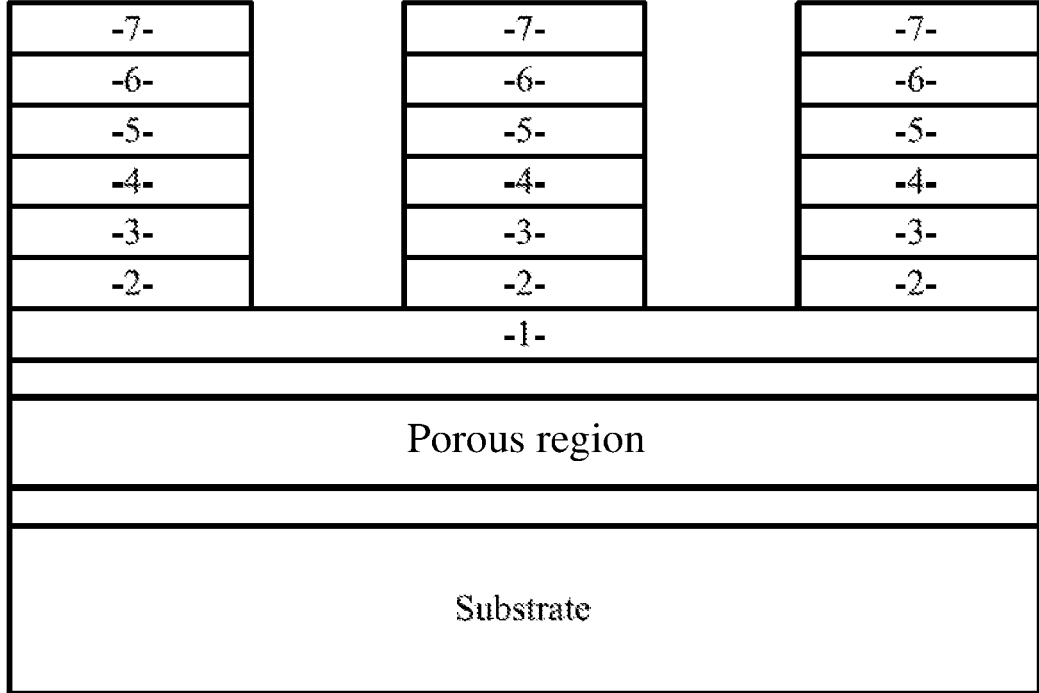

FIG. 10 onwards illustrates the semiconductor structure following etching of layers 2-7 of the semiconductor structure into multiple discrete LED stacks, or mesas, each having the same structure.

The steps of LED fabrication are conventional and well-known to those skilled in the art. The order of the following fabrication steps are not specific to the present invention, and the skilled person will be appreciated that LED devices within the scope of the present invention may be prepared using alternative fabrication steps to those illustrated below. For the purposes of illustration only, however, one preferred fabrication route to prepare LEDs according to the present invention is described below.

In the next step, the transparent conducting layer 7 is structured in such a way that it covers only the top surface of the active emission element. The structuring can be done using standard semiconductor processing methods that included resist coating and photolithography. The transparent conducting layer is etched by using wet chemistry or a sputter etch process using Argon. This step is followed by wet or dry etching of the III-nitride structure. An inductively couple plasma reactive ion etching, only reactive ion etching or neutral beam etching is used to create mesas in the III-nitride layer. The dry etch process may include either one or more of Cl, Ar, BCl$_3$, SiCl$_4$ gases.

The purpose of this step is to isolate the individual emitting elements and access the buried n-doped layer of the p-n junction.

After the dry etch process a wet etch process is done to remove the dry etching damage from the sidewalls of the mesa. The wet chemistry may involve KOH (1-20%), TMAH or other base chemistries.

Figure 11:
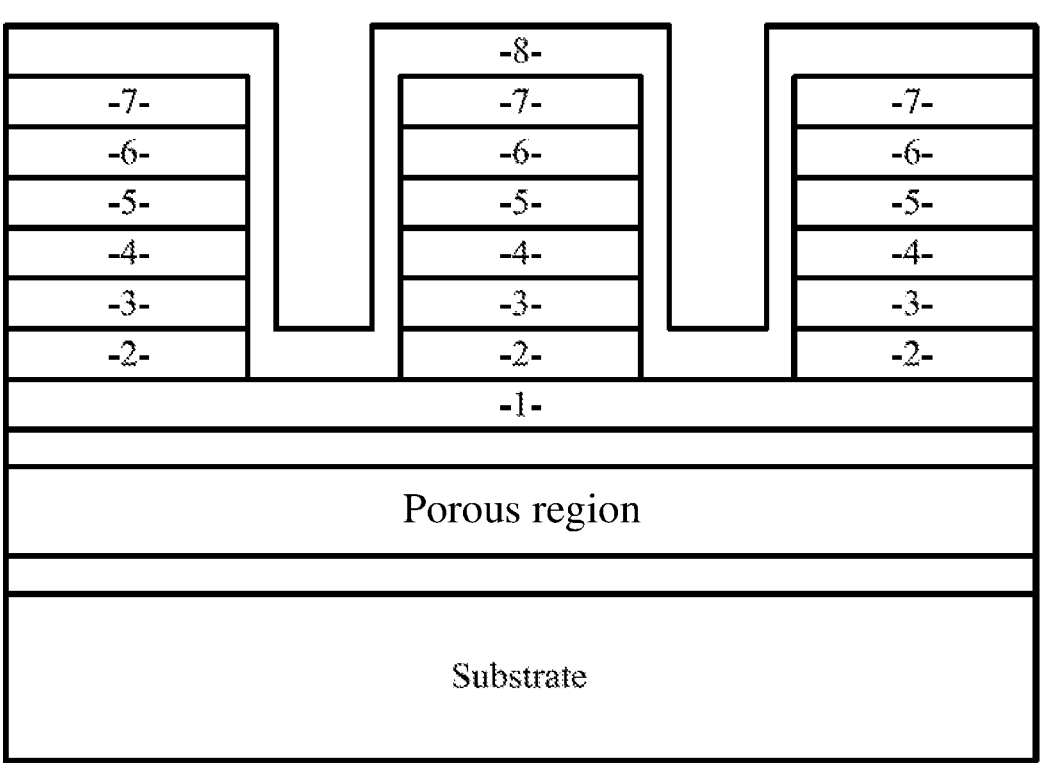
Figure 12:
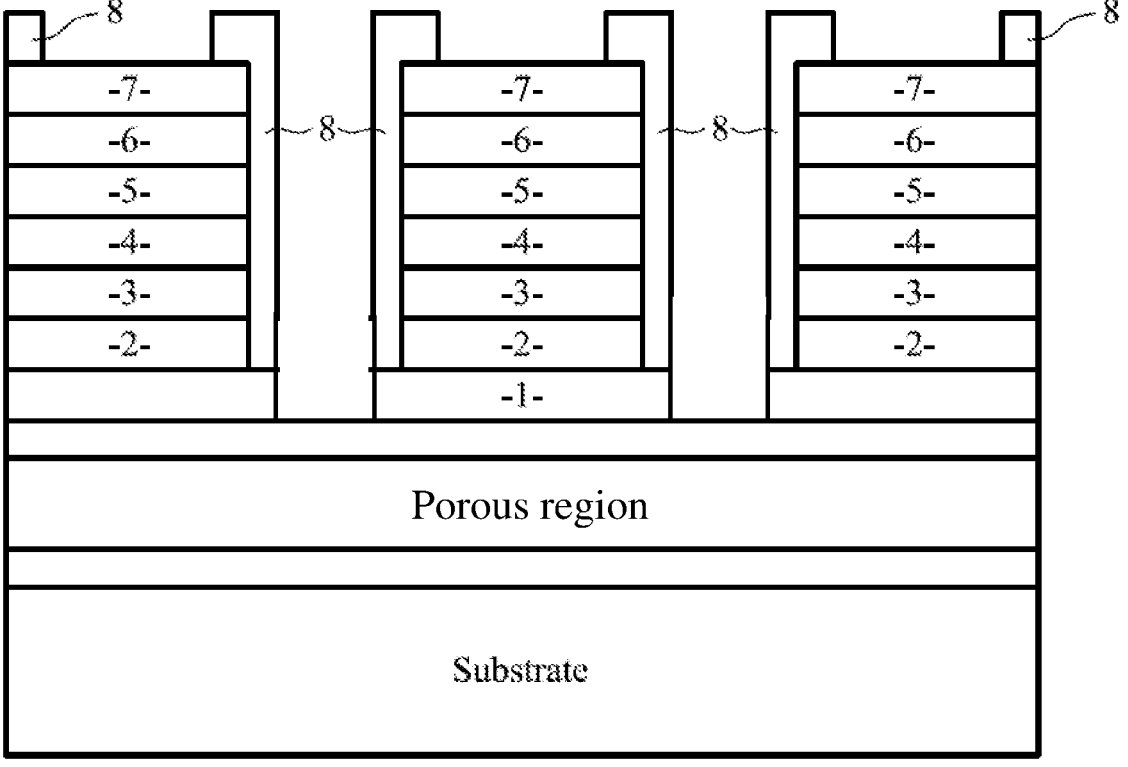

FIG. 11—Passivation

The next step is to deposit a passivation layer 8 or a combination of passivation layers. The starting passivation layer can be Al2O3 (10-100 nm) (deposited by atomic layer depositions) followed by sputtered or plasma enhanced chemical vapor deposited SiO2, SiN or SiON (50-300 nm).

The Al2O3 can be deposited between 50-150° C.

The SiO2, SiN and SiON can be deposited between 250-350° C.

The sputter process can be done at room temperature.

FIGS. 12-13

The next step is to create openings in the oxide passivation layer 8 to expose the top of the LED structure. This can be done via wet or dry etching or a combination of both.

For wet etching buffered oxide etch, diluted hydrofluoric acid phosphoric acid or a mixture of these can be used.

Channels are also etched through the connecting layer 1 between the LED structures, followed by electrically isolating the LED structures from one another by depositing dielectric mask material 8 into the channels, so that the LEDs are operable independently from one another.

The next step in device fabrication is to cover the transparent conducting layers 7 on the p-doped layers 6 with metal layers to act as electrical p-contacts 9. The covering can be done with a single step or multiple steps. The metals can be covering the pixels completely or partially. In this example a single step is used to simplify the details.

The metal contacts 9 may contain Ti, Pt, Pd, Rh, Ni, Au. The thickness of the complete metal stack can be between 200-2000 nm.

Figure 14:
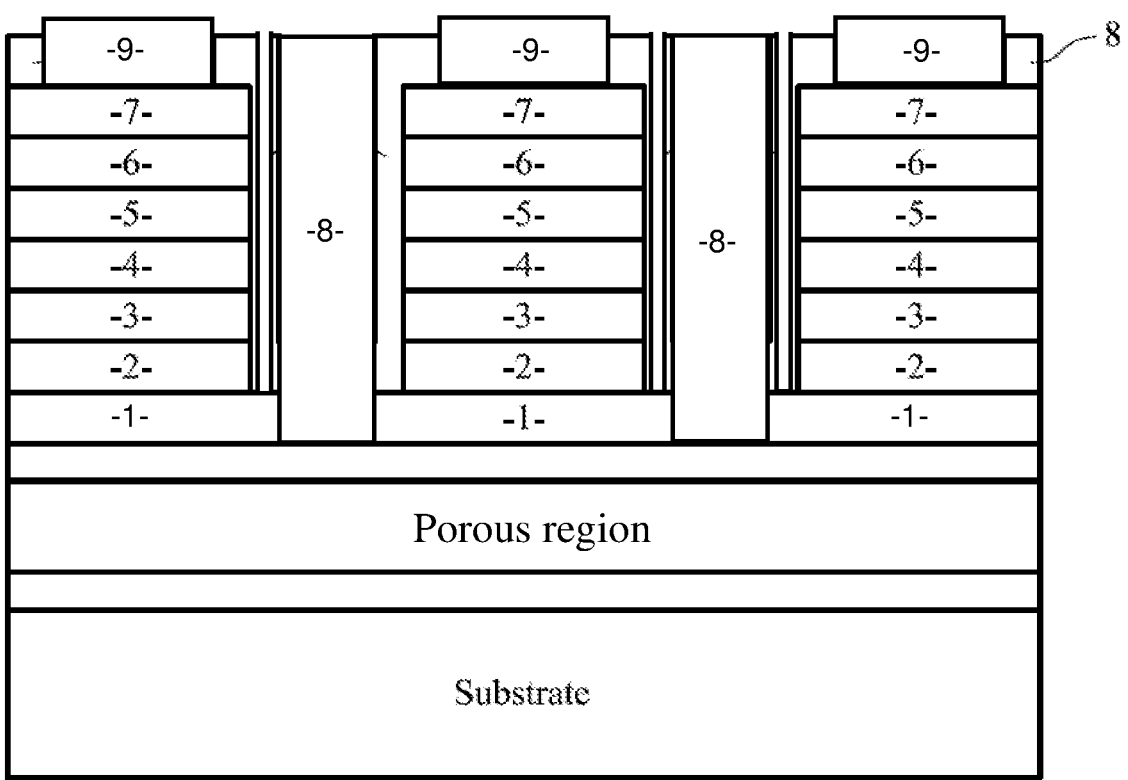
Figure 15:
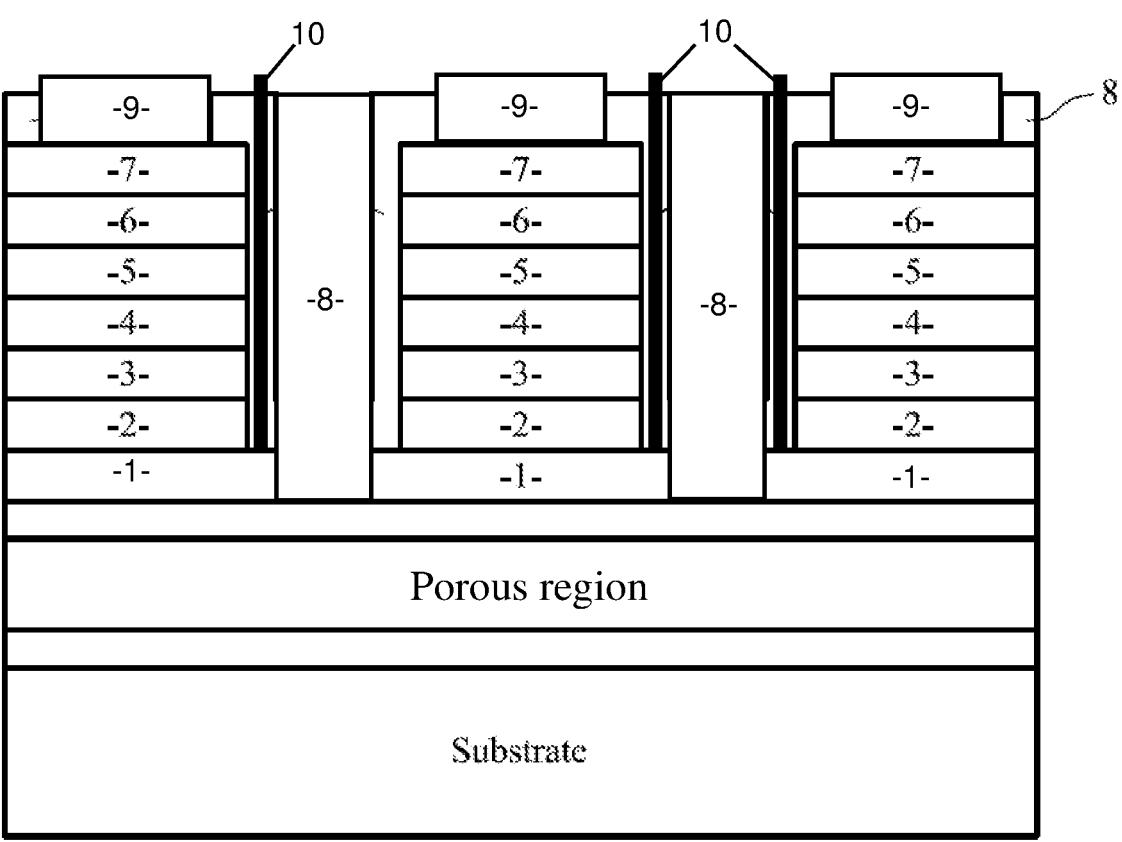

FIG. 14—Exposing Connecting Layer

Standard photolithography techniques can be used to create openings in the second mask layer 8 to expose a plurality of regions of the connecting layer 1. The size of the openings can vary between 200 nm-50000 nm. This distance between the openings can be between 500 nm-30000 nm. The opening are creating only in the regions of the wafer that are not occupied by LED structures.

Dry etching is preferably used to etch the second mask layer 8 using fluorine based gases.

FIG. 15—N-Contacts

The next step in device fabrication is to cover the openings in the oxide 8 with metal contacts 10 to access the connecting layer 1, which is in electrical contact with the n-doped layers of the LED structures. The covering can be done with a single step or multiple steps. The metals can be covering the pixels completely or partially. In this example a single step is used to simplify the details.

The metal may contain Ti, Pt, Pd, Rh, Ni, Au. The thickness of the complete metal stack can be between 200-2000 nm.

FIGS. 16-18

After this processing, the substrate can be thinned, and/or the porous region can be removed so that the connecting layer 1 is exposed.

Surface structuring or texturing can be done on the substrate, at the porous region, or layer 1 to enhance the light output and control the emission angle, as well as other optical engineering and design.

Finally, the wafer/devices can be flipped, and bonded to another carrier substrate either can be silicon/sapphire or any type as passive devices, alternatively, the devices can be bonded to a CMOS silicon backplane for active matrix micro-LED display panel.

Figure 16:
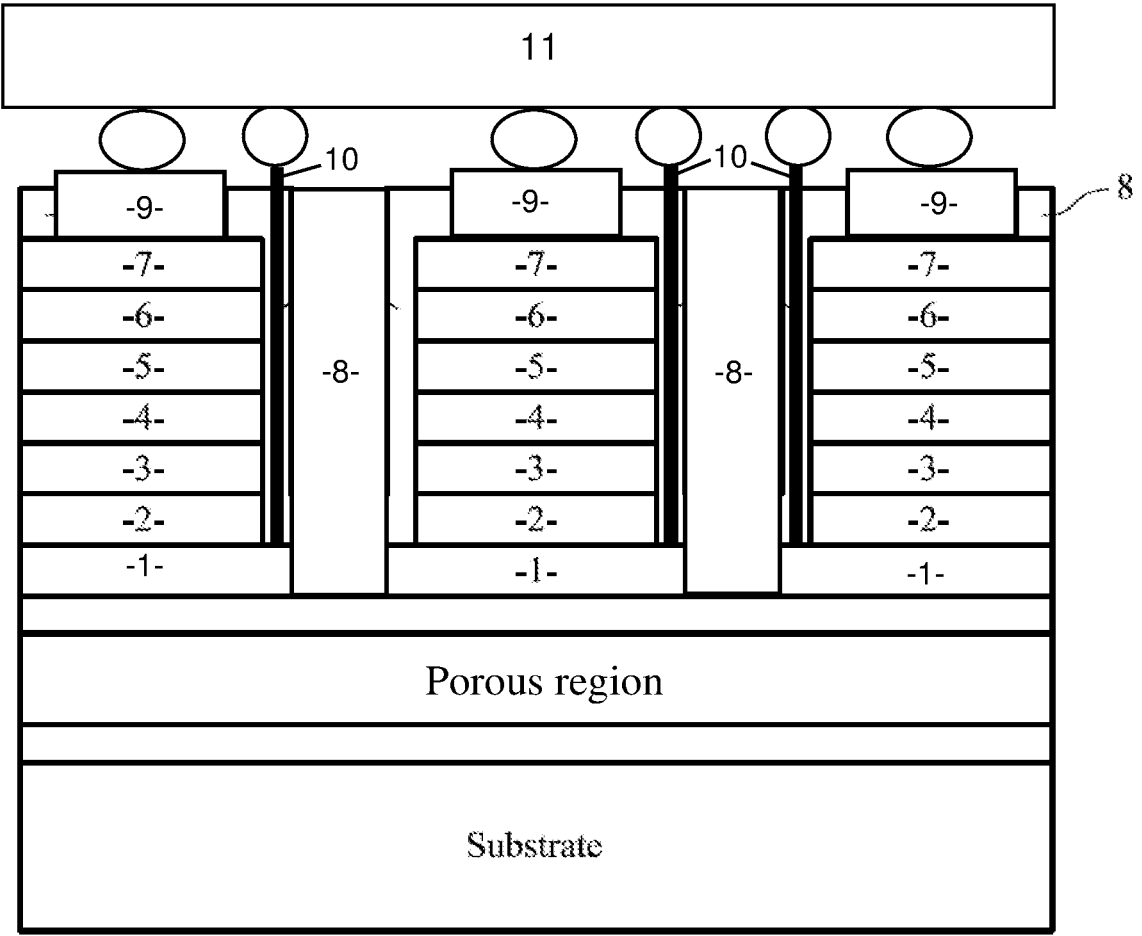

As shown in FIG. 16, the top side of the device may be bonded to another carrier wafer/substrate/backplane 11, or to a microdriver circuit board to form an array of pixels.

Figure 17:
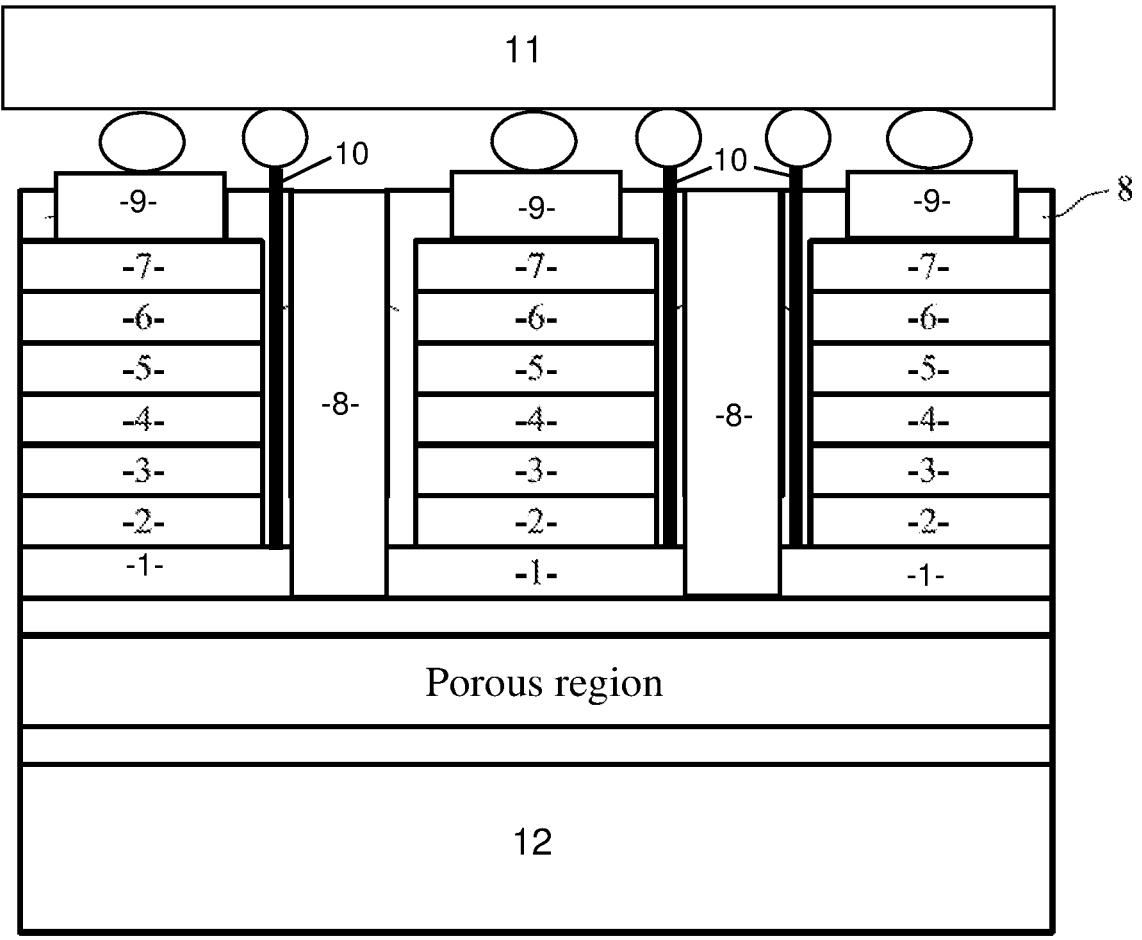

As shown in FIG. 17, the substrate may then be removed from the device, and the bottom-side of the device may be bonded to a cover glass or transparent material 12.

Figure 18:
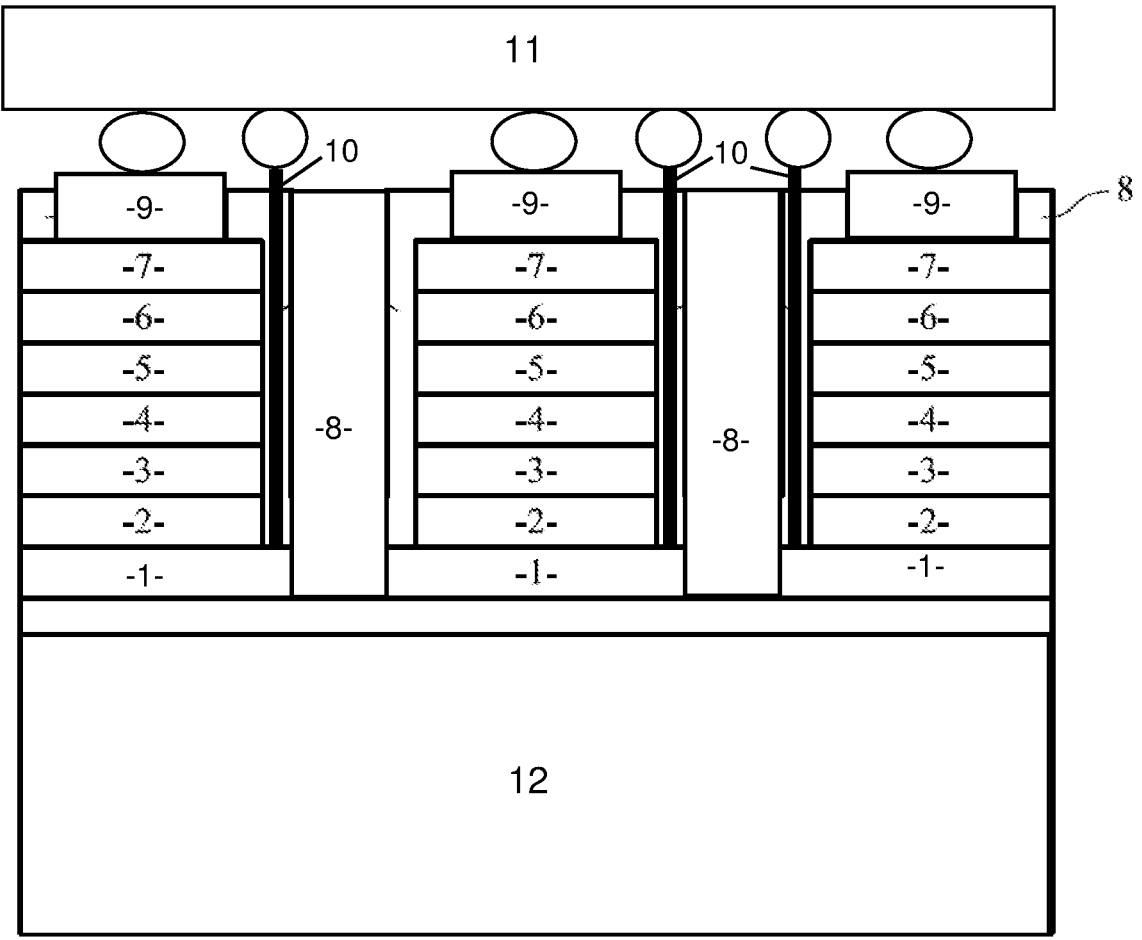

As shown in FIG. 18, the substrate and the porous and non-porous region may be removed from the device. The top side of the device may be bonded to another carrier wafer/substrate/backplane 11, or to a microdriver circuit board to form an array of pixels. The bottom-side of the device may be bonded to a cover glass or transparent material 12.

The skilled person will understand that the emission wavelengths of the individual LED structures may be controlled by altering the composition and layer structures of the LED structures according to known principles of LED construction. Thus a variety of variable-wavelength LED devices emitting over different emission wavelength ranges may be provided using the present invention, and colour combinations other than green to red may be provided.

FIGS. 19-23

Figure 19:
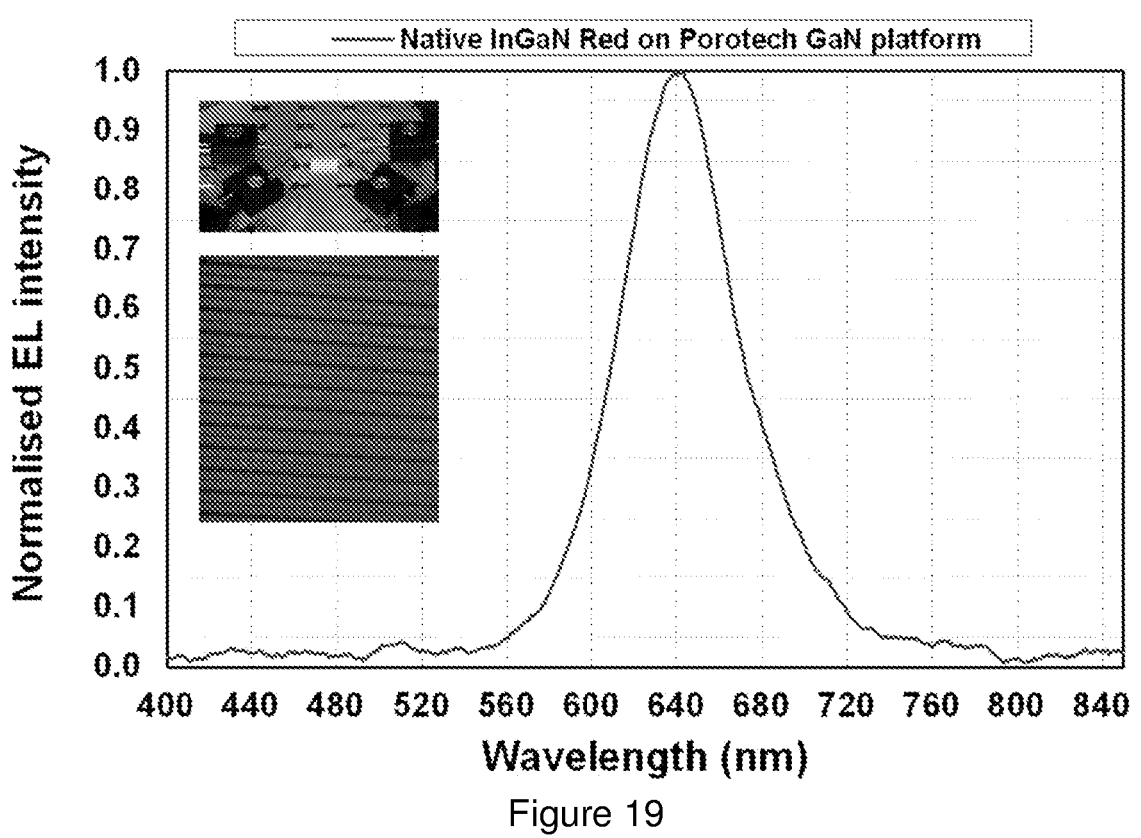
FIG. 19 is a graph of normalised electroluminescence (EL) intensity vs wavelength, for an InGaN LED over a porous region.

FIG. 19 shows an example of an InGaN LED over a porous layer that emits at a peak wavelength of around 625 nm due to the wavelength red-shift caused by the porous region.

Figure 20:
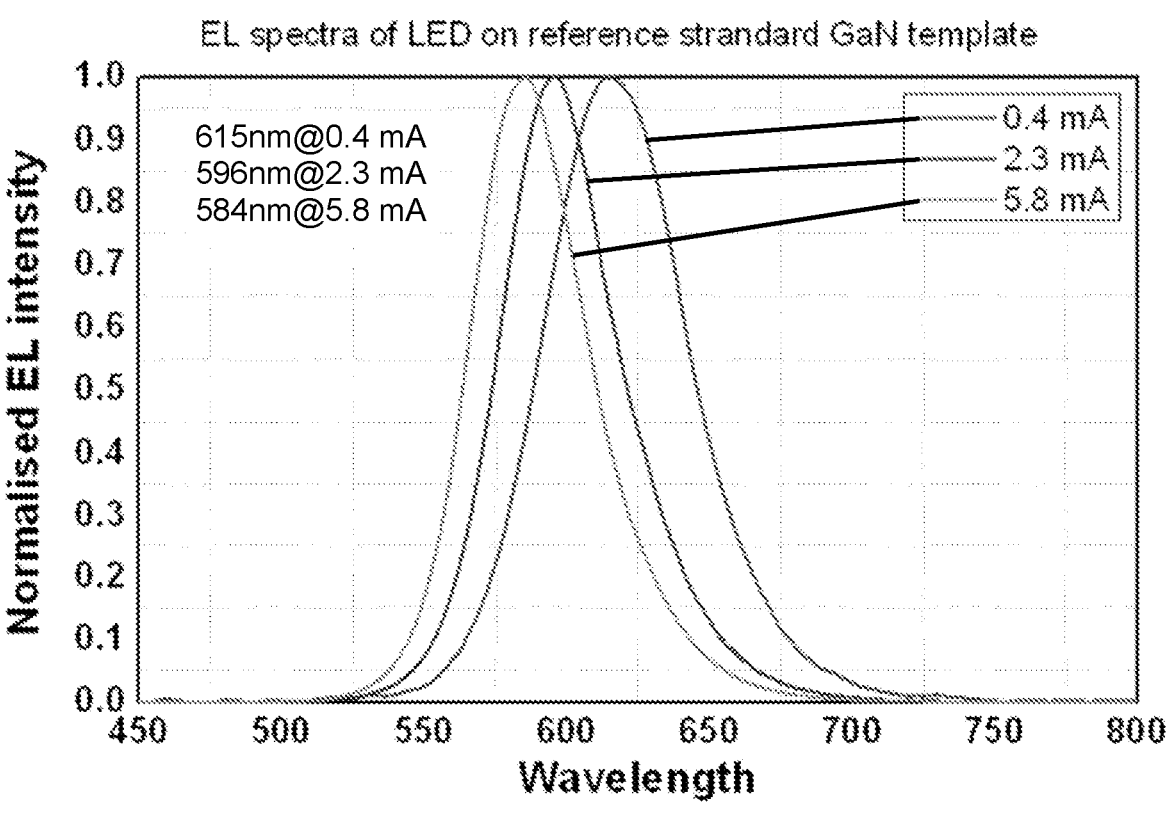
FIG. 20 is a graph of normalised electroluminescence (EL) intensity vs wavelength at different current injections, for an InGaN LED on a non-porous substrate.

FIGS. 20 and 21 compare the emission characteristics of an InGaN LED on a non-porous substrate (FIG. 20) and the same InGaN LED grown on a template comprising a porous layer of III-nitride material. Comparison of these two graphs demonstrates the shift towards longer emission wavelengths caused by the porous underlayer, as the emission of the LED on the porous template is consistently between 21 nm and 45 nm longer than that of the same LED on the non-porous template.

Figure 23:
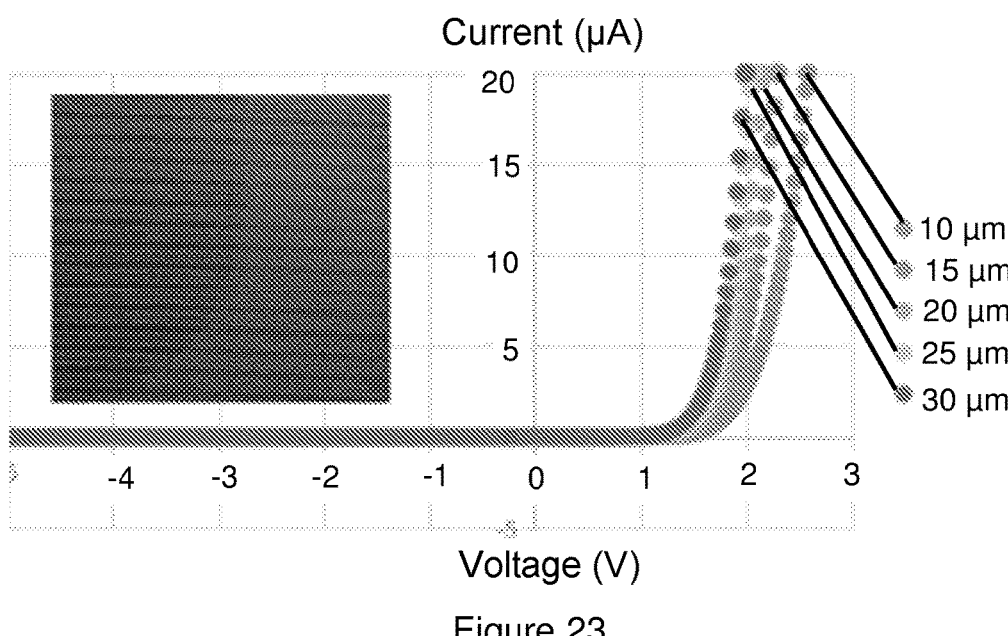
FIG. 23 is an I-V curve measured for InGaN micro-LEDs of different pixel sizes on a porous substrate, with the inset image showing red emission.

FIGS. 22 and 23 compare the I-V characteristics of yellow InGaN micro-LEDs on a non-porous substrate (FIG. 22) with the same InGaN micro-LEDs grown on a template containing a porous layer. On the porous template, the InGaN micro-LEDs emit red light, as shown in the inset image.

Figure 24:
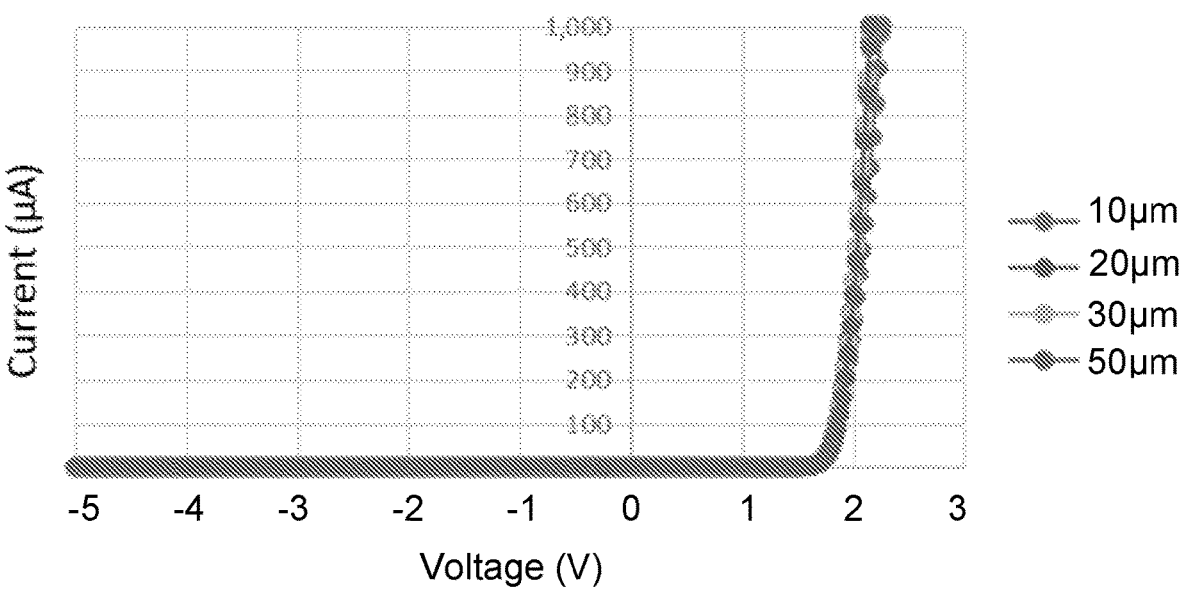
FIG. 24 is an I-V curve measured for InGaN micro-LEDs of different pixel sizes on a template with a sub-surface porous region.
Figure 25:
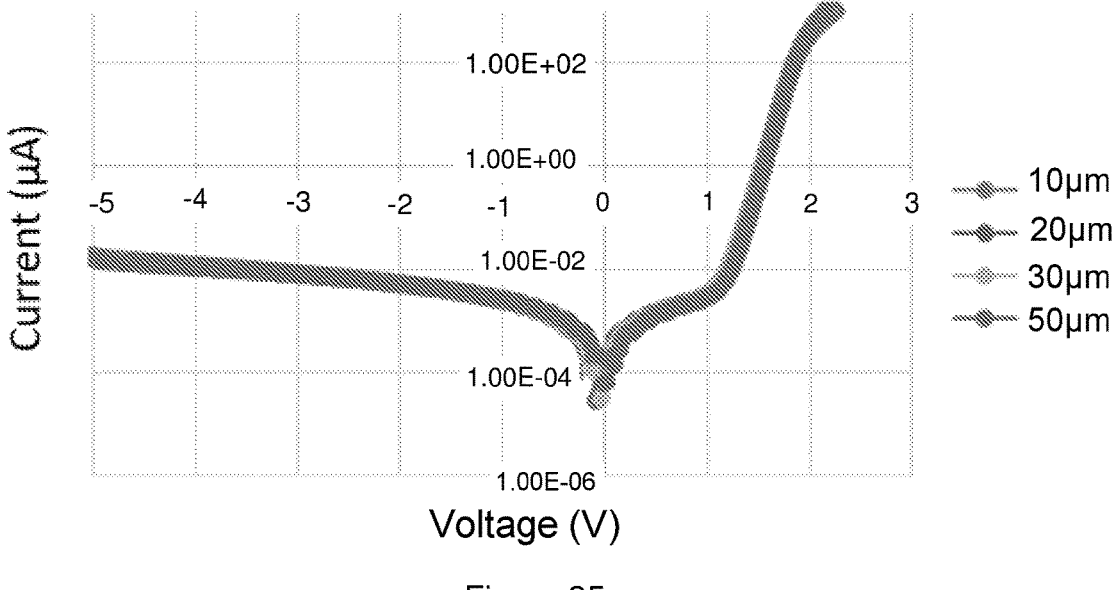
FIG. 25 is a low-current I-V curve measured for InGaN micro-LEDs of different pixel sizes on a template with a sub-surface porous region.

FIG. 24 is an I-V curve measured for InGaN micro-LEDs of different pixel sizes (10 μm×10 μm; 20 μm×20 μm; 30 μm×30 μm; 50 μm×50 μm) on a porous substrate. FIG. 25 shows the I-V characteristics of the same pixels, with the axes altered to focus on low currents from $1 \times 10^{-6}$ μA to just over 100 μA.

Figure 26:
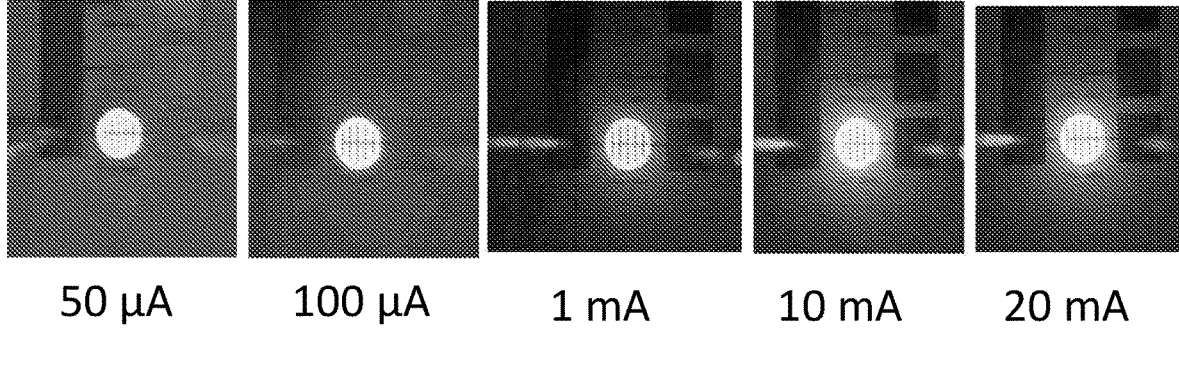
FIG. 26 is a series of five EL images of the same MicroLED pixel being driven at different currents in constant wave mode (CW), showing five different colours of emission.

FIG. 26 is a series of five EL images of the same variable-wavelength MicroLED InGaN pixel being driven at different currents in constant wave mode (CW), showing five different colours of emission. In the left-hand image, the micro-LED emission colour is seen to be red at a driving current of 50 μA. In the second image from the left, the micro-LED emission colour is seen to be red-orange at a driving current of 100 μA. In the third image from the left, the micro-LED emission colour is seen to be orange at a driving current of 1 mA. In the fourth image from the left, the micro-LED emission colour is seen to be yellow-green at a driving current of 10 mA. In the right-hand image, the micro-LED emission colour is seen to be green at a driving current of 20 mA.

By varying the driving current between 50 μA to 20 mA, the same micro-LED is therefore capable of emitting at wavelengths ranging from red to green. The spectral width of this emission wavelength range is on the order of 90 nm (from around 570 nm to around 660 nm). This is a far greater range of emission wavelengths than has ever been achievable with a single LED in the prior art.

Figure 27A:
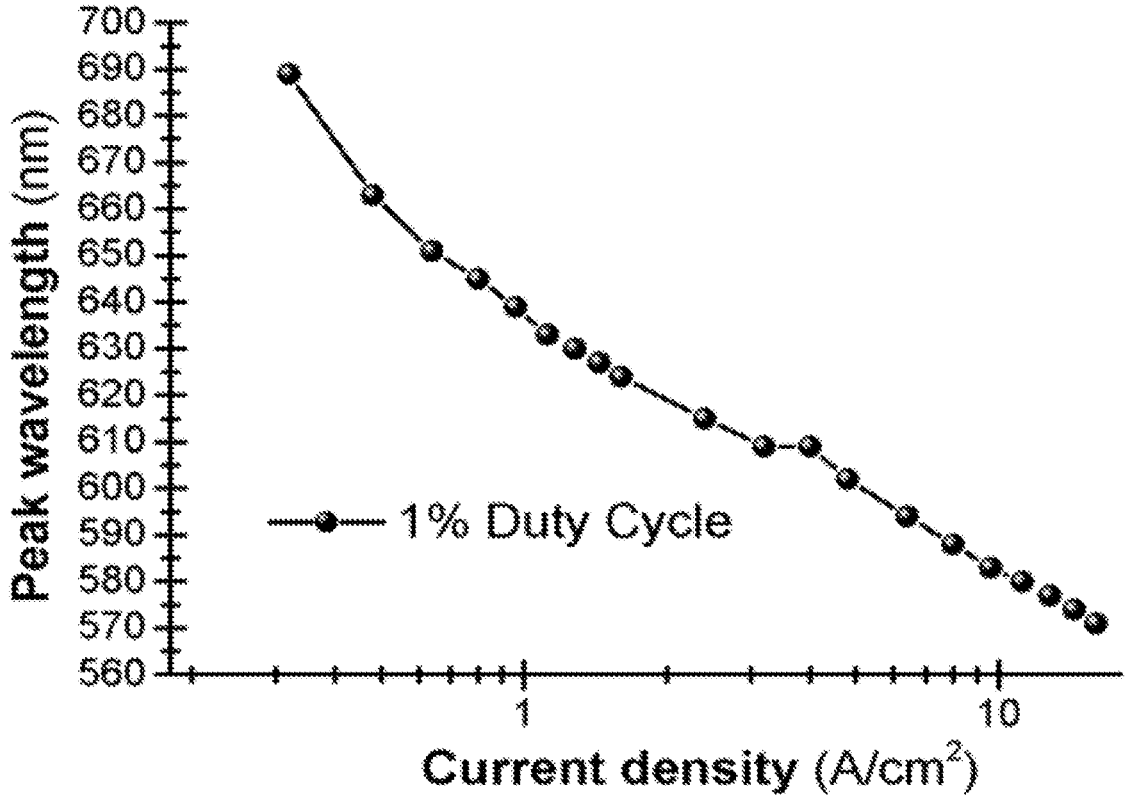
FIG. 27A is an emission wavelength vs current density plot for a 25 μm×25 μm 100×100 variable-wavelength LED pixel array driven in pulsed mode with a 100 μs pulse at 1% duty cycle.
Figure 27B:
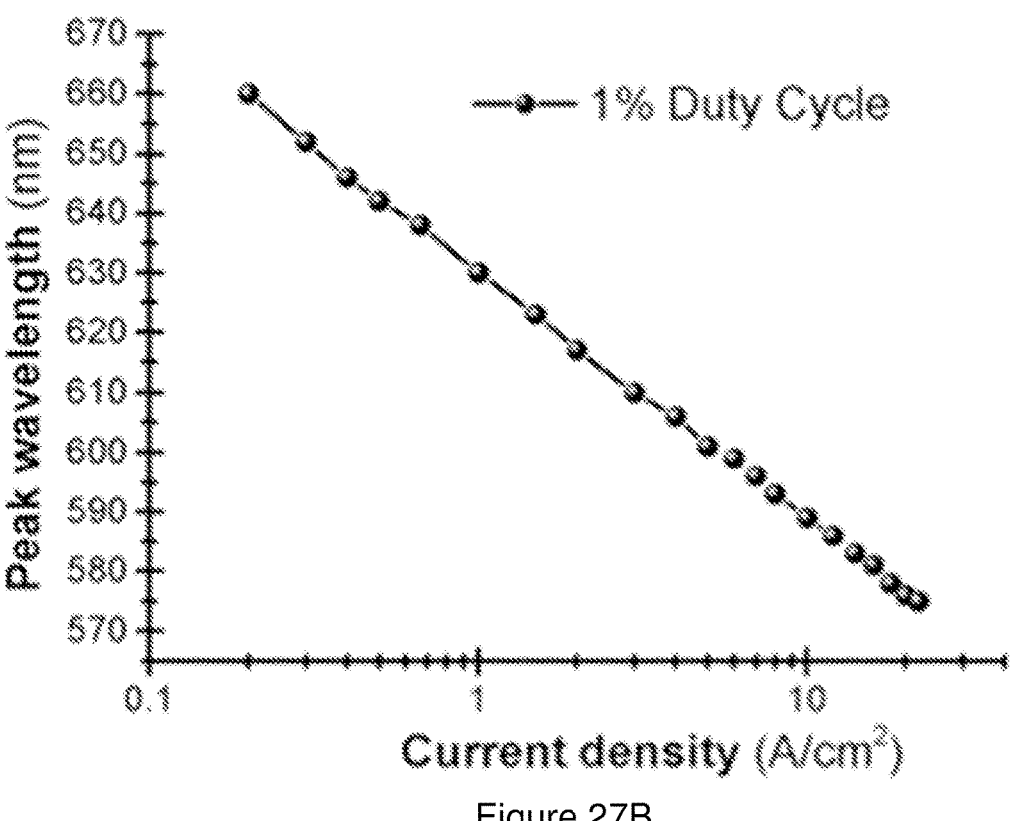
FIG. 27B is an emission wavelength vs current density plot for a 30 μm×30 μm 100×100 variable-wavelength LED pixel array driven in pulsed mode with a 100 μs pulse at 1% duty cycle.

FIG. 27A is an emission wavelength vs current density plot for a 25 μm×25 μm InGaN LED pixel array (100×100 array, containing 10,000 pixels) driven in pulsed mode with a 100 μs pulse at 1% duty cycle. FIG. 27B is an emission wavelength vs current density plot for a 30 μm×30 μm InGaN LED pixel array (100×100 array, containing 10,000 pixels) driven in pulsed mode with a 100 μs pulse at 1% duty cycle.

Both of these plots show the controllability of the peak emission wavelength with a pulse driven power supply. In particular, the wavelength is linearly dependent on the current density (plotted on a logarithmic scale). This linearity can equally be manipulated when driving with a pulsed voltage power supply. The variable emission wavelengths of the LED can therefore be controlled with either voltage or current driving schemes in either CW or pulsed mode, all of which are standard ways of display driver IC.

This linear relationship between the driving current density and the resulting emission wavelength is highly advantageous for the purposes of LED display design, as it enables accurate control of the emission wavelengths by varying the current density of the power supply.

Figure 28:
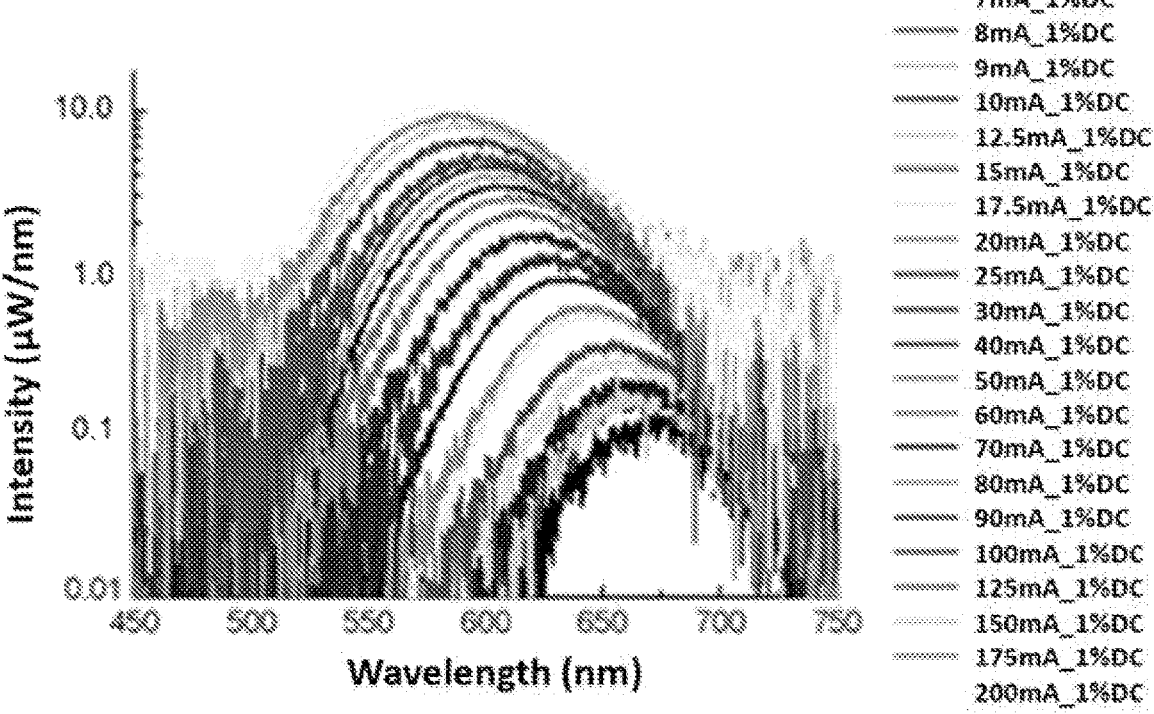
FIG. 28 is a plot of intensity vs wavelength for a single variable-wavelength LED driven at different currents in pulsed driving mode with a 100 μs pulse at 1% duty cycle.

FIG. 28 is a plot of intensity vs wavelength for a variable-wavelength InGaN LED driven at different DC currents. The power supply is operated in pulsed driving mode with a 100 μs pulse at 1% duty cycle.

FIG. 28 again reflects a gradual, continuous transition of the peak emission wavelength of the LED as the current of the power supply is varied. At a driving current of 200 mA, the peak emission wavelength is around 575 nm, with an intensity of around 10 μW/nm. As the driving current is reduced, however, the peak emission wavelength moves gradually to longer wavelengths, and to lower emission intensities. When the driving current reaches 7 mA, the peak emission wavelength is approximately 675 nm, with an intensity of around 0.1 μW/nm.

Figure 29A:
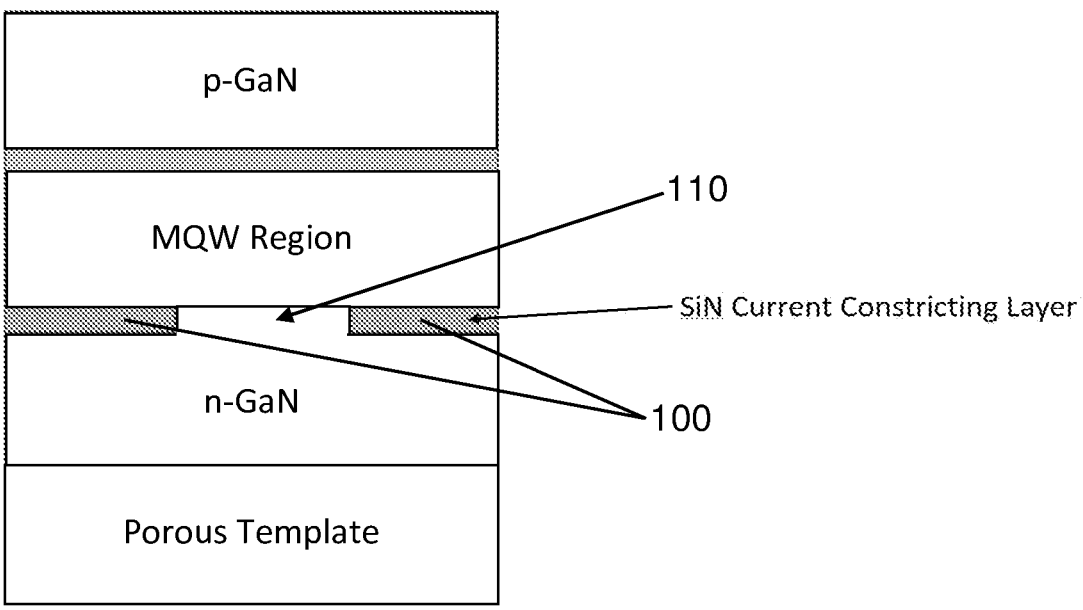
FIG. 29A is a schematic plot of an LED structure comprising a current constraining layer, according to a preferred embodiment of the present invention.

FIG. 29A is a schematic plot of an LED structure over a porous template comprising a porous region of III-nitride material. The LED comprises a current constraining layer 100 positioned between the n-doped portion (labelled n-GaN in this example) and the light-emitting region of the LED. The light-emitting region is labelled the MQW (multiple quantum well) region of the LED. Although an SiN current constraining layer 100 is indicated in the Figures, the current constraining layer 100 (which may alternatively be termed a current constricting layer) may be formed of another dielectric material.

A circular aperture 110 is provided through the centre of the dielectric current constraining layer 100. The aperture extends through the thickness of the current constraining layer, providing a conductive pathway between the n-doped region and the light-emitting region of the LED. In the illustrated embodiment, the diameter of the aperture is approximately 33% of the lateral width of the LED structure, but the width of the aperture may be varied to modify the local current density passing through the aperture.

Figure 29B:
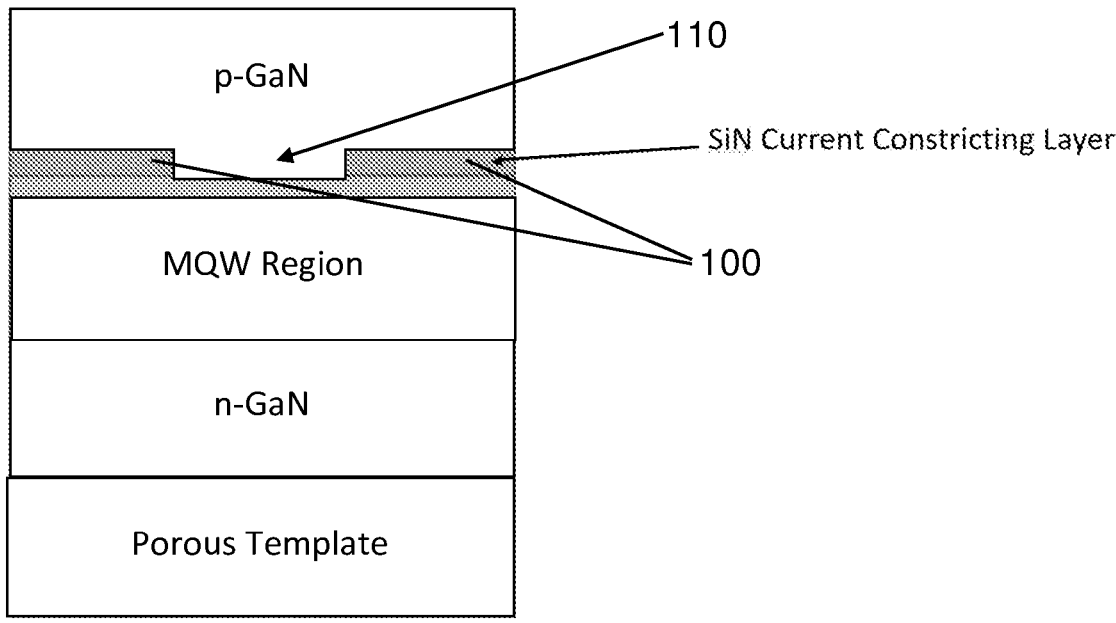
FIG. 29B is a schematic plot of an LED structure comprising a current constraining layer, according to another preferred embodiment of the present invention.

FIG. 29B is a schematic plot of an LED structure comprising a current constraining layer 100 in an alternative position, positioned between the p-doped portion (labelled p-GaN in this example) and the light-emitting region (MQW region) of the LED. An aperture 110 extends through the thickness of the current constraining layer 100, providing a conductive pathway between the p-doped region and the light-emitting region of the LED.

FIGS. 30-35

FIGS. 30-34 are schematic cross-sections of an LED structure formed over a porous template according to a preferred embodiment of the present invention.

The LED structure comprises a substrate, which as described above may be Silicon, Sapphire, SiC, β-Ga2O3, GaN. Substrate size can be as small as 1×1 cm-2, 50 mm, 100 mm, 150 mm, 200 mm, 300 mm or larger in diameter.

A porous region is formed over the substrate, and a connecting layer (layer 1) of (Al,In) GaN is formed over the porous region. An n-type layer of n (Al,In) GaN (layer 2) is positioned over the connecting layer, and forms the n-type portion of the LED device. A pre-strain layer (layer 3) is formed over the n-type layer and an active region (layer 4) containing a multiple quantum well (MQW) is positioned over the pre-strain layer and below a p-type layer (layer 5) of p-(Al,In) GaN.

This is a typical LED structure formed over a porous semiconductor template. The porous region can be a uniform porous layer or region, and can also be a partly patterned porous region.

The porous region may be any porous region as described above—a variety of thickness, composition and configuration are possible within the scope of the invention.

Figures 30, 31:
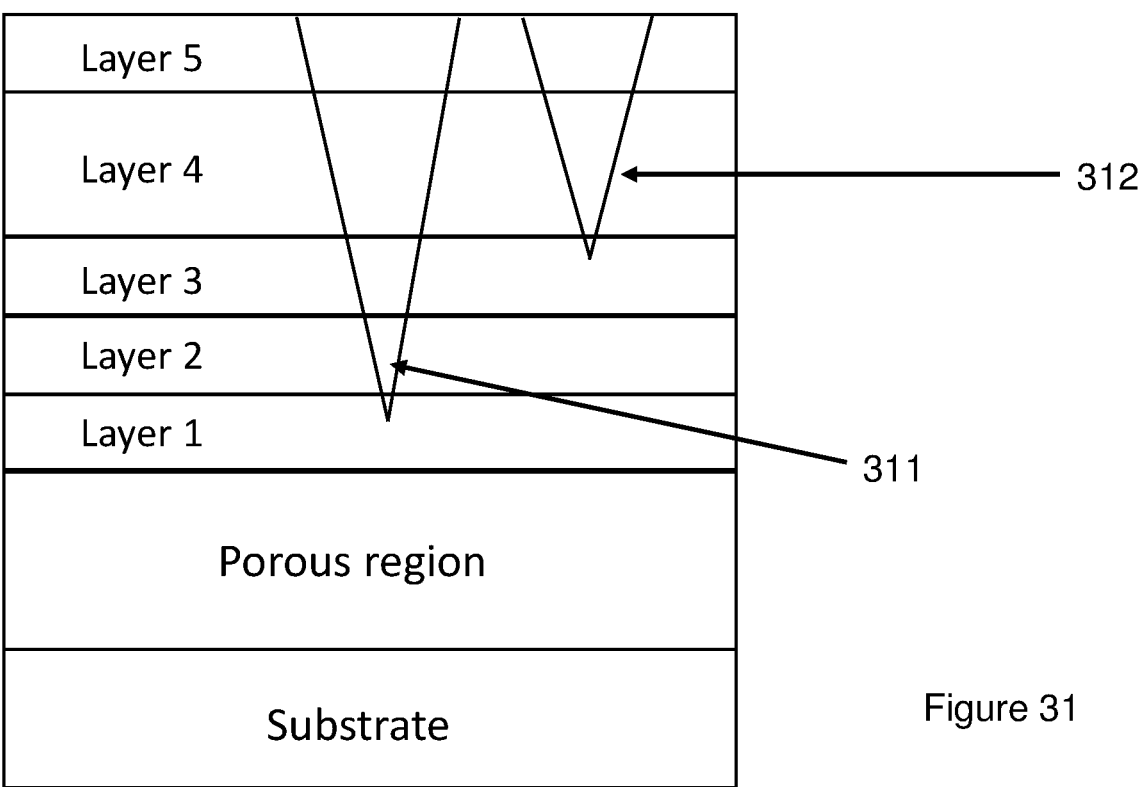
FIG. 30 is a schematic cross-section of an LED according to a preferred embodiment of the present invention.
FIGS. 31-34 are schematic cross-sections of the LED of FIG. 30, including two v-shaped pits.

In a preferred embodiment of the invention illustrated schematically in FIG. 31, two v-shaped pits are formed in the LED structure. These pits are v-shaped in cross section, and create v-shaped voids through the upper layers of the LED structure.

As illustrated, a first v-shaped pit 311 extends from the connecting layer (layer 1) to the upper surface of the LED device, which is formed by the outer surface of the p-type layer (layer 5). The narrow point of the v-shaped pit is located in the connecting layer, and the width of the pit enlarges with each layer that is epitaxially grown over the connecting layer, reaching its widest point at the surface of the p-type layer.

A second v-shaped pit 312 extends from the pre-strain layer (layer 3) to the upper surface of the LED device, which is formed by the outer surface of the p-type layer (layer 5).

Figure 32:
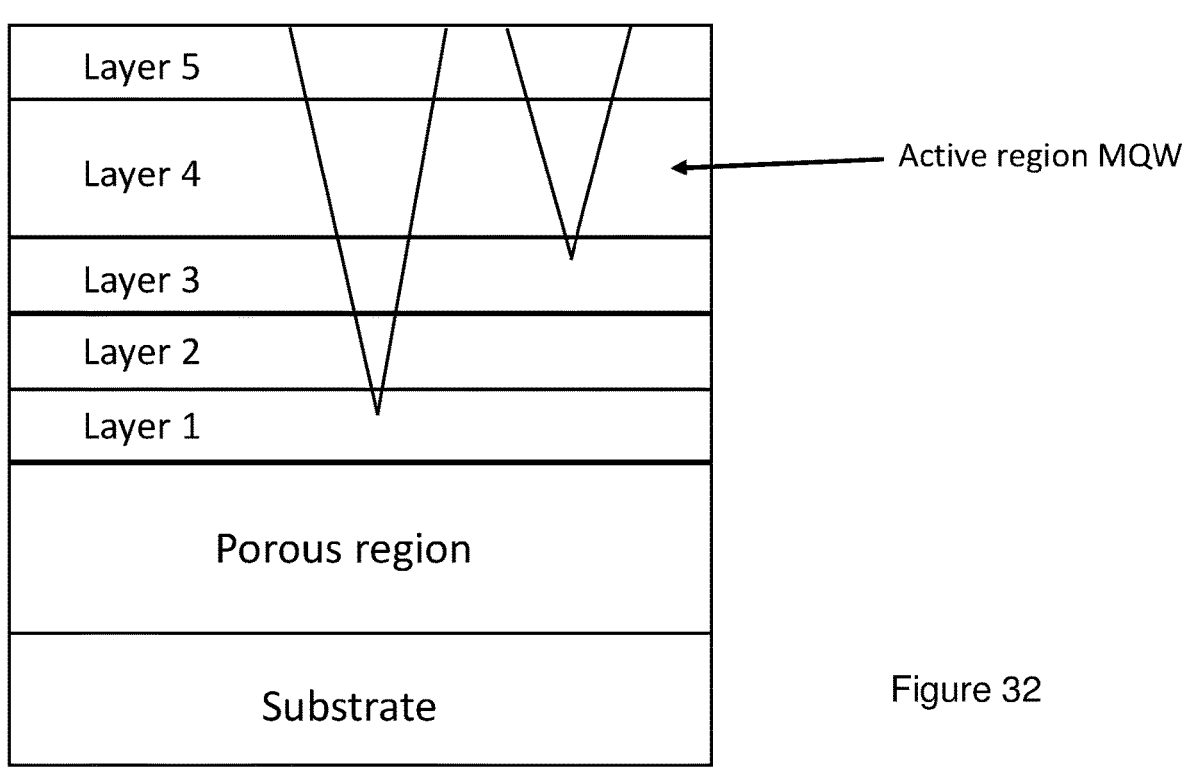

As shown in FIG. 32, the first and second v-shaped pits 311, 312, extend through the active region MQW of the LED structure. The v-shaped pits thus create gaps or voids in the semiconductor structure. V-shaped pits can be generated either in layer 1 or layer 3, but have to go through layer 4, which is the MQW region.

Active light emitting multiple quantum wells (MQWs) and quantum barriers (QBs) can be made of (Al,In) GaN and (Al,In) GaN, respectively, and effectively any combination of materials, composition, and thickness. The MQW can have any period, 1×QW, 2×QW, 3×QW, 4×QW, 5×QW, all the way to 10×QWs or more.

In some preferred embodiments the QWs are continuous. In some preferred embodiments the QWs are fragmented.

V-shaped pits can be originated or caused by the existence of threading dislocations. V-shaped pits can alternatively be formed by different growth modes in the epitaxy process, i.e. 3-dimensional growth.

The growth of v-shaped pits is described, for example, in *The effect of nanometre-scale V-pits on electronic and optical properties and efficiency droop of GaN-based green light-emitting Diodes*; Zhou et al; Scientific Reports|(2018) 8:11053|DOI: 10.1038/s41598-018-29440-4.

Figure 33:
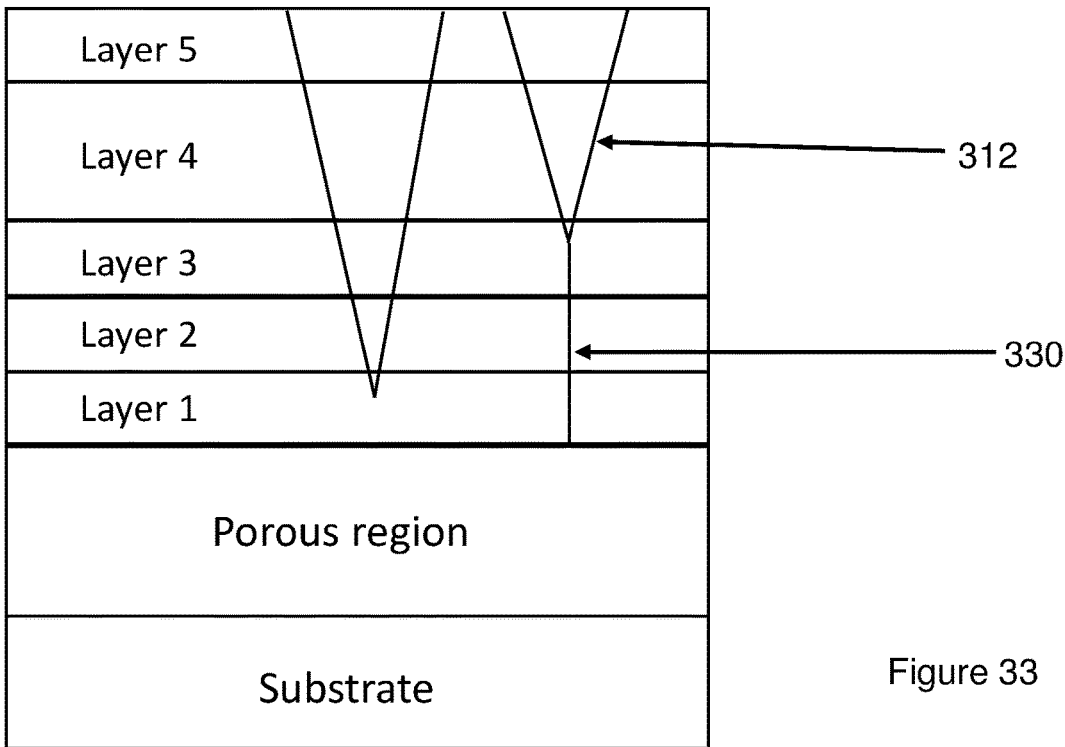
Figure 34:
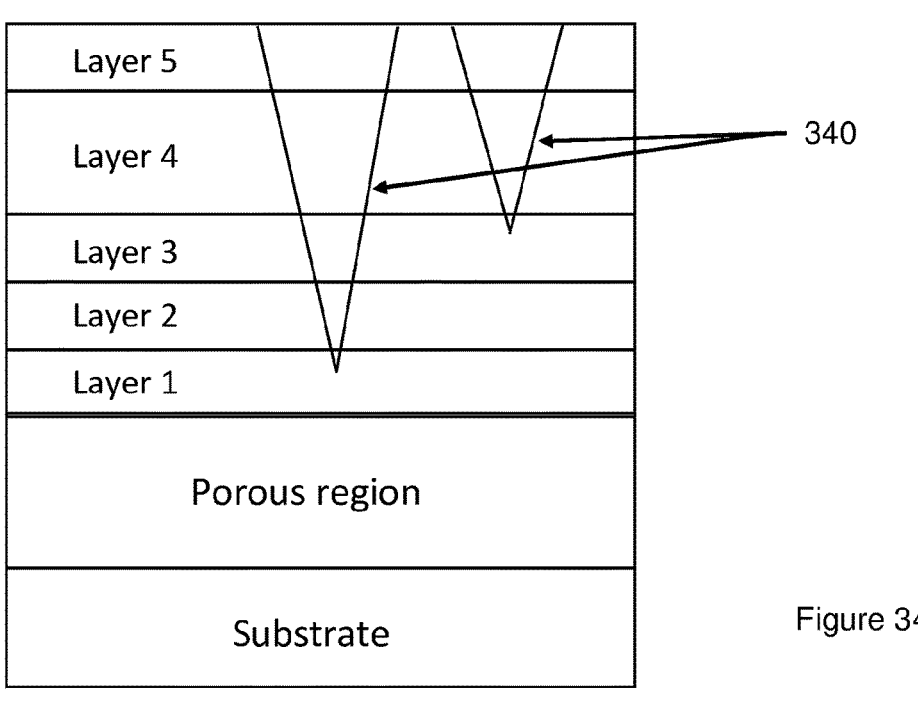

As shown in FIG. 33, the second v-shaped pit 312 originates from a threading dislocation 330. The threading dislocation originates at the porous region or the connecting layer (layer 1), and extends upwards through sequentially deposited layers of semiconductor material (layers 1&2). At the pre-strain layer (layer 3) the threading dislocation 330 begins to widen into a v-shaped pit 312, and as further semiconductor layers are epitaxially grown over layer 3 the v-shaped pit 312 gets wider and wider.

As the v-shaped pits run through the MQW active region during epitaxial growth, there will also be MQWs being grown on the side walls 340 of the v-shaped pits. The MQWs deposited which will be of different thickness and composition comparing to the planar MQWs at which no such pits are present.

As the v-shaped pits have begun to form before the active region including the MQWs is deposited, the semiconductor material that is epitaxially deposited over the layers below is deposited into the v-shaped pits. At the v-shaped pits, the layers of material forming the MQWs are therefore distorted as the layers are stretched down the sidewalls 340 of the v-shaped pits. This is shown by the transmission electron microscopy (TEM) image of FIG. 35.

Figure 35:
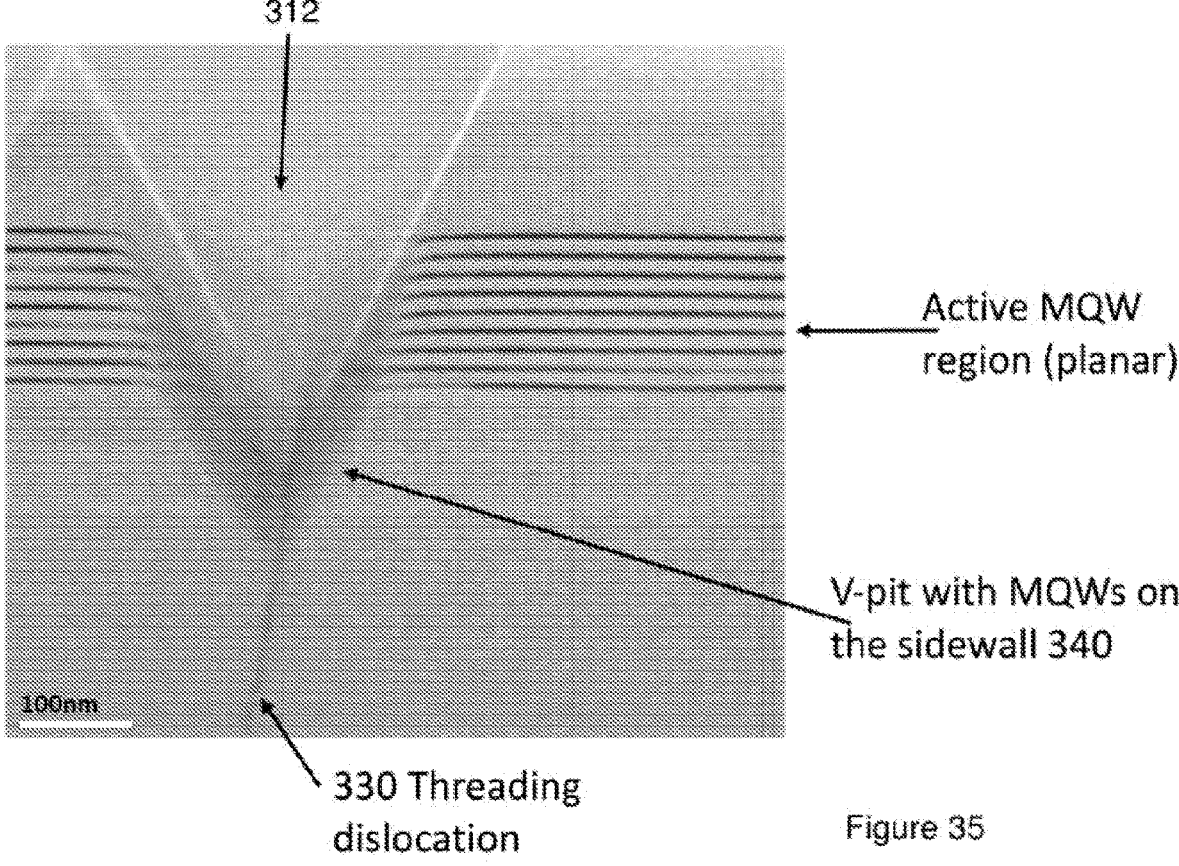
FIG. 35 is a TEM image of a cross-section of an LED with a v-shaped pit, according to a preferred embodiment of the present invention.

As shown in FIG. 35, on either side of the v-shaped pit 312, layers of semiconductor structure are grown as flat planar layers. The active MQW region is thus planar around the v-shaped pit (on either side as shown in cross-section). In the location of the v-shaped pit, however, the MQW layers are distorted and stretched downwards along the sidewalls 340 into the v-shaped pit. This stretching effect changes the thickness of the QWs on the sidewalls 340 of the pit, so that they are different in thickness compared to the planar QW layers formed over the rest of the LED structure.

The inventors have found that v-shaped pits can create local strain relaxation, and MQWs deposited on the sidewall of these v-pits will have different thickness and composition compared to the rest of the MQW, hence the MQW in the region of the v-shaped pits will produce a different emission wavelength.

FIGS. 36 & 37

Figure 36:
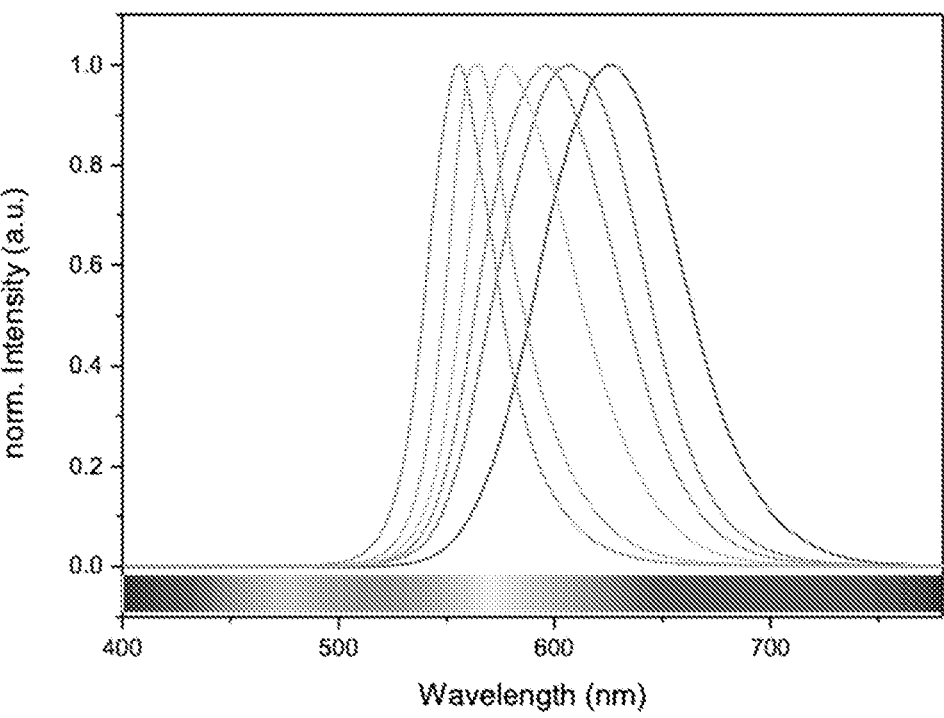
FIG. 36 is a graph of normalised intensity vs peak emission wavelength, for a variable-wavelength LED according to the present invention.
Figure 37:
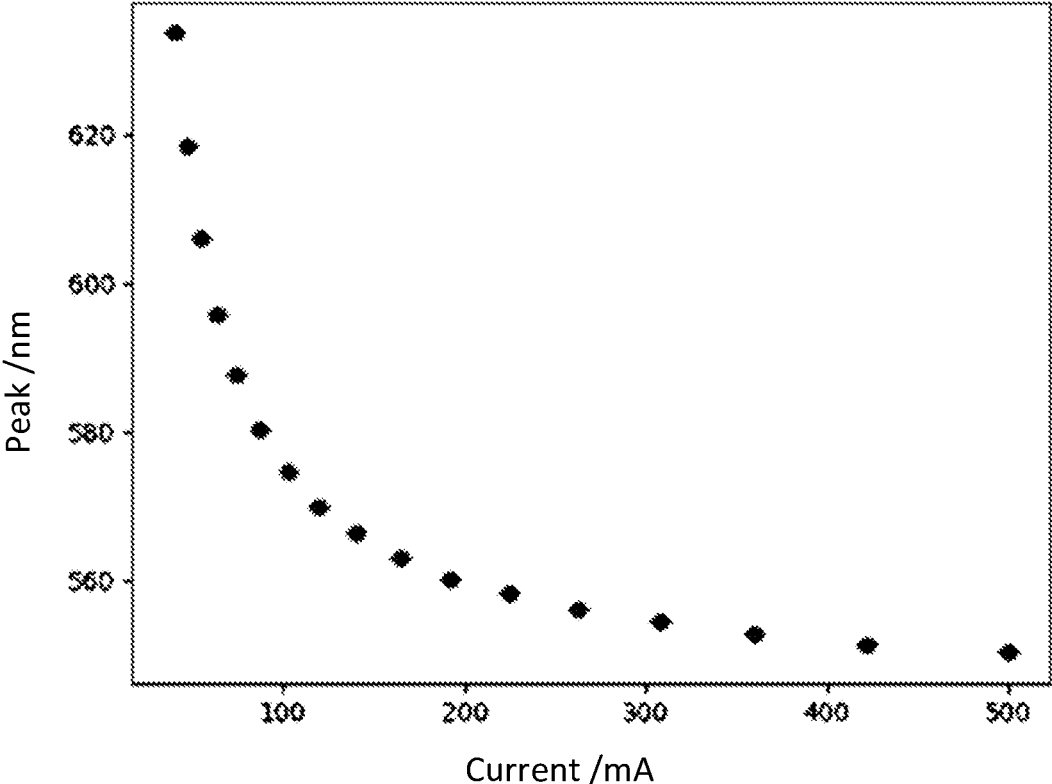
FIG. 37 is a graph of peak emission wavelength vs driving current, for a variable-wavelength LED according to the present invention.

FIG. 36 is a graph of normalised intensity vs peak emission wavelength, for a variable-wavelength LED containing v-shaped pits as shown in relation to FIGS. 31-35. As the driving conditions applied to the LED are varied, the LED emits light at different peak emission wavelengths. As shown in FIG. 36, the peak emission wavelength of the LED can be varied across a continuous wavelength range from around 530 nm to around 640 nm, FIG. 37 is a graph of peak emission wavelength vs driving current, for a variable-wavelength LED according to the present invention. FIG. 37 shows that as the driving current applied to the LED is increased, the peak emission wavelength changes smoothly from around 550 nm to around 635 nm, Higher driving currents cause the LED to emit at shorter wavelengths, while lower driving currents cause the LED to emit at lower wavelengths. The variation in peak emission wavelengths is continuous and consistent as the driving current is varied, leading to simple calibration of the LED device.

FIG. 38

Figure 38:
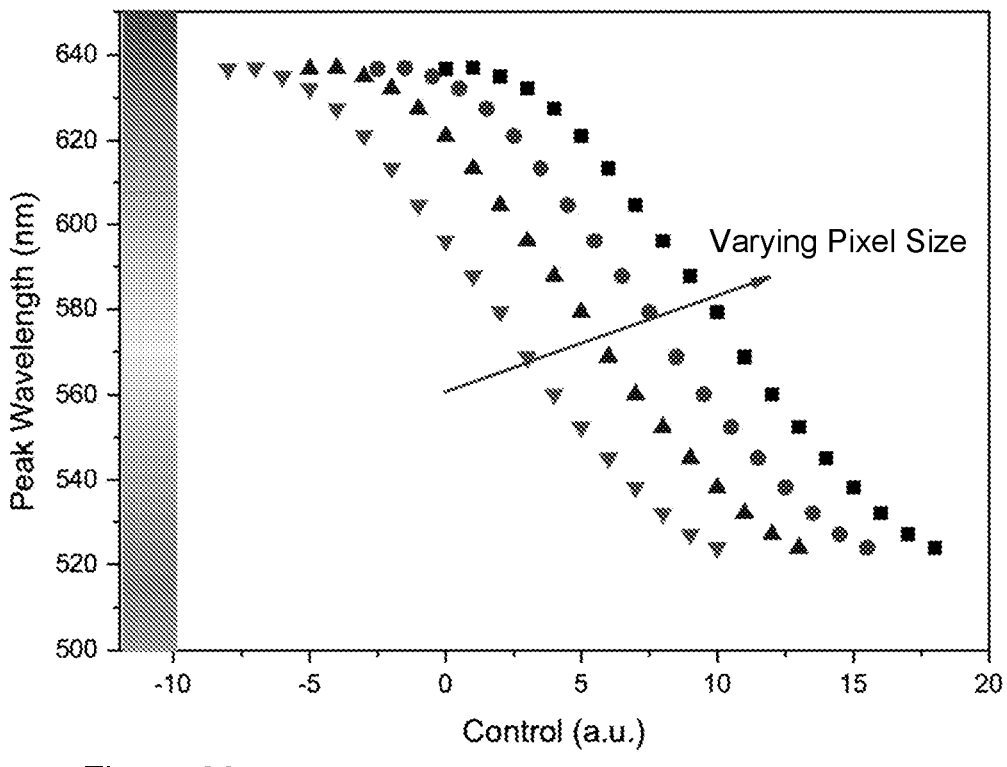
FIG. 38 is a graph of peak emission wavelength for variable-wavelength LEDs of different pixel sizes.

FIG. 38 is a graph of peak emission wavelength for variable-wavelength LEDs of different pixel sizes. As shown in FIG. 38, changing the size of LED pixels affects the peak emission wavelengths that the pixels emit. Under the same driving conditions, pixels of different sizes (which are otherwise identical) will emit at different peak wavelengths.

FIGS. 39 & 40

Figure 39:
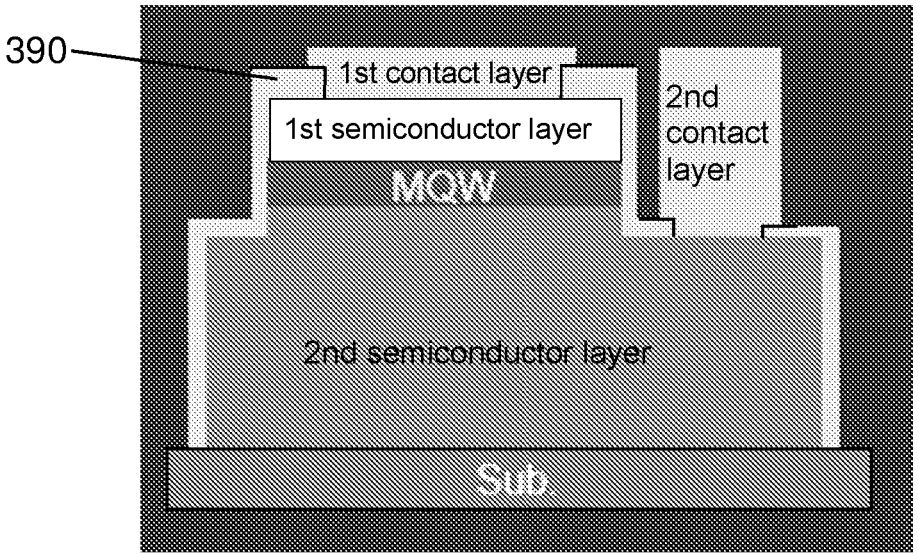
FIG. 39 is a schematic side-on cross-section of a variable-wavelength LED structure according to a preferred embodiment of the present invention.

FIGS. 39 and 40 are a schematic side-on cross-sections of a variable-wavelength LED structure according to two alternative embodiments.

In the following examples, the LEDs and LED subpixels are preferably variable-wavelength LEDs as described above.

The LED structures in FIGS. 39 and 40 are shown with simplified diode structures, in which a light-emitting region containing a multiple quantum well (MQW) is positioned between $1^{st}$ and $2^{nd}$ semiconductor layers. The LED structure is provided on a substrate which preferably contains a porous region of semiconductor material.

FIGS. 39 and 40 illustrate alternative arrangements for the electrical contacts attached to the LEDs. In both embodiments, a $1^{st}$ electrical contact is shown positioned over the $1^{st}$ semiconductor layer. An electrically-insulating masking layer 390 (which may be called a passivation layer) is positioned partially between the $1^{st}$ semiconductor layer and the $1^{st}$ contact layer, so that the $1^{st}$ contact layer contacts the $1^{st}$ semiconductor layer only through an aperture in the masking layer 390. The size of the aperture determines the contact area over which the $1^{st}$ semiconductor layer and the $1^{st}$ contact layer are in contact with one another. When a driving current is applied through the electrical contacts, this contact area restricts the area through which the driving current can pass into the LED structure. The size of the contact area and the magnitude of the driving current determines the current density experienced by the LED structure. The current density experienced by the LED structure in turn determines the peak emission wavelength of the light emitted by the MQW.

The $2^{nd}$ contact layers are arranged differently in FIGS. 39 and 40.

In FIG. 39, the $2^{nd}$ contact layer is arranged to contact the $2^{nd}$ semiconductor layer through an aperture in the masking layer 390. As for the $1^{st}$ contact layer, the size of the aperture determines the contact area shared by the $2^{nd}$ contact layer and the $2^{nd}$ semiconductor layer.

In FIG. 40, the $2^{nd}$ contact layer is positioned on the substrate instead of on the $1^{st}$ semiconductor layer.

The LED structures of FIGS. 39 and 40 may be formed as described above in relation to FIGS. 1 to 18, with the $1^{st}$ and $2^{nd}$ semiconductor layers acting as p-type and n-type layers so that the MQW emits at a peak wavelength when a driving current is applied between the two electrical contacts.

The first semiconductor layer may include but is not limited to p-Gan and n-Gan.

The first contact layer may include but is not limited to titanium, platinum, chromium, aluminium, nickel, gold and some compounds such as ITO (indium tin oxide).

Because the emission wavelength will blue-shift with increasing injection current density, in order to control the current density, there will be different contact areas, as shown in FIG. 41.

FIG. 41 illustrates three different contact areas between a contact layer and a semiconductor layer in an LED diode. A $1^{st}$ electrical contact layer is shown positioned over a $1^{st}$ semiconductor layer. An electrically-insulating masking layer 390 is positioned partially between the $1^{st}$ semiconductor layer and the $1^{st}$ contact layer, so that the $1^{st}$ contact layer contacts the $1^{st}$ semiconductor layer only through an aperture in the masking layer 390. The size of the aperture determines the contact area over which the $1^{st}$ semiconductor layer and the $1^{st}$ contact layer are in contact with one another. When a driving current is applied through the electrical contacts, this contact area restricts the area through which the driving current can pass into the LED structure. The size of the contact area and the magnitude of the driving current determines the current density experienced by the LED structure. The current density experienced by the LED structure in turn determines the peak emission wavelength of the light emitted by the MQW.

FIG. 42 is a plan view of an electrical contact positioned over an LED subpixel mesa. The contact area $A_{contact}$ is necessarily smaller than the area of the subpixel mesa $A_{mesa}$, as the largest possible contact would contact the LED subpixel mesa over its entire area, giving a contact ratio of 1:1.

Figures 43A, 43B, 43C:
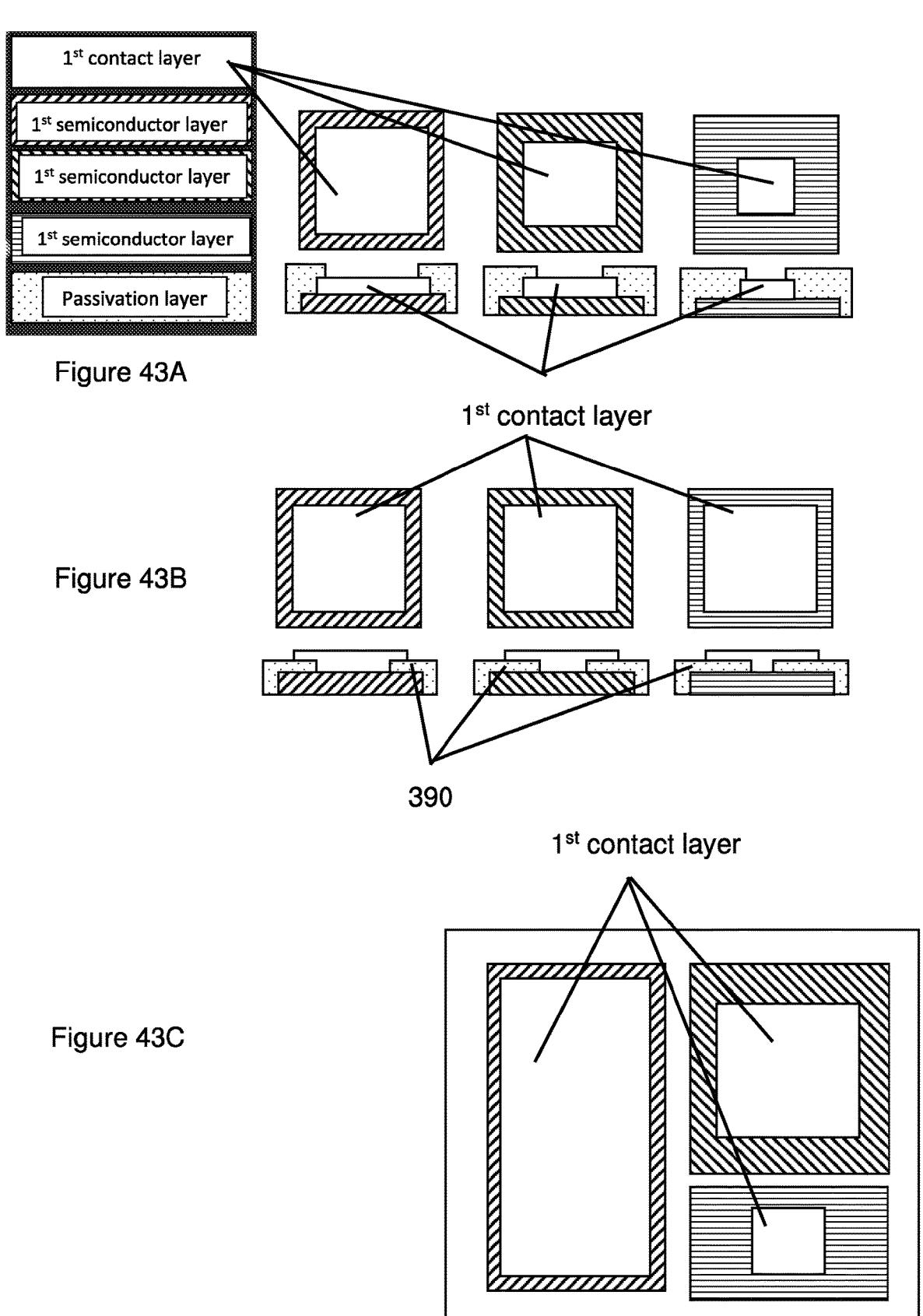
FIG. 43A is a schematic illustration of three subpixel mesas having the same subpixel mesa area, but different contact areas and thus different contact ratios.
FIG. 43B is a schematic illustration of three subpixel mesas having the same subpixel mesa area and the same contact pad size, but different contact areas and thus different contact ratios.
FIG. 43C is a schematic illustration of three subpixel mesas having different subpixel mesa areas, different contact areas and different contact ratios.

FIGS. 43A-43C illustrate three alternative ways of obtaining RGB subpixels using three subpixels having the same diode structure.

In FIG. 43A, three subpixel mesas have the same subpixel mesa area, but different sizes of electrical contact pad. The different sizes of electrical contact pad means that each of the three subpixels has a different contact area, and thus each of the subpixels has a different contact ratio (the ratio of contact area:light-emitting area, which because the light-emitting region spans the entire subpixel mesa, is the same as the ratio of contact area:subpixel mesa area). The subpixel on the left has the largest contact area, and therefore the largest contact ratio. The subpixel on the right has the smallest contact area, and therefore the smallest contact ratio. And the subpixel in the centre has a contact area and contact ratio between the other two.

The smaller the contact ratio, the smaller the contact area through which driving current is provided to the subpixel, and thus the higher the current density experienced by the subpixel. As shown in FIGS. 27A and 27B, higher current densities lead to shorter peak emission wavelengths, so of the three subpixels in FIG. 43A, the subpixel on the left emits at the longest peak wavelength and the subpixel on the right emits at the shortest peak wavelength.

In particularly preferred embodiments, the contact ratios of the three subpixels, and the driving current, are chosen so that the three subpixels emit at red (left subpixel), green (centre subpixel) and blue (right subpixel) in response to a single driving current.

FIG. 43B shows an alternative way of arriving at the same three contact ratios as FIG. 43A. In FIG. 43B, the three subpixels again have the same mesa area, and thus the same light-emitting area. In FIG. 43B, the three electrical contact pads also have the same area when viewed from above. However, masking layers 390 are positioned between the subpixels and the electrical contact layers, with the masking layers on the three subpixels containing apertures of different sizes. The contact layers can only contact the subpixel diode structure through the apertures, so the sizes of the apertures control the contact areas. The subpixel on the left has the largest aperture in the masking layer, and thus the largest contact area, which leads to the largest contact ratio. The subpixel on the right has the smallest aperture through the masking layer, and thus the smallest contact area and the smallest contact ratio. The subpixel in the centre has a masking layer aperture with a size in between the other two, which leads to a contact area and contact ratio between those of the other two subpixels.

The sizes of the apertures in the masking layers are selected to create the same contact areas as the subpixels in FIG. 43A. Thus in response to the same driving current, the three subpixels in FIGS. 43A and 43B will emit at three corresponding peak emission wavelengths, preferably RGB wavelengths.

FIG. 43C shows a third way of creating three subpixels having the same contact ratios as those shown in FIGS. 43A and 43B.

In FIG. 43C, the three subpixel mesas each have different subpixel mesa areas, and each have different sizes of electrical contacts creating different contact areas on the three subpixels. In FIG. 43C however, the relative sizes of the subpixels and contact areas are the same as those shown in FIGS. 43A and 43B. Thus the red subpixel shown on the left in FIG. 43C has the same contact ratio as the red subpixels on the left of FIGS. 43A and 43B; the green subpixel shown in the top right in FIG. 43C has the same contact ratio as the green subpixels in the centre of FIGS. 43A and 43B; and the blue subpixel shown in the bottom right in FIG. 43C has the same contact ratio as the blue subpixels on the right of FIGS. 43A and 43B. As the peak emission wavelength at a given driving current is determined by the contact ratio (the ratio of contact area:light-emitting area, which because the light-emitting region spans the entire subpixel mesa, is the same as the ratio of contact area:subpixel mesa area), the subpixels of all of FIGS. 43A-43C will emit at the same three wavelengths in response to the same driving current.

Figure 13:
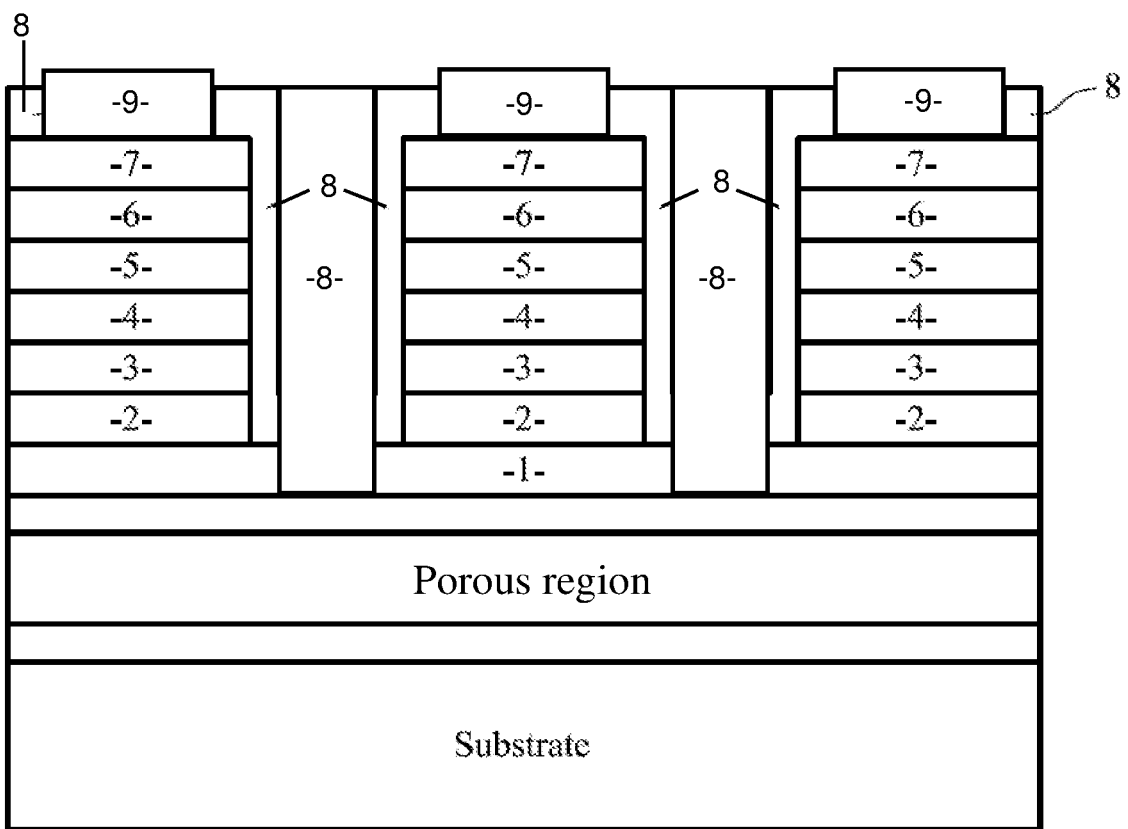

FIGS. 44 and 45 show three LED subpixels formed from a single LED structure, similar to the embodiment shown in FIG. 13. In the embodiments shown in FIGS. 44 and 45 however, instead of each LED subpixel having a uniform metal contact layer 9, the three subpixels each have differently sizes electrical contacts 9A, 9B, 9C, which create different contact areas between the contacts and the three subpixel diode structures.

The embodiment of FIG. 44 corresponds to the example of FIG. 43A, in which the three subpixels all have the same mesa size, and thus the same light-emitting area, but in which the three electrical contacts are formed in differently sized apertures in an electrically-insulating masking layer 8. The subpixel on the left has the largest electrical contact 9A, and thus the largest contact area and the largest contact ratio.

The subpixel on the right has the smallest electrical contact 9C, and thus the smallest contact area and the smallest contact ratio. The subpixel in the centre has an electrical contact 9B having a size between the sizes of the other contacts 9A, 9C, and thus the centre subpixel has a contact area and contact ratio between those of the other two subpixels. These three subpixels will emit at three different peak wavelengths in response to the same driving current. The subpixel on the left will emit at the longest wavelength, due to its contact ratio being the highest, and the subpixel on the right will emit at the shortest wavelength, due to its contact ratio being the lowest.

FIG. 45 is an analogue of FIG. 43B, in which the electrical contacts 9A, 9B, 9C have the same size when viewed from above, but the contact areas between the electrical contacts and the three subpixels are controlled by the sizes of apertures through the masking layer 8. The contact areas between the electrical contacts 9A, 9B, 9C and the three subpixels are the same as those in FIG. 44, so the three subpixels will emit at corresponding wavelengths in response to the same driving current.

FIGS. 46A-G illustrate alternative embodiments of light-emitting regions of variable-wavelength LEDs according to the present invention. Examples of MQWs:

1. Continuous MQWs
2. V-pits
3. Broken QWs, gappy QWs, fragmented QWs
4. QDs
5. Well-width fluctuation
6. Alloy composition
7. Different combinations of MQWs and underlayers These structural characteristics can be identified and examined by standard material characterisation techniques, such as cross-sectional transmission electron microscopy (TEM), X-ray diffraction (XRD), Energy Dispersive X-ray Spectroscopy (EDX or EDS), 3D atom probe (3DAP).

FIG. 46A shows a continuous MQW light-emitting region of an LED, in which three identical QWs are provided between four identical quantum barriers (QBs).

FIG. 46B shows the continuous MQW of FIG. 46B, with a V-shaped pit propagating through the light-emitting region. The v-shaped pit terminates in a threading dislocation, and has QWs on its semi-polar facets.

FIG. 46C shows a MQW in which the QW layers comprise discontinuities or gaps in the semiconductor material.

Figure 46D:
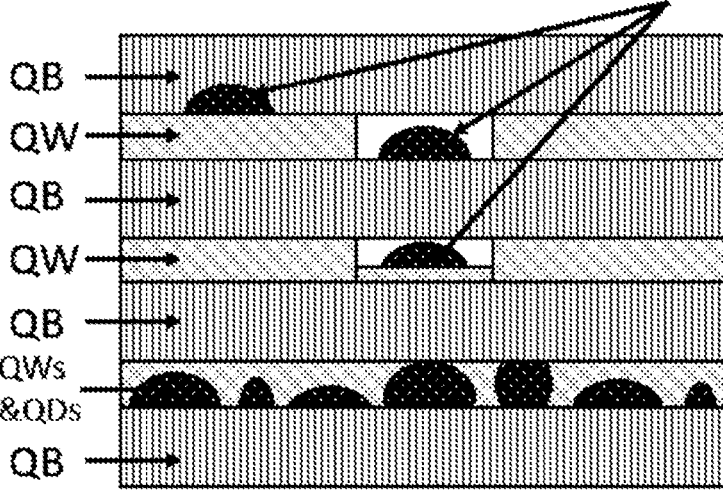

FIG. 46D shows a MQW in which quantum dots (QDs) create non-uniformities in the MQW. QDs may be provided on or in the QB or QW layers, for example in gaps in the QW structure.

Figure 46E:
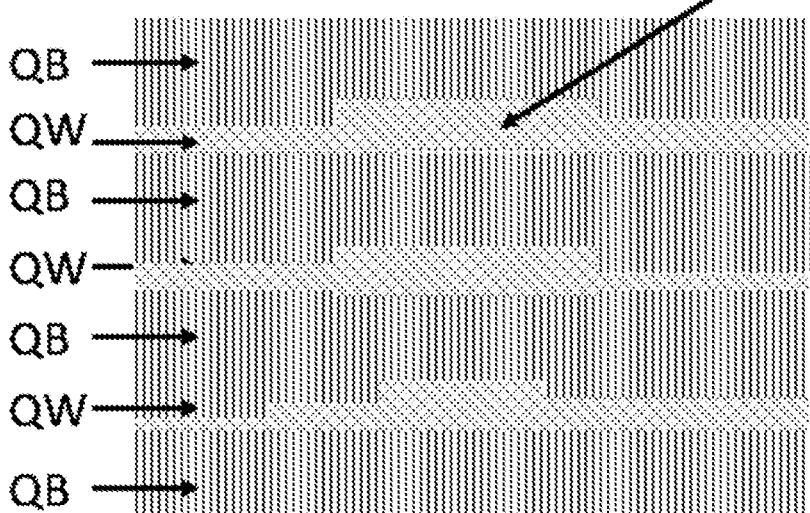

FIG. 46E shows a MQW with well-width fluctuation, in which the thicknesses of the QW layers are not uniform across the light-emitting region. The QWs may have different widths from each other, and also varying widths within a single QW.

Figure 46F:
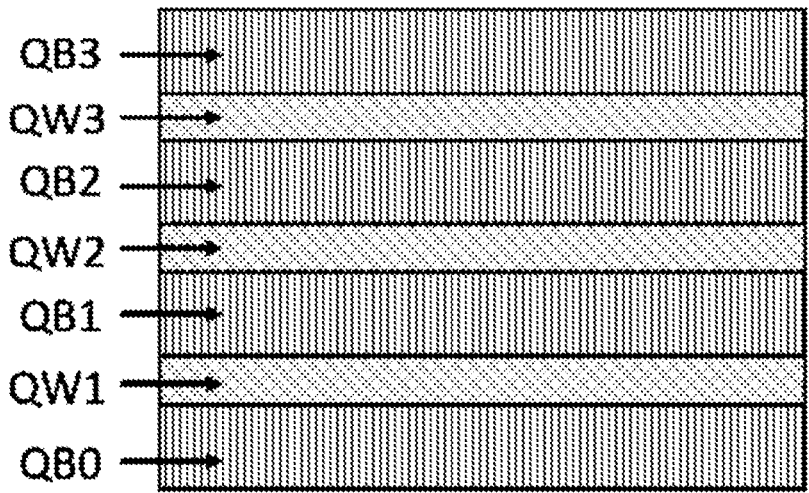

FIG. 46F shows a MQW with fluctuations in alloy composition in the light-emitting region. The compositions of the QBs and the QWs differ from layer to layer. In particular, the indium In % composition is varying within the same QWs, i.e. in QW2, In % is varying between 10-12% or 10-15%, or 10-25%, or 10-35%.

Figure 46G:
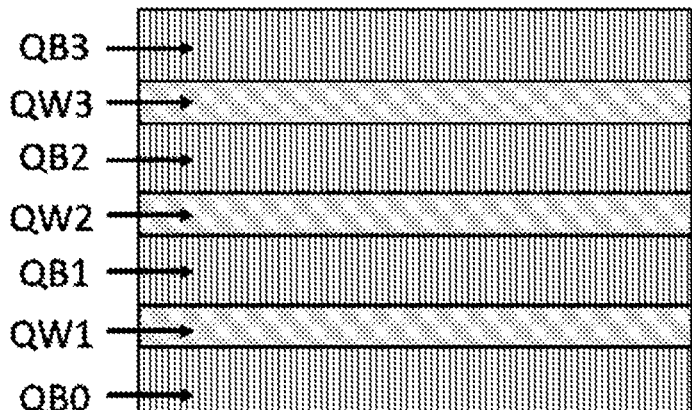

FIG. 46G shows a MQW containing different combinations of MQWs and underlayers. In % composition is different across different QWs. For example In % in QW1 is 15%, In % in QW2 is 25%, and In % in QW3 is 30%. In embodiments of the present invention, the lower In % QW is preferably positioned at the bottom of the MQW, due to its strain and thermal effect, while the high In % QWs is preferred to be on the top. In a preferred embodiment, for example, QW1 is a blue emitting QW, QW2 is a green emitting QW, QW3 is a red emitting QW.

FIG. 47A is a TEM image of a cross-section of a conventional non-variable-wavelength LED. Non-variable LED—MQWs are uniform and smooth in both upper and lower interface (5 MQWs shown here clearly)

Figure 47C:
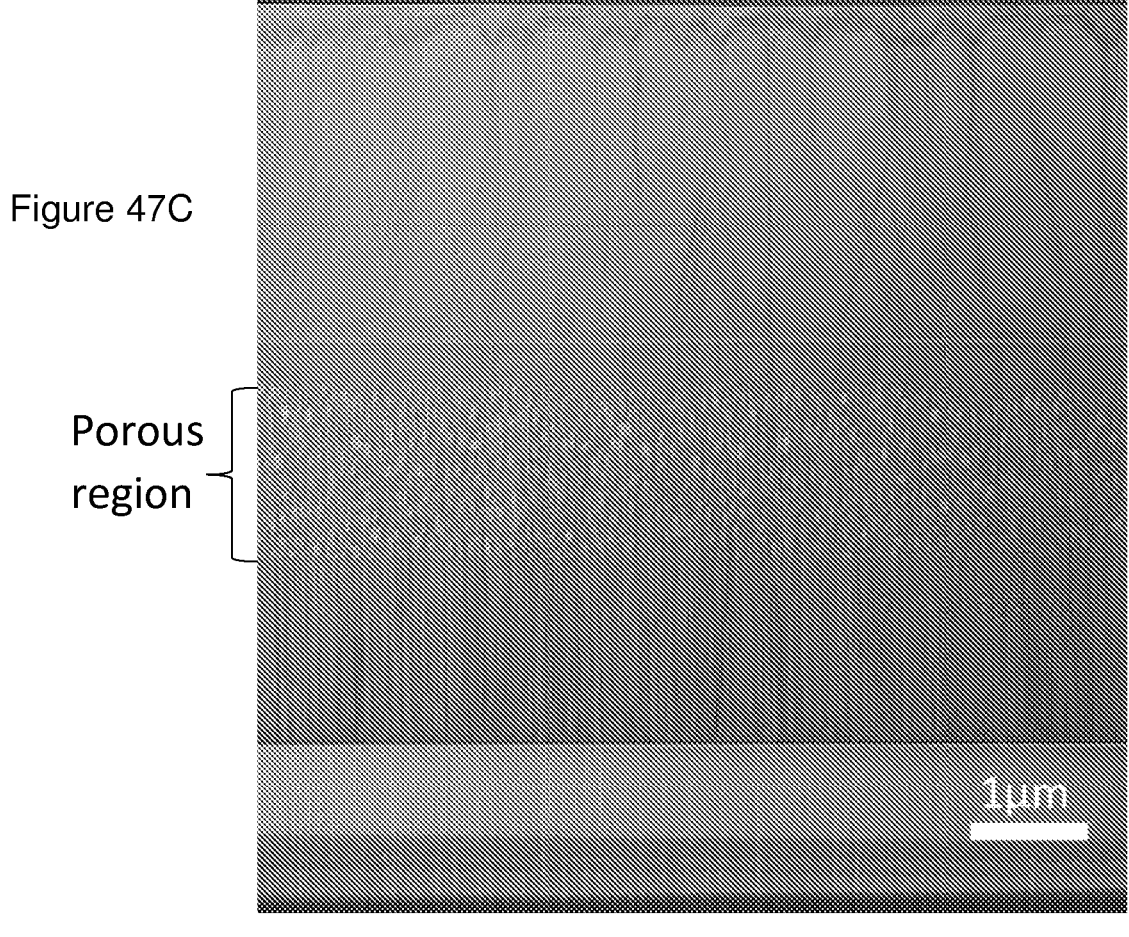
FIG. 47C is a TEM image of the variable-wavelength LED of FIG. 47B, showing a porous region and a light-emitting region comprising a plurality of v-shaped pits, according to a preferred embodiment of the present invention.

FIGS. 47B and 47C are TEM images a variable-wavelength LED comprising v-shaped pits, according to an embodiment of the present invention. Variable wavelength LED—MQWs are non-uniform, which induced by various methods, one example is v-pits and the semi-polar facets which would incorporate more indium and thinner QWs. Another example is also evident in FIG. 47B, that the MQWs are not uniform, in terms of broken QWs, discontinuous QWs, fragmented QWs, QWs with well-width or In composition fluctuation FIG. 47C shows a cross section of the variable-wavelength LED of FIG. 47B, showing a porous region and a light-emitting region comprising a plurality of v-shaped pits, according to a preferred embodiment of the present invention.

In this structure, the light-emitting region contains multiple emission wavelength regions that are deliberately introduced such as multiple types of QW region with v-shaped pits extending through the light-emitting region.

V-shaped pits (V-pits) are actually hexagonal pits looking from the above, v-shape is when looking at the cross-section. V-pits can be initialize at each site of dislocations under special epitaxy growth conditions during the growth of InGaN, GaN, InGaN/InGaN superlattice, or InGaN/GaN superlattice structures underlying the MQWs, such as low growth temperature (e.g. <1000° C., or <900° C., or <800° C., or <700° C.) and nitrogen ambient.

Figure 48A:
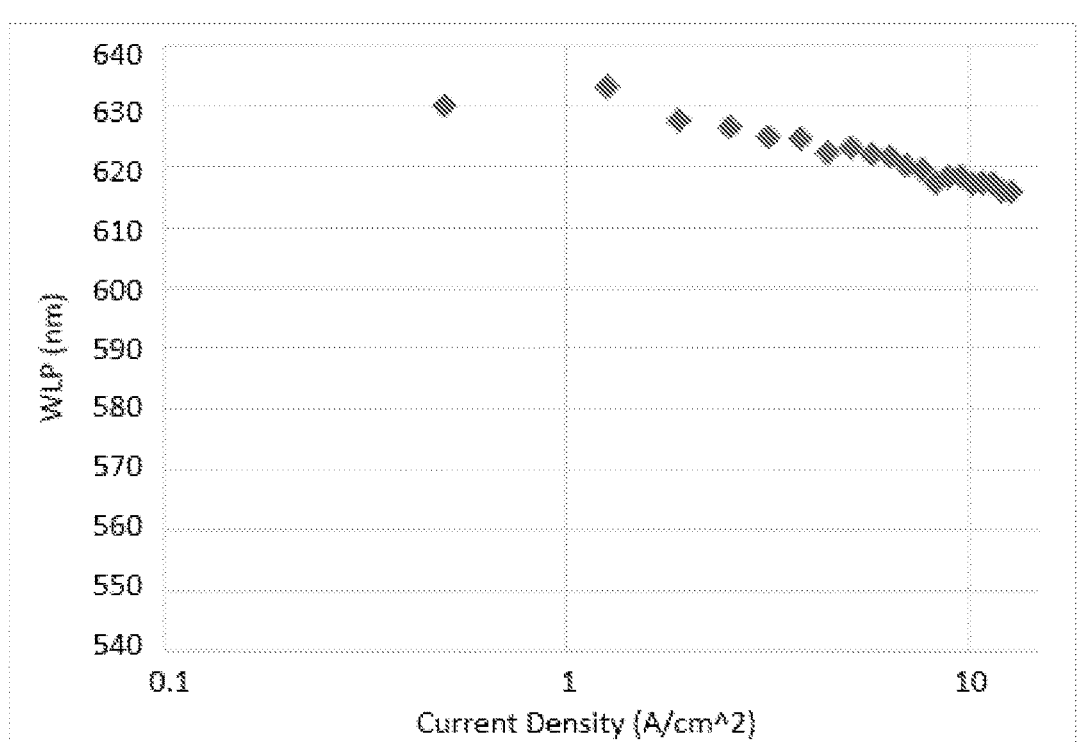
FIG. 48A is a graph of peak emission wavelength vs driving current density for a conventional non-variable wavelength LED.

FIG. 48A is a graph of peak emission wavelength vs driving current density for a conventional non-variable wavelength LED. By varying the driving current density applied to the LED, the emission wavelength can be slightly varied, across an emission wavelength range of around 15 nm.

Figure 48B:
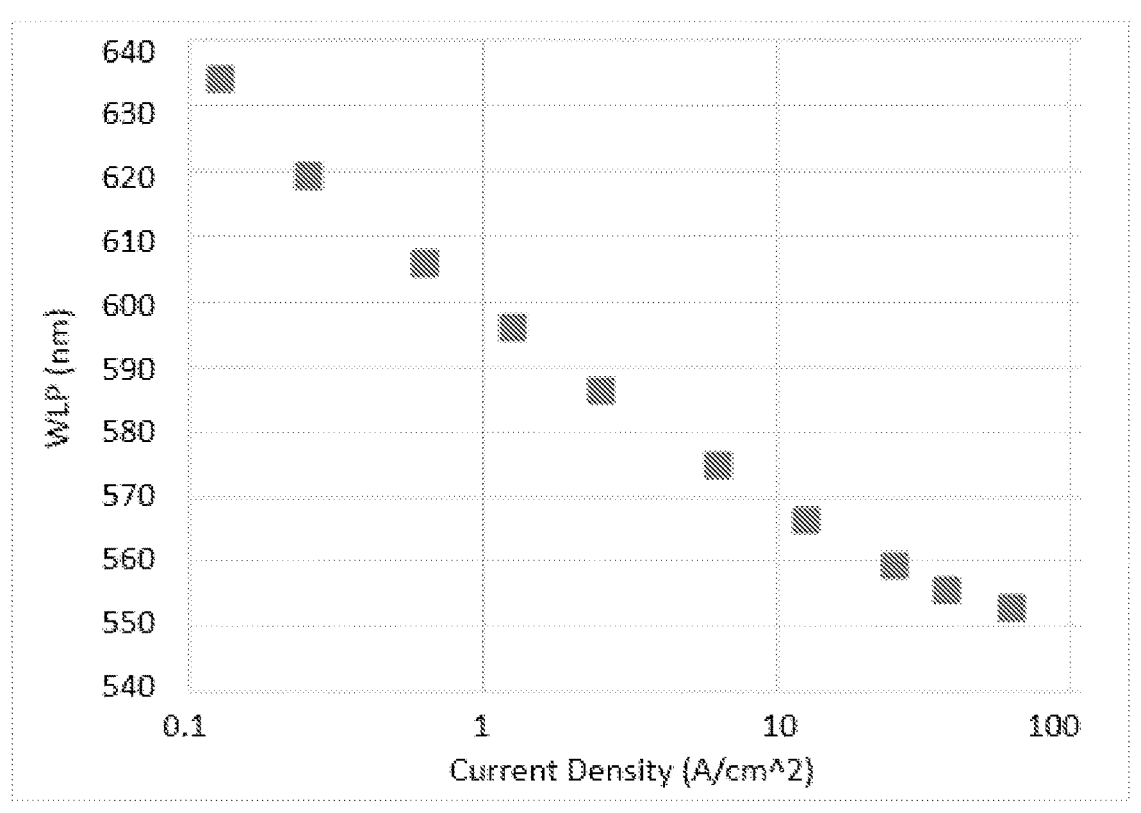
FIG. 48B is a graph of peak emission wavelength vs driving current density for a variable-wavelength LED according to an embodiment of the present invention.

FIG. 48B is a graph of peak emission wavelength vs driving current density for a variable-wavelength LED according to an embodiment of the present invention. In the variable-wavelength LED, varying the current density of the driving power supply creates a much larger variation in the peak emission wavelengths (WLP) emitted by the LED. In this embodiment, varying the driving current density between roughly 0.1 and 100 A/cm² varies the peak emission wavelength from around 635 nm to around 550 nm—an emission wavelength range of around 85 nm.

FIG. 48C is a graph of peak emission wavelength vs driving current density for a variable-wavelength LED according to another embodiment of the present invention. In this embodiment, varying the driving current density varies the peak emission wavelength from around 720 nm to around 580 nm—an emission wavelength range of around 140 nm.

FIG. 49A is a graph of peak emission wavelength vs driving current density for another variable-wavelength LED according to the present invention. In this embodiment, varying the driving current density between roughly 0.1 and 200 A/cm² varies the peak emission wavelength from 615 nm to 508 nm—an emission wavelength range of around 100 nm. The data for this graph only goes to 514.5 nm due to a limitation on the testing capabilities, The current density for 508 nm is therefore estimated. However, the obtainable range of emission wavelengths can be pushed either way significantly.

Figure 49B:
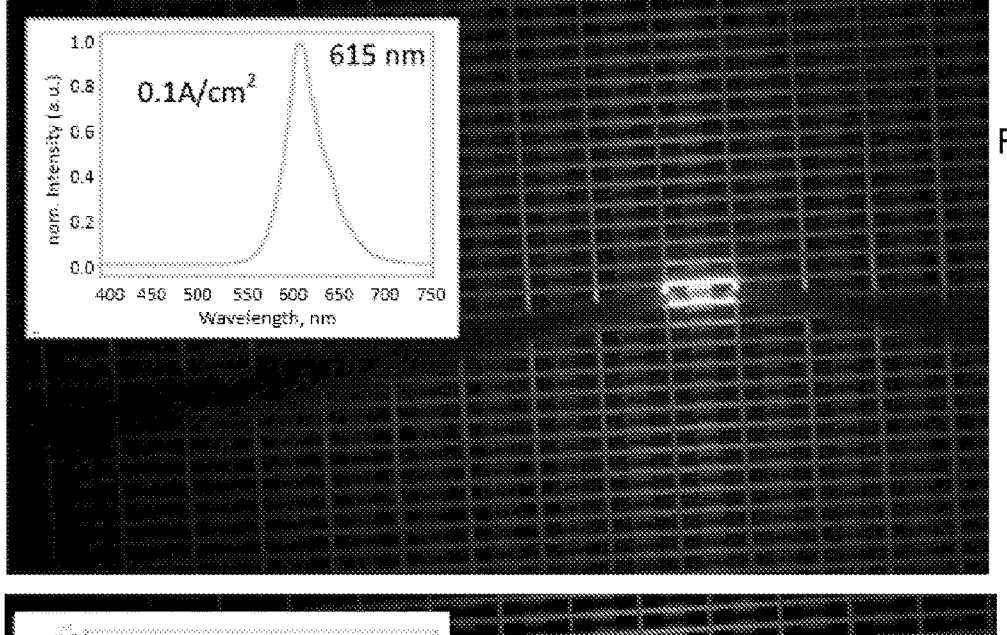
FIGS. 49B-E are photographs of the variable-wavelength LED of FIG. 49A, with inset emission spectra showing the different peak emission wavelengths at different driving current densities.
Figure 49C:
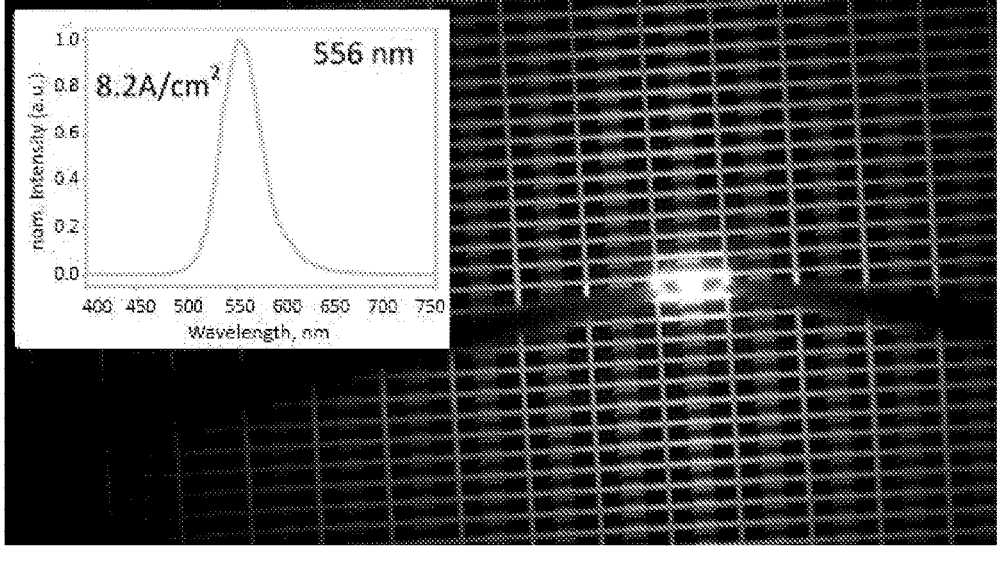
Figures 49D, 49E, 50A:
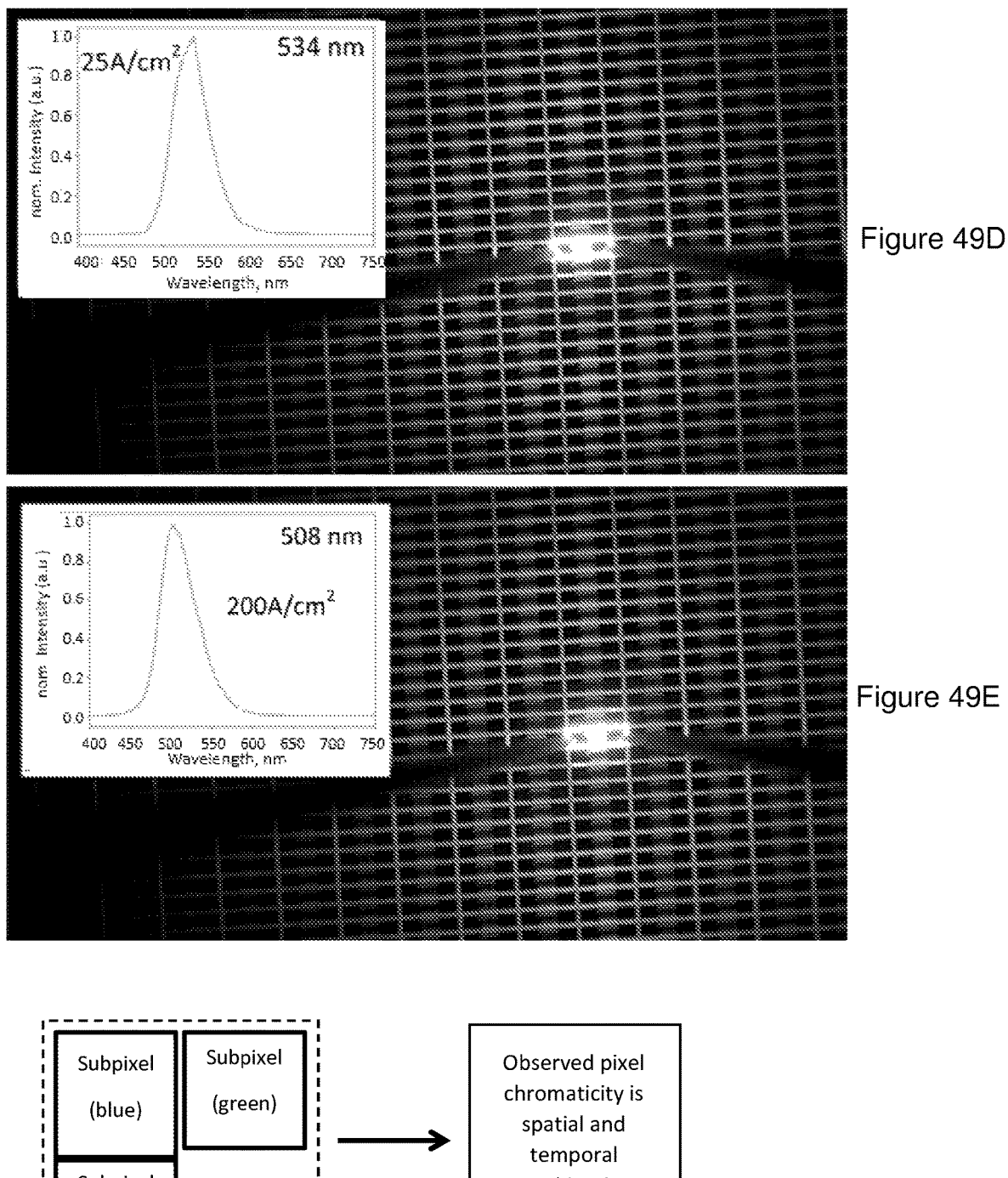
FIG. 50A is a schematic illustration of the spatial combination of single-colour subpixels in a conventional display pixel.

FIGS. 49B-D are photographs of the variable-wavelength LED of FIG. 49A, showing the same variable-wavelength LED emitting at four different wavelengths across its emission wavelength range. The inset emission spectra show the different peak emission wavelengths at different driving current densities. This shows the same variable-wavelength LED emitting at peak emission wavelengths in the orange (615 nm), yellow (556 nm), green (534 nm) and blue (508 nm) in response to different driving current densities.

Display Devices

Figure 50B:
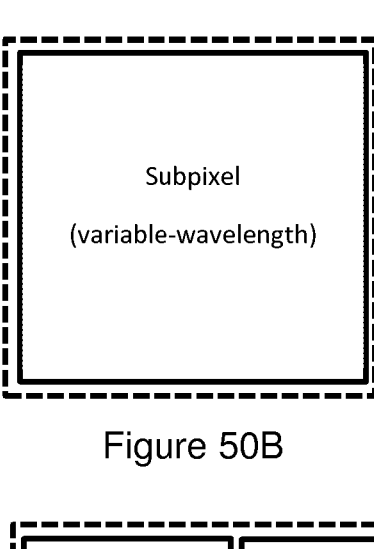
FIGS. 50B-50G are schematic illustrations of LED display device pixels containing at least one variable-wavelength LED according to the present invention.

Conventionally, colour display pixels are made up of multiple single-colour subpixels: a blue subpixel, a green subpixel and a red subpixel. The observed pixel chromaticity is the spatial combination of the light emitted by the three subpixels, as shown in FIG. 50B.

With the variable-wavelength LED of the present invention, individual LED subpixels can display colours over a wide spectral range, for example from blue to red. This allows different colours to be achieved by using a single LED chip and different driving time frames. The observed pixel colour produced is the temporal combination of light emitted by the LED subpixel.

A variety of display device pixels may be configured to incorporate one or more variable-wavelength LEDs according to the present invention. In all of the following pixel embodiments, the overall emitted colour perceived by a viewer is the spacial and temporal combination of the light emitted by the subpixels in any given device pixel.

FIG. 51B illustrates a device pixel consisting of a single variable-wavelength LED. By varying the driving conditions supplied to the LED, the peak emission wavelength from this pixel can be varied across the emission wavelength range, the width and absolute wavelengths of which are determined by the driving conditions and the LED diode size and structure.

Figure 50C:
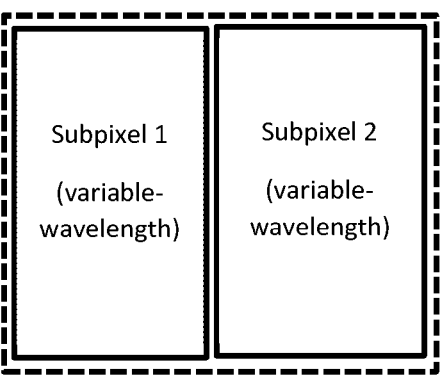

FIG. 50C illustrates a device pixel comprising two subpixels, both of which are variable-wavelength LEDs according to the present invention. The two subpixels may be controlled separately by separately controlling the driving current provided to each subpixel, so that the subpixels may be controlled to emit at different wavelengths.

Figure 50D:
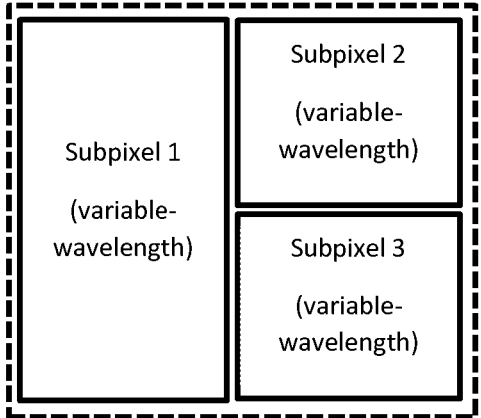

FIG. 50D illustrates a device pixel comprising three variable-wavelength LED subpixels. By controlling the driving currents provided to the three separate subpixels, the peak emission wavelengths of each subpixel may be individually varied.

Figure 50E:
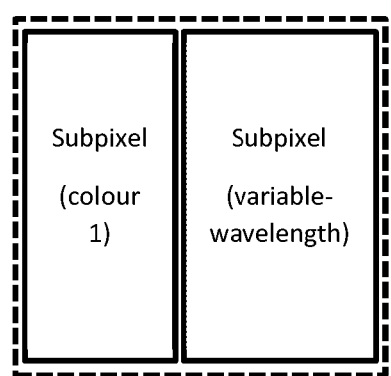

FIG. 50E illustrates a device pixel comprising one variable-wavelength subpixel and one fixed-emission-wavelength subpixel.

Figure 50F:
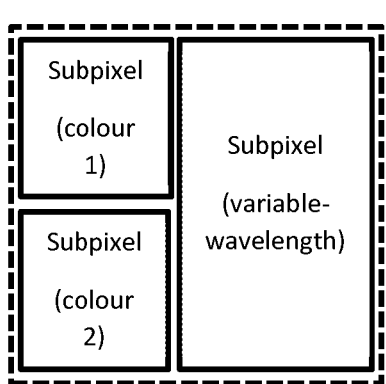

FIG. 50F illustrates a device pixel comprising one variable-wavelength subpixel and two fixed-emission-wavelength subpixels.

Figure 50G:
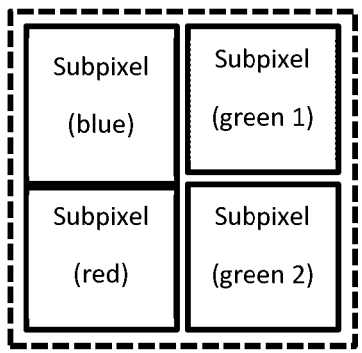

FIG. 50G illustrates a device pixel comprising two fixed-emission-wavelength blue and red subpixels, and two fixed-emission wavelength green subpixels configured to emit at different peak wavelengths within the green range of the spectrum. The green subpixels may be variable-wavelength subpixels configured to receive two different fixed driving current densities, corresponding to different peak emission wavelengths in the green.

Display Devices with Expanded Colour Gamut

Conventional LED displays typically show colours by combining light from subpixels with different primary colours, as shown in FIG. 50A. Conventional pixels include red, green and blue subpixels.

Combinations of light from three primary colour subpixels allow any colour within the triangle (defined by the primary colours) shown in FIG. 51A to be displayed. The triangle shown in FIG. 51A defines the colour gamut obtainable with such a display. The colour space outside of the triangle is not accessible by a conventional three subpixel pixel, and therefore the colour gamut achievable by the pixel is limited.

Solutions to increase colour gamut:

Including additional sub-pixels with different colours, the colour gamut then being defined by a quadrilateral as shown in FIG. 51B. This requires additional cost and complexity.

Further expansion to 5 or more sub-pixels would further expand gamut but increase complexity and cost.

By incorporating the variable-wavelength LED of the present invention into an LED display device, preferably there is provided a display device with controllable chromaticity comprising: an LED structure whose emission spectrum is strongly dependent on drive current density, where the shift in peak emission wavelength is greater than 20 nm/decade, where the peak emission wavelength is controllable in the range 450 nm to 630 nm or wider.

The display comprises subpixels formed of LED devices with controllable chromaticity (variable emission wavelengths).

Preferably subpixels have the same diode structure, and the peak emission wavelength from any given subpixel is controlled only by current density provided to that subpixel during use.

Subpixels may have constant chromaticity (for example in response to a fixed driving current) or may change chromaticity (in response to a varying driving current) such that a greater colour gamut may be achieved. The achievable colour gamut is equal to or greater than that defined by sRGB primaries.

In some embodiments, all subpixels may change chromaticity dynamically from frame to frame. In other embodiments, only some subpixels may change chromaticity dynamically from frame to frame.

A wide colour gamut is thus achievable with a display device incorporating one or more variable-wavelength LEDs according to the present invention.

FIG. 51C illustrates the expanded colour gamut achievable with a variable-wavelength LED device when peak emission wavelength is controlled from 450 nm to 620 nm

Embodiment 1 (FIGS. 52A-D)

FIG. 52A illustrates a display pixel comprising three subpixels. Each subpixel may be an LED device with controllable peak wavelength of light emitted.

When viewed at a distance the observed chromaticity of light emitted is a spatial and temporal combination of the sub-pixel light emission.

Blue (B) and red (R) subpixel are operated with fixed emission corresponding to fixed observed chromaticity. The peak emission wavelengths of the B and R subpixels may be fixed by providing driving currents having fixed magnitudes corresponding to the current densities required for emission at the desired blue and red wavelengths.

Green (G) subpixel can operate in two modes with different peak wavelengths, by providing two separate driving current modes having different magnitudes corresponding to the current densities required for emission at the two desired green wavelengths. The green subpixel can be operated in either of the green modes by switching to the desired drive current mode.

In combination with the B and R subpixels, each of the two G sub-modes enables a different gamut of colours to be displayed.

The effective gamut of the display is that which can be achieved with G sub-pixel in either mode By extension, when variable-wavelength LEDs are used for the R or B subpixels, those subpixels could also be switched between two or more modes. All pixels could be switched between two or more modes allowing the gamut to be set once or dynamically controlled during regular operation.

In an alternative embodiment, conventional blue and red LEDs may be incorporated into the pixel to act as the blue and red subpixels, with a variable-wavelength LED forming the green subpixel.

Figures 53, 54A, 54B, 55A:
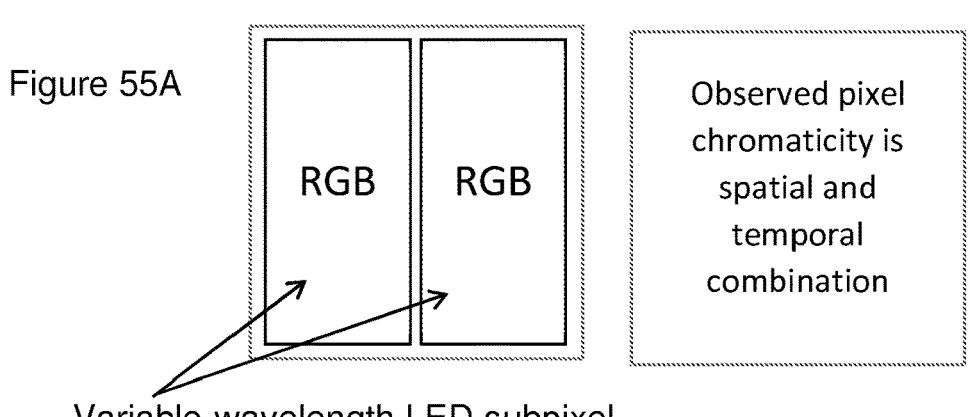
FIG. 53 illustrates a method of controlling a display pixel containing variable-wavelength LEDs according to the present invention.
FIGS. 54A & 54B illustrate a display pixel according to an embodiment of the present invention and the colour gamut obtainable with that pixel.
FIGS. 55A-D illustrate a display pixel according to another embodiment of the present invention and the colour gamut obtainable with that pixel.

Embodiment 2 (FIG. 53)

A display formed with each display pixel comprising three subpixels. Each subpixel is preferably a variable-wavelength LED device with controllable peak wavelength of light emitted, as described above.

During operation of the display device, subpixels are switched from emitting one peak wavelength to a different peak wavelength within a unit of time, as shown in FIG. 53. The peak emission wavelengths of any given subpixel is varied by varying the magnitude of the drive current provided to that subpixel. A unit of time may be a display frame or shorter such that a number of time units occur in a single display frame.

Emitting peak wavelengths which require high current density can cause significant localised heating which can affect performance and reliability of devices and the whole display.

The advantage of this method of controlling the subpixels is that heating of sub-pixels is shared more uniformly distributed over the display pixel and hot spots on particular sub-pixels are avoided.

In the four time units of time illustrated in FIG. 53, B and R subpixels are shown as swapping, but if the G subpixel is a variable-wavelength LED then the G subpixel can also switch emission wavelengths. Any combination of switching is possible with the present invention, simply by varying the drive currents provided to the separate subpixels.

Embodiment 3 (FIGS. 54A & 54B)

FIG. 54A schematically illustrates a pixel of a display device formed with pixels comprising four subpixels. Each subpixel is preferably a variable-wavelength LED device with controllable peak wavelength of light emitted, as described above, though in the illustrated embodiment the B and R subpixels could alternatively be provided by conventional blue and red LEDs.

The display comprises a plurality of subpixels within the same colour (red, green or blue for example, as each of these "colours" is commonly accepted as extending over a range of wavelengths in the visible spectrum), with the plurality of subpixels configured to emit at different peak wavelengths within that colour.

For example in preferred embodiments pixel "colours" may be: 400 nm-450 nm (violet); 450 nm-500 nm (blue); 500 nm-570 nm (green); 570 nm-590 nm (yellow), 590 nm-610 nm (orange), or 610-700 nm (red). Where there are a plurality of subpixels within a given "colour", those subpixels may all be configured to emit at wavelengths somewhere in one of these ranges.

In the preferred embodiment illustrated in FIG. 54A, the display pixel comprises two green sub-pixels with different peak wavelengths.

The advantage of this pixel design is to expand the gamut of the display without the need to switch a single LED subpixel between G subpixel operating modes (as is required in FIGS. 52A-D.

In the illustrated embodiment in FIGS. 54A and 54B, the peak emission wavelength of green (G) subpixel G1 is different from the peak emission wavelength of green subpixel G2.

By extension there could (in addition, or alternatively) be two R or two B pixels with different peak wavelengths. For example the pixel could contain two red subpixels R1 and R2 having different peak emission wavelengths in the red. And/or the pixel could contain two blue subpixels B1 and B2 having different peak emission wavelengths in the blue.

In all cases the LED devices may preferably have the same diode structure (N, active region, P) and only the drive current density is used to control the peak wavelength of emission. This may apply to all embodiments. Thus the two green subpixels G1 and G2 for example may be identical to one another in structure, but driven at different drive current densities. The difference in drive current densities leads to G1 emitting at a peak emission wavelength different from that of G2.

Embodiment 4 (FIGS. 55A-D)

FIG. 55A schematically illustrates a pixel of a display device comprising two subpixels, where each subpixel is a variable-wavelength LED device with controllable peak wavelength of light emitted.

When viewed at a distance the observed chromaticity of light emitted is a spatial and temporal combination of the sub-pixel light emission.

Both subpixels are operated with controllable emission corresponding to a particular observed chromaticity.

Figure 55B:
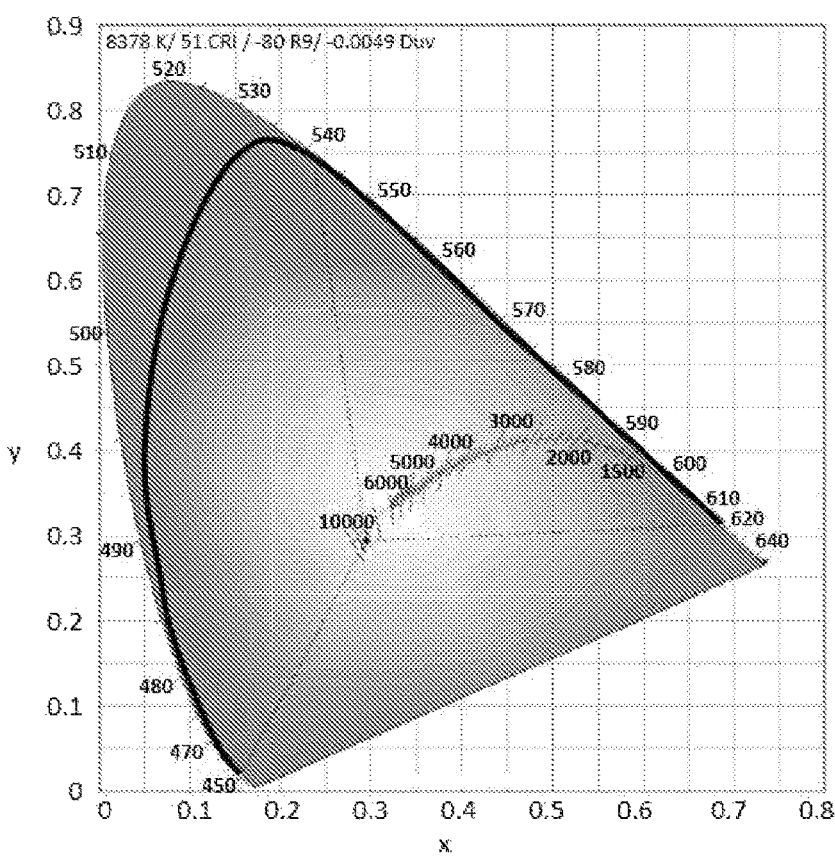

Both subpixels may preferably be controllable to emit at a peak emission wavelength from 450 nm to 630 nm, by varying the driving current provided to the subpixel. FIG. 55B illustrates the chromaticity achievable by the pixel when the peak emission wavelengths of the two variable-wavelength subpixels are varied from 450 nm to 620 nm.

Figure 55C:
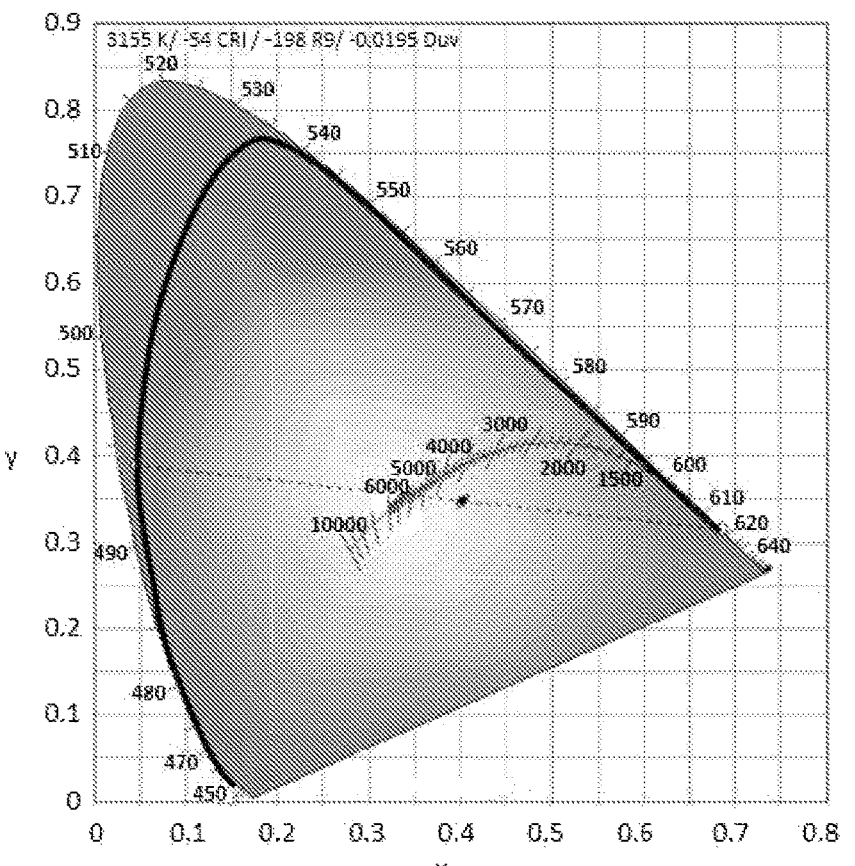

For any set of observed chromaticity points that can be displayed by the two subpixels, all chromaticities which exist on a straight line between the points can be displayed, as shown in FIG. 55C.

Figures 55D, 56:
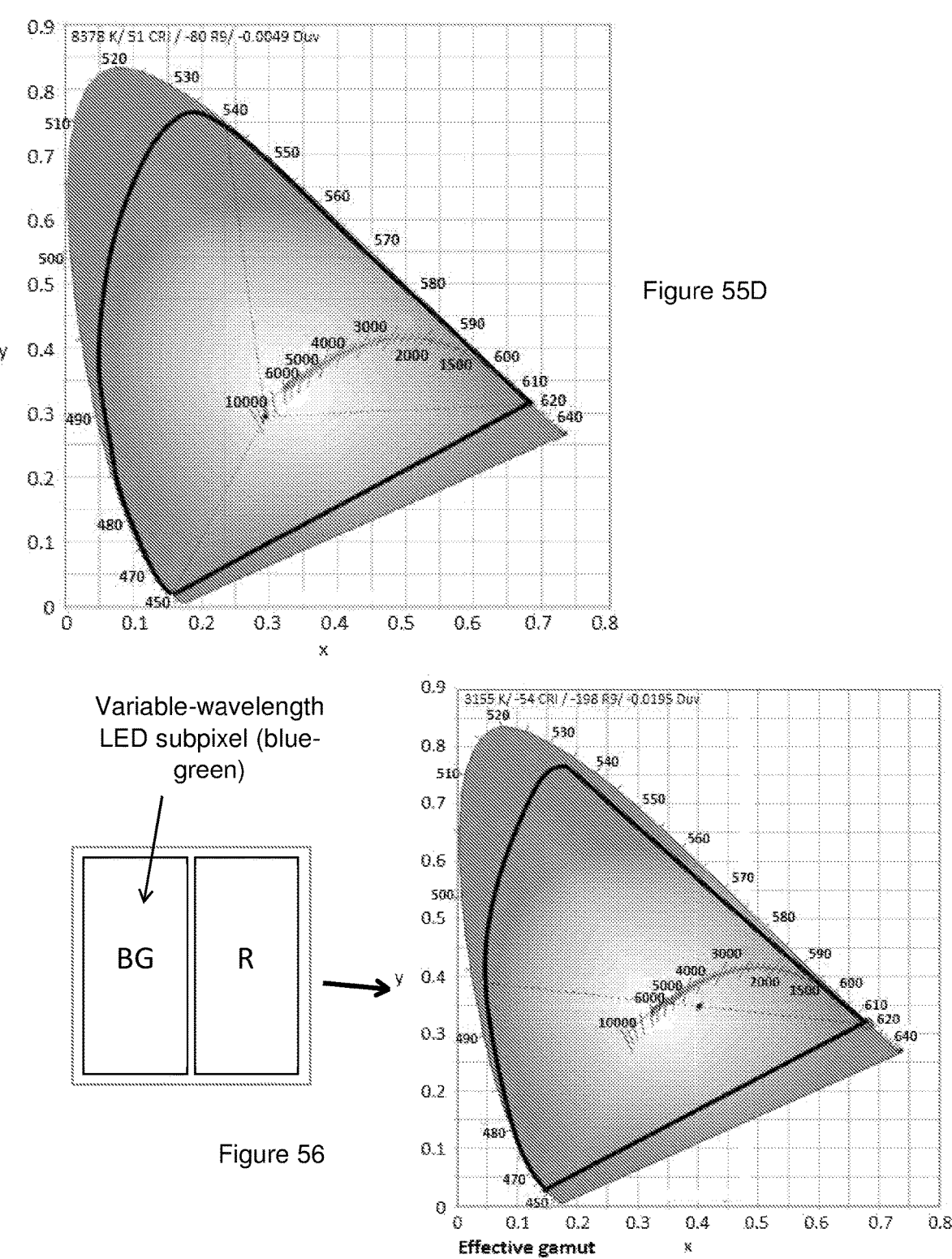
FIG. 56 illustrates a display pixel according to another embodiment of the present invention and the colour gamut obtainable with that pixel.

The effective gamut of the display is shown in FIG. 55D, and is defined by the line corresponding to the chromaticity of the LED device when the peak emission wavelength is controlled from 450 nm to 630 nm, and the straight line between the highest and lowest peak emission wavelength.

Embodiment 5 (FIG. 56)

FIG. 56 illustrates a pixel of a display formed with pixels comprising two subpixels. Each subpixel is preferably a variable-wavelength LED device with controllable peak emission wavelength, as described above, though in the illustrated embodiment the R subpixel could alternatively be provided by a conventional red LED.

In FIG. 56, one subpixel has controllable emission between a range of wavelengths, for example from 450 nm to 530 nm (B to G). The other subpixel is operated with a fixed emission wavelength corresponding to fixed observed chromaticity, for example at 630 nm®. Even if the R subpixel is a variable-wavelength LED, the peak emission wavelength of the R subpixel may be fixed by providing a driving current having a fixed magnitude corresponding to the current density required for emission at the desired red wavelength.

This is particularly effective because higher drive current is needed to achieved blue emission which results in increased radiant flux, however the human eye is less sensitive to blue light and therefore luminous flux from a green-blue pixel will change less than expected as the peak wavelength shifts between ~530 nm and ~450 nm, enabling a more efficient display with decreased complexity to control.

Figure 57:
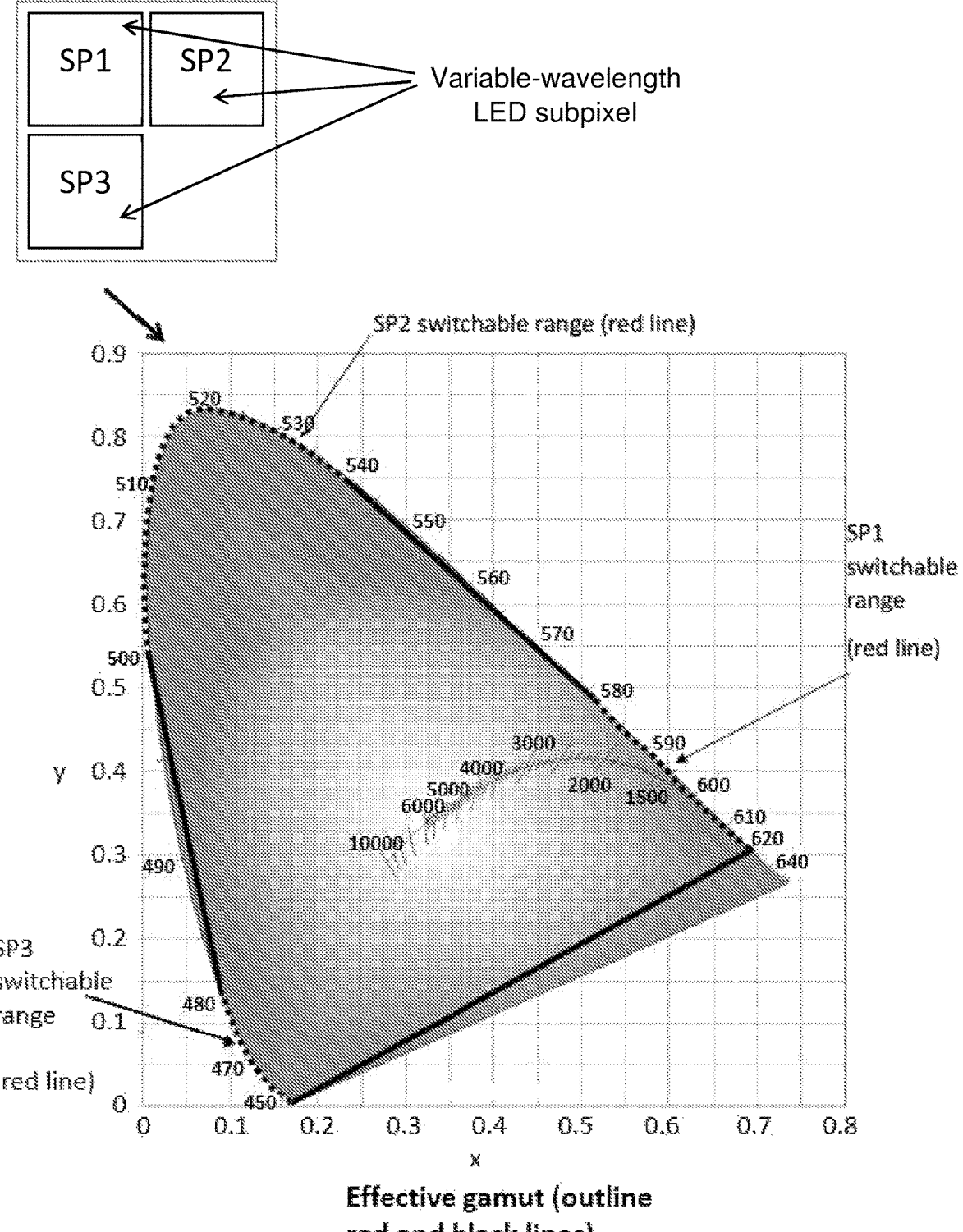
FIG. 57 illustrates a display pixel according to another embodiment of the present invention and the colour gamut obtainable with that pixel.

Embodiment 6 (FIG. 57)

FIG. 57 illustrates a pixel of a display formed with pixels comprising three subpixels, where each subpixel is a variable-wavelength LED device with controllable peak wavelength of light emitted.

When viewed at a distance the observed chromaticity of light emitted is a spatial and temporal combination of the subpixel light emission.

Subpixel SP1 is configured to emit light at wavelengths between 440 nm and 480 nm by varying the magnitude of the drive current supplied to SP1 during use. Subpixel SP2 is configured to emit light at wavelengths between 500 nm and 540 nm by varying the magnitude of the drive current supplied to SP2 during use. Subpixel SP3 is configured to emit light at wavelengths between 580 nm and 620 nm by varying the magnitude of the drive current supplied to SP3 during use. Thus SP1, SP2 and SP3 operate as blue (B), green (G) and red (R) subpixels respectively, and the peak emission wavelength of each subpixel can be varied across an emission wavelength range of 40 nm by varying the magnitude of the drive current to each subpixel.

R, G and B can each operate in a number of modes with peak wavelength switchable by 20 nm lower and higher than a central wavelength.

In combination each of the modes enables a different gamut of colours to be displayed As shown in FIG. 57, the effective gamut of the display is larger than that which can be achieved R, G and B sub-pixels having fixed emission wavelengths.

Figures 58, 59A, 59B, 59C:
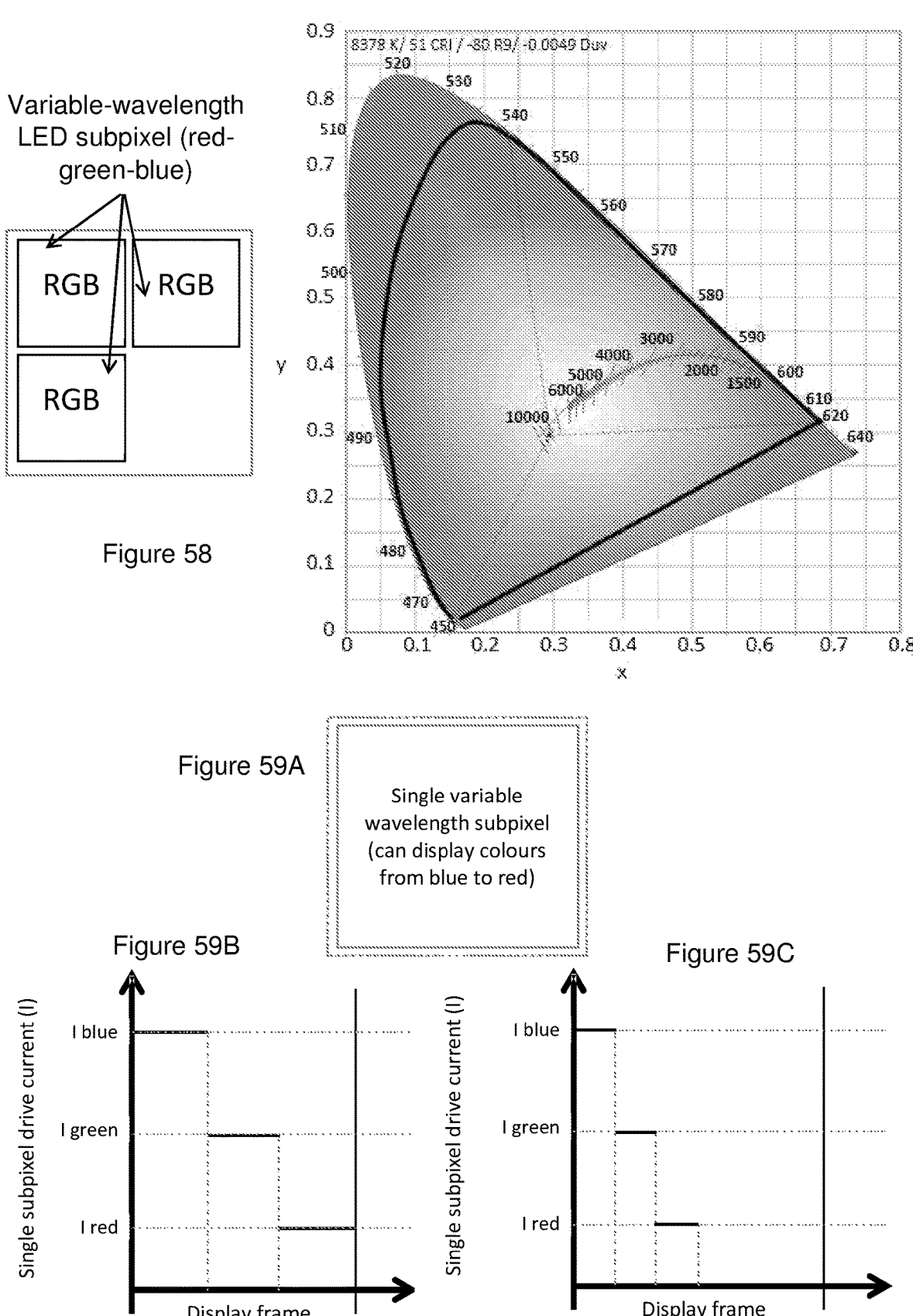
Figures 60A, 60B, 60C:
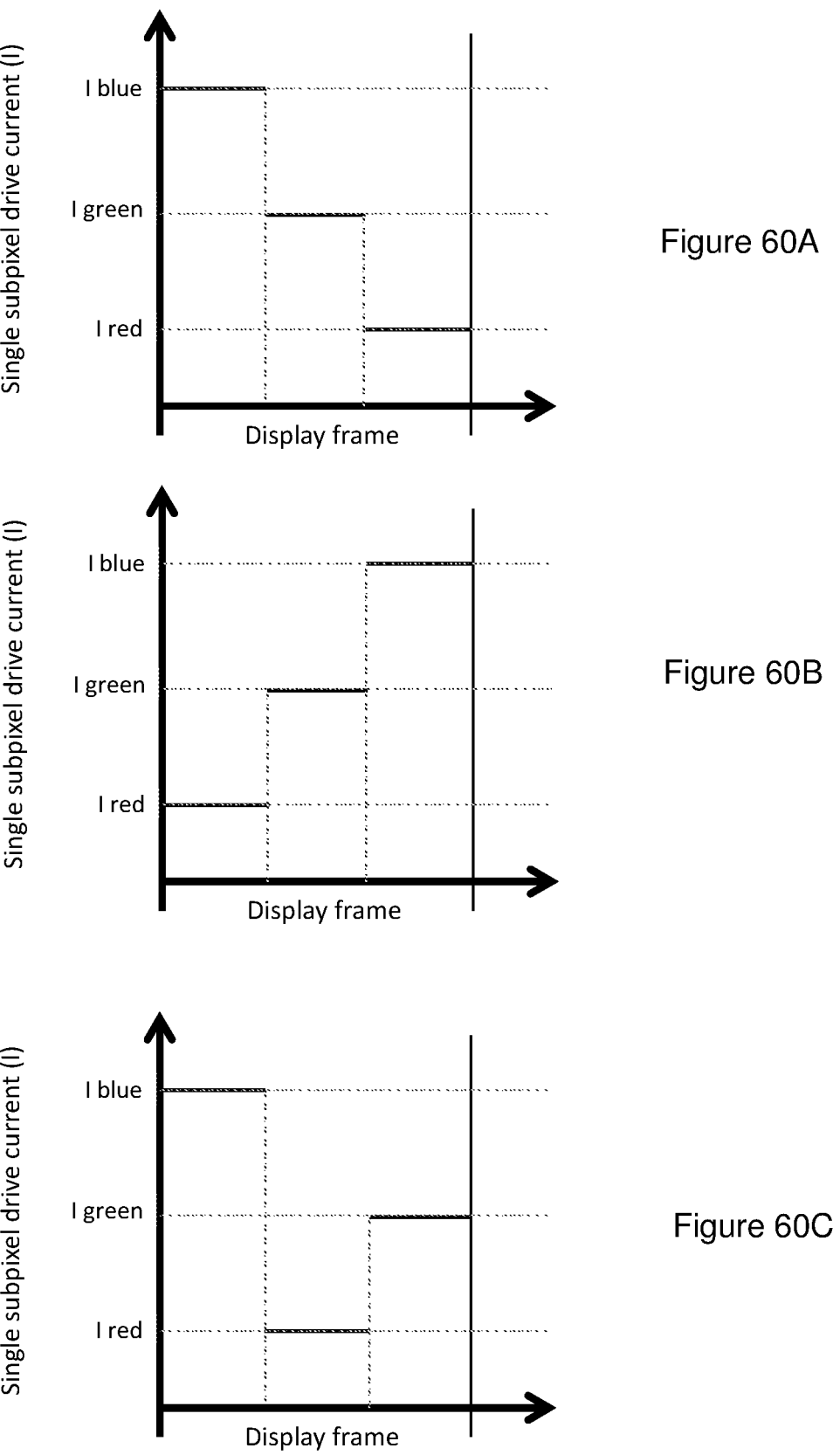

Generalisation of Embodiment 6 (FIG. 58)

FIG. 58 illustrates a pixel of a display formed with pixels comprising three subpixels, where each subpixel is a variable-wavelength LED device with controllable peak wavelength of light emitted.

When viewed at a distance the observed chromaticity of light emitted is a spatial and temporal combination of the sub-pixel light emission.

Each variable-wavelength subpixel is controllable to emit across a wide emission wavelength range, so that each subpixel can be operated as a red, green or blue subpixel depending on the drive current provided to the subpixels. The subpixels are controllable to operate in a number of modes with different peak wavelength.

In combination each of the modes enables a different gamut of colours to be displayed.

As shown in FIG. 58, the effective gamut of the display is that which can be achieved with R, G and B sub-pixels in any mode.

For each chromaticity within the achievable colour space there exists a continuous range of combinations of primary colours that enable this chromaticity to be displayed.

When controlling the display device, the choice of which combination to choose is preferably made by calculating the efficiency of each combination and choosing the highest efficiency.

The calculation of efficiency may advantageously take into account:

Efficiency of light emission from each subpixel at a particular peak emission wavelength;

Amount of light emission needed for each sub-pixel to achieve the chosen chromaticity and luminance;

Efficiency of light extraction from the active region of the LED device to the observer;

Efficiency of delivering electrical power from the display device driver to the LED device.

Temporal Colour Control

In a typical display different colours cannot be shown at the same position. Therefore each light emitting area (pixel) is divided into separately addressable single-color regions (subpixels). When viewed at a distance the colour seen is a spatial combination of the sub-pixel colours. Subpixels emit a fixed chromaticity that is different to other subpixels.

By adjusting the proportional amount of light emitted from each sub-pixel the observed chromaticity of a pixel is set, as illustrated in FIG. 50A.

Typically three or more subpixels are required to enable the display to show a wide range of colours (large colour gamut). Reducing the number of sub-pixels is advantageous to reduce cost and complexity, however doing so will impact the achievable colour gamut.

In some prior art display technologies not all coloured subpixels can be created in the same material, therefore significant cost and complexity is required to combine and arrange subpixels formed from different semiconductor materials, and to form the pixels into a display.

Subpixels with differing emission properties will have different efficiencies resulting in non-uniform localised heating.

Subpixels with higher efficiency will have shorter driving time ("on time") than sub-pixels with lower efficiency, in order to achieve particular observed chromaticity. It is inefficient to have a system where a large quantity of sub-pixels are not emitting light for a significant proportion of the time.

By incorporating the variable-wavelength LED of the present invention into a display device, there is provided a display where each pixel can emit a broad range of colours.

Each pixel is comprised of a number of subpixels. In some embodiments, however, one single variable-wavelength LED may be used to form a pixel having only one subpixel as shown in FIG. 59A.

The peak wavelength and therefore chromaticity of light emitted from a sub-pixel is dependent on the drive current. By choosing a drive signal where the drive current is changed during one display frame, the observed chromaticity of a pixel is determined by the temporal combination of the colours sequentially emitted by the one or more subpixels.

Altering duty cycle of subpixels is used to achieve grayscale control at each chromaticity.

The present invention may advantageously provide display with fewer than three subpixels that can display a wide colour gamut, which has significant benefits over prior art displays.

Benefits of the invention and all advantages over existing solutions:

Fewer sub pixels reduces the complexity and cost.

The pixel can be emitting light at all times, increasing the system efficiency and therefore observed brightness The pixel will heat during high current operation, operating at low drive current allows the pixel to cool

Embodiment 7

FIG. 59A illustrates a preferred embodiment in which the pixel of a display device consists of a single variable-wavelength LED. By varying the drive current provided to the pixel, the peak emission wavelength of the LED may be varied across a broad emission wavelength range, as discussed above, so that colours from blue to red may be emitted by the device pixel.

Where there is a single pixel, duty cycle control is used to access different grayscale levels. The duration for which current pulses are applied to the pixel may be varied to control the observed pixel brightness.

In the preferred embodiment illustrated in FIGS. 59B and 59C, the display device is configured to provide three discrete drive current modes to the LED pixel. The power supply can be operated to provide any one of $I_{blue}$, $I_{green}$ or $I_{red}$ to the LED at any one time.

The pixel colour observed by a viewer is the temporal combination of the light emitted by the pixel during a display frame. In FIG. 59B, each of the three drive modes is supplied for one third of a display frame, so the observed pixel colour will be an equal mix of blue, green and red wavelengths.

FIG. 59C illustrates an alternative control mode, in which each of the three drive modes is supplied for one sixth of a display frame. As the duty cycles of each drive current are still equal to one another, the observed pixel colour will be an equal mix of blue, green and red wavelengths exactly like FIG. 59B. However, as the subpixel has a lower overall on-time in FIG. 59C, the brightness of the pixel will be lower using the control mode of FIG. 59B.

FIGS. 60A-D show the three drive current modes $I_{blue}$, $I_{green}$ or $I_{red}$ being provided to the LED for the same overall duty cycles, but in different orders. Where there is a single pixel, the four drive scheme variations illustrated in FIGS. 60A-60D give an equivalent result, as temporal averaging is experienced by an observer.

Embodiment 8

In some preferred embodiments, a pixel may comprise a plurality of variable-wavelength subpixels which are configurable to emit at different peak emission wavelengths in response to different driving currents. For example a single subpixel may be drivable to emit at wavelengths from blue to red in response to variations in the driving current provided to that subpixel.

FIG. 61A illustrates a display device pixel containing two subpixels, each of which is a variable-wavelength LED with an emission wavelength range encompassing blue to red wavelengths.

Drive Scheme A in FIG. 61B illustrates a driving scheme for the upper subpixel, and a different driving scheme for the lower subpixel. Both the upper and lower subpixel are driven in the blue driving mode for one quarter of the display frame, in the green driving mode for one quarter of the display frame, and in the red driving mode for one half of the display frame. As the pixel colour observed by a viewer is the temporal combination of the light emitted by the pixel during a display frame, both the upper and lower subpixels will appear to emit the same colour of light.

Drive Scheme B in FIG. 61C illustrates an alternative driving scheme which uses shorter current pulses to achieve the same result as Drive Scheme A. Despite the shorter current pulses, the upper and lower subpixels are still driven in blue, green and red modes for the same total duty cycles, so the observed colours will be the same.

In all of these drive schemes, the pixel colour produced is the spatial and temporal combination of the emitted colours.

Embodiment 9

In some preferred embodiments, a pixel may comprise a plurality of subpixels, at least one of which is a variable-wavelength subpixel which is configurable to emit at different peak emission wavelengths in response to different driving currents. For example a single subpixel may be drivable to emit at wavelengths from blue to red in response to variations in the driving current provided to that subpixel.

In some particularly preferred embodiment, each pixel may comprise two sub-pixels in which:

One sub-pixel is operated with fixed colour

One sub-pixel changes colour

The advantage of this arrangement is that a less efficient sub-pixel can have a longer "on-time".

FIG. 62 illustrates a display device pixel containing two subpixels. The upper subpixel is a variable-wavelength LED with an emission wavelength range encompassing blue to green wavelengths, while the lower subpixel is a red subpixel. The red subpixel may be a conventional red LED subpixel incorporated into the display device, but preferably the red subpixel is a variable-wavelength LED with an emission wavelength range encompassing red wavelengths.

FIG. 62 shows that the upper subpixel may be driven by applying pulses of drive current in the blue mode $I_{blue}$ and green mode $I_{green}$ sequentially during the display frame, while the red lower subpixel may be driven by applying a continuous drive current in the red drive mode $I_{red}$.

This arrangement may advantageously provide a simplified RGB pixel.

The indicated emission colours are by way of example only, as subpixels with fixed emission wavelengths in colours other than red may equally be provided, and subpixels with emission wavelengths controllable across ranges other than blue to green may be provided.

Embodiment 10

In some preferred embodiments, a pixel may comprise a plurality of subpixels which are variable-wavelength subpixels which are configurable to emit at different peak emission wavelengths in response to different driving currents.

In the embodiment illustrated in FIG. 63, for example, a single upper subpixel is drivable to emit at wavelengths from blue to red in response to variations in the driving current provided to that subpixel. Another lower subpixel is drivable to emit at wavelengths from green to red in response to variations in the driving current provided to that subpixel.

In some particularly preferred embodiments, each pixel may comprise two sub-pixels in which a first variable-wavelength subpixel is drivable to emit at wavelengths across a first range in response to variations in the driving current provided to that subpixel (for example the driving current being controlled across a first driving current range); and a second variable-wavelength subpixel is drivable to emit at wavelengths across a second range in response to variations in the driving current provided to that subpixel (for example the driving current being controlled across a second driving current range). Preferably the first wavelength range covers a different range of wavelengths than the second wavelength range, though the first wavelength range may overlap the second wavelength range.

In this embodiment both sub-pixels change colour.

The advantage of this arrangement is that higher drive currents which generate significant localised heating are followed by lower drive currents which do not, allowing the sub-pixels to maintain a more stable temperature.

Figure 64A:
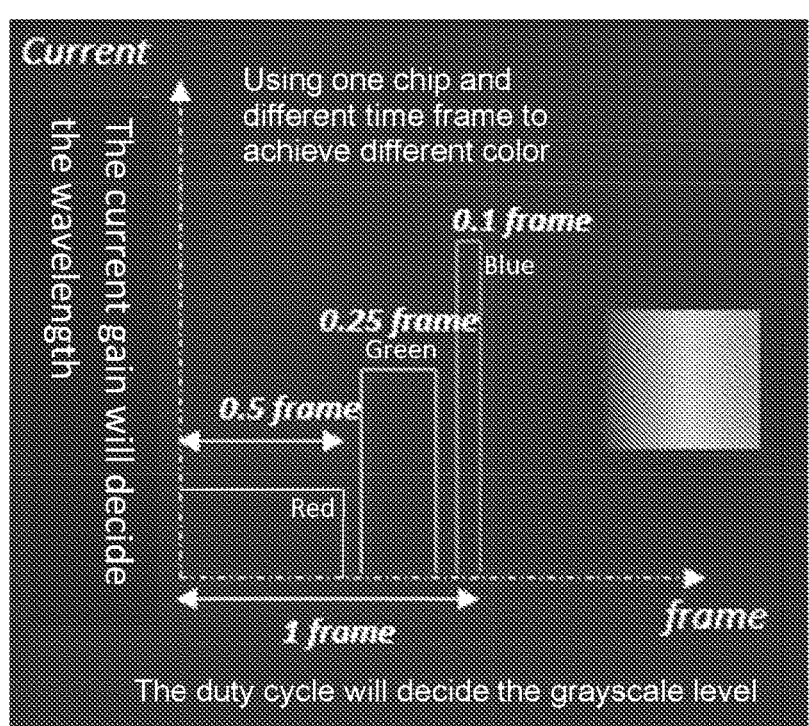
FIG. 64A is a schematic illustration of driving current conditions for a variable-wavelength LED according to the present invention
Figure 64B:
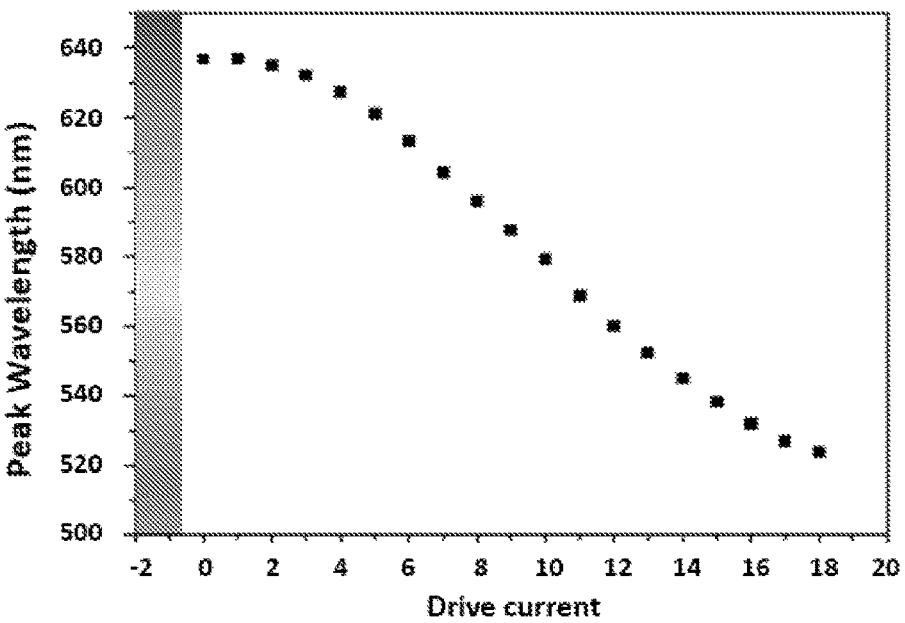
FIG. 64B illustrates the peak emission wavelength emitted by a variable-wavelength LED according to the present invention in response to different drive currents.

FIG. 64A is a schematic illustration of driving current conditions for a variable-wavelength LED according to the present invention. Within a single display frame, the driving current is activated in three different non-zero modes. The duty cycle (the duration of a pulse of driving current relative to the display frame) of each mode is different, and individually controllable.

The current gain of the driving current determines the wavelength produced by the variable-wavelength subpixel, while the duty cycle of the driving current determines the grayscale level produced by the subpixel.

The length of a display frame may be varied to correspond to any predetermined frame rate. The length of a display frame may be controlled by controlling the LED driving conditions provided by the power supply.

Where there is a single LED forming a pixel, duty cycle control is used to access different grayscale levels.

The following embodiments illustrate a variety of possible driving conditions usable to control a display device comprising one or more variable-wavelength LED subpixels according to the present invention.

These methods of control advantageously allow dynamic pixel tuning of the LEDs in the display device.

Figure 65:
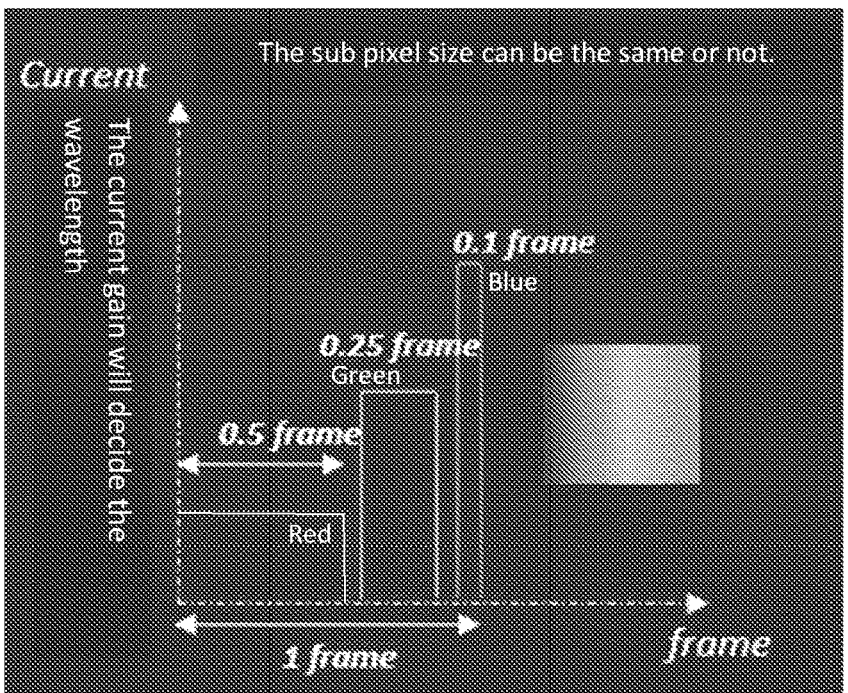
FIG. 65 is a schematic illustration of driving current conditions for a variable-wavelength LED according to Embodiment 1 of the present invention.

Embodiment 11 (FIG. 65)

Single pixel can be one subpixel or more, and each subpixel can change colors by the image information (this subpixel can display colors from blue to red)

Each pixel can determine its own color by modulating the signal and produce image information Pixel color and brightness are a combination of signal pulse duty cycle and amplitude

Embodiment 12 (FIG. 66)

Single pixel can be three or more subpixels (can display colors from blue to red).

The subpixel size will be the same.

Each subpixel can determine its own color by modulating the signal, and Image information for each pixel can be determined by combining multiple sub-pixels.

Pixel color and brightness are a combination of signal pulse duty cycle and amplitude.

Where there is a single pixel, these drive scheme variations are equivalent as temporal averaging is experienced by an observer

Embodiment 13 (FIG. 67)

Single pixel can be three or more subpixels (can display colors from blue to red).

The chip size is changed to adjust the magnitude of the current and pulse width.

Each subpixel can determine its own color by modulating the signal, and Image information for each pixel can be determined by combining multiple sub-pixels.

Pixel color and brightness are a combination of signal pulse duty cycle and amplitude.

Embodiment 14 (FIG. 68)

Single pixel can be three or more subpixels (can display colors from blue to red).

Chip sizes are optimised to achieve the same driving mode for each subpixel.

Each subpixel can determine its own color by modulating the signal, and Image information for each pixel can be determined by combining multiple sub-pixels.

Pixel color and brightness are a combination of signal pulse duty cycle and amplitude.

Embodiment 15 (FIG. 69)

Some sub-pixels can focus on producing specific colors through signal modulation, while others can change colors as needed by the image information (can display colors from blue to red).

The subpixel size can be the same or different.

Each subpixel can determine its own color by modulating the signal, and image information for each pixel can be determined by combining multiple sub-pixels.

Pixel color and brightness are a combination of signal pulse duty cycle and amplitude.

Spectral Reconstruction

In many applications it is desirable to be able to reproduce a particular spectrum of light.

In the prior art, this is achieved by:

Modulating the intensity of one or more illumination sources with fixed broad band emission spectra. This is inherently inefficient due to the subtractive nature.

Combining the emission from multiple narrow band emission sources. This provides limited tunability due to the fixed number of emission sources.

Using filters to modify the light from a high power broad spectrum source. This suffers from inherent inefficiency, and limited tunability due to fixed number of tuning elements.

As illustrated in FIGS. 70 to 79, an aspect of the present invention relates to utilising a variable-wavelength LED emission source in which the emission wavelength can be continuously tuned through control of the applied current.

The variable-wavelength LED source may be driven sequentially with a number of different current pulses. Different current pulses may have different magnitudes, or amplitudes. The time at which a particular current pulse is applied may be different to the time at which other current pulses are applied to the variable-wavelength LED.

As the emission wavelength emitted by the variable-wavelength LED correlates to the driving conditions applied to the LED at any given time, each applied current pulse with a different amplitude will produce a different peak emission wavelength.

In a preferred embodiment, the total length of pulses applied at different current amplitudes is faster than the response time of the detector (~50 ms for the human eye as a detector). In that case the emission spectrum perceived by the detector (preferably the human eye) will be a temporal average of the spectrum emitted by the variable-wavelength LED, that is a temporal average of the emission spectra created by each current pulse.

Current control can be done either using an analogue or digital pulse form.

Figure 70:
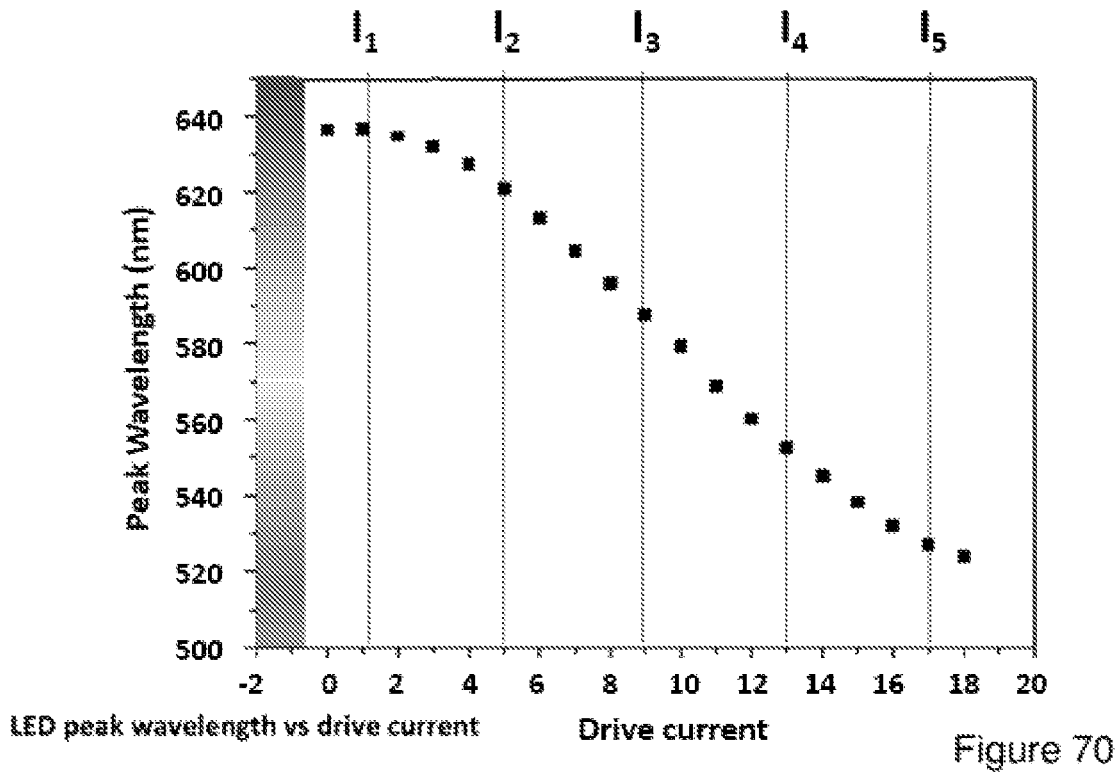
FIG. 70 illustrates the peak emission wavelength emitted by a variable-wavelength LED according to the present invention, overlaid with five different drive currents.
Figure 71:
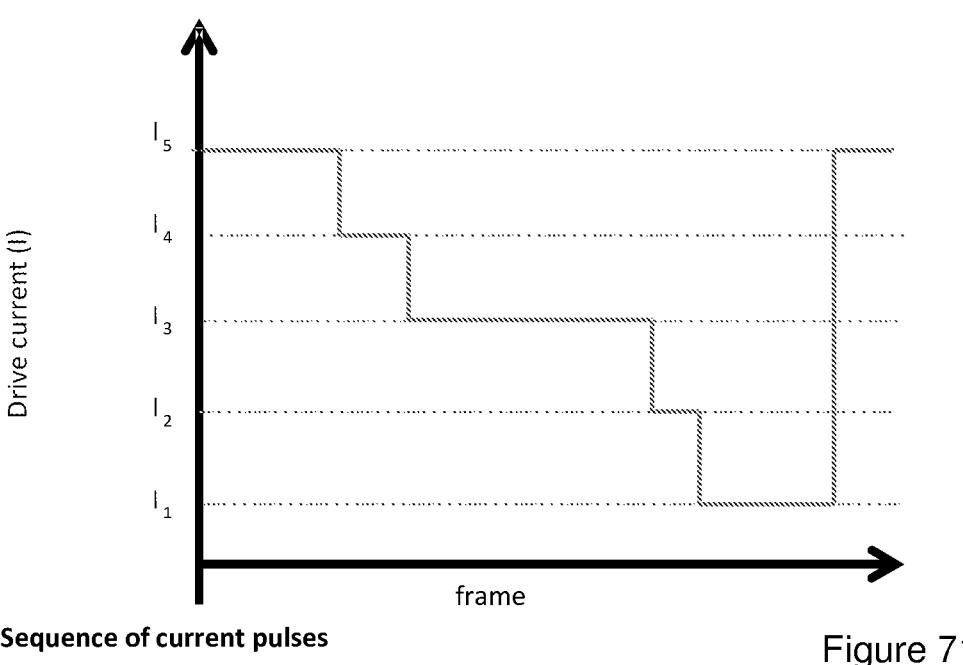
FIG. 71 illustrates a pattern of digital pulses of five different driving currents.
Figure 72:
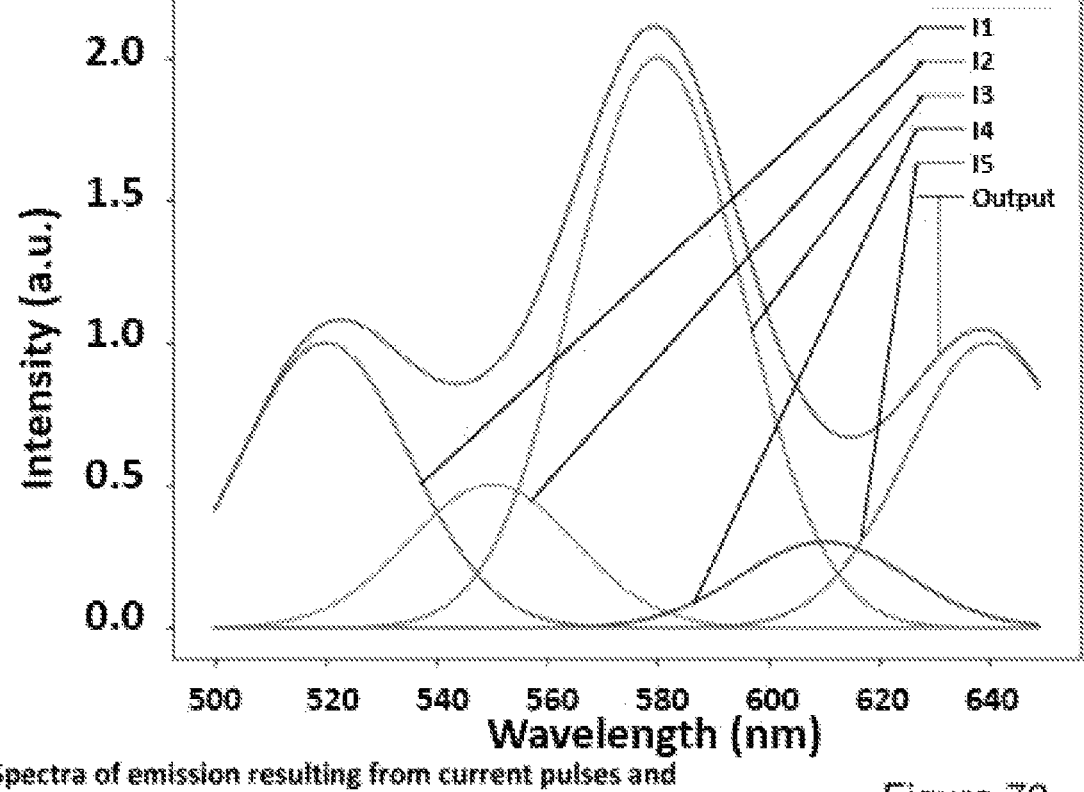
FIG. 72 illustrates the resulting emission spectra emitted by a variable-wavelength LED in response to the pulse pattern of FIG. 71.

FIGS. 70 to 72 illustrate an example of a "digital pulse" comprising a discrete sequence of current pulses.

FIG. 70 illustrates the emission spectrum of a variable-wavelength LED according to a preferred aspect of the invention, overlaid with lines indicating five discrete driving currents $I_1$-$I_5$. Each of driving currents $I_1$-$I_5$ differs in magnitude from the other driving currents. The intersection between the overlaid lines $I_1$-$I_5$ and the LED's emission spectrum indicates the peak emission wavelength emitted by the variable-wavelength LED in response to each of discrete driving currents $I_1$-$I_5$.

FIG. 71 illustrates an exemplary sequence of the current pulses being applied to the variable-wavelength LED. Each of $I_1$-$I_5$ has its own discrete magnitude (amplitude), and thus produces its own discrete peak emission wavelength when applied to the variable-wavelength LED. The sequence in which the pulses are applied to the LED, as well as the temporal duration of each current pulse, will therefore determine the overall emission spectra produced by the LED within the time of a given display frame. The order and duration of the current pulses may be controlled to achieve a huge variety of different perceived emission spectra.

FIG. 72 illustrates the combination of five discrete emission spectra having different peak emission wavelengths, which correspond to the five spectra produced by the five current pulses of FIG. 70. The overall output spectrum which is perceived by a viewer is the combination of these five discrete spectra, as shown by the "output" line in FIG. 71.

Embodiment A

FIGS. 73A-73D illustrate spectral reconstruction using multiple current set points (digital pulses), using the variable-wavelength LED described above.

A plurality n of current set points (n=5 in the illustrated example of FIG. 73A) are selected across tuning range of the LED (the range of peak emission wavelengths over which the variable-wavelength LED can emit).

Figures 73A, 73B, 73C, 73D:
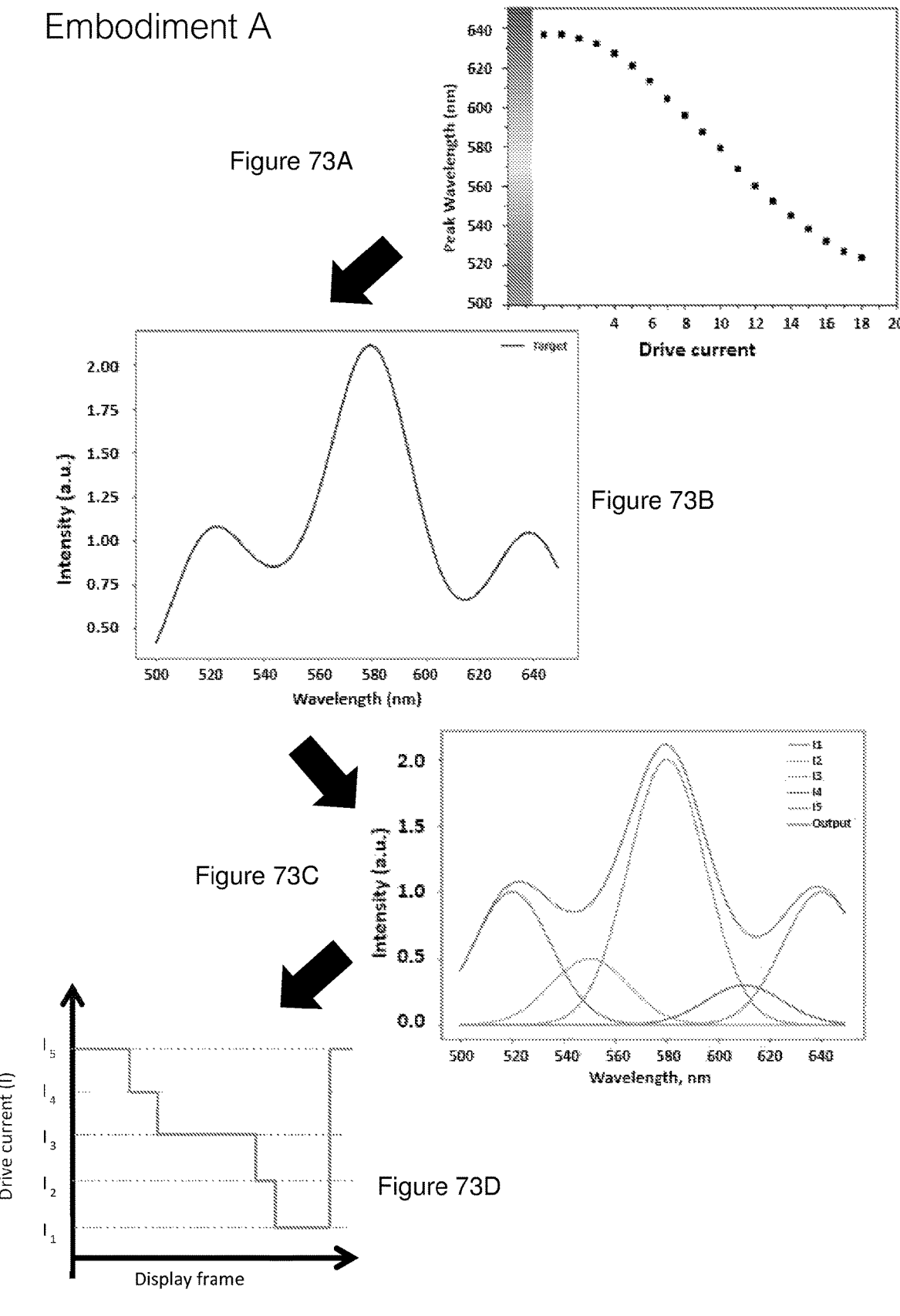
FIGS. 73A-73D illustrates spectral reconstruction using a plurality of digital pulses of driving current according to Embodiment A of the present invention.
Figure 77:
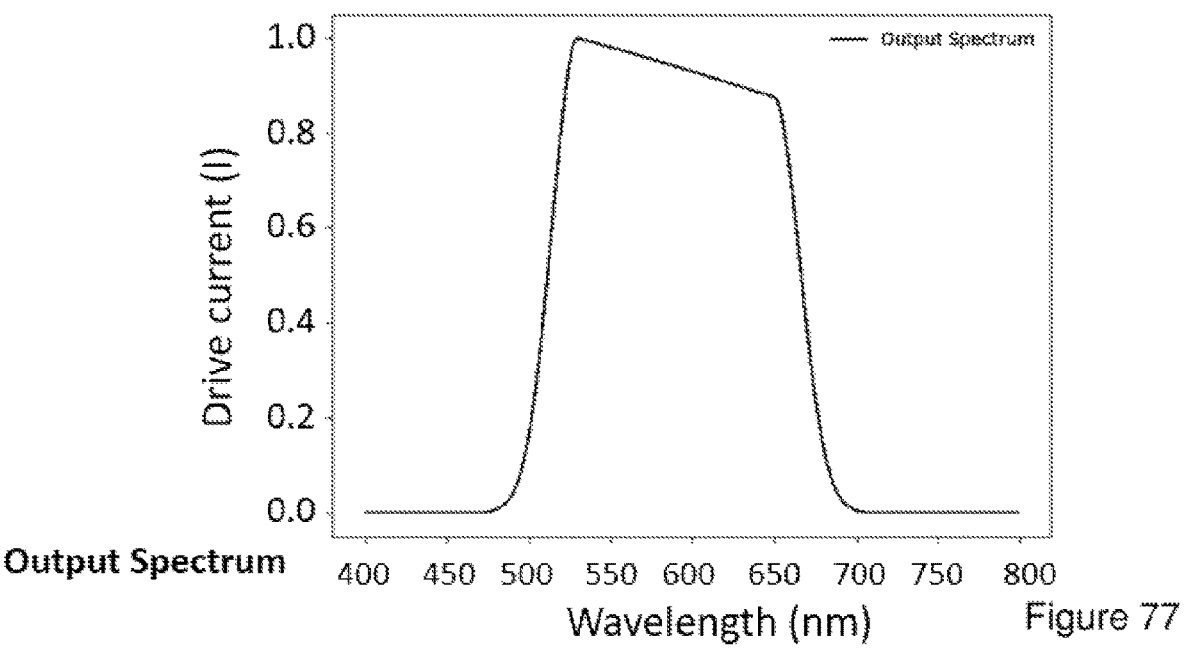
FIG. 77 illustrates a perceived output spectrum produced by a variable-wavelength LED in response to the analogue current pulse of FIG. 63.

A target spectrum (shown in FIG. 73B) is reconstructed as a linear combination of the Emission spectra of the LED at the chosen current set points (shown in FIG. 73C). The intensity of each constituent peak wavelength is converted into a time (pulse duration) at each of the n set currents to account for the LED emission brightness at each set current, to arrive at a pattern of digital pulses which completes within the duration of a display frame (illustrated in FIG. 73D). In use, the pulse pattern is repeated for as long a time as the target emission spectrum is to be displayed, until a change in output spectrum is desired. At that time the LED may be driven with a different pulse pattern to produce a different perceived spectrum.

Embodiment B (FIGS. 74-77)

In the event where the number of current set points is large ($\rightarrow\infty$) the spectral reconstruction can be considered using an analogue current pulse.

To recreate a particular desired emission spectrum a total current pulse can be calculated such that the total emitted light at each wavelength in the tuning range of the variable-wavelength LED matches the desired target emission spectrum.

An exemplary target emission spectrum is shown in FIG. 74.

In order to produce the target emission spectrum of FIG. 74, a variable-wavelength LED with the emission characteristics illustrated in FIG. 75 may be driven using an analogue current pulse in which the amplitude of the current pulse varies over time. FIG. 76 shows an illustrative example of an "analogue pulse" of driving current with an amplitude which varies during a display frame. When such an analogue pulse is used to drive the variable-wavelength LED, the LED produces different peak emission wavelengths as the amplitude of the driving current pulse varies within the display frame, resulting in an output spectrum such as that shown in FIG. 77.

Similarly to the digital pulses described above in Embodiment A, the target spectrum shown in FIG. 74 is reconstructed as a temporal combination of emission spectra of the LED, with the analogue driving pulse behaving like a very high number ($n \rightarrow \infty$) of constituent driving currents.

Figure 78:
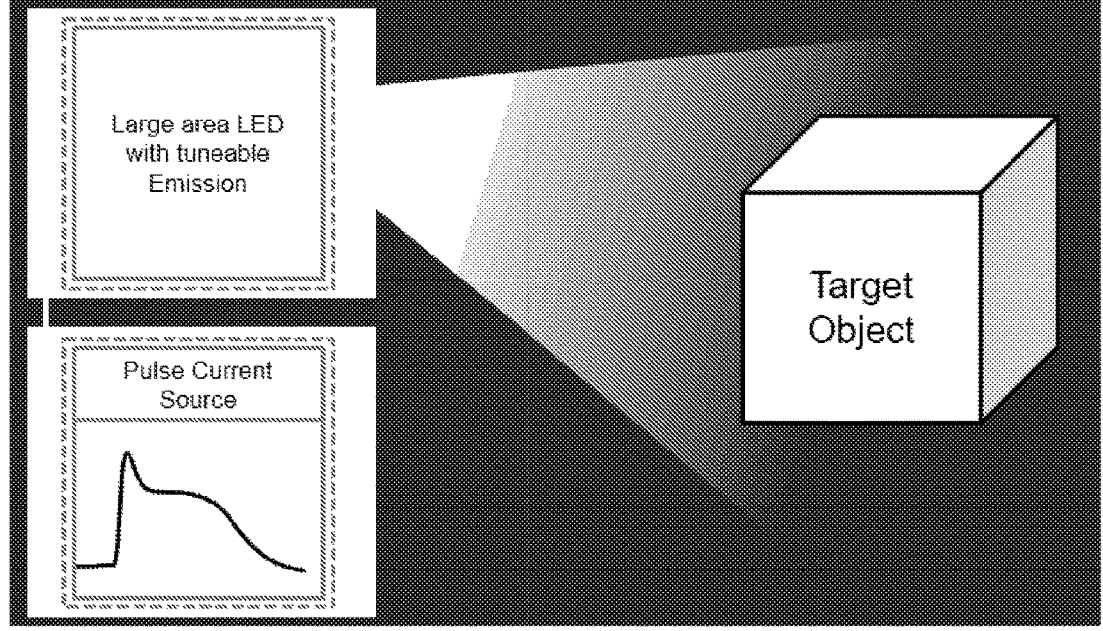
FIG. 78 illustrates a large area spectrally tuneable illumination source according to a preferred Embodiment C of the present invention.

Embodiment C (FIG. 78)

One or more variable-wavelength LEDs may provide a large area spectrally tuneable illumination source for use as a hyperspectral light source or for general illumination. This may be achieved using the concepts of Embodiments A and B described above.

The spectra produced can either be narrow or broad spectrum, depending on the driving conditions applied to the one or more LEDs.

The illumination spectrum can either be fixed between illumination frames (by keeping the driving conditions the same, or repeating the same driving pulse during each display frame) or modified between frames (by modifying the pulse pattern/sequence or pulse shape between frames), where the illumination frame is a time shorter than the response time of the detector used.

This may be particularly useful for applications requiring a particular controlled spectrum including medical imaging, phototherapy, specialty lighting, agritech.

Figure 79:
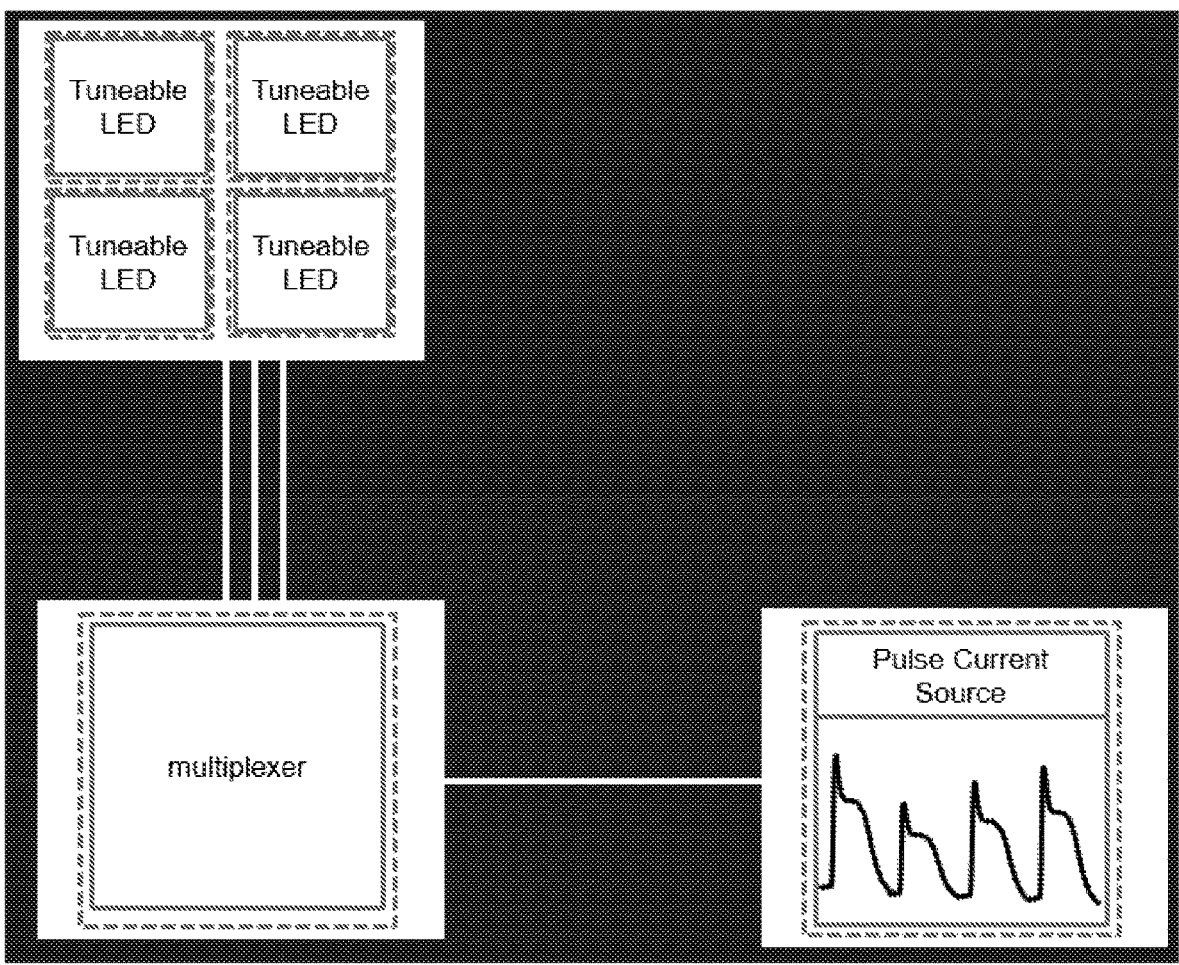
FIG. 79 illustrates a spectrally correct display device comprising spectrally tuneable pixels according to a preferred Embodiment D of the present invention.

Embodiment D (FIG. 79)

In an aspect of the invention may provide one or more spectrally tuneable pixels for a spectrally correct display, where each individual pixel (or each individual subpixel) behaves as described above in Embodiment A or B.

As shown in FIG. 79, a plurality of variable-wavelength LEDs ("tuneable" LEDs) may be provided in an array to form a display device. Each variable-wavelength LED is preferably arranged to form a pixel (or a subpixel) of the display device. The pixels of the display device may each be configured to receive their own driving current from a pulse current source which is configured to generate current pulses (either series of digital pulses as described in relation to embodiment A, or analogue pulses as described in relation to embodiment B). The driving current provided to each pixel is preferably controllable independently from that applied to the other pixels. The pulse current source may be configured to provide pulses of driving current to a multiplexer which is connected to the individual pixels in the display device.

The current pulses can be designed for two main applications:

To accurately represent the spectrum of the image being recreated; or

To correct for non-uniformity arriving during the manufacturing process by adjusting the current pulse for each sub pixel such that they all emit identical emission wavelength and intensity across the entire display. The tuned display would then be driven with the adjusted current pulses with the emission from two or more sub pixels combining to produce the perceived colour for each pixel.

Pixel Size & Geometry

The embodiments set out below illustrate aspects of the invention in terms of pixels comprising two subpixels with different areas and different emission wavelengths. The skilled person will understand, however, that pixels having other numbers of subpixels may equally be provided using the same principles.

Embodiments E to H use the same variable-wavelength LED structures described throughout the present application. By controlling the light-emitting area of the LED mesas during manufacture, the current densities experienced by the mesas can be controlled. As the current density governs the emission wavelength of a given LED, as described above, by controlling the light-emitting area of the LED mesas different subpixels with identical diode structures can be made to emit at different wavelengths in response to the same drive current.

Figure 80A:
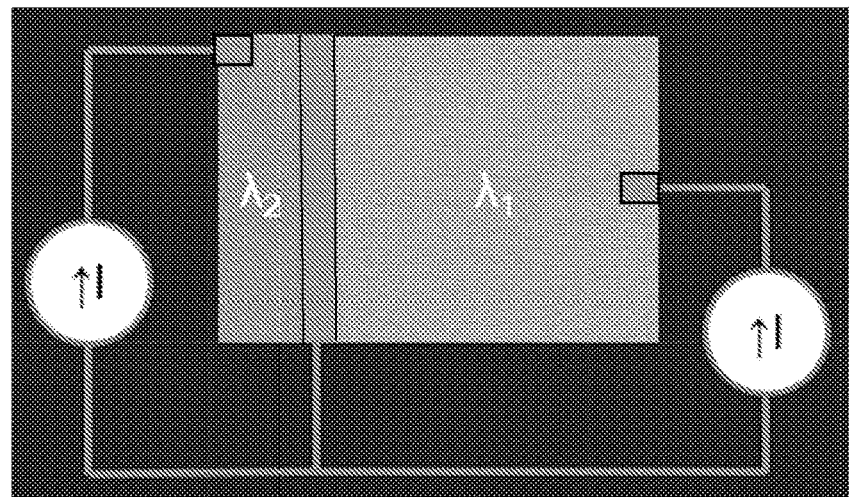
FIG. 80A is a schematic plan view of a display pixel having two variable-wavelength subpixels with the same diode structure but different light-emitting areas.

FIG. 80A is a plan view of a display pixel having two variable-wavelength subpixels with the same diode structure but different sizes, which emit at different peak emission wavelengths in response to the same fixed-magnitude driving current. Separate variable-wavelength LEDs having different areas but otherwise identical diode structures (identical layered LED structures of n-type layer(s), active layers and p-type layers) will thus emit different peak emission wavelengths in response to the same absolute drive current. In the illustrated embodiment, the larger subpixel emits at a red peak emission wavelength $\lambda_1$, while the smaller subpixel experiences a higher current density and emits at a shorter green peak emission wavelength $\lambda_2$. Together, the red and green subpixels form a combined red-green (RG) pixel package which may be integrated onto a device back plane driver as shown in FIG. 80B.

Figure 80B:
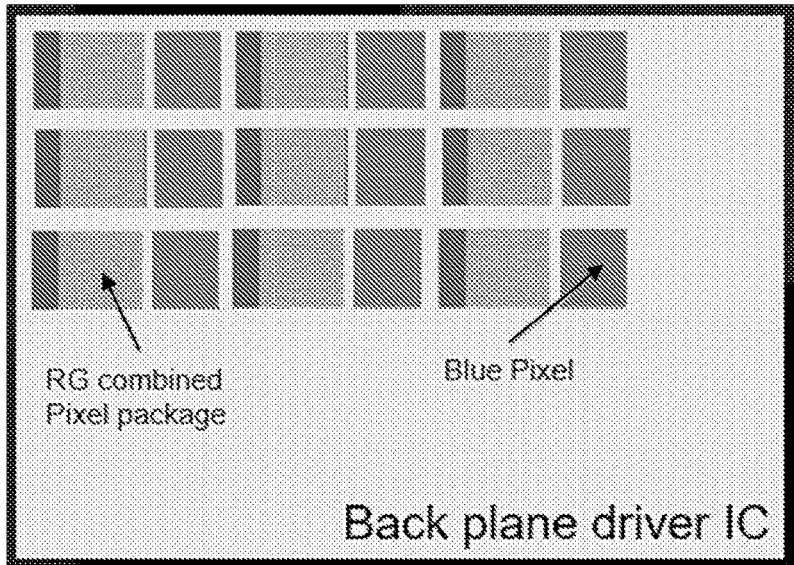
FIG. 80B shows an array of the red-green (RG) pixel packages of FIG. 80A, mounted on a back plane driver integrated circuit with an array of blue LED subpixels.

In FIG. 80B an array of combined red-green (RG) pixel packages is mounted on a back plane driver integrated circuit, with an array of blue LED subpixels. Together, each red-green (RG) pixel package combines with a blue subpixel to form a RGB pixel of a display device.

Embodiment E

LED geometry design to achieve multiple wavelengths at specified current densities.

For a given absolute current applied to an LED (or an LED subpixel), the current density experienced by the LED will depend on the area of the LED. The peak emission wavelength of a variable-wavelength LED can be varied by controlling the current density applied to the LED. The size, area and geometry of the LED will therefore affect the current density that results from any given absolute current, and thus the peak emission wavelength that is emitted.

For a display device configured to apply a fixed drive current I, for example, providing a plurality of LEDs having light-emitting layers with different areas will result in those LEDS emitting at different peak emission wavelengths.

Although the absolute drive current applied to the different LEDs may be the same, the different surface areas of the LEDs will mean that different LEDs experience different drive current densities, which will result in emission at different peak emission wavelengths.

Thus even when different LED subpixels have the same diode structure (the same arrangement and composition of semiconductor layers), by varying the light emitting area of different subpixels, those subpixels may be configured to emit at different peak emission wavelengths even when all of those subpixels receive the same absolute drive current.

By providing display devices configured to apply more than one fixed drive currents to the plurality of LEDs, the variety of peak emission wavelengths emittable by the LEDs may be increased. For example the drive current may be switchable between two different drive current modes, such that each LED subpixel is driveable to emit at two different peak emission wavelengths. The absolute value of the peak emission wavelengths are determined by the light-emitting area of the individual subpixels, and the magnitude of the drive currents in the drive current modes Using the drive current density vs wavelength curve shown in FIG. 81 (for an exemplary variable-wavelength LED) the required Current density $\rho$ for a given peak emission wavelength $\lambda$ can be found.

From this, the pixel surface area for each wavelength can be calculated using:

$$A_i = \frac{I_i}{\rho_i}$$

LED mesas with the corresponding area required for a desired peak emission wavelength can then be etched into the LED wafer, leaving multiple LEDs with varying emission wavelengths connected to a common substrate.

FIGS. 82A and 82B illustrate an exemplary device pixel comprising two subpixels with the same diode structure but different areas, which emit at different peak emission wavelengths in response to the same driving current.

In the example illustrated in Figured 82A and 82B, a first subpixel mesa (Mesa 1) forms a first subpixel having a first area $A_1$, and a second subpixel mesa (Mesa 2) forms a second subpixel having a second area $A_2$. The same drive current may be applied to both subpixels, but the difference in subpixel area means that the two subpixels will experience different current densities. These different current densities will drive the two subpixels to emit light at different wavelengths, even if the first and second subpixels have identical diode structures.

The pixel of FIGS. 82A and 82B is preferably manufactured by growing an LED structure on a semiconductor template comprising a porous region of III-nitride material. The LED structure may be grown as a uniform diode structure across the entire semiconductor wafer.

The wafer-scale LED structure may then be processed into a multi-colour display device, or into a plurality of multi-colour LED pixels to be separated and integrated into display devices, as follows.

In order to provide LED pixels each containing two LED subpixels which emit at different peak emission wavelengths from one another in response to a fixed drive current $I_1$, the two desired peak emission wavelengths $\lambda_1$, $\lambda_2$ are chosen. Based on the characteristic relationship between peak emission wavelength and drive current density for the grown LED structure, the drive current densities $\rho_1$ and $\rho_2$ required for each subpixel to produce the desired peak emission wavelengths are calculated. Based on the fixed drive current $I_1$ that will be used to drive the display, the formulae set out above are used to calculate the LED areas $A_1$, $A_2$ which will result in the two subpixels experiencing drive current densities $\rho_1$ and $\rho_2$.

Conventional semiconductor etching techniques are used to etch the LED structure into a plurality of pixels, in which each pixel contains two mesas of the LED diode structure which form two discrete LED subpixels: a first mesa having area $A_1$, which will experience drive current density $\rho_1$ when drive current $I_1$ is applied, and will thus emit at a desired peak emission wavelength $\lambda_1$; and a second mesa having area $A_2$, which will experience drive current density $\rho_2$ when drive current $I_2$ is applied, and will thus emit at a desired peak emission wavelength $\lambda_2$.

Drive currents $I_1$ and $I_2$ provided to the two subpixels may be the same drive current, or they may be different in magnitude. Drive currents $I_1$ and $I_2$ may be fixed-magnitude drive currents, so that the subpixels act as fixed-wavelength LEDs in use. Alternatively, Drive currents $I_1$ and $I_2$ may be variable-magnitude drive currents, such that the variable-wavelength subpixels can be driven to emit at a range of different wavelengths.

As the two LED subpixel mesas are grown on the same substrate, both are positioned on a shared n-type substrate. N-contacts and p-contacts are applied according to conventional methods, so that the two subpixels are driveable separately.

Although the description above relates to pixels comprising two subpixels, the invention may apply to pixels comprising any number of subpixels, and the same process may be used to form LED pixels comprising different numbers of subpixels.

Embodiment F

LED geometry design to produce a given emission Intensity at given emission wavelengths.

Figure 81:
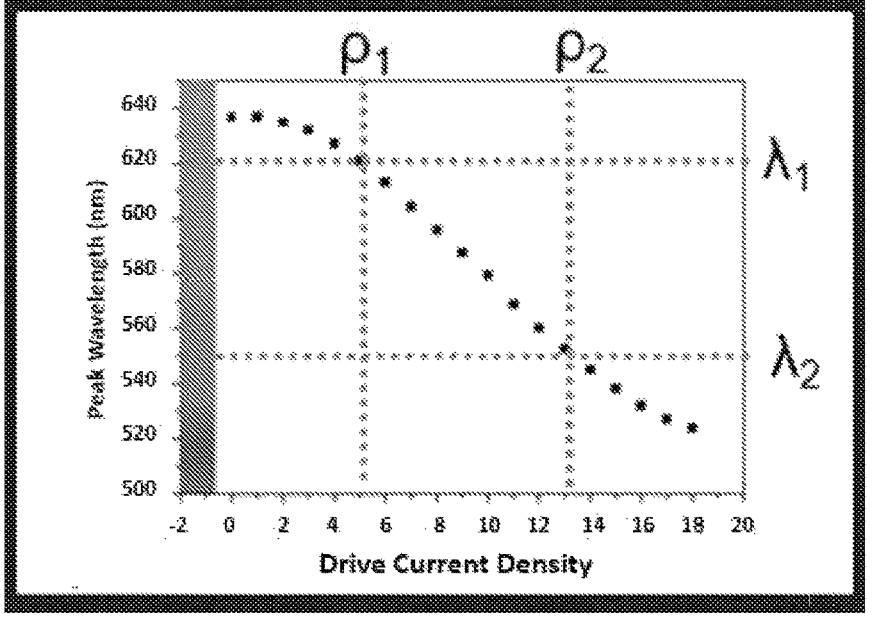
FIG. 81 is a graph of drive current density vs emission wavelength for a variable-wavelength LED subpixel according to an aspect of the present invention.

Using the drive current density vs wavelength curve shown in FIG. 81 (for an exemplary variable-wavelength LED) the required Drive Current Density ($\rho_1$, $\rho_2$) is selected to achieve two desired emission wavelengths ($\lambda_1$, $\lambda_2$).

Figure 83:
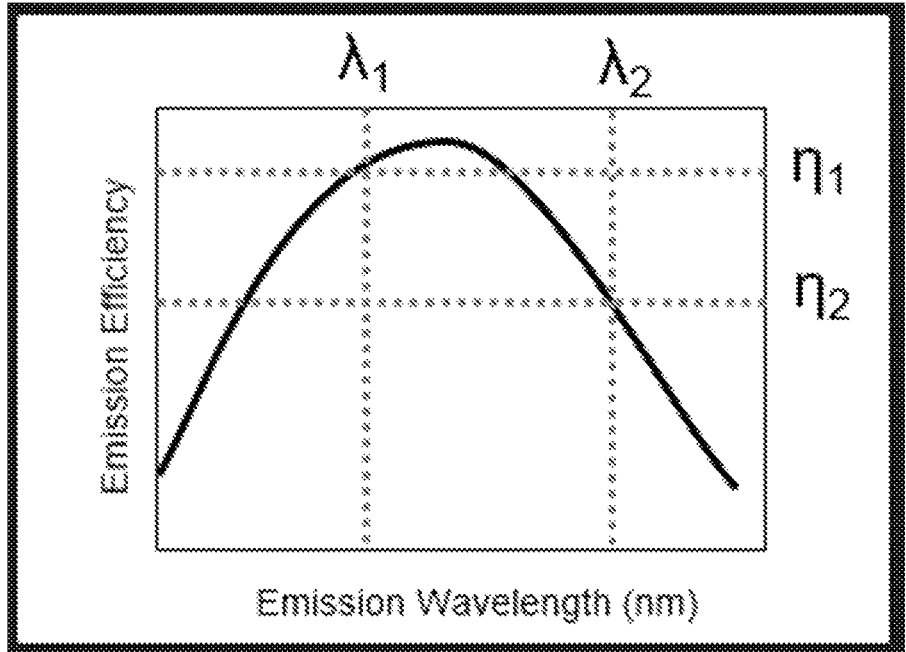
FIG. 83 illustrates the relationship between emission efficiency and emission wavelength for an exemplary variable-wavelength LED subpixel according to an aspect of the present invention.

For a given LED diode structure, the relationship between emission efficiency and emission wavelength is known or can be easily characterised, as shown in FIG. 83.

The Emission Efficiency at a given wavelength is given by $\eta_i$.

In this embodiment:
1. Wavelength $\lambda$ is selected and used to determine drive current density $\rho$;
2. Emission efficiency $\eta$ at $\lambda$ (or $\rho$) is used to scale the emitting area A of the sub-pixel to achieve a desired output density (emission intensity);
3. The drive current that is required is found from $\rho \times$Area.

Thus once an emission wavelength is selected, the current density is fixed, and then the sub-pixel area is scaled according to efficiency at that wavelength, in order to achieve a required total flux (intensity) from the sub-pixel.

Using this method, it can be ensured that subpixels emit not only at the intended wavelength, but also at a desired emission intensity.

At the desired emission wavelengths ($\lambda_1$, $\lambda_2$) for a two-subpixel pixel, the drive current densities ($\rho_1$, $\rho_2$) required to emit with the desired emission wavelengths ($\lambda_1$, $\lambda_2$) is known. The Emission Efficiency at those wavelengths is given by $\eta_i$. By taking into account the emission efficiency, the light-emitting areas ($A_i$) required for the two subpixels to emit at the desired emission intensity is calculated.

From the subpixel areas (A) and the drive current densities, the total drive Current required ($I_i$) to give the desired emission intensity is calculated.

As described above in relation to Embodiment E, mesas may be etched into an LED structure to give mesas having the correct light-emitting area ($A_1$, $A_2$) that will emit at the desired peak emission wavelengths ($\lambda_1$, $\lambda_2$). As both subpixels are etched from the same LED structure, both subpixels have the same diode structure, but different areas (footprints—the area of a subpixel is the surface area of the mesa when viewed from above).

As the drive current ($I_i$) required to give a desired emission intensity has been calculated separately for each subpixel, the subpixels will emit at the desired emission intensity whenever the drive current is applied.

The drive current ($I_i$) applied to each separate subpixel may optionally be different. This may advantageously compensate for the difference in emission efficiencies at different emission wavelengths. Thus a first subpixel (Mesa 1 in FIGS. 82A & 82B for example) may be driven by a first drive current $I_1$ to produce the emission intensity desired from the first subpixel, while a second subpixel (Mesa 2 in FIGS. 82A & 82B for example) may be driven by a second drive current $I_2$ to produce the emission intensity desired from the second subpixel.

Embodiment G

LED geometry design to produce a given Luminosity at given emission wavelengths

Using the drive current density vs wavelength curve shown in FIG. 81 (for an exemplary variable-wavelength LED) the required Drive Current Density ($\rho_1$, $\rho_2$) is selected to achieve two desired emission wavelengths ($\lambda_1$, $\lambda_2$) from two separate LED subpixels.

For a given LED diode structure, the relationship between emission efficiency and emission wavelength is known or can be easily characterised, as shown in FIG. 83.

At the design drive current densities required to emit with the desired emission wavelength, the Emission Efficiency is given by $\eta_i$.

Figure 84:
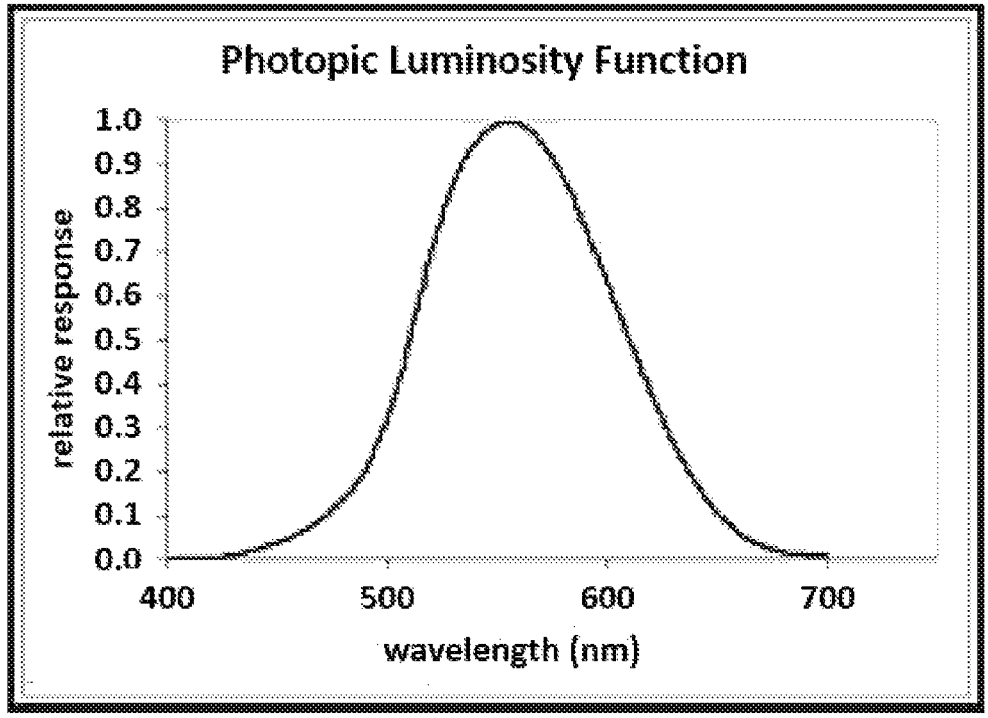
FIG. 84 illustrates the photopic luminosity function for emission at different wavelengths for an exemplary variable-wavelength LED subpixel according to an aspect of the present invention.

This can then be combined with the Photopic Luminosity function. For a given LED diode structure, the photopic luminosity function for emission at different wavelengths is known or can be easily characterised, as illustrated for an exemplary subpixel in FIG. 84.

From this the total Current required ($I_i$) for an LED subpixel to give a desired emission luminosity can be calculated.

Finally from this required current ($I_i$) and the current density, the formula above can be used to calculate a Mesa area for an LED subpixel such that the requirements are met and the subpixel will emit light at the desired peak emission wavelength and the desired luminosity when the drive current is applied.

Similarly to the embodiments described above, a plurality of LED subpixels having different areas (footprints) may be formed in the same semiconductor wafer by etching the wafer into a plurality of subpixel mesas having mesa areas corresponding to the desired subpixel areas.

Embodiment H

LED geometry Optimised for Concentric emission of two or more wavelengths.

Figure 85A:
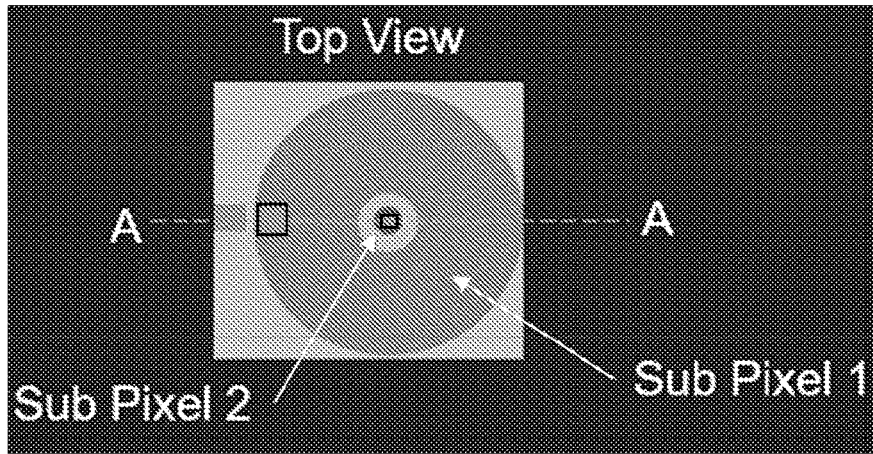
FIG. 85A is a schematic plan view of a two-subpixel device pixel according to a preferred embodiment of the present invention.
Figure 85B:
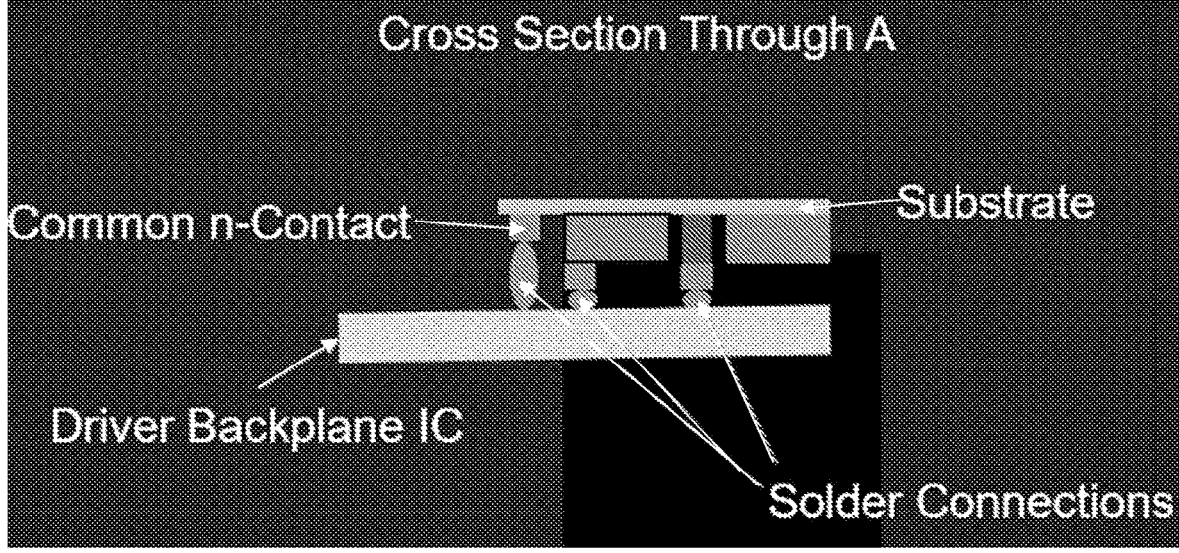
FIG. 85B is a schematic side-on cross-sectional view of the pixel of FIG. 85A, taken along the line A-A.

FIGS. 85A and 85B illustrate an exemplary embodiment of a two-subpixel device pixel in which the two subpixels are provided in the form of a ring-shaped subpixel 1 positioned concentrically around a circular subpixel 2. Both subpixels are provided on a shared conductive substrate and connected to a common n-contact, but subpixels 1 and 2 are connected to separate p-contacts through which the subpixels are bonded to a driver backplane IC.

FIGS. 85A and 85B show two concentric sub pixels, however the number of emitting wavelengths can be as large as required, with each subsequent sub pixel forming a ring centered around the smallest sub pixel.

The additional freedom in controlling the layout of the devices in a single layer rather than mass transfer allows for:

1. Correction of chromatic aberration of imaging optics; and
2. Generation of multi colour pixels with the same apparent centre.

The principles set out above may be used to calculate the areas required for different subpixels to emit light at the desired wavelengths. Once those subpixel areas are known, the subpixels may be formed in a wide variety of shapes, with a variety of subpixel geometries. In the example illustrated above, for example, subpixels may be formed as concentric rings, one around the other. This concentric arrangement may be converted into a display device by etching concentric circles having the desired footprint area into an LED wafer comprising a shared n-type conductive layer, and then flipping the wafer before bonding p-contacts to connect each individual subpixel to a driver backplane IC. The driver backplane IC is configured to apply a drive current, or a plurality of different drive currents, to each subpixel, such that the discrete subpixels can be controlled separately from one another.

The invention claimed is:

1. A display device comprising a light emitting diode (LED) which includes a porous semiconductor material,
  wherein the device comprises a pixel comprising a plurality of subpixels each having a light-emitting layer;
  wherein a first subpixel has a first light-emitting layer having a first area $A_1$, and a second subpixel has a second light-emitting layer having a second area $A_2$ different from the first area $A_1$;
  wherein the first and second subpixels have identical LED epitaxial structures and identical layer compositions;
  wherein the first subpixel and the second subpixel are variable-wavelength subpixels, and in which the display device is configured to provide a variable drive current to the variable-wavelength subpixels, such that each variable-wavelength subpixel emits at different peak emission wavelengths in response to different drive currents;
  wherein the first subpixel is a variable-wavelength subpixel configured to emit at a first peak emission wavelength in response to a first drive current applied to the first subpixel, and to emit at a third peak emission wavelength in response to a third drive current applied to the first subpixel;
  wherein the second subpixel is a variable-wavelength subpixel configured to emit at a second peak emission wavelength different from the first peak wavelength in response to a second drive current applied to the second subpixel, and to emit at a fourth peak emission wavelength in response to a fourth drive current applied to the second subpixel.

2. The display device according to claim 1, in which the first subpixel has a first geometry or shape, and in which the second subpixel has a second geometry or shape, in which the first geometry or shape is different from the second geometry or shape.

3. The display device according to claim 2, in which the first subpixel is circular in shape, and in which the second subpixel is formed as a ring arranged concentrically around the circular first subpixel.

4. The display device according to claim 1, in which the first subpixel and the second subpixel are positioned on a shared n-type conductive layer of semiconductor material.

5. The display device according to claim 1, comprising driver circuitry configured to control the drive current provided to each subpixel in the display device.

6. The display device according to claim 1, in which the first subpixel is configured to emit at a first emission intensity at the first peak emission wavelength in response to the first drive current applied to the first subpixel, and/or in which the second subpixel is configured to emit at a second emission intensity at the second peak emission wavelength in response to the second drive current applied to the second subpixel.

7. The display device according to claim 1, in which the first subpixel is configured to emit at a first luminosity at the first peak emission wavelength in response to the first drive current applied to the first subpixel, and/or in which the second subpixel is configured to emit at a second luminosity at the second peak emission wavelength in response to the second drive current applied to the second subpixel.

8. A method of controlling the display device according to claim 1, comprising the steps of:

provide a variable-magnitude drive current to the first subpixel, and providing a variable-magnitude drive current to the second subpixel;

wherein providing the variable-magnitude drive current to the first subpixel comprises providing the first drive current to the first subpixel such that the first subpixel emits at the first peak emission wavelength, and providing the third drive current to the first subpixel such that the first subpixel emits at the third peak emission wavelength;

wherein providing the variable-magnitude drive current to the second subpixel comprises providing the second drive current to the second subpixel such that the second subpixel emits at the second peak emission wavelength different from the first peak emission wavelength, and providing the fourth drive current to the second subpixel such that the second subpixel emits at the fourth peak emission wavelength.

9. The display device according to claim 1, in which the first area $A_1$ of the first light-emitting layer is larger than the second area $A_2$ of the second light-emitting area, or in which the first area $A_1$ of the first light-emitting layer is smaller than the second area $A_2$ of the second light-emitting area.

10. The display device according to claim 1, in which the first area $A_1$ of the first light-emitting layer has a different shape than the second area $A_2$ of the second light-emitting area.

11. The display device according to claim 1, in which the first area $A_1$ and the second area $A_2$ are footprints of the first and second light-emitting layers over the porous semiconductor material.

12. The method according to claim 8, in which the magnitude of the first drive current is the same as the magnitude of the second drive current.

13. The display device according to claim 1, comprising a first electrical contact which contacts the first subpixel over a first contact area, the first electrical contact being configured to apply a drive current to the first subpixel, and a second electrical contact which contacts the second subpixel over a second contact area, the second electrical contact being configured to apply a drive current to the second subpixel, in which the first subpixel has a first contact ratio defined by the ratio of the first contact area:first area $A_1$, and the second subpixel has a second contact ratio defined by the ratio of the second contact area:second area $A_2$, and in which the first contact ratio is different from the second contact ratio, so that the first and second subpixels are configured to emit at different peak emission wavelengths in response to the same drive current.

* * * * *